US012805178B2

(12) United States Patent
Chen et al.

(10) Patent No.: US 12,805,178 B2
(45) Date of Patent: Nov. 17, 2026

(54) ORGANOMETALLIC IRIDIUM COMPOUND AND APPLICATION THEREOF

(71) Applicant: GUANGDONG AGLAIA OPTOELECTRONIC MATERIALS CO., LTD., Foshan (CN)

(72) Inventors: Shaofu Chen, Foshan (CN); Zhiqiao Cheng, Foshan (CN); Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD., Foshan (CN)

( * ) Notice: Subject to any disclaimer, the term of this patent is extended or adjusted under 35 U.S.C. 154(b) by 359 days.

(21) Appl. No.: 18/289,445

(22) PCT Filed: Feb. 26, 2022

(86) PCT No.: PCT/CN2022/078117

§ 371 (c)(1),
(2) Date: Nov. 3, 2023

(87) PCT Pub. No.: WO2022/242264

PCT Pub. Date: Nov. 24, 2022

(65) Prior Publication Data

US 2024/0292732 A1 Aug. 29, 2024

(30) Foreign Application Priority Data

May 18, 2021 (CN) ......................... 202110538115.6

(51) Int. Cl.

| | |
|---|---|
| ***H10K 85/00*** | (2023.01) |
| ***C07F 15/00*** | (2006.01) |
| ***C09K 11/06*** | (2006.01) |
| ***H10K 85/30*** | (2023.01) |
| *H10K 50/12* | (2023.01) |

(52) U.S. Cl.

CPC ......... *H10K 85/00* (2023.02); *C07F 15/0033* (2013.01); *C09K 11/06* (2013.01); *H10K 85/342* (2023.02); *C07B 2200/05* (2013.01); *C09K 2211/1044* (2013.01); *C09K 2211/185* (2013.01); *H10K 50/12* (2023.02)

(58) Field of Classification Search

CPC ...... H10K 85/00; H10K 85/342; H10K 50/12; H10K 2101/10; H10K 50/11; C07F 15/0033; C07F 15/00; C09K 11/06; C09K 2211/1044; C09K 2211/185; C07B 2200/05; C07B 59/00

USPC ............................................................. 546/4

See application file for complete search history.

(56) References Cited

U.S. PATENT DOCUMENTS

| | | | |
|---|---|---|---|
| 6,687,266 | B1 | 2/2004 | Ma et al. |
| 8,367,223 | B2 | 2/2013 | Xia et al. |
| 10,211,413 | B2 | 2/2019 | Ma et al. |
| 10,312,458 | B2 | 6/2019 | Kottas et al. |
| 2017/0040552 | A1 | 2/2017 | Xia et al. |

FOREIGN PATENT DOCUMENTS

| | | | |
|---|---|---|---|
| CN | 1726606 | A | 1/2006 |
| CN | 102272261 | A | 12/2011 |
| CN | 102898477 | A | 1/2013 |
| CN | 102939295 | A | 2/2013 |
| CN | 103254238 | A | 8/2013 |
| CN | 103396455 | A | 11/2013 |
| WO | 2012/020327 | A1 | 2/2012 |

OTHER PUBLICATIONS

Wen, et al., "Highly Phosphorescent Bis-Cyclometalated Iridium Complexes Containing Benzoimidazole-Based Ligands," Chem. Mater., vol. 16, Issue 12, pp. 2480-2488 (May 21, 2004).

*Primary Examiner* — Taylor V Oh

(74) *Attorney, Agent, or Firm* — Maschoff Brennan

(57) ABSTRACT

The present invention relates to an organometallic iridium compound and application thereof. The organometallic iridium compound has a structure represented by Formula (1). The compound provided by the present invention has the advantages of high optical and electrochemical stability, narrow emission half-peak width, high color saturation, high luminous efficiency, long device service life and the like, and can be used in organic electroluminescent devices. In particular, the compound has the potential for application in the AMOLED industry as a green light-emitting dopant.

(1)

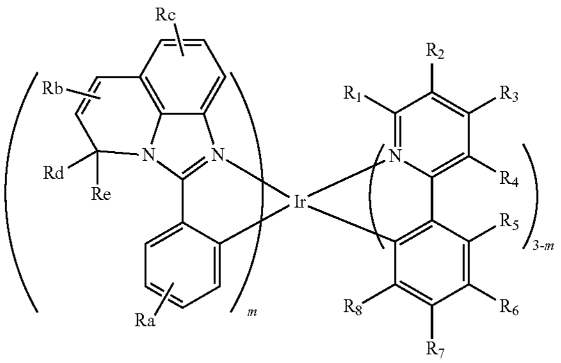

20 Claims, No Drawings

ORGANOMETALLIC IRIDIUM COMPOUND AND APPLICATION THEREOF

TECHNICAL FIELD

The present invention relates to the technical field of organic electroluminescence, in particular to an organic light-emitting material applicable to organic electroluminescent devices, and specially relates to an organometallic iridium compound and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminous efficiency, driving voltage and service life, of the OLED still need to be strengthened and improved.

In generally, the OLED includes various organic functional material films with different functions sandwiched between metal electrodes as a basic structure, which is similar to a sandwich structure. Under the driving of a current, holes and electrons are injected from a cathode and an anode, respectively. After moving to a certain distance, the holes and the electrons are compounded in a light-emitting layer, and then released in the form of light or heat to achieve luminescence of the OLED.

However, organic functional materials are core components of the OLED, and the thermal stability, photochemical stability, electrochemical stability, quantum yield, film forming stability, crystallinity, color saturation and the like of the materials are main factors affecting properties of the device.

Generally, the organic functional materials include fluorescent materials and phosphorescent materials. The fluorescent materials are usually organic small-molecule materials, which can only utilize 25% of a singlet state for luminescence, so that the luminous efficiency is relatively low. Meanwhile, due to an earth-spin orbit coupling effect caused by a heavy atom effect, the phosphorescent materials can utilize 25% of a singlet state and can also utilize 75% of the energy of triplet excitons, so that the luminous efficiency can be improved. However, compared with the fluorescent materials, the phosphorescent materials are developed later, and the thermal stability, service life, color saturation and the like of the materials need to be improved. Thus, the phosphorescent materials have become a challenging topic. Various organometallic iridium compounds have been developed to serve as the phosphorescent materials. For example, an invention patent (CN1726606) discloses an arylbenzimidazole iridium compound. However, the luminous efficiency of the compound is far from enough to meet market demands. A non-patent document published by Wen et al. in 2004 (Chem. Mater. 2004, 16, 2480-2488) discloses a benzimidazole-aromatic ring metallic iridium complex, which has certain luminous efficiency. However, due to too large half-peak width and short device service life, especially short T95, of the material, market application demands are difficult to meet, and the material needs to be further improved. An invention patent document (CN102272261) discloses an iridium compound connected with aryl-substituted benzimidazole having steric hindrance on N. However, the color saturation, the emission spectrum half-peak width and device properties, especially the luminous efficiency and the device service life, of the compound need to be improved. An invention patent document (CN103396455) discloses a substituted benzimidazole iridium compound connected with alkyl on N. Similarly, the compound also has the problems of poor color saturation, too large emission spectrum half-peak width, low device efficiency, short device service life and the like, which need to be solved. An invention patent document (CN103254238) discloses an iridium compound connected with aryl-substituted benzimidazole-dibenzoheterocyclic ring having steric hindrance on N. However, the compound also has the problems of too large emission spectrum half-peak width, low device efficiency, short device service life and the like, which need to be solved. An invention patent document (CN102898477) discloses an iridium compound shown as

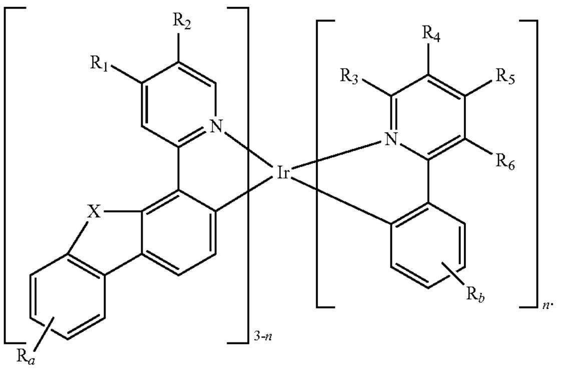

However, the compound also has the problems of too large emission spectrum half-peak width, low device efficiency, short device service life and the like, which need to be solved.

SUMMARY

In order to overcome the above disadvantages, the present invention provides an organic electroluminescent device with high properties and an organometallic iridium compound material capable of realizing the organic electroluminescent device.

An organometallic iridium compound of the present invention has a structure represented by Formula (1). The iridium complex provided by the present invention has the advantages of high optical and electrical stability, narrow emission half-peak width, high luminous efficiency, long service life, high color saturation and the like, and can be used in organic light-emitting devices. In particular, the compound has the potential for application in the AMOLED industry as a green light-emitting phosphorescent material.

An organometallic iridium compound has a structure formula represented by Formula (1):

(1)

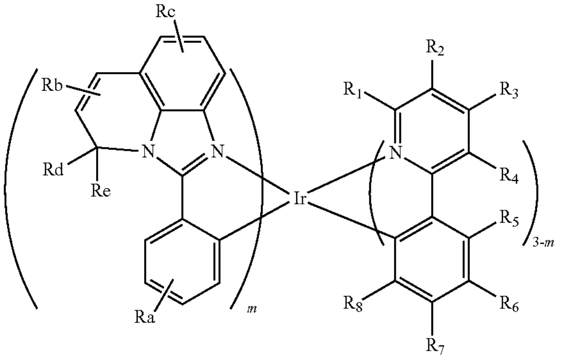

where

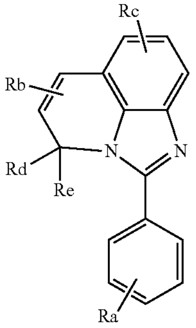

is L1, and

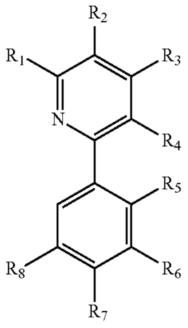

is L2;

m is 1, 2 or 3, two L2 groups are the same or different when the m is 1, and multiple L1 groups are the same or different when the m is greater than 1;

the number of Ra, Rb and Rc is from 1 to a maximum substitution number;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

at least one of the Rd and the Re is not hydrogen;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl, or any two adjacent groups of the $R_1$-$R_8$ may be connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

The m is 1 or 2, and the two L1 groups or the two L2 groups are the same.

As a optional organometallic iridium compound, at least one of the Rd and the Re is not hydrogen, and at least one of the Rd and the Re is substituted or unsubstituted $C_1$-$C_6$ alkyl, or substituted or unsubstituted $C_3$-$C_6$ cycloalkyl.

As a optional organometallic iridium compound, the Ra is hydrogen.

As a optional organometallic iridium compound, at least one of the $R_1$-$R_4$ is not hydrogen.

As a optional organometallic iridium compound, at least one of the $R_5$-$R_8$ is not hydrogen.

As a optional organometallic iridium compound, at least one of the $R_1$-$R_4$ is not hydrogen, and at least one of the $R_5$-$R_8$ is not hydrogen.

As a optional organometallic iridium compound, one of the $R_1$-$R_4$ is deuterium, $C_1$-$C_5$ alkyl substituted or unsubstituted with deuterium, or $C_3$-$C_5$ cycloalkyl substituted or unsubstituted with deuterium, one of the $R_5$-$R_8$ is deuterium, $C_1$-$C_5$ alkyl substituted or unsubstituted with deuterium, or $C_3$-$C_5$ cycloalkyl substituted or unsubstituted with deuterium, and the other groups are hydrogen.

As a optional organometallic iridium compound, the $R_5$ and the $R_6$, the $R_6$ and the $R_7$, or the $R_7$ and the $R_8$ are connected to each other to form a ring-fused structure represented by Formula (2):

(2)

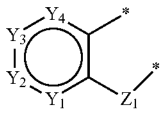

where * indicates a connecting position;

$Y_1$-$Y_4$ are independently $CR_0$ or N;

Z1 is selected from O and S;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

As a optional organometallic iridium compound, the $R_4$ and the $R_5$ are connected to each other to form an aliphatic ring structure represented by Formula (3):

(3)

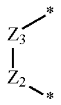

where * indicates a connecting position;

Z2 and Z3 are independently selected from O, S, $N(R_0)$ and $C(R_0)_2$, and at least one of the Z2 and the Z3 is $C(R_0)_2$;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

As a optional organometallic iridium compound, at least one of the Rb and the Rc is not hydrogen.

As a optional organometallic iridium compound, at least one of the Rb and the Rc is substituted or unsubstituted $C_1$-$C_6$ alkyl, or substituted or unsubstituted $C_3$-$C_6$ cycloalkyl.

As a optional organometallic iridium compounds, one of the Rb and the Rc is substituted or unsubstituted $C_1$-$C_6$ alkyl, or substituted or unsubstituted $C_3$-$C_6$ cycloalkyl, and the other groups are hydrogen.

As a optional organometallic iridium compound, the L1 optionally has one of the following structural formulas, or is partially or completely deuterated or fluorinated correspondingly,

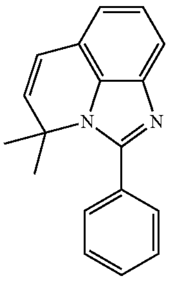

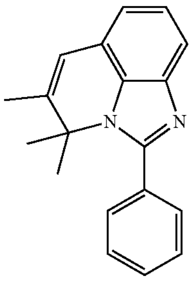

-continued

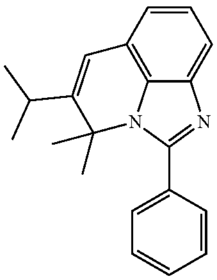

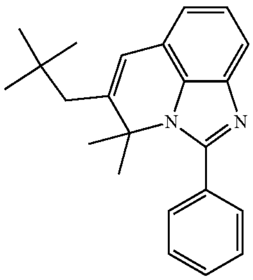

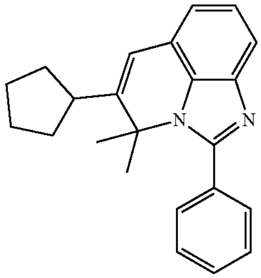

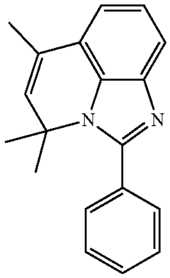

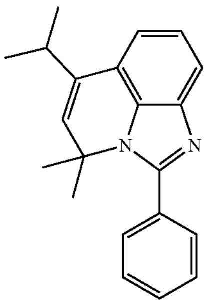

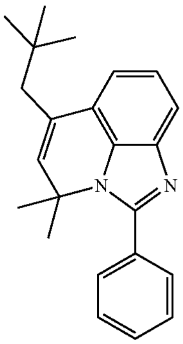

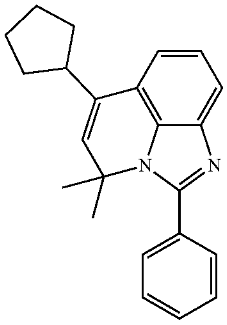

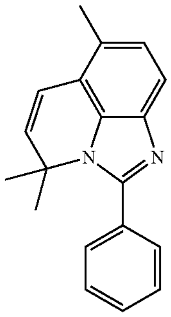

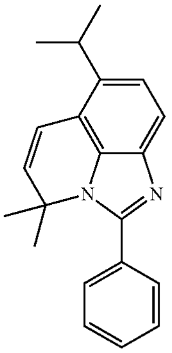

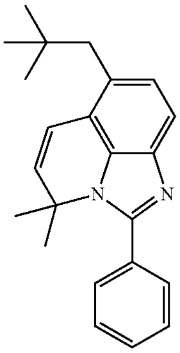

-continued
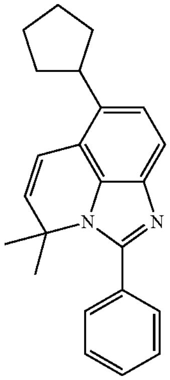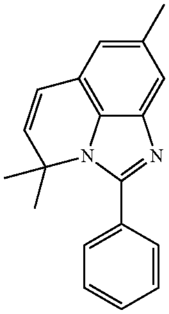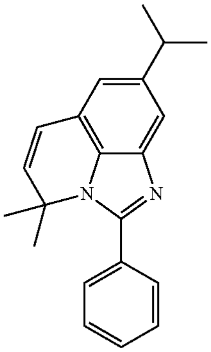
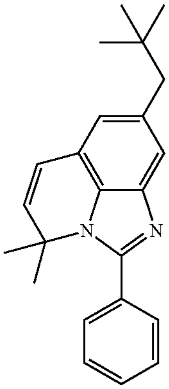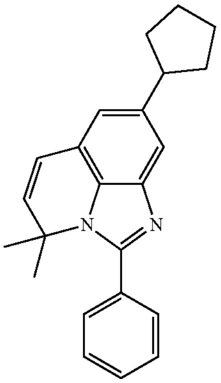
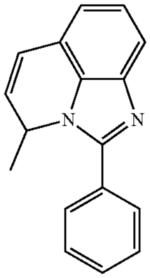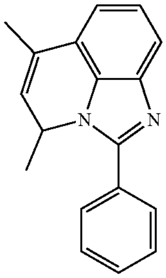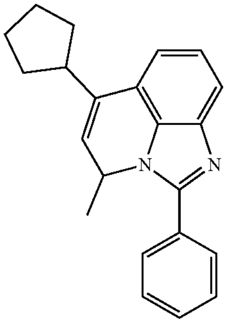
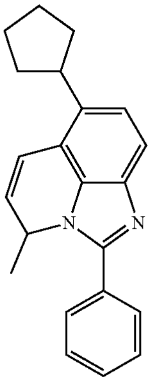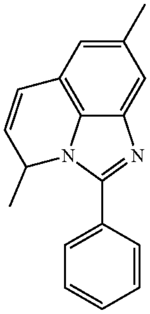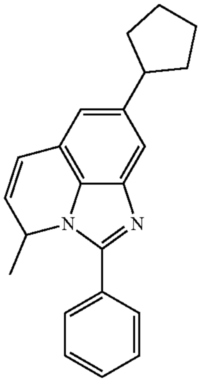
As a optional organometallic iridium compound, the L2 optionally has one of the following structural formulas, or is partially or completely deuterated or fluorinated correspondingly,
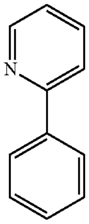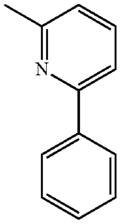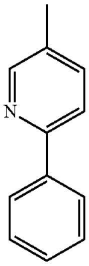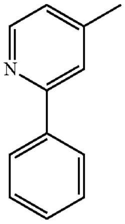
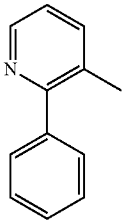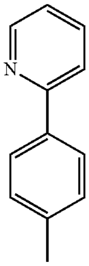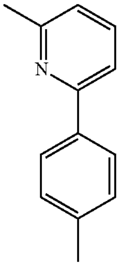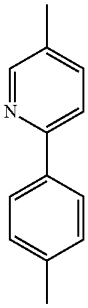
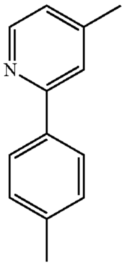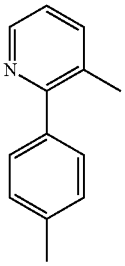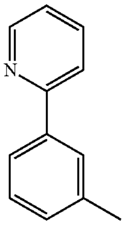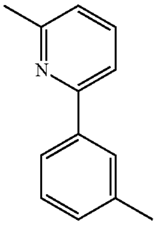
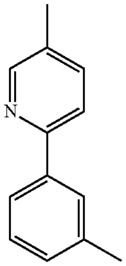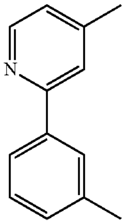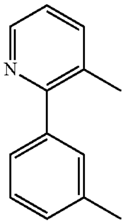
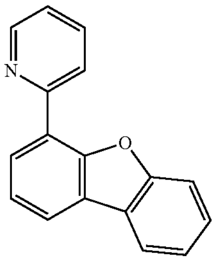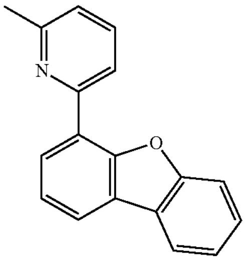
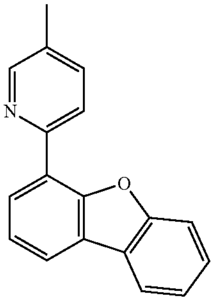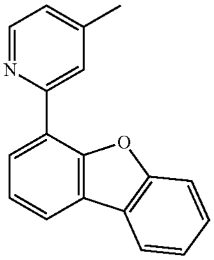

-continued
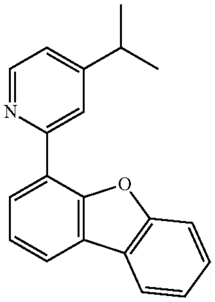
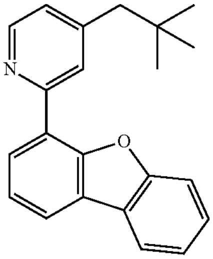
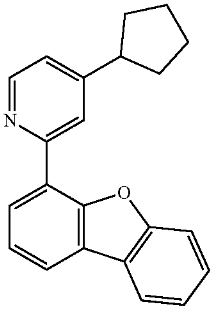
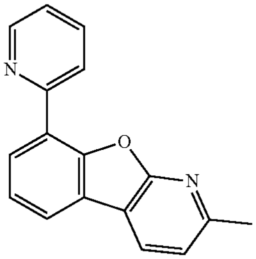
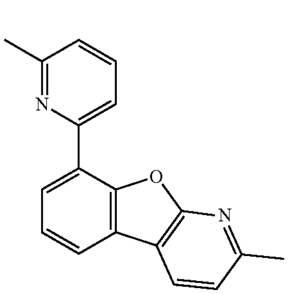
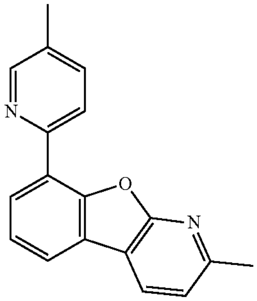
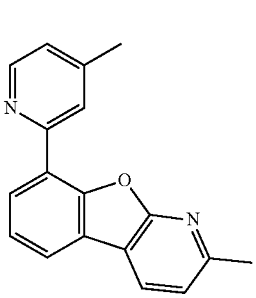
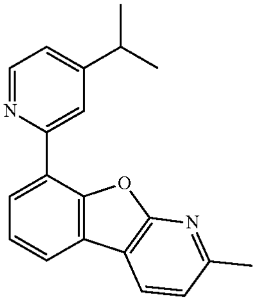
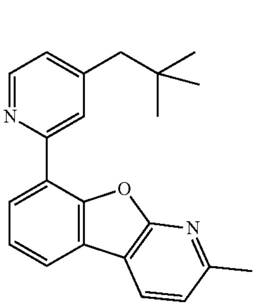
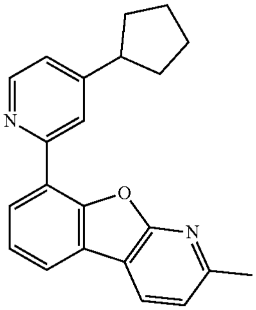
-continued
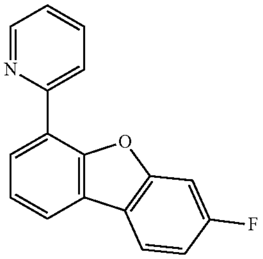
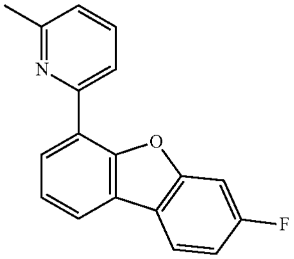
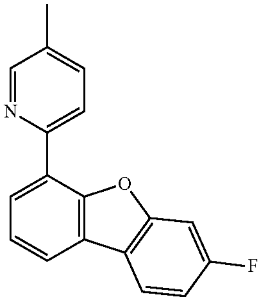
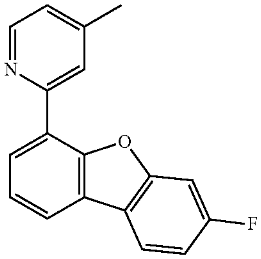
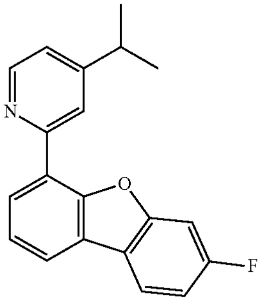
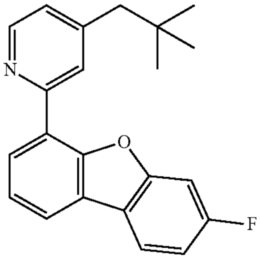
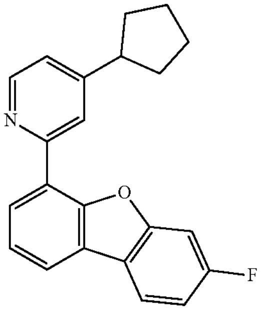
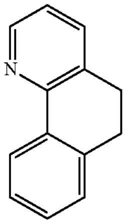
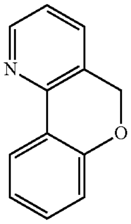
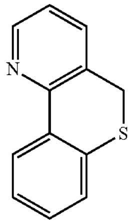
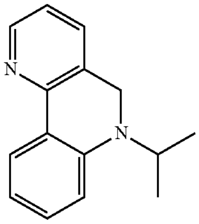
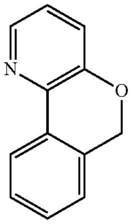
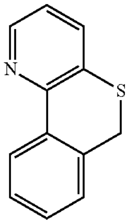
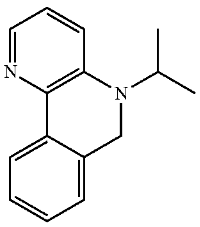
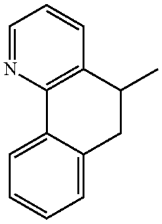

-continued
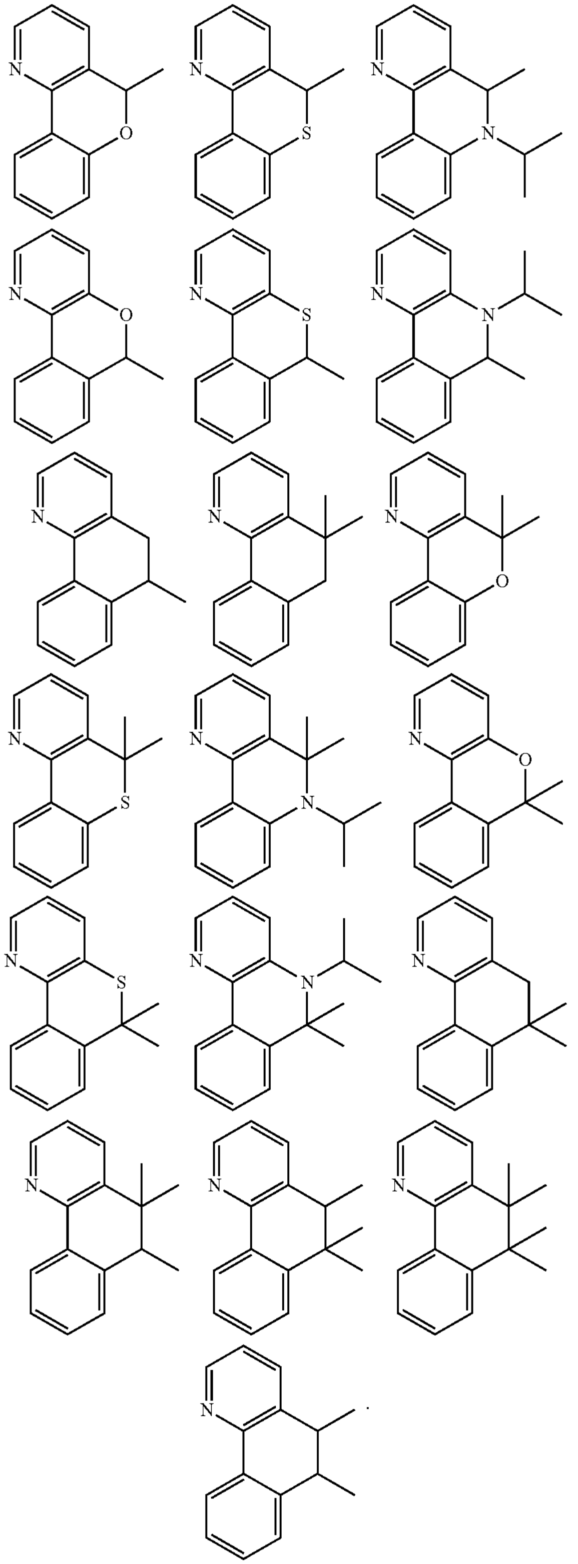
As a optional organometallic iridium compound, the compound represented by Formula (1) optionally has one of the following structural formulas, or is selected from corresponding partial or complete deuterides or fluorides thereof,
CPD 1
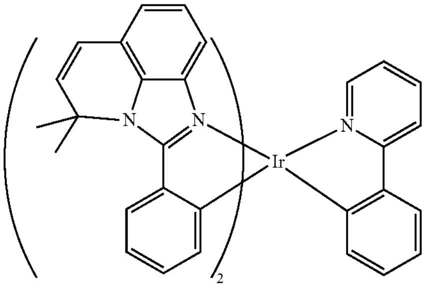
CPD 2
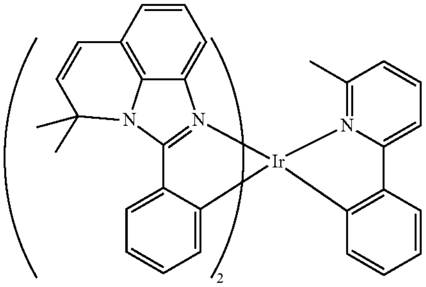
CPD 3
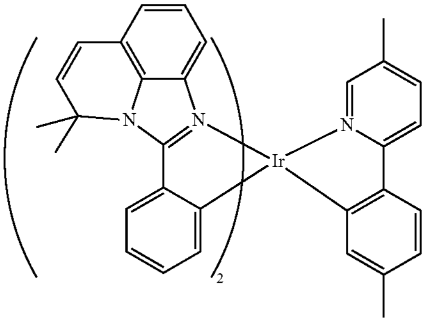
CPD 4
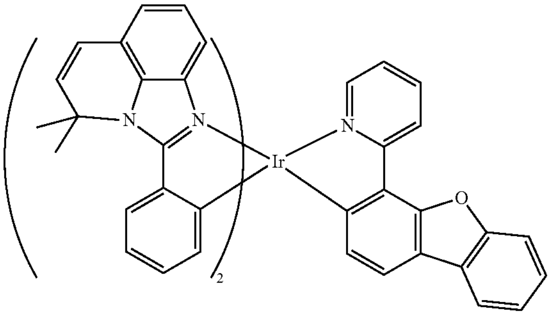
CPD 5
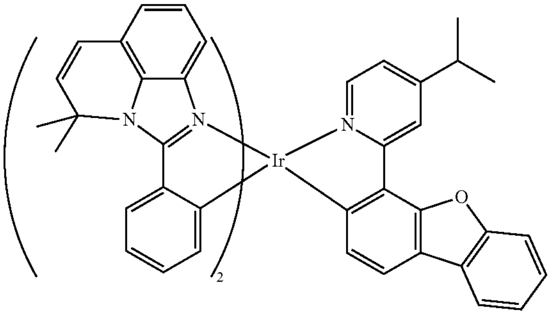

-continued
CPD 6
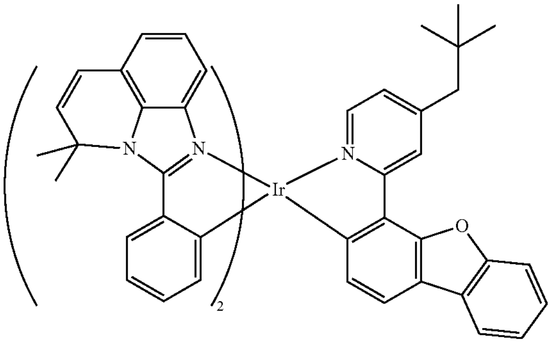
CPD 7
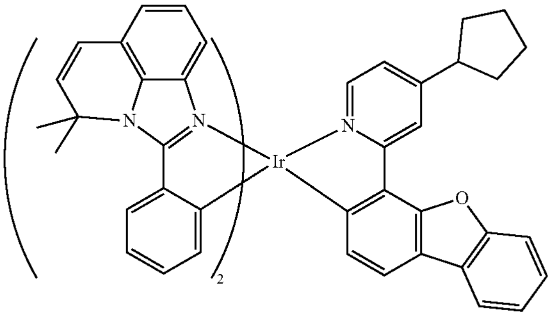
CPD 8
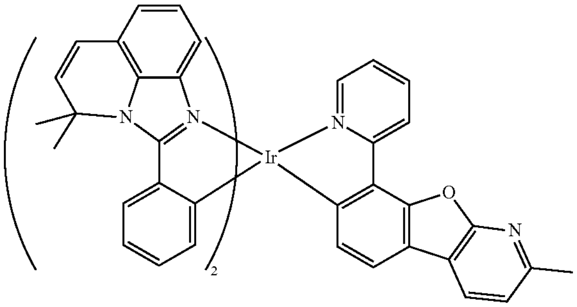
CPD 9
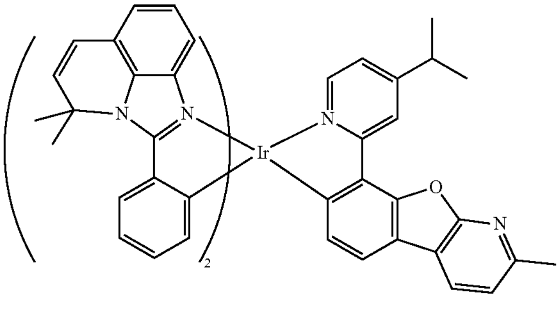
-continued
CPD 10
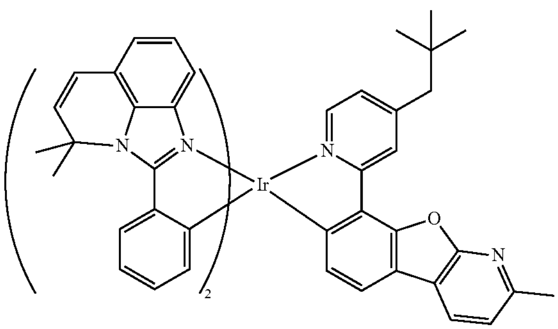
CPD 11
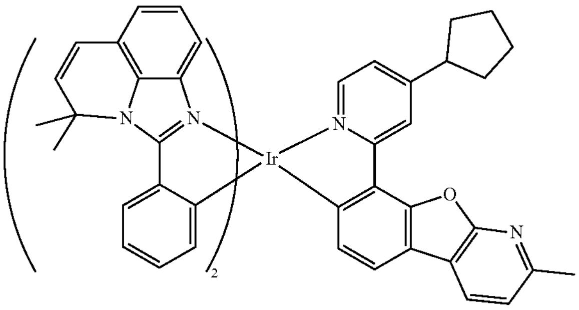
CPD 12
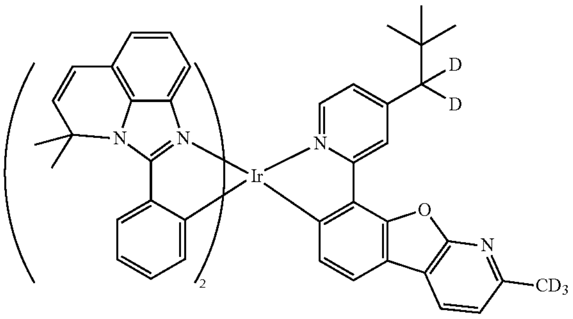
CPD 13
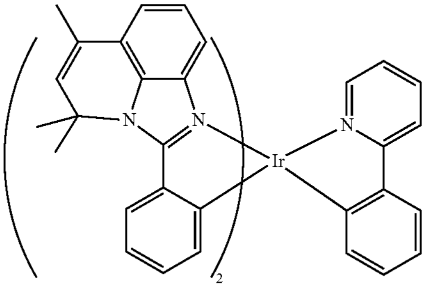
CPD 14
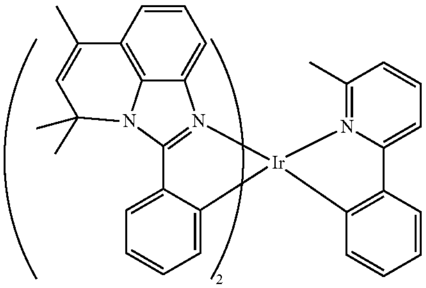

-continued
CPD 15
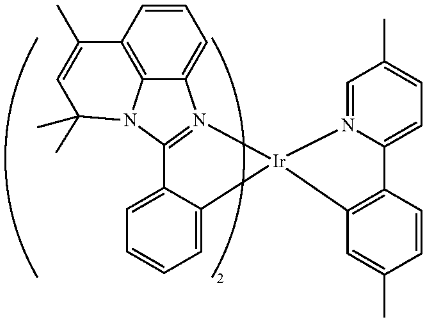
CPD 16
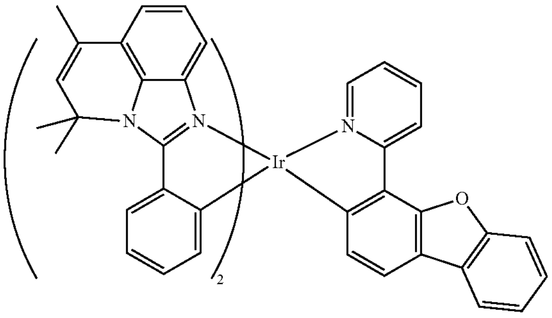
CPD 17
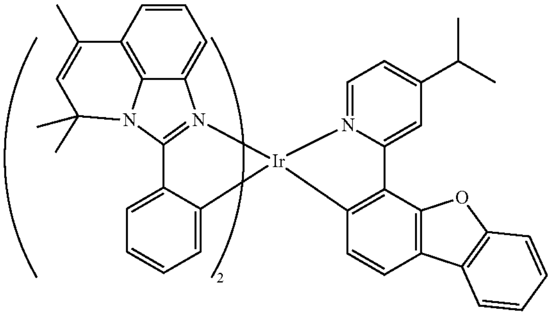
CPD 18
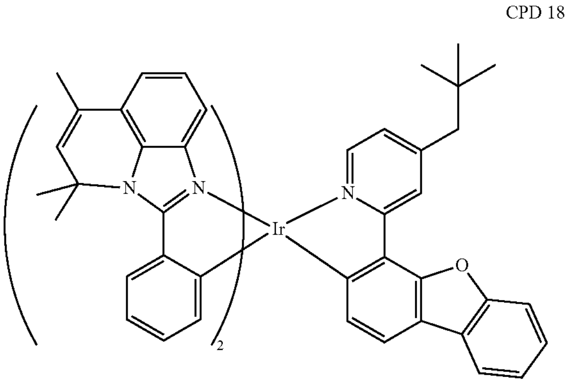
-continued
CPD 19
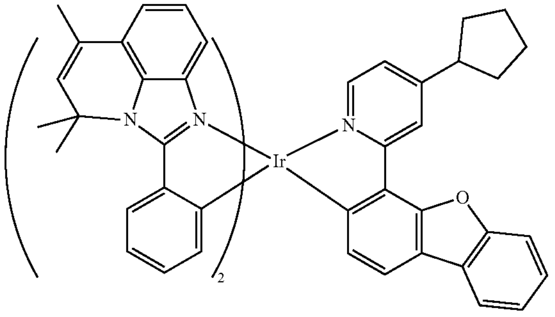
CPD 20
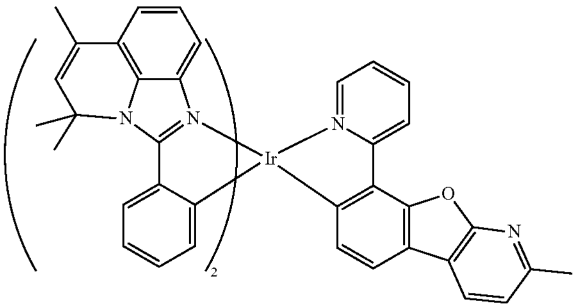
CPD 21
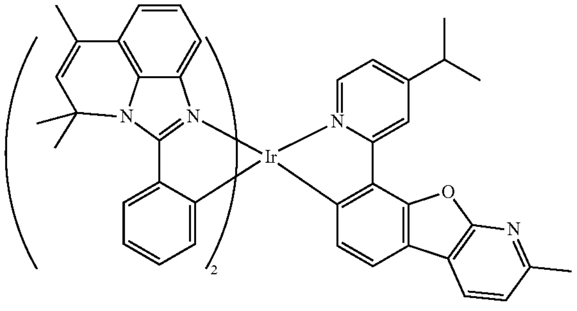
CPD 22
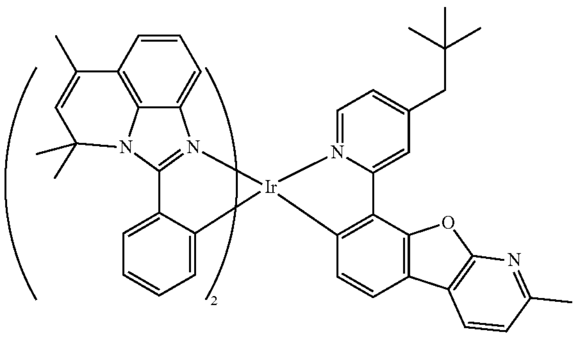

CPD 23
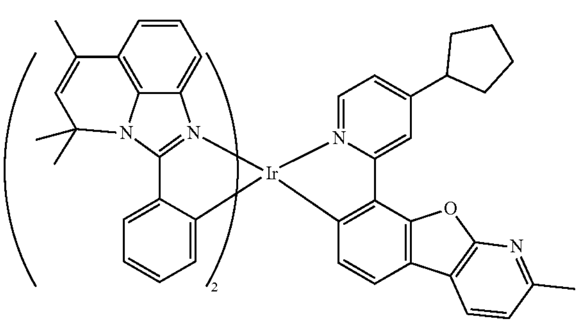
CPD 24
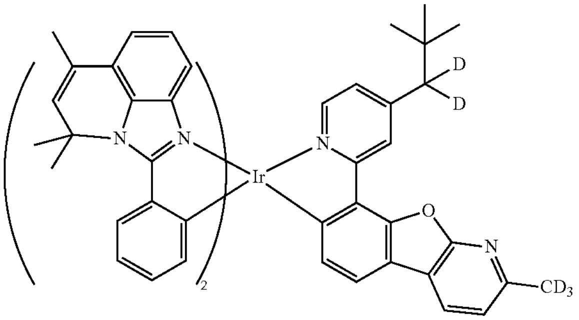
CPD 25
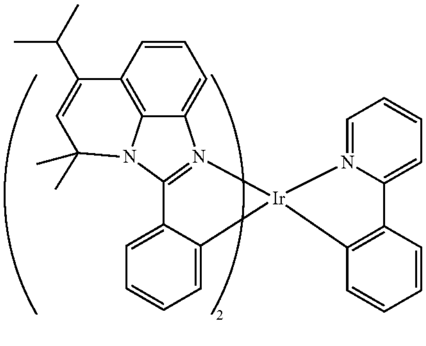
CPD 26
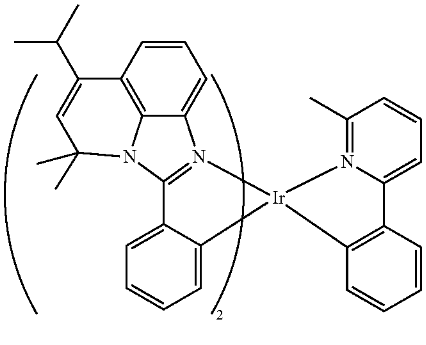
CPD 27
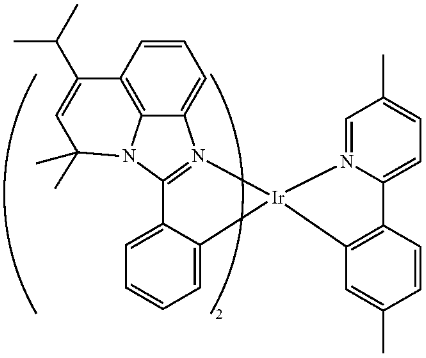
CPD 28
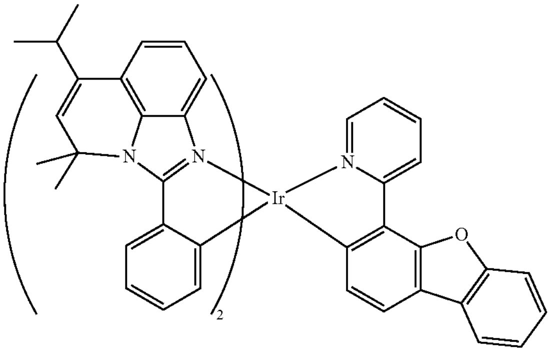
CPD 29
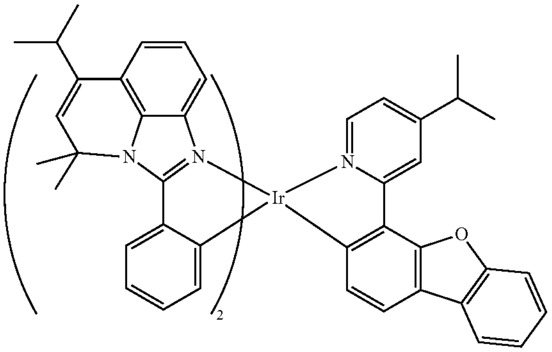
CPD 30
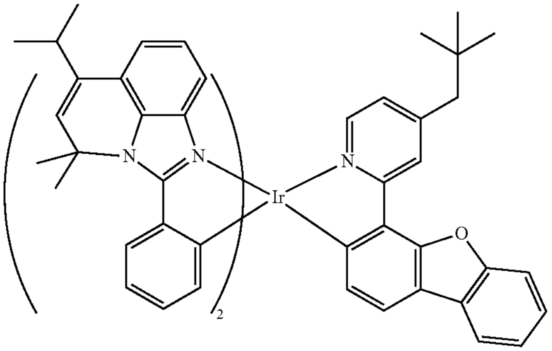

-continued
CPD 31
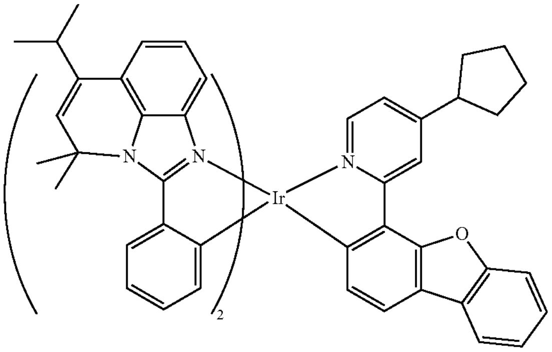
CPD 32
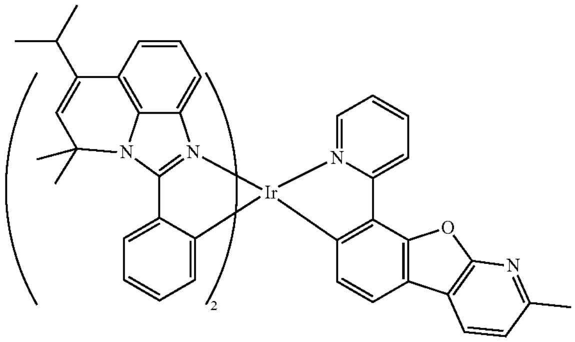
CPD 33
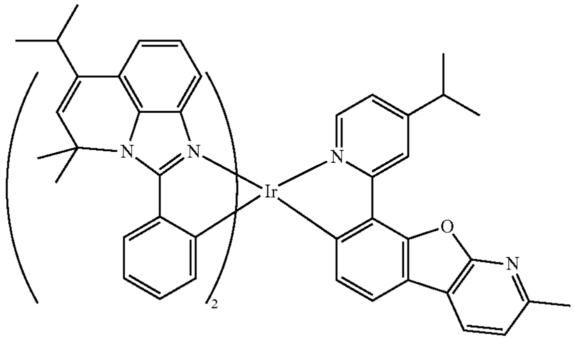
CPD 34
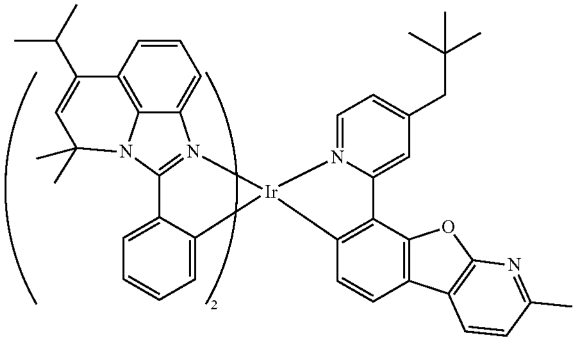
-continued
CPD 35
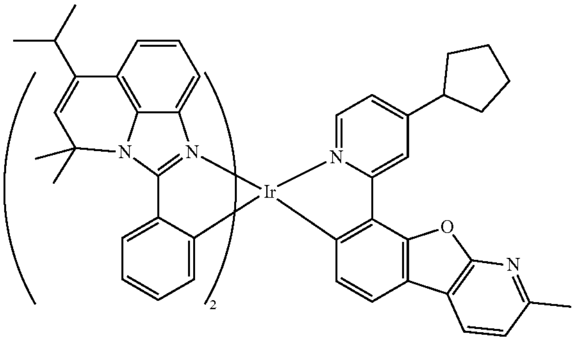
CPD 36
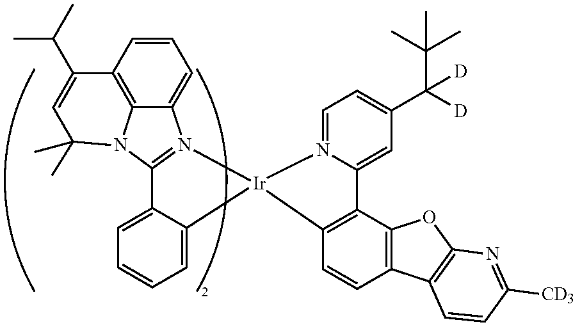
CPD 37
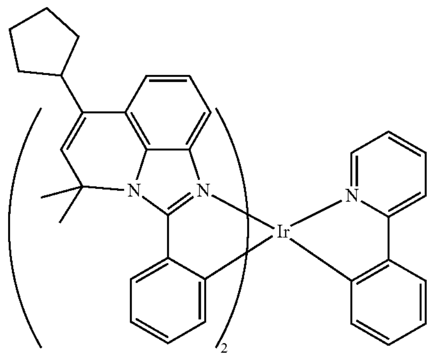
CPD 38
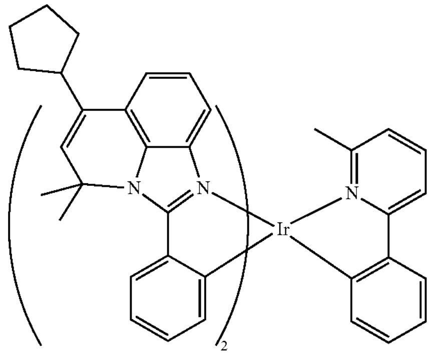

-continued
CPD 39
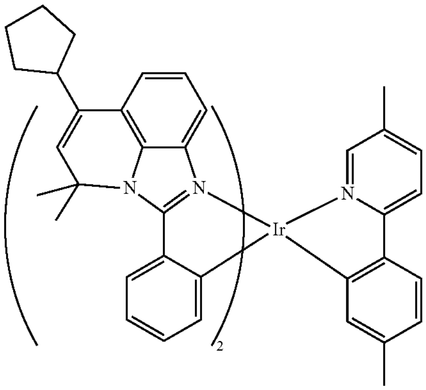
CPD 40
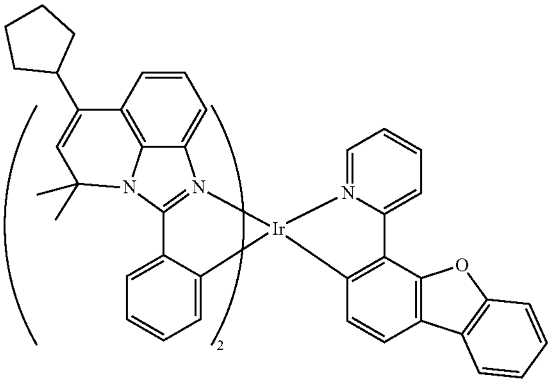
CPD 41
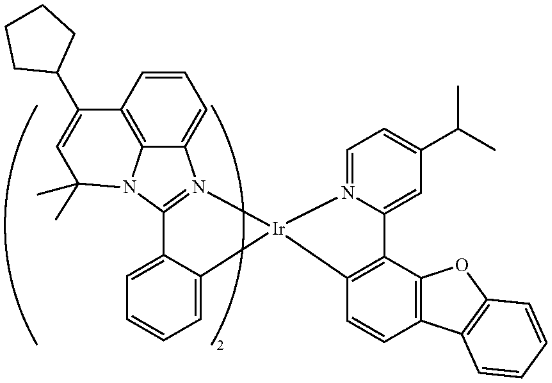
CPD 42
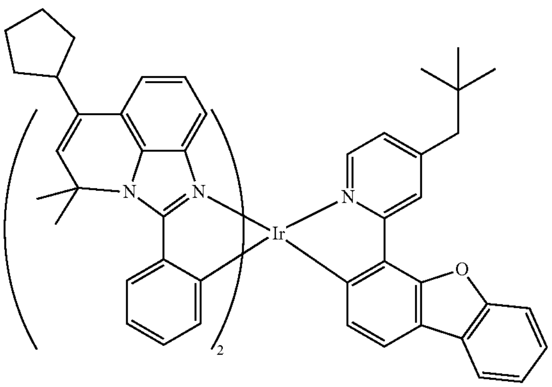
-continued
CPD 43
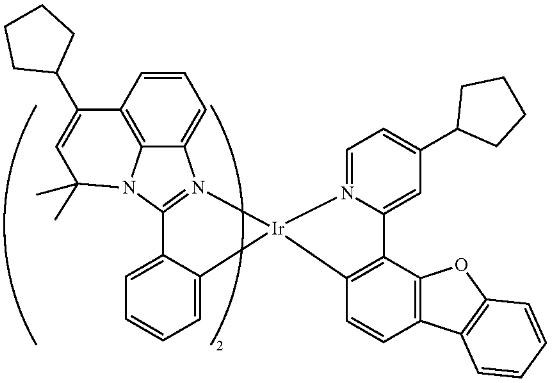
CPD 44
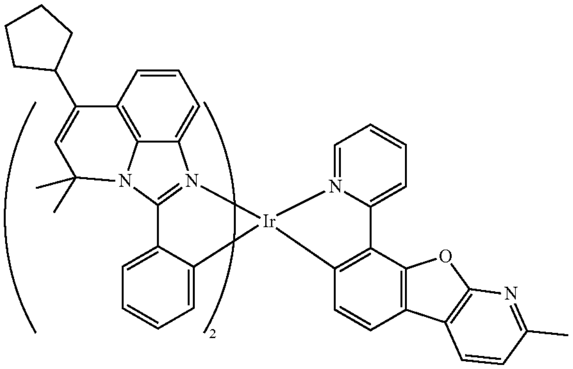
CPD 45
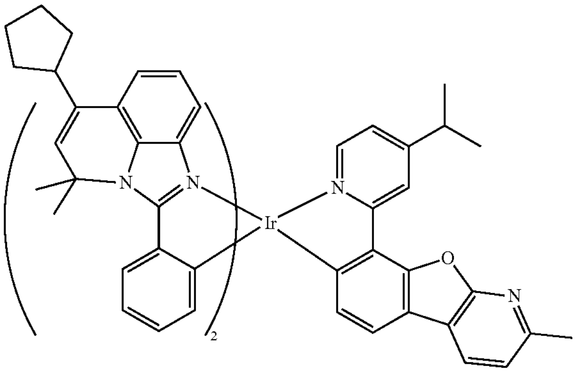
CPD 46
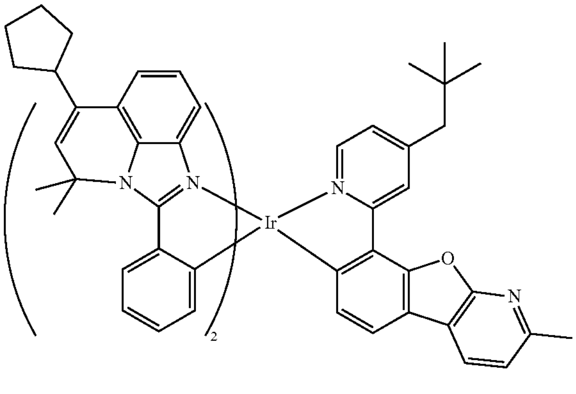

CPD 47
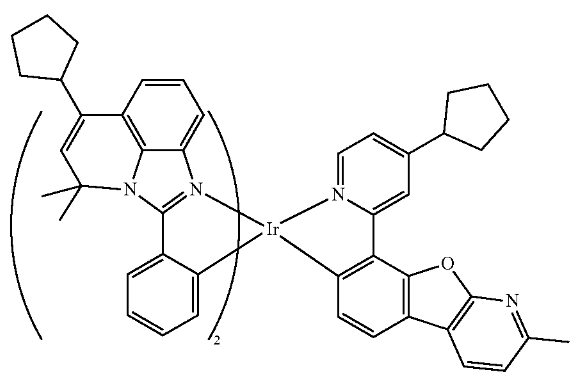
CPD 48
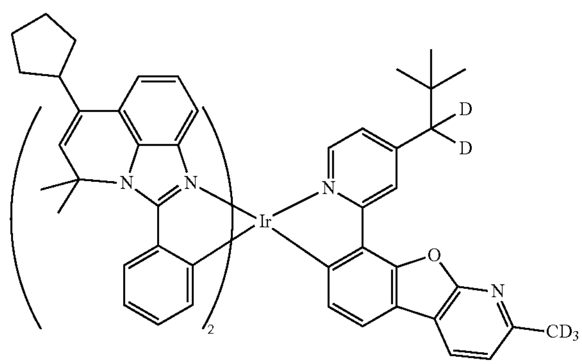
CPD 49
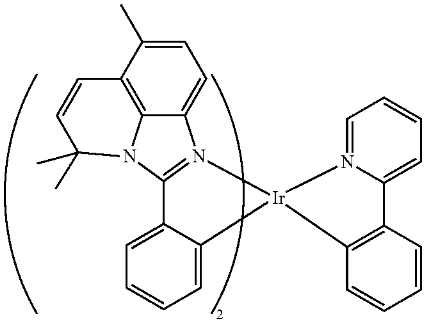
CPD 50
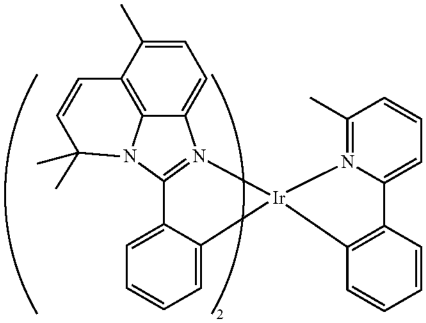
CPD 51
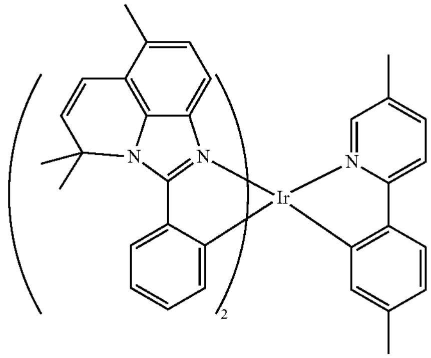
CPD 52
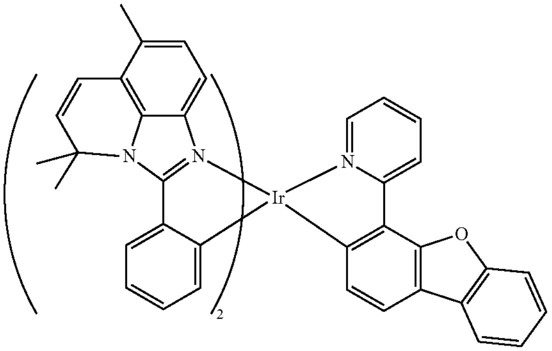
CPD 53
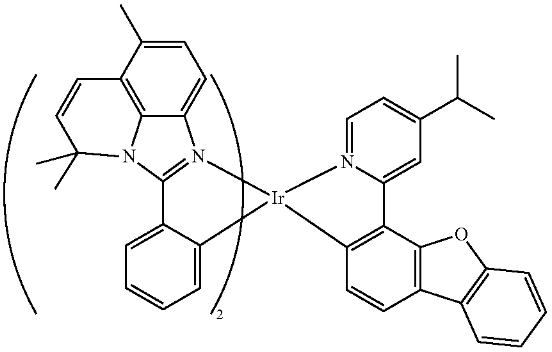
CPD 54
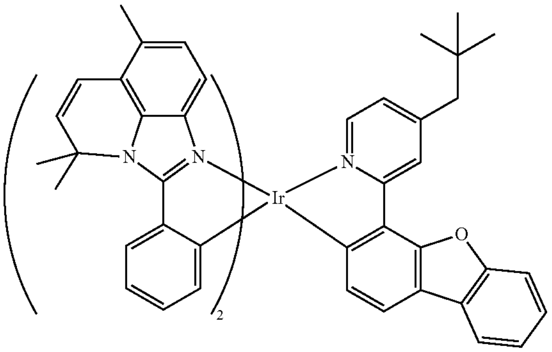

-continued
CPD 55
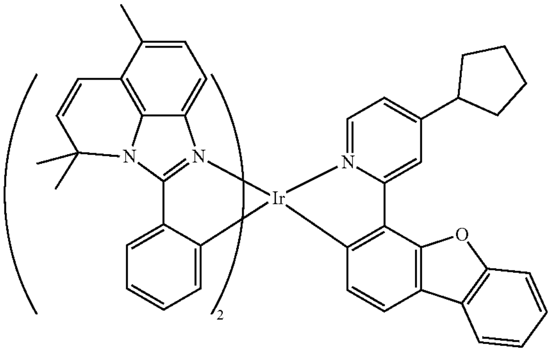
CPD 56
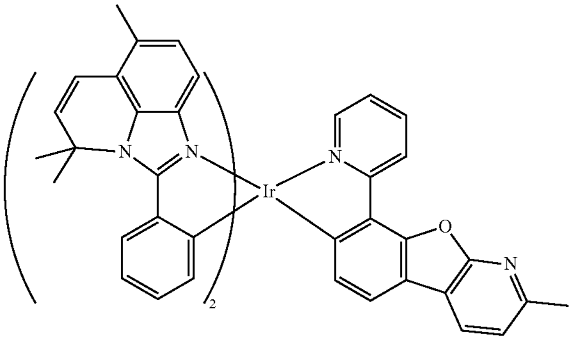
CPD 57
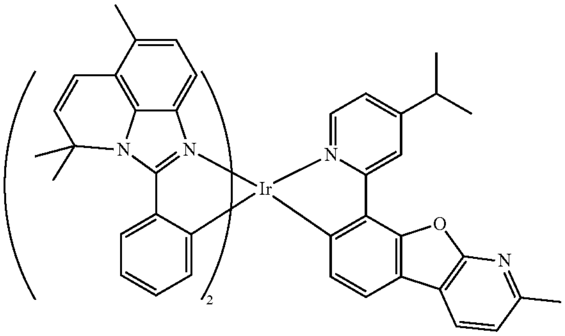
CPD 58
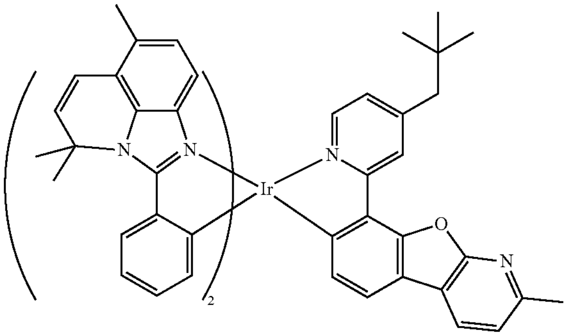
-continued
CPD 59
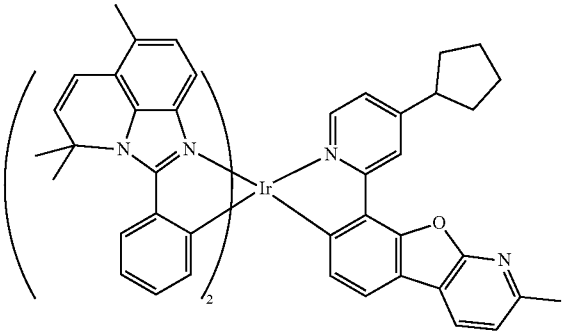
CPD 60
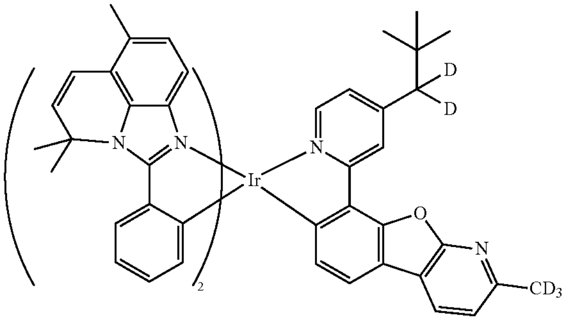
CPD 61
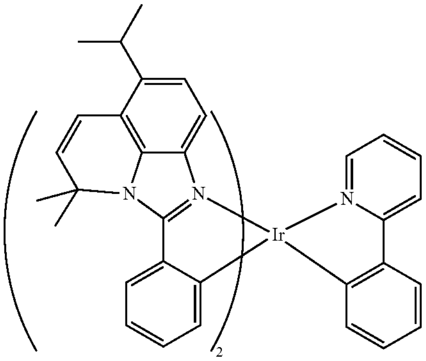
CPD 62
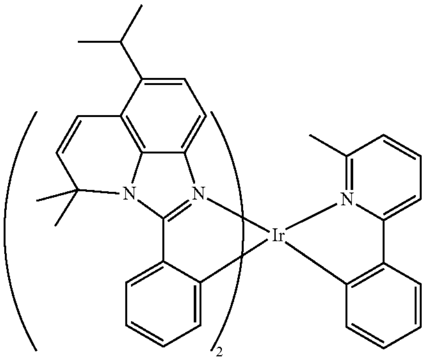

-continued
CPD 63
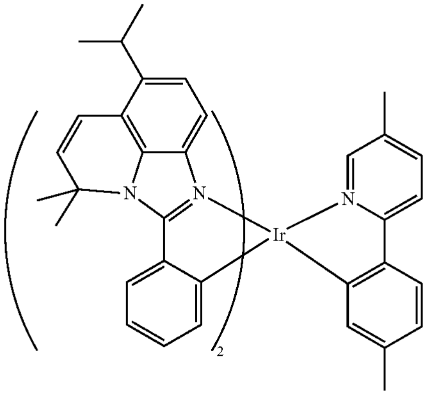
CPD 64
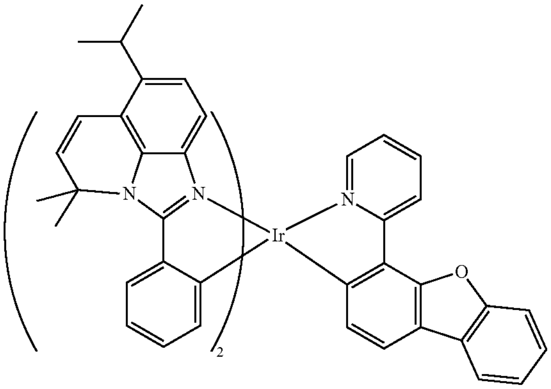
CPD 65
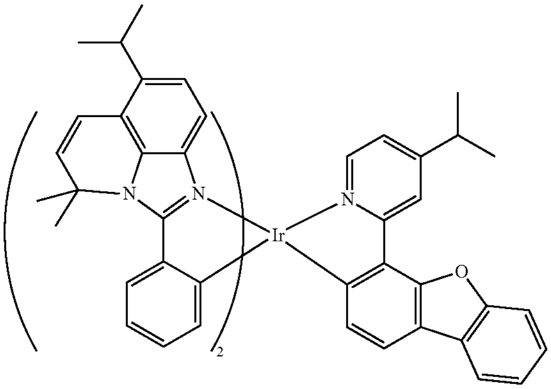
CPD 66
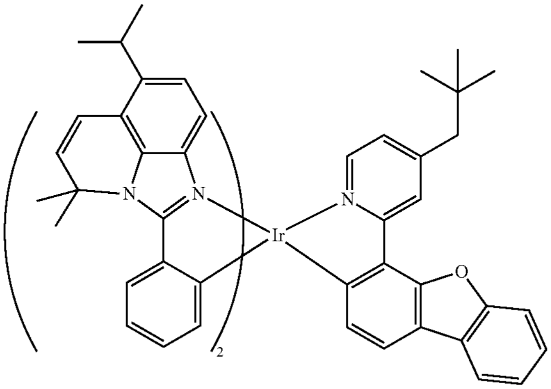
-continued
CPD 67
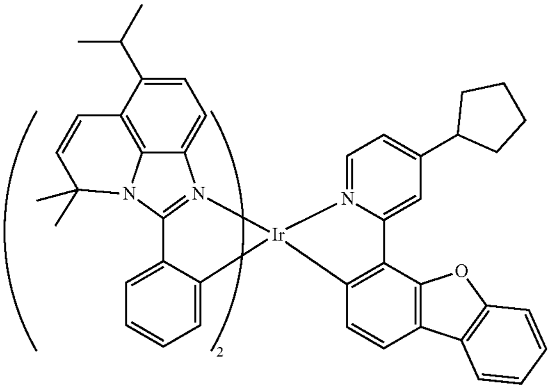
CPD 68
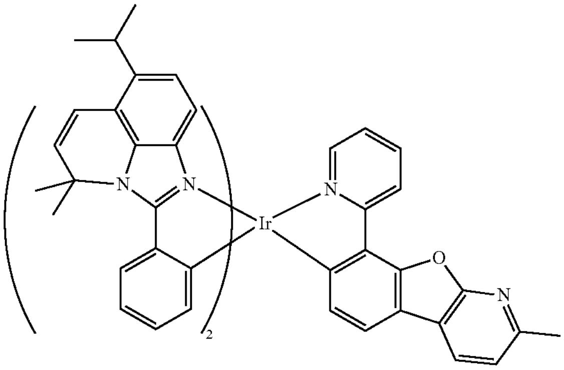
CPD 69
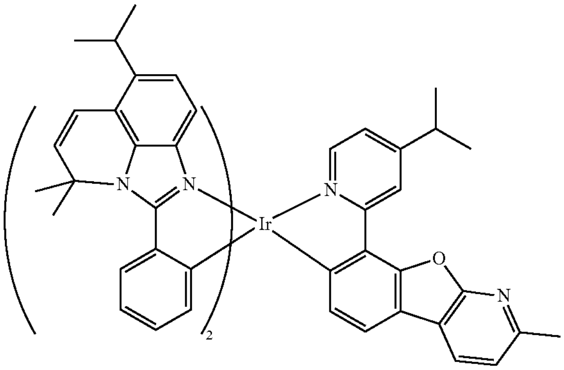
CPD 70
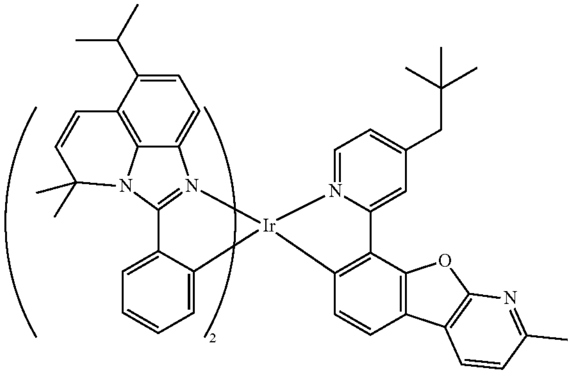

-continued
CPD 71
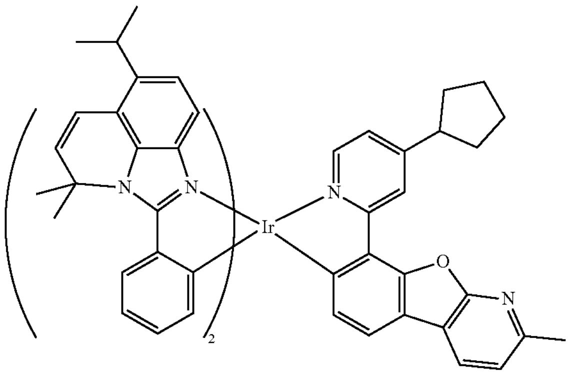
CPD 72
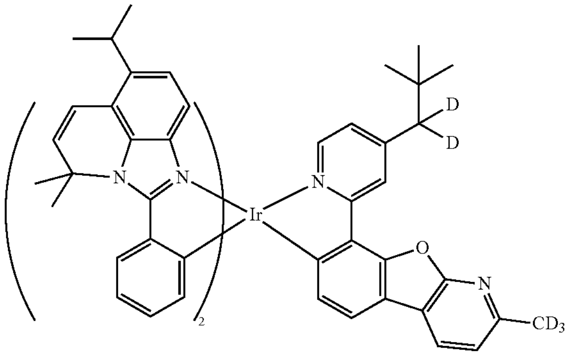
CPD 73
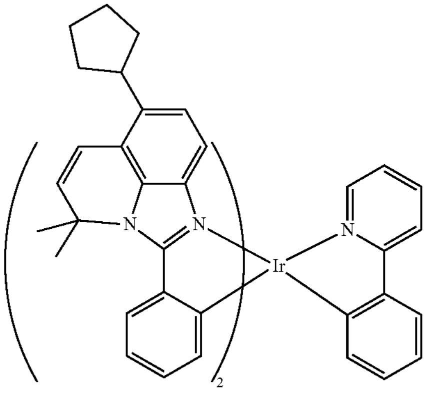
CPD 74
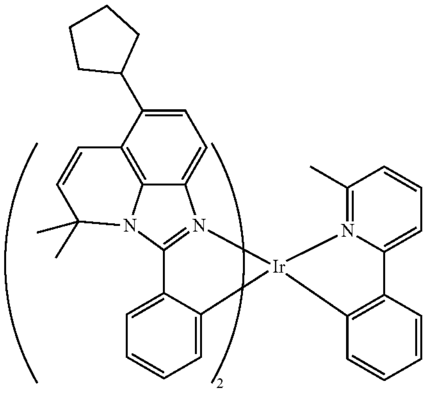
-continued
CPD 75
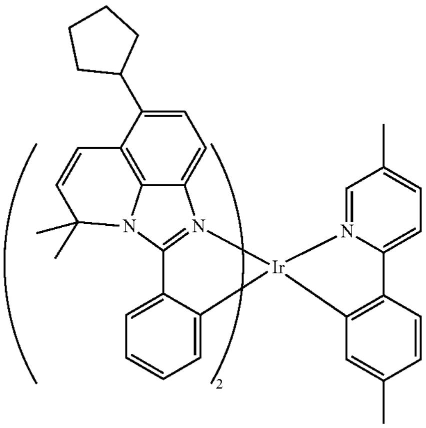
CPD 76
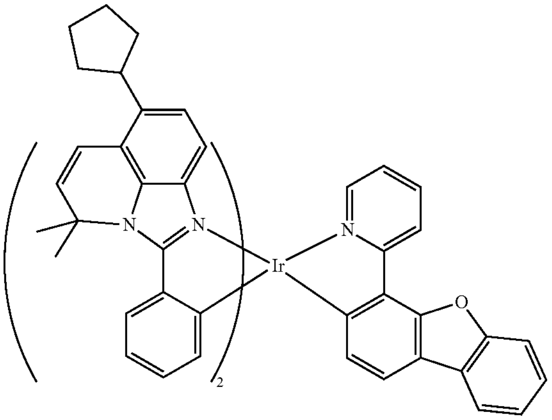
CPD 77
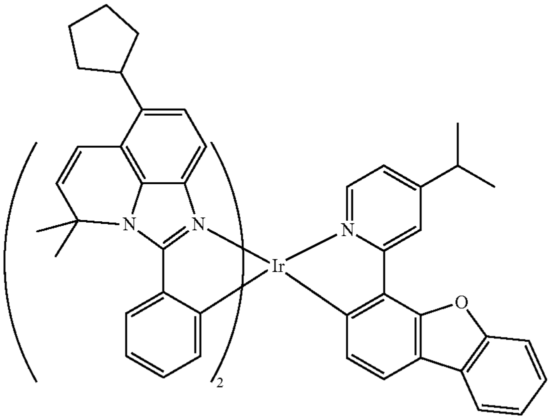

-continued
CPD 78
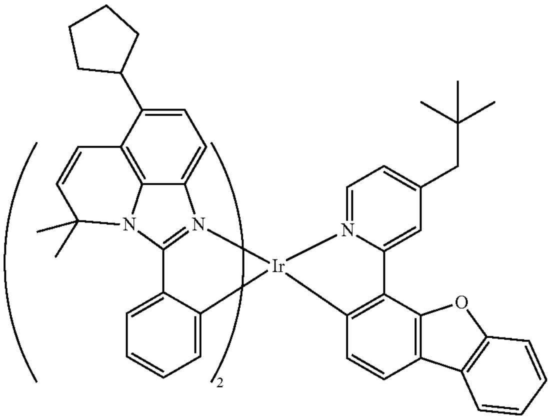
CPD 79
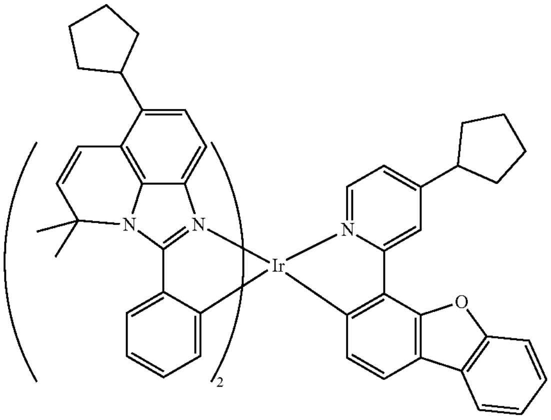
CPD 80
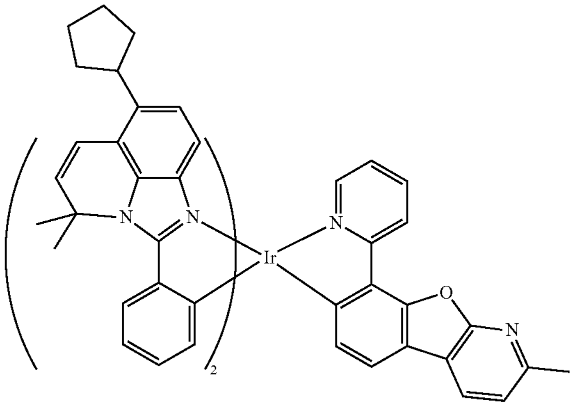
-continued
CPD 81
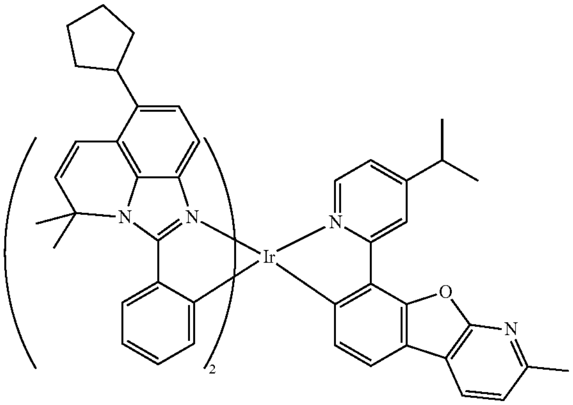
CPD 82
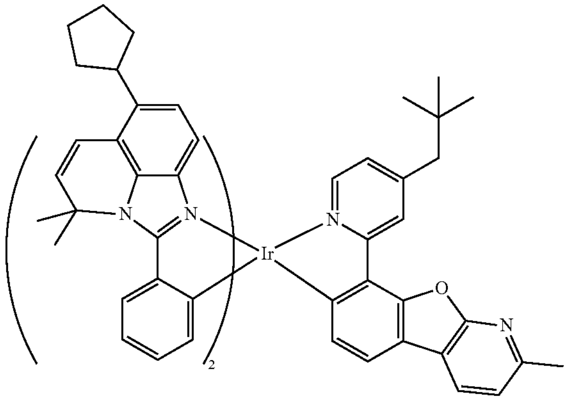
CPD 83
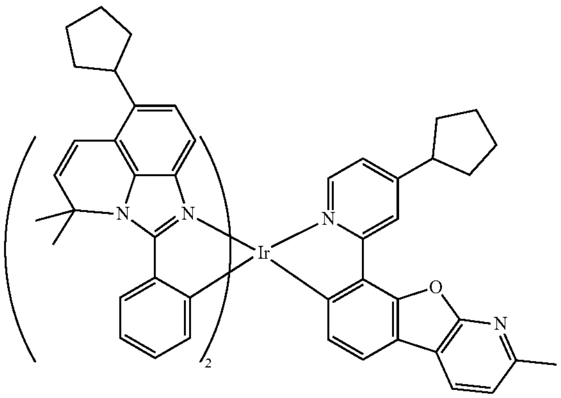

-continued
CPD 84
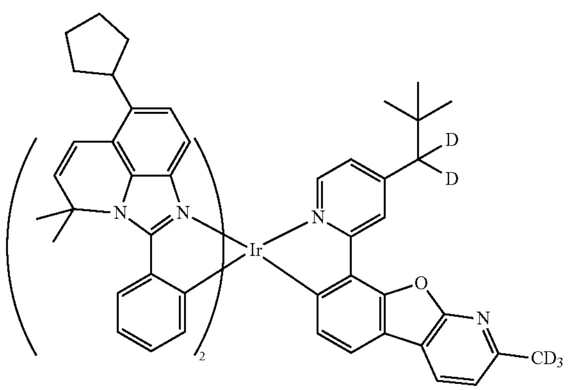
CPD 85
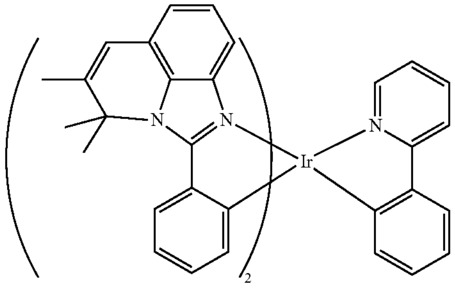
CPD 86
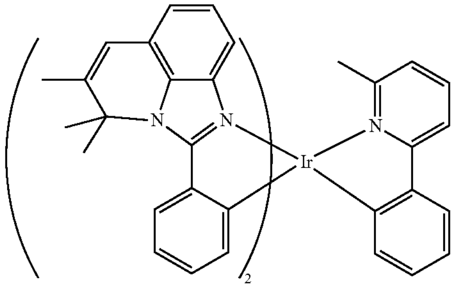
CPD 87
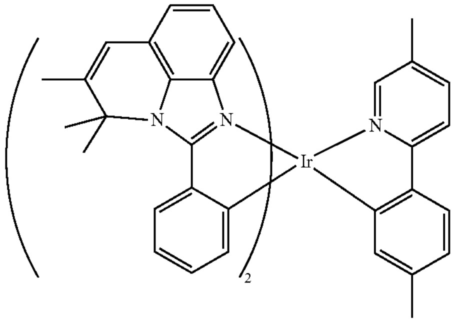
-continued
CPD 88
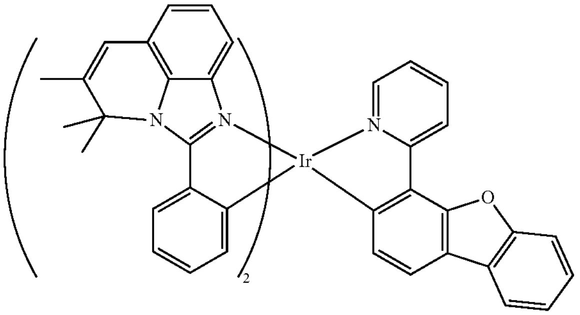
CPD 89
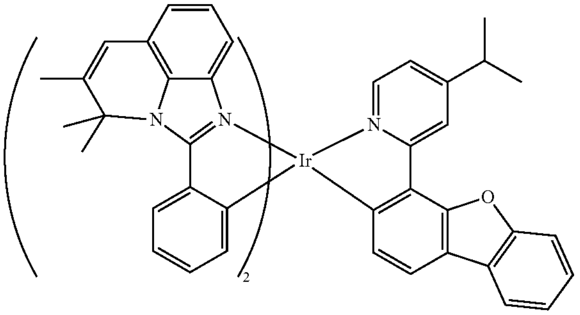
CPD 90
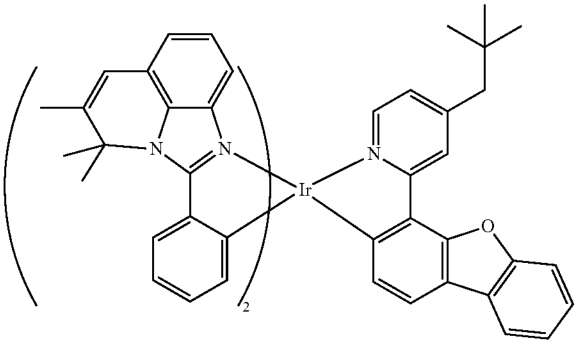
CPD 91
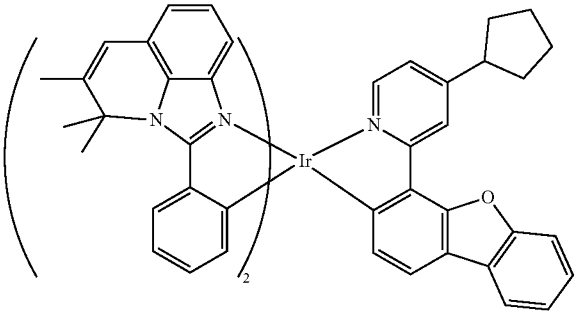

-continued
CPD 92
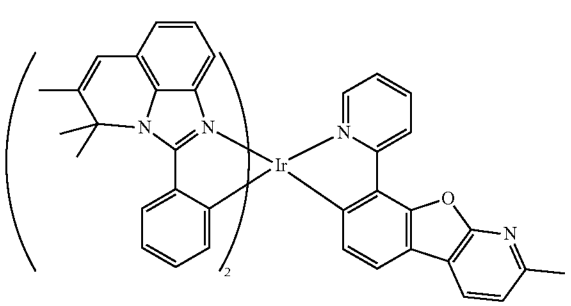
CPD 93
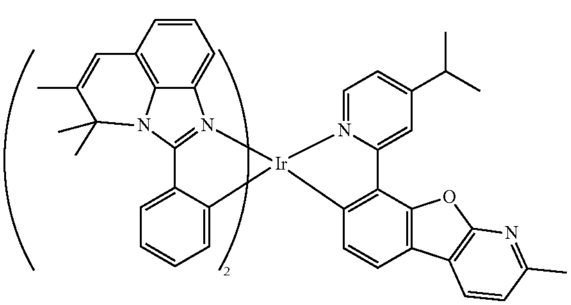
CPD 94
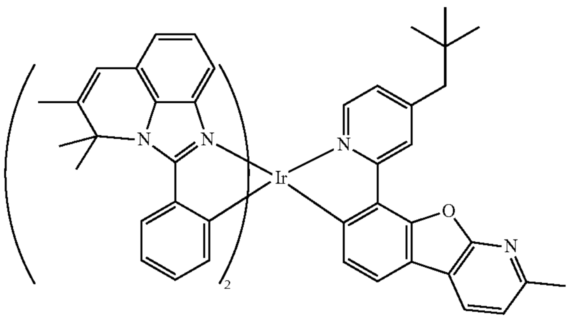
CPD 95
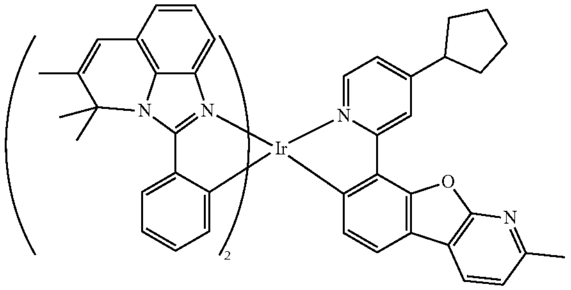
CPD 96
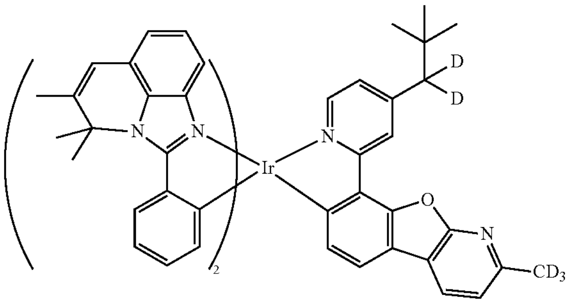
-continued
CPD 97
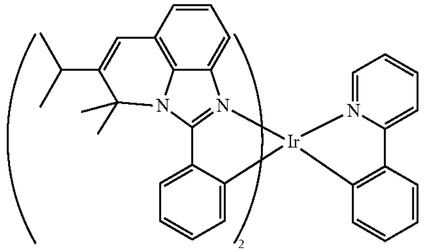
CPD 98
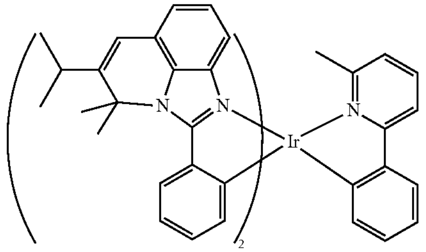
CPD 99
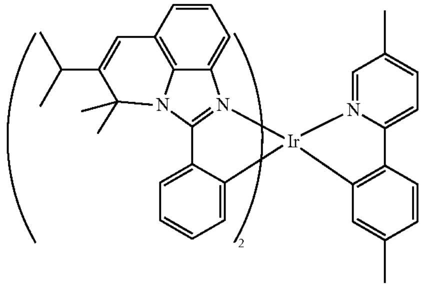
CPD 100
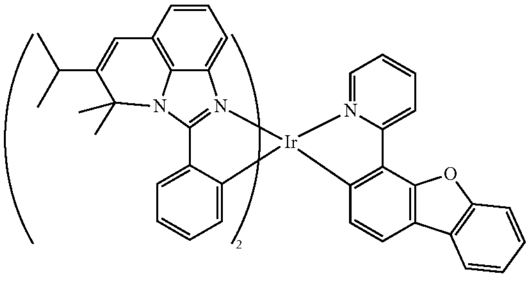
CPD 101
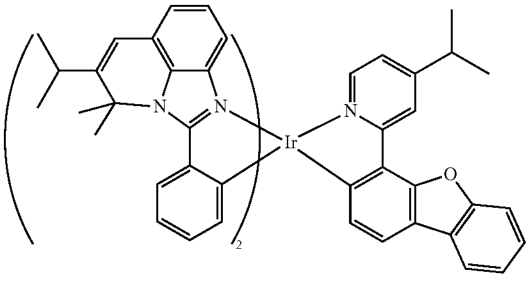

-continued
CPD 102
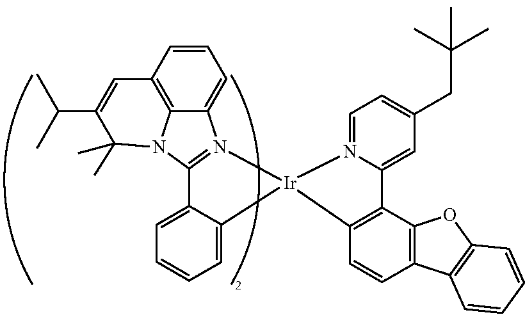
CPD 103
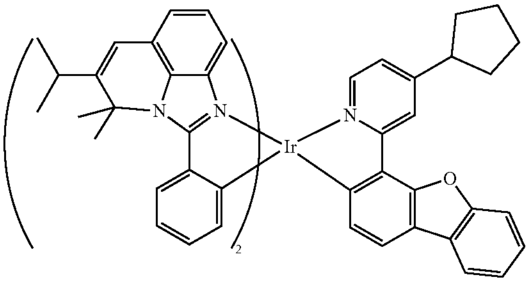
CPD 104
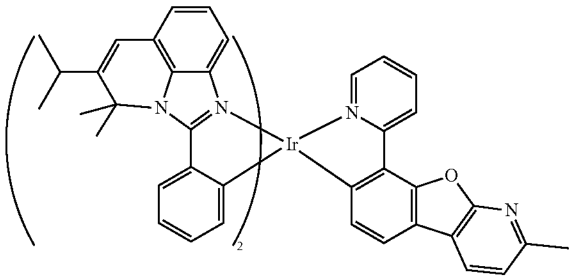
CPD 105
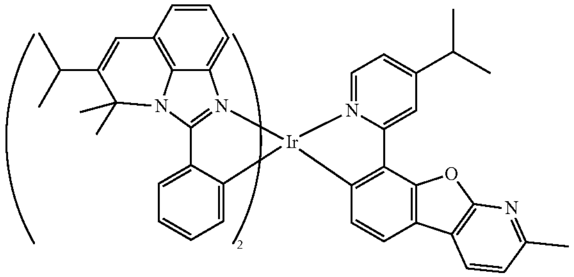
CPD 106
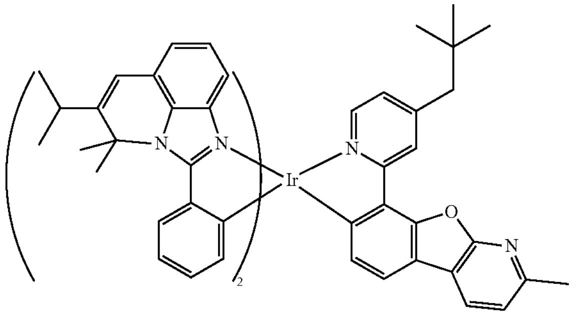
-continued
CPD 107
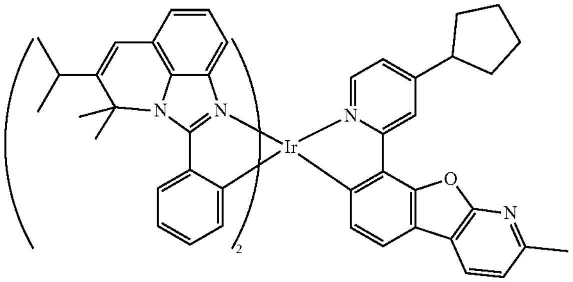
CPD 108
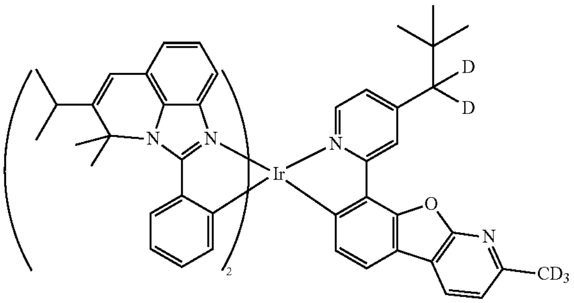
CPD 109
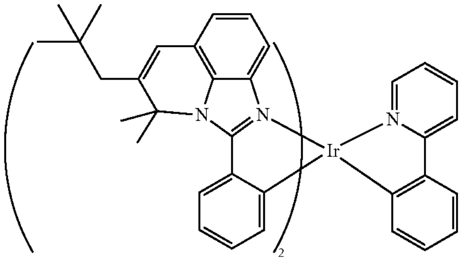
CPD 110
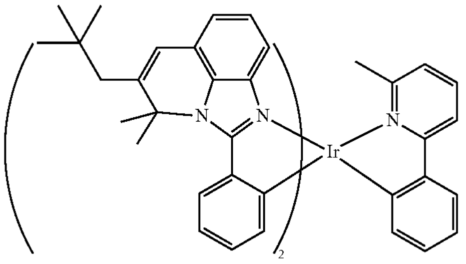
CPD 111
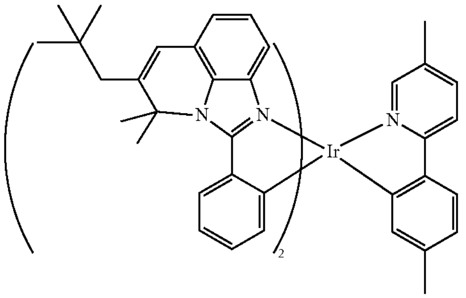

-continued
CPD 112
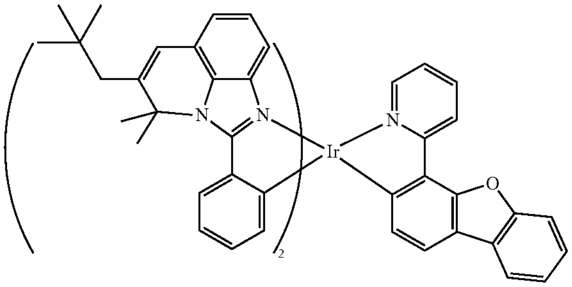
CPD 113
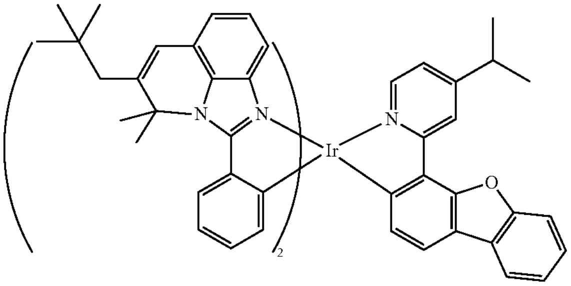
CPD 114
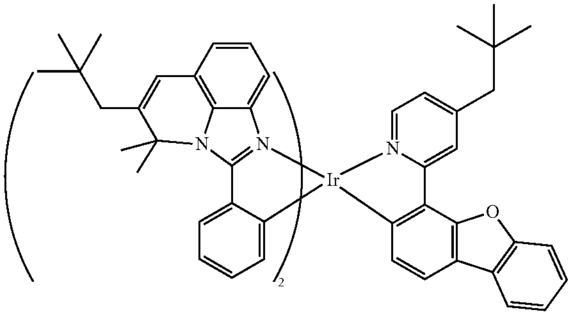
CPD 115
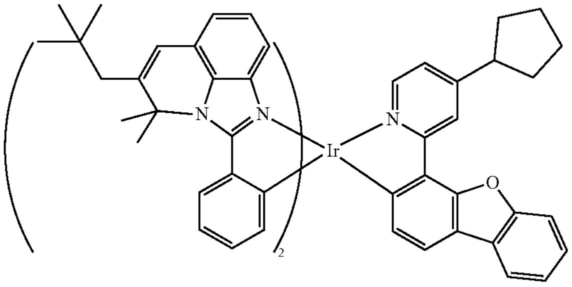
CPD 116
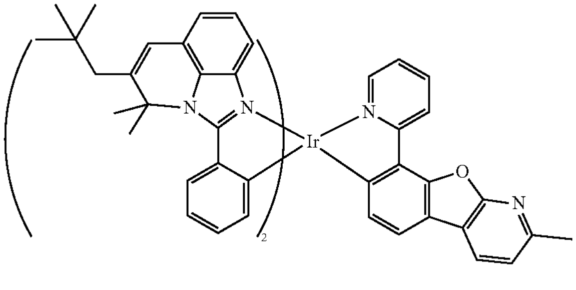
-continued
CPD 117
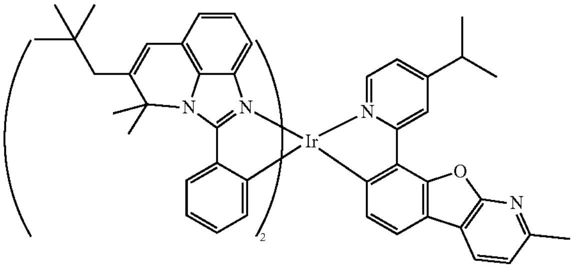
CPD 118
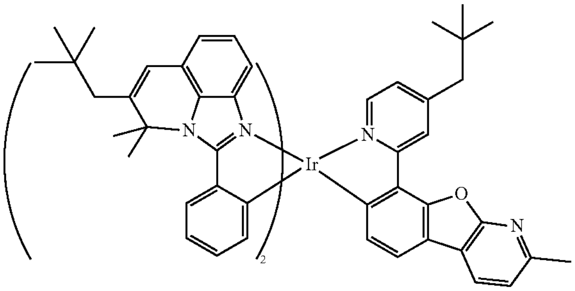
CPD 119
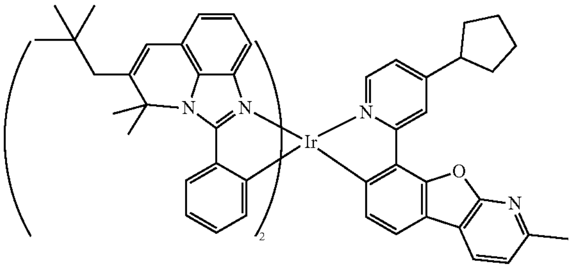
CPD 120
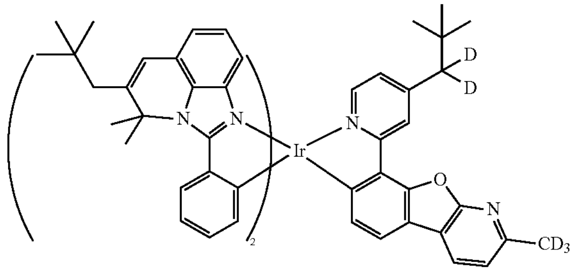
CPD 121
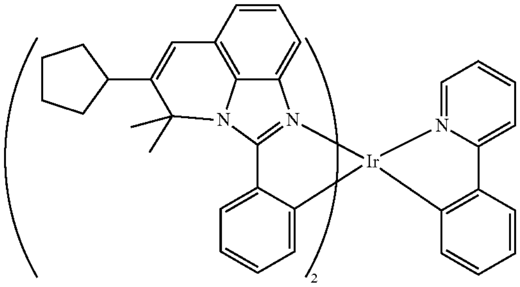

-continued
CPD 122
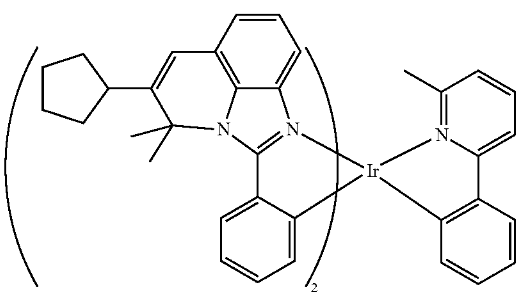
CPD 123
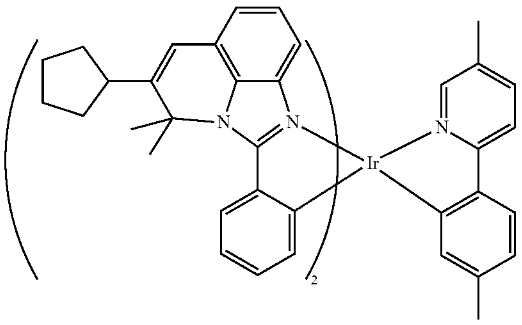
CPD 124
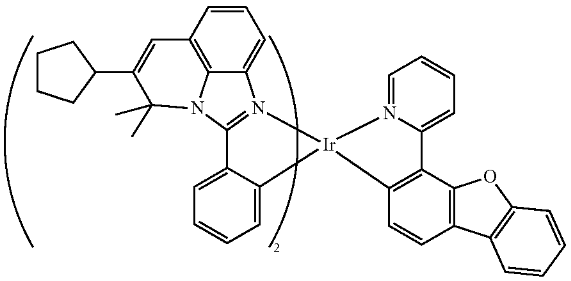
CPD 125
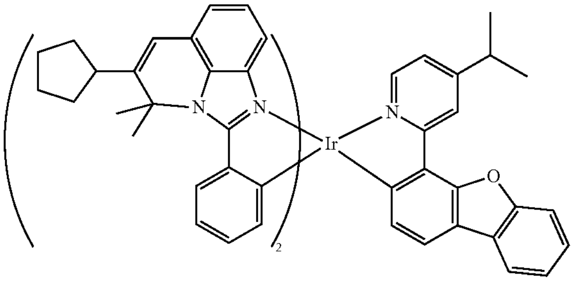
CPD 126
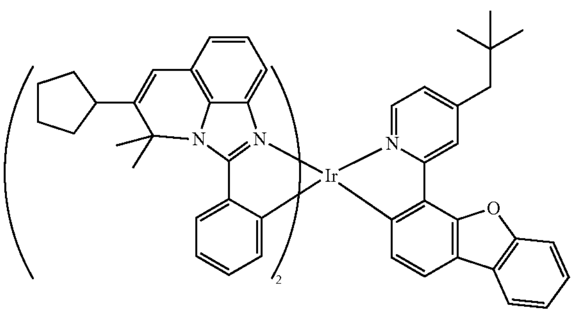
-continued
CPD 127
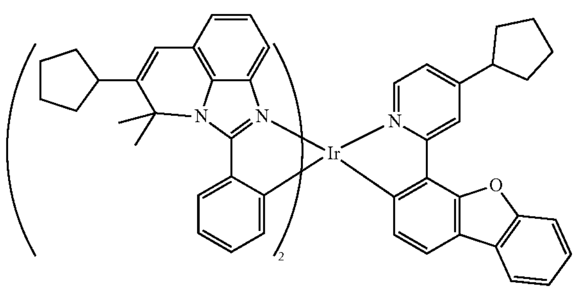
CPD 128
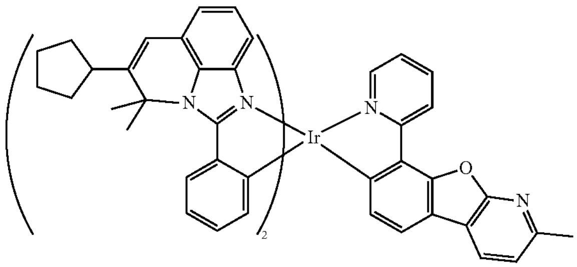
CPD 129
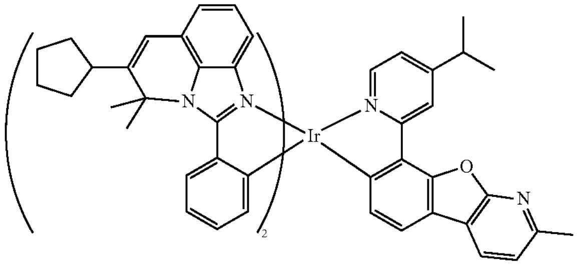
CPD 130
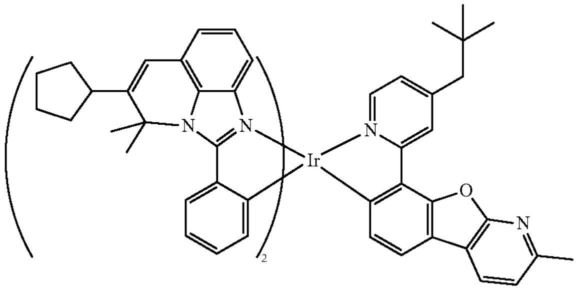
CPD 131
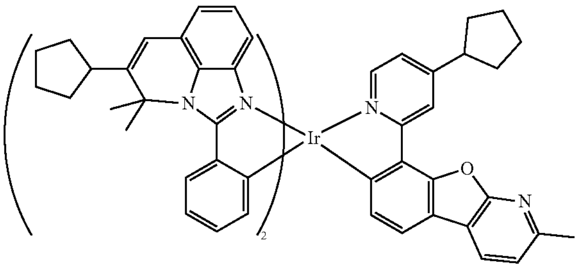

-continued
CPD 132
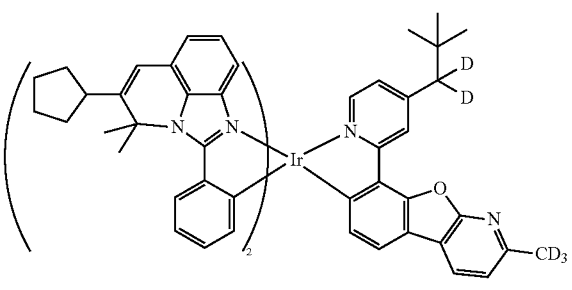
CPD 133
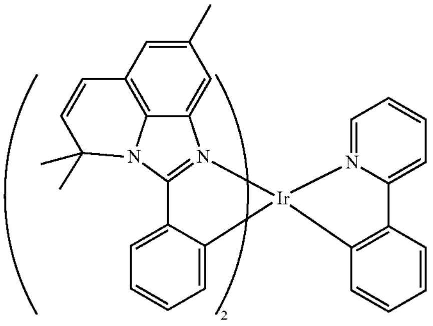
CPD 134
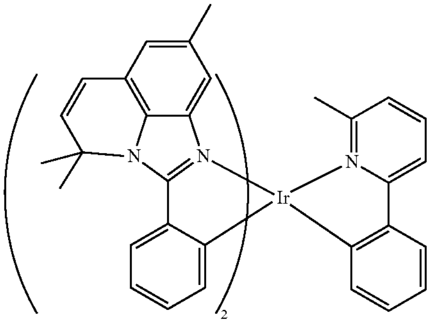
CPD 135
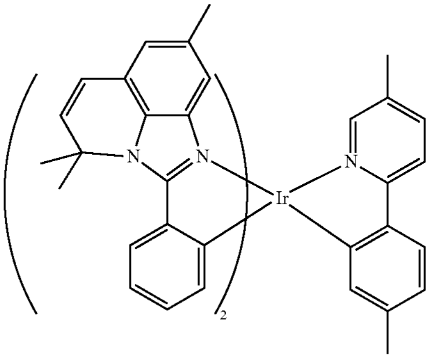
-continued
CPD 136
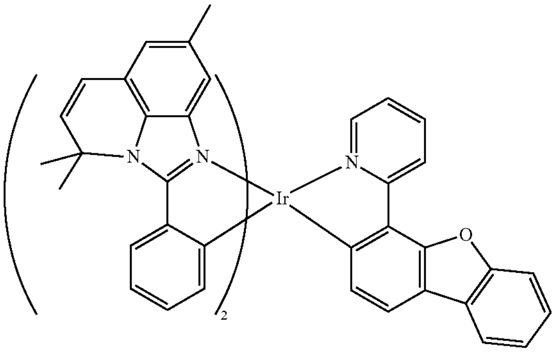
CPD 137
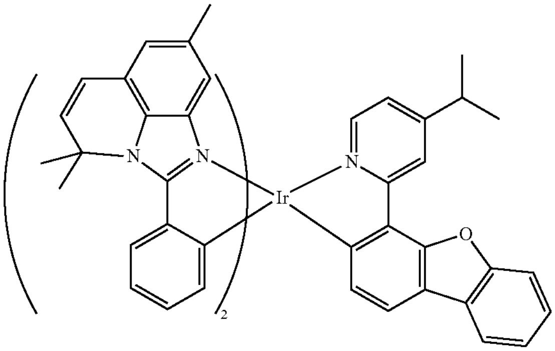
CPD 138
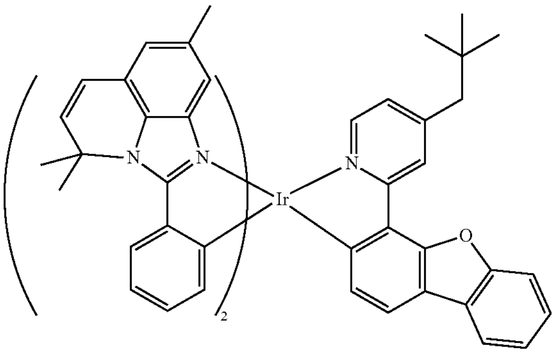
CPD 139
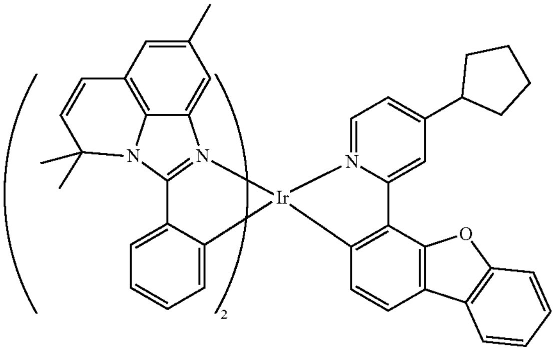

-continued
CPD 140
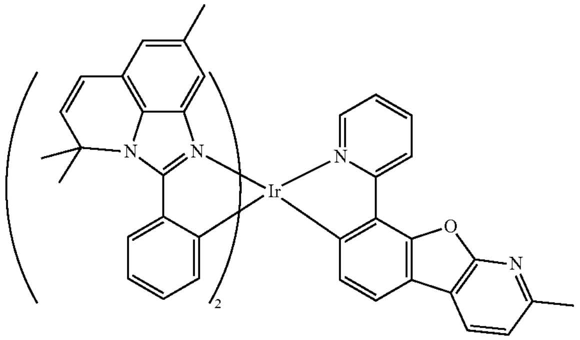
CPD 141
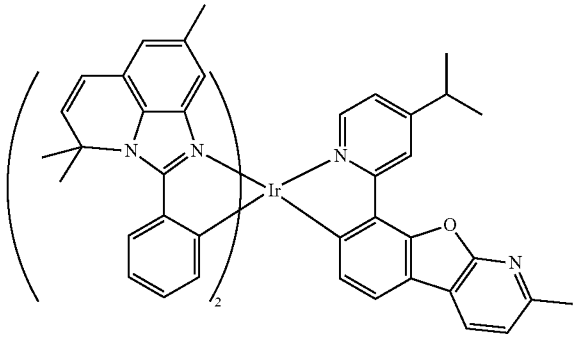
CPD 142
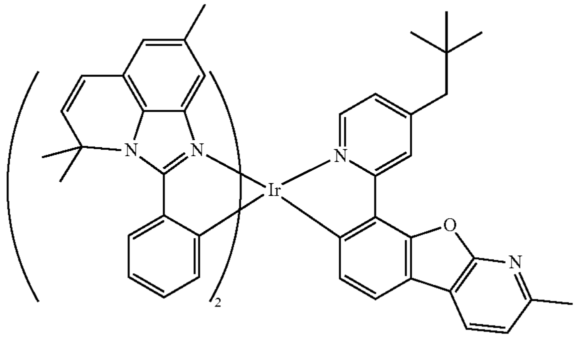
CPD 143
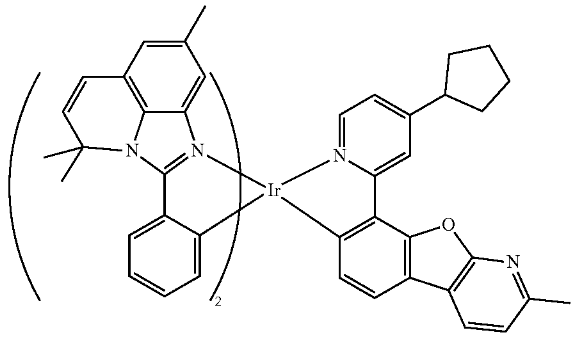
-continued
CPD 144
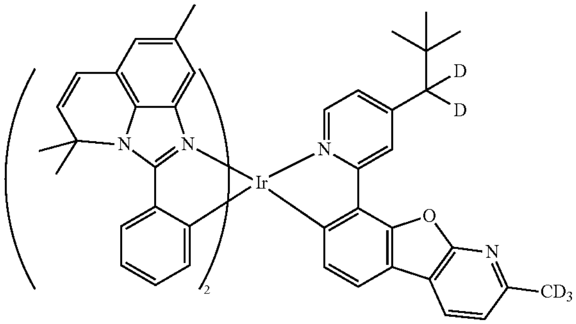
CPD 145
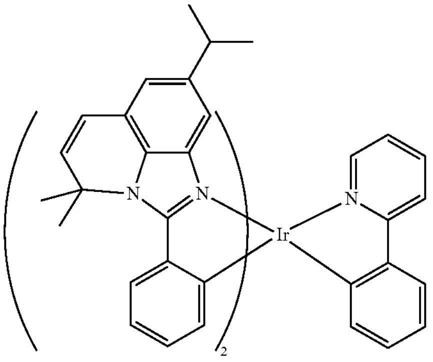
CPD 146
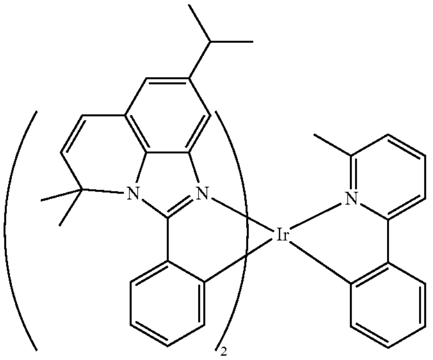
CPD 147
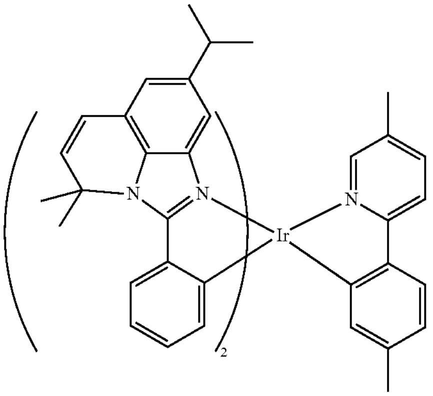

-continued
CPD 148
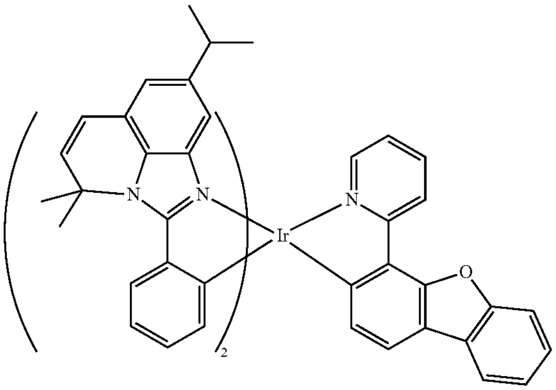
CPD 149
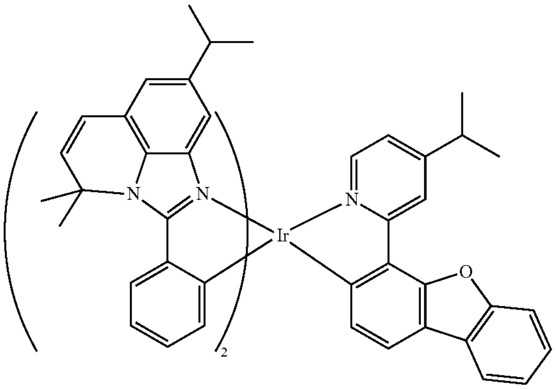
CPD 150
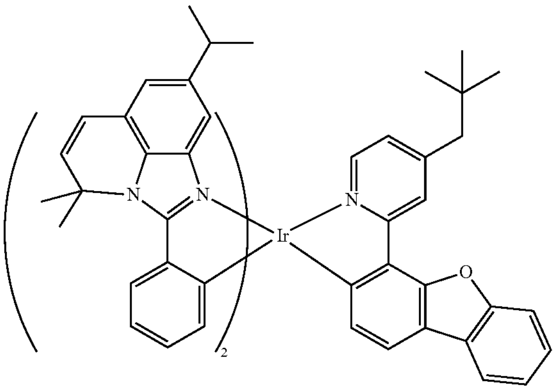
CPD 151
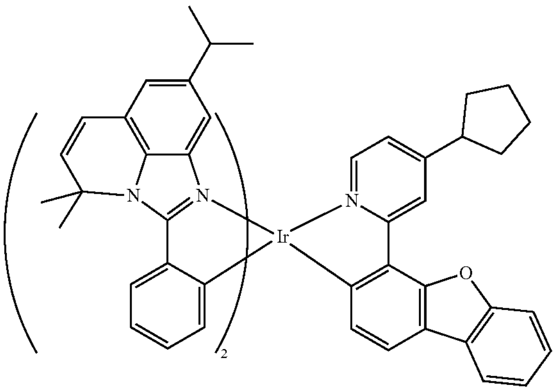
-continued
CPD 152
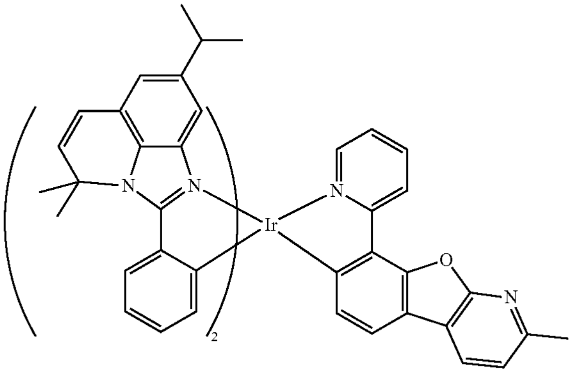
CPD 153
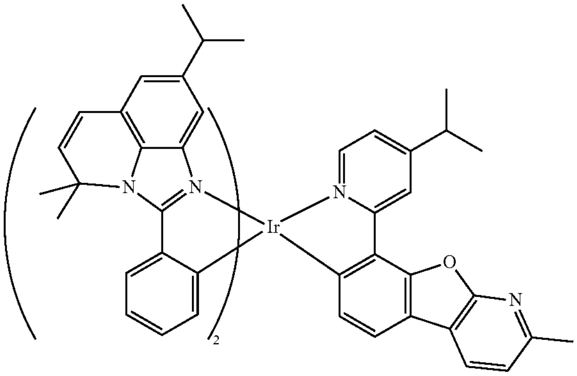
CPD 154
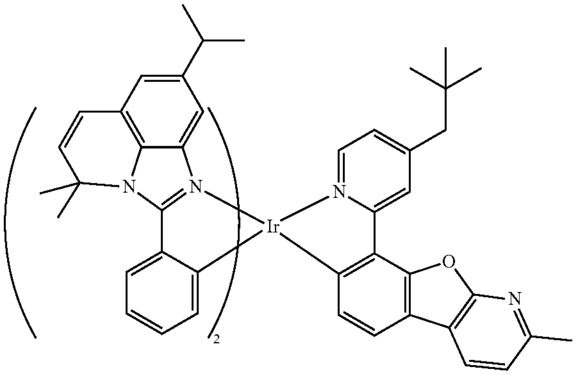
CPD 155
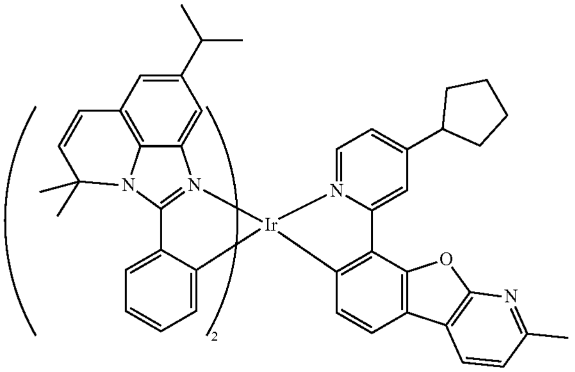

-continued
CPD 156
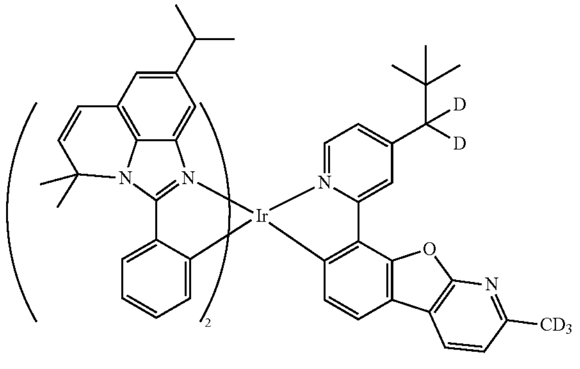
CPD 157
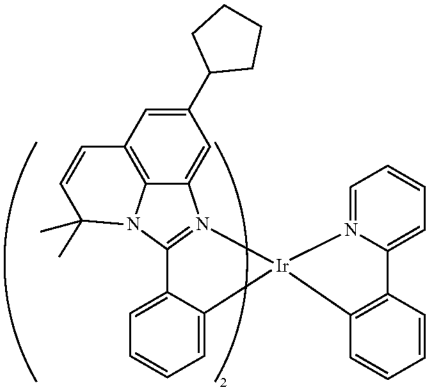
CPD 158
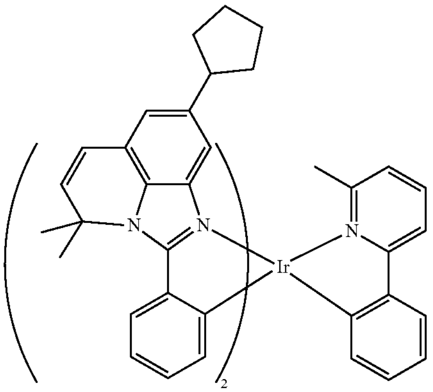
CPD 159
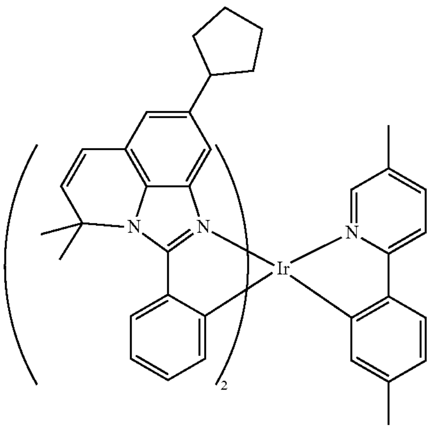
-continued
CPD 160
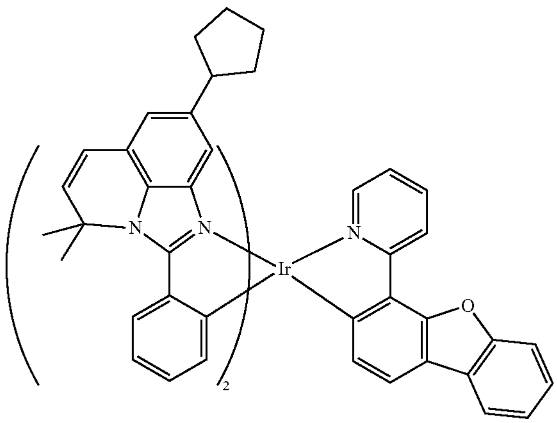
CPD 161
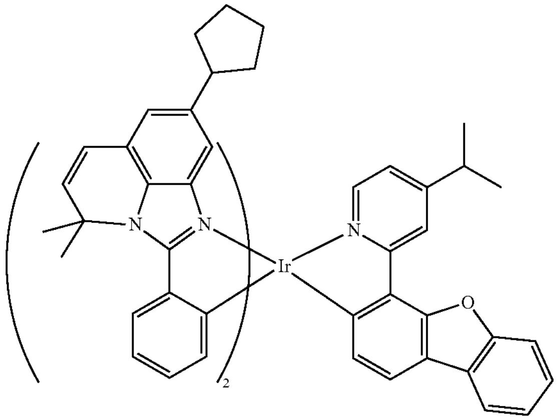
CPD 162
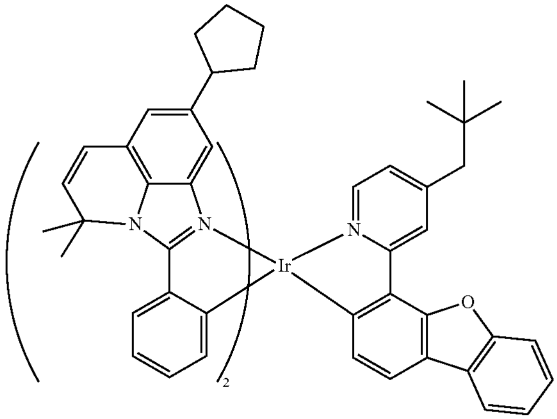

-continued
CPD 163
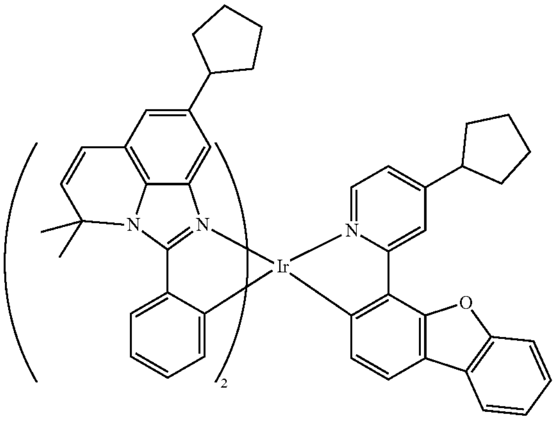
CPD 164
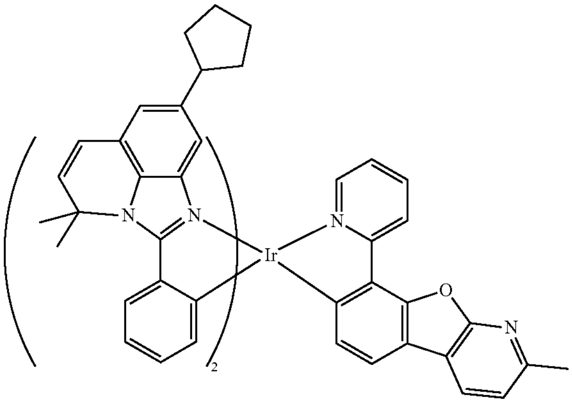
CPD 165
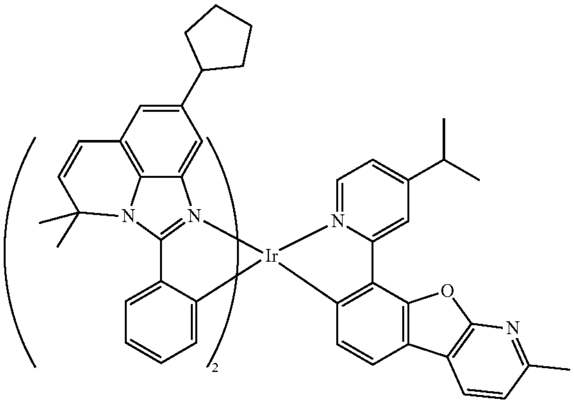
-continued
CPD 166
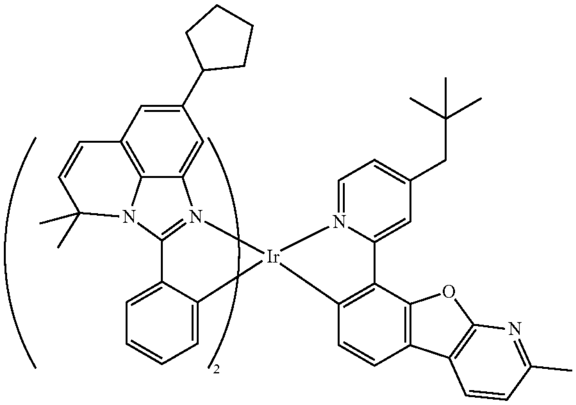
CPD 167
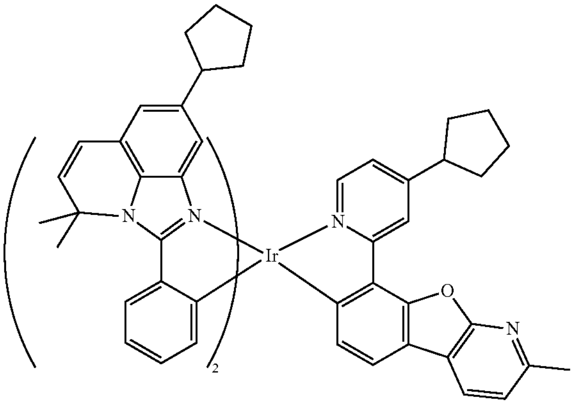
CPD 168
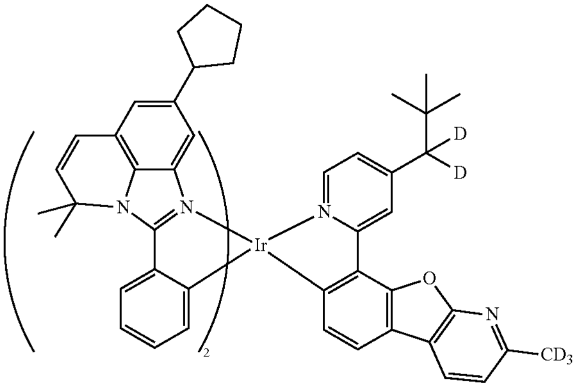
CPD 169
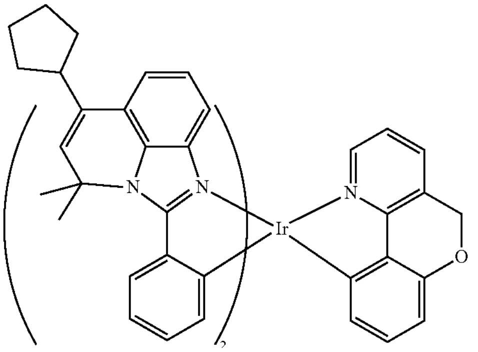

-continued
CPD 170
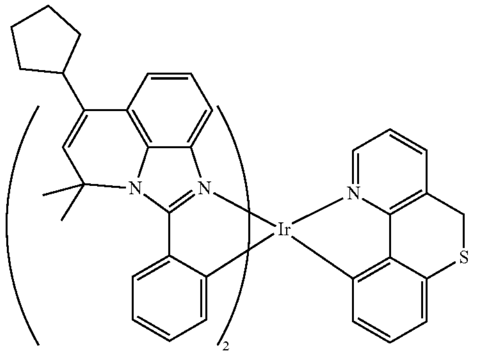
CPD 171
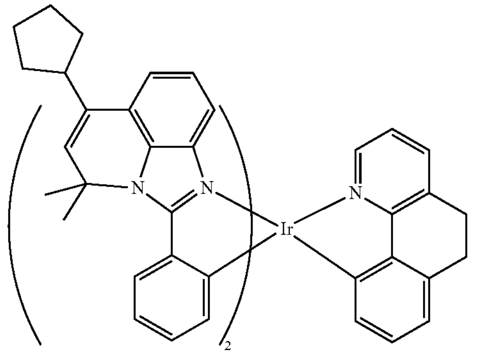
CPD 172
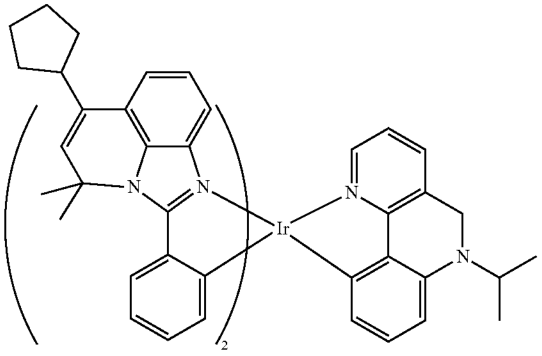
CPD 173
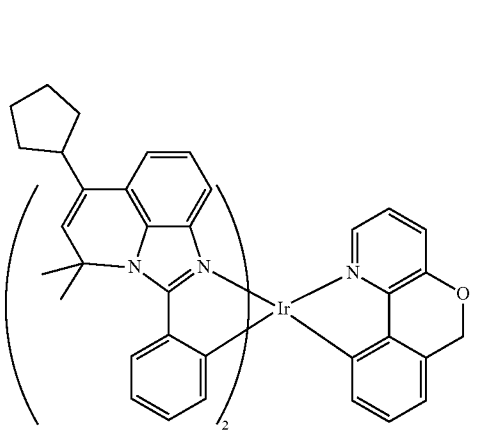
-continued
CPD 174
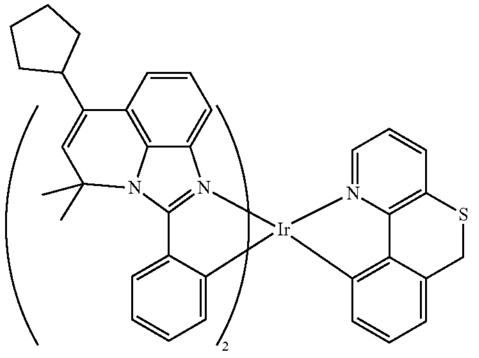
CPD 175
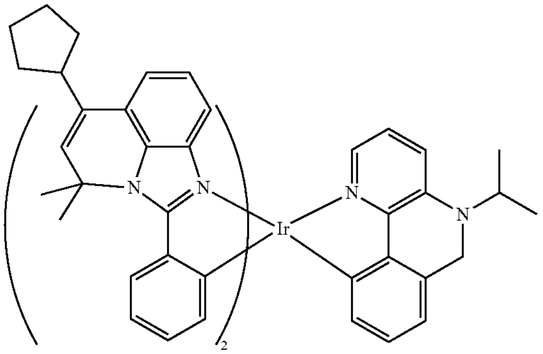
CPD 176
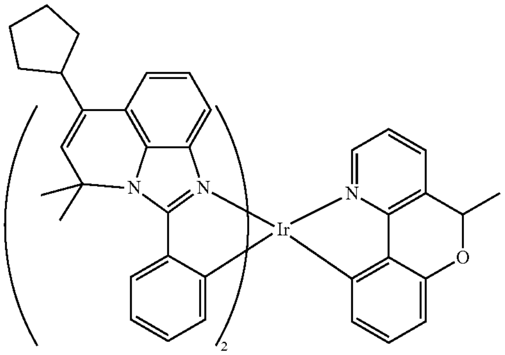
CPD 177
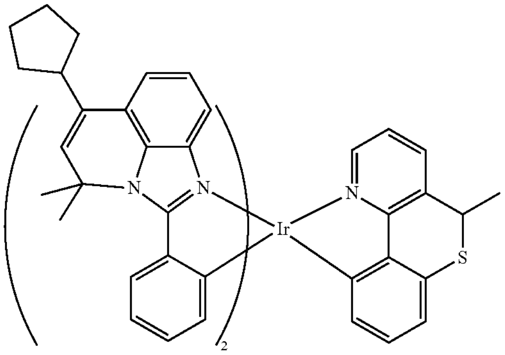

-continued
CPD 178
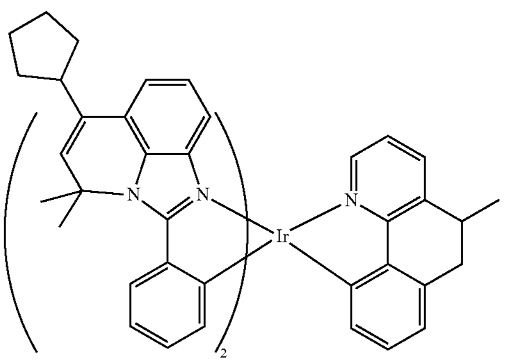
CPD 179
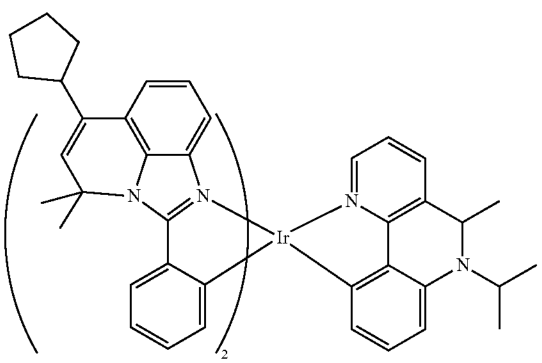
CPD 180
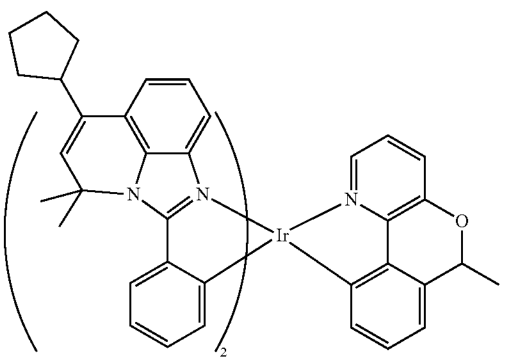
CPD 181
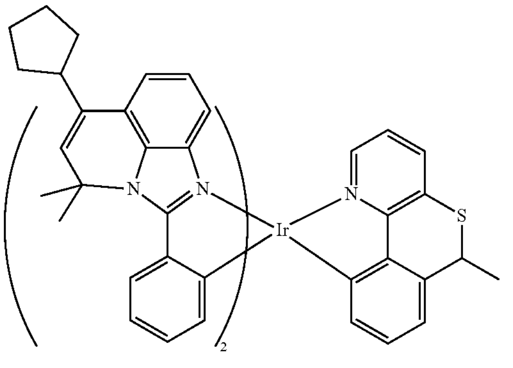
-continued
CPD 182
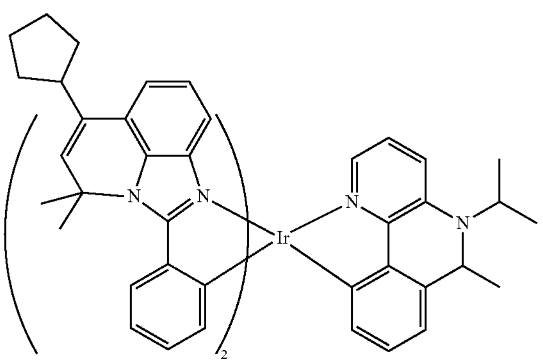
CPD 183
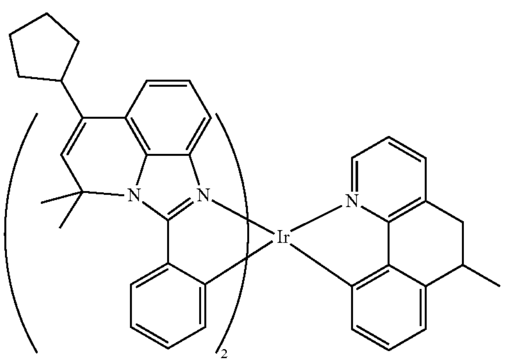
CPD 184
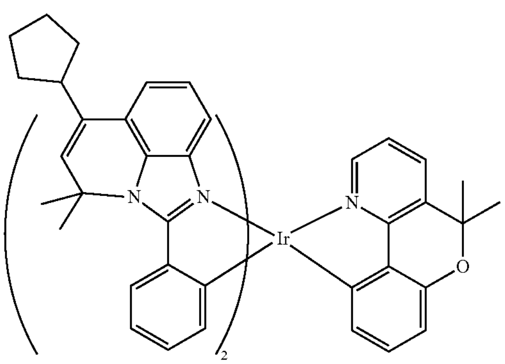
CPD 185
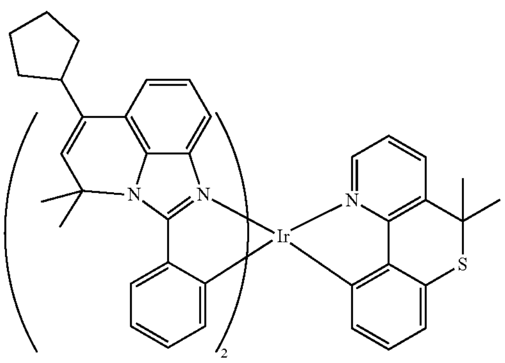

-continued
CPD 186
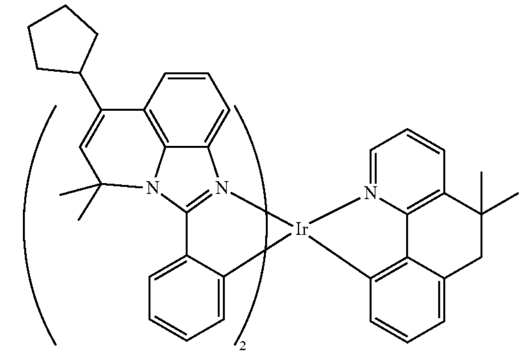
CPD 187
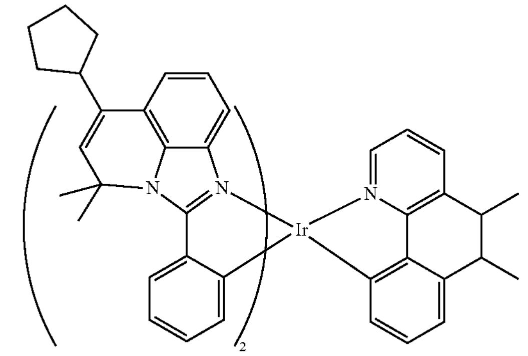
CPD 188
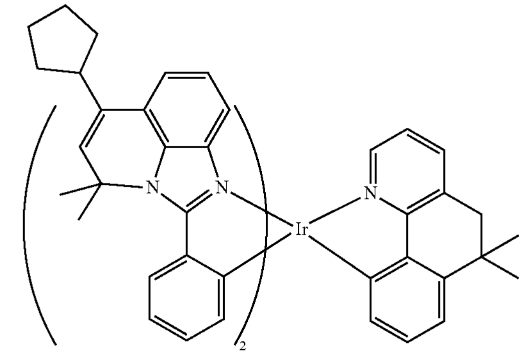
CPD 189
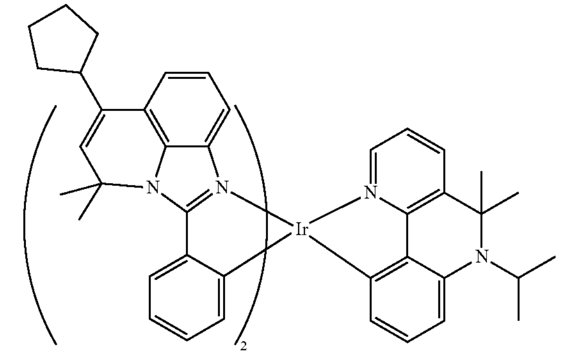
-continued
CPD 190
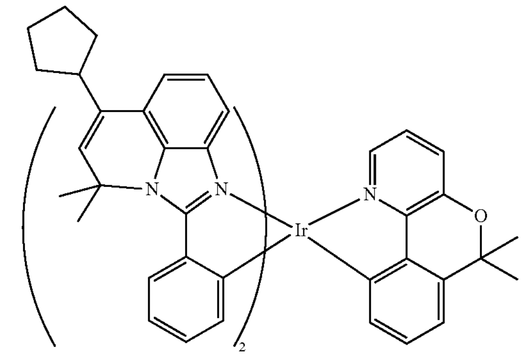
CPD 191
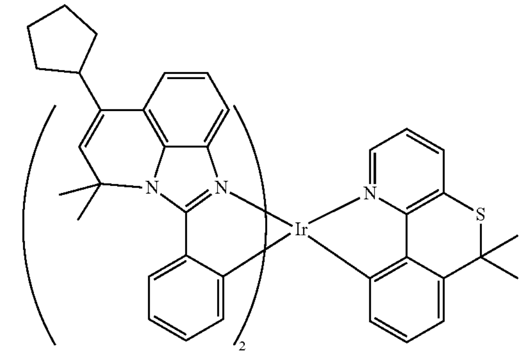
CPD 192
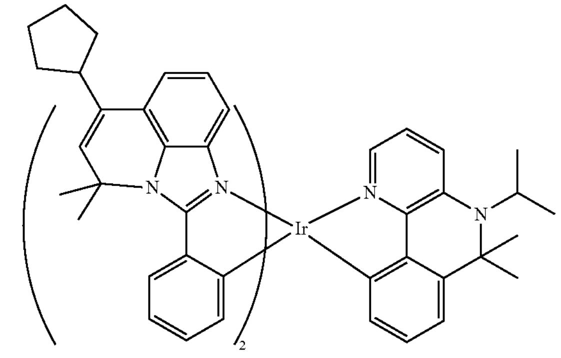
CPD 193
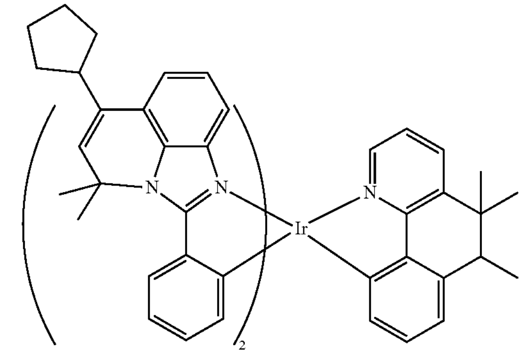

-continued
CPD 194
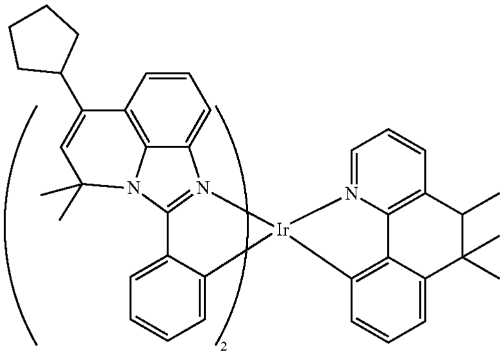
CPD 195
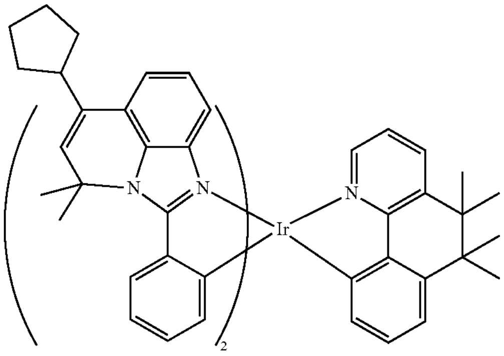
CPD 196
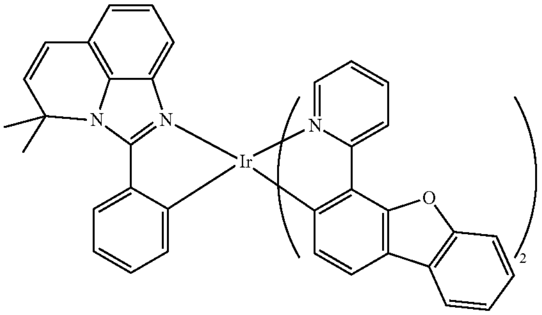
CPD 197
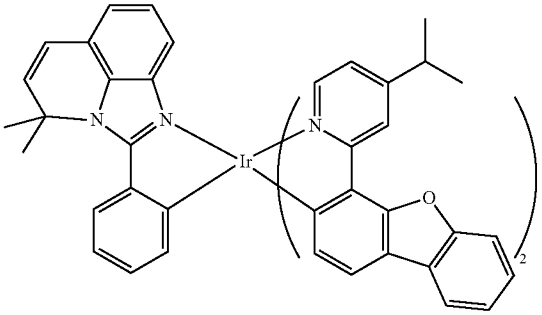
-continued
CPD 198
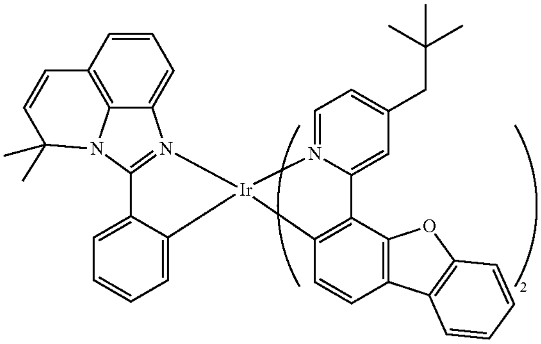
CPD 199
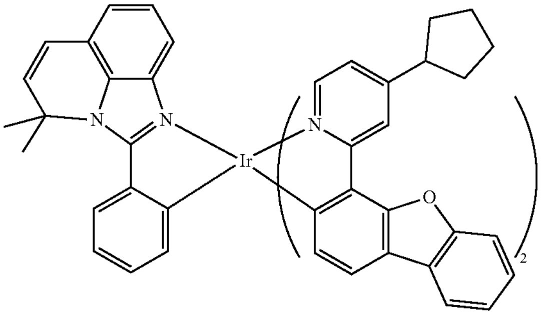
CPD 200
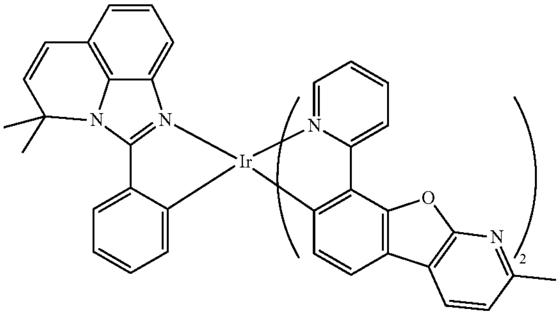
CPD 201
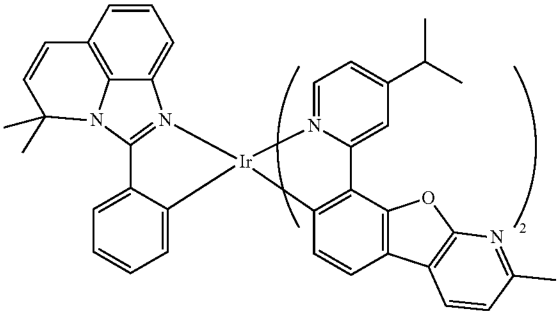

-continued
CPD 202
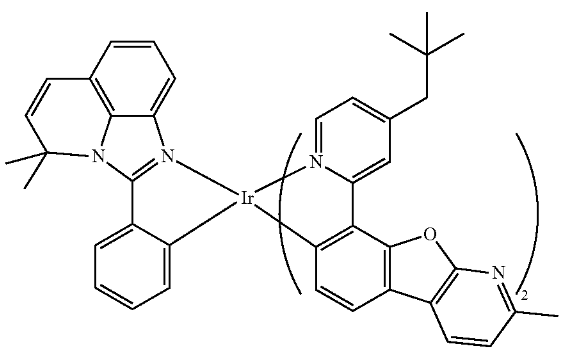
CPD 203
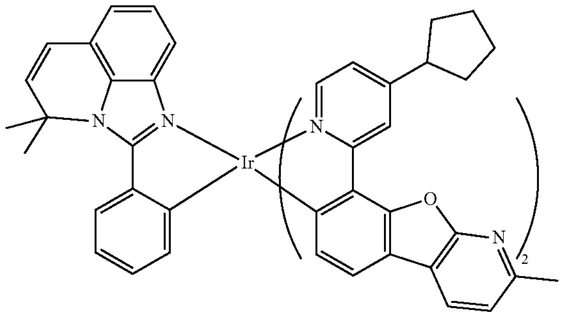
CPD 204
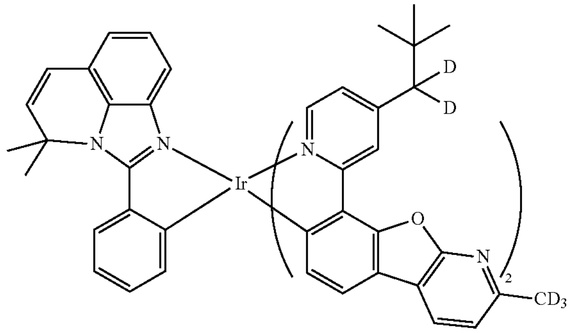
CPD 205
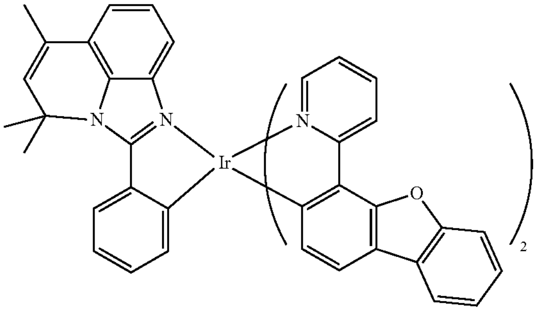
-continued
CPD 206
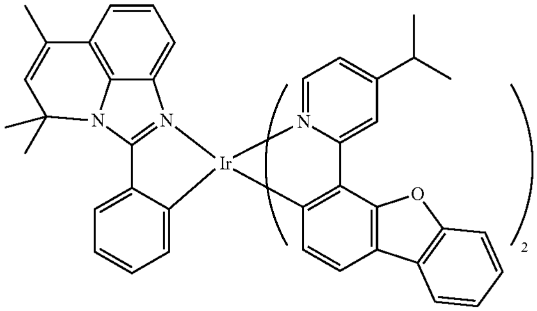
CPD 207
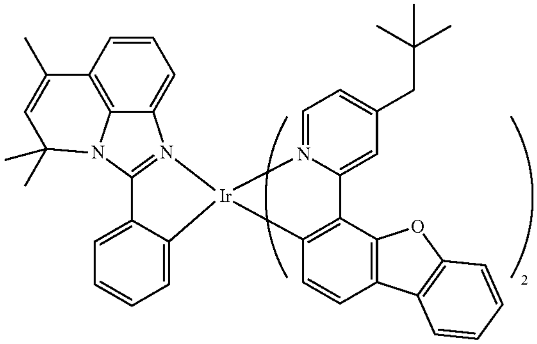
CPD 208
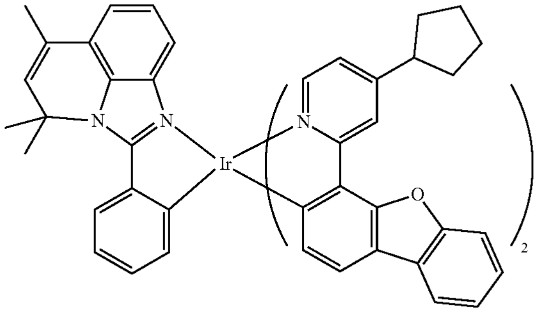
CPD 209
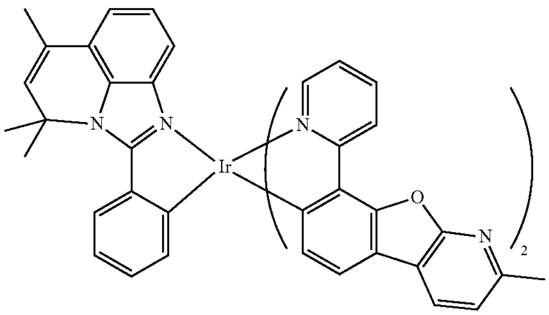

-continued
CPD 210
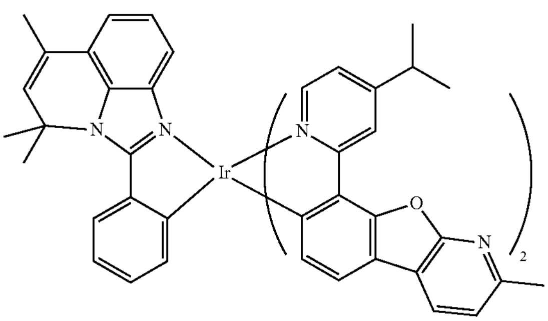
CPD 211
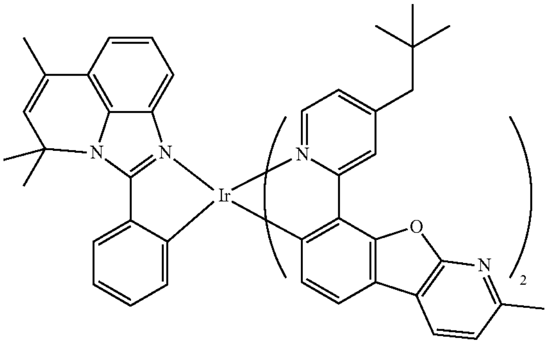
CPD 212
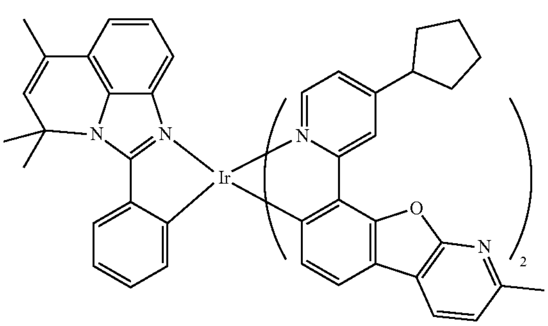
CPD 213
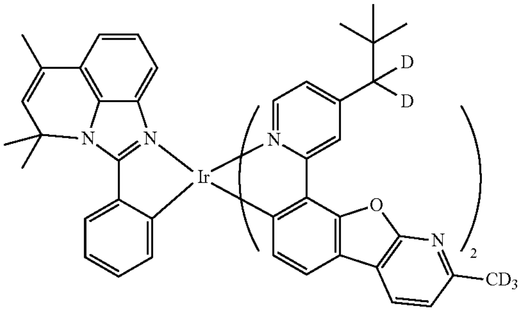
-continued
CPD 214
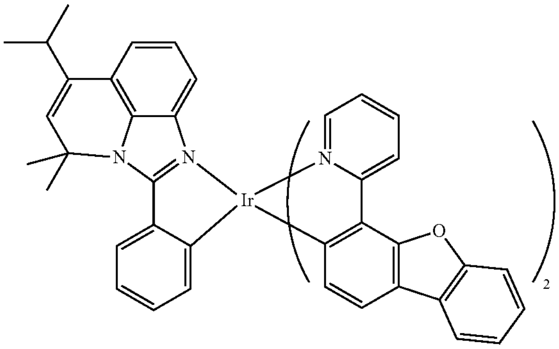
CPD 215
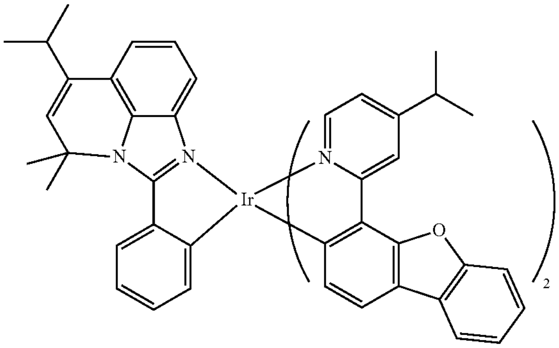
CPD 216
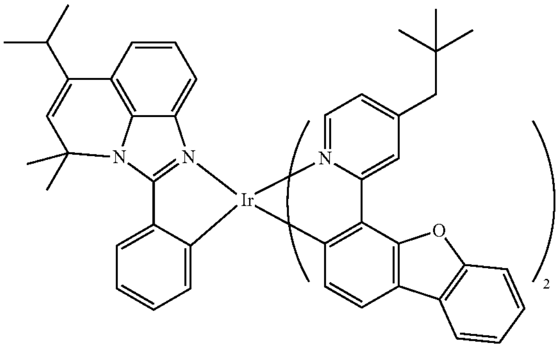
CPD 217
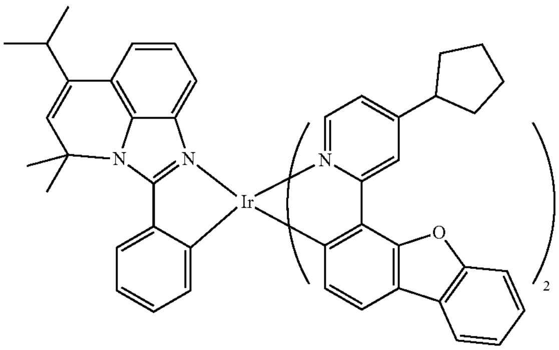

CPD 218
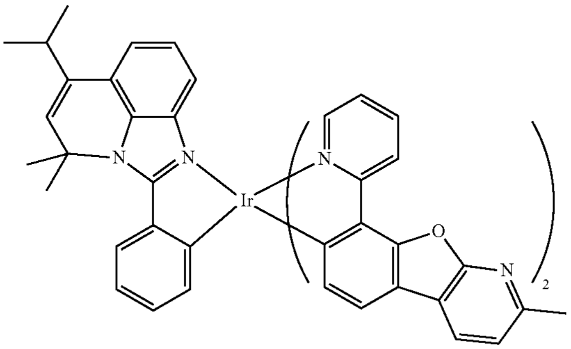
CPD 219
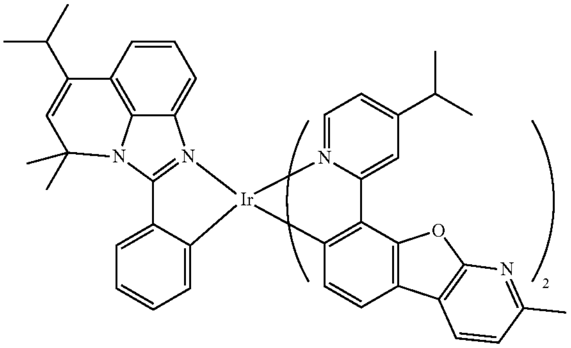
CPD 220
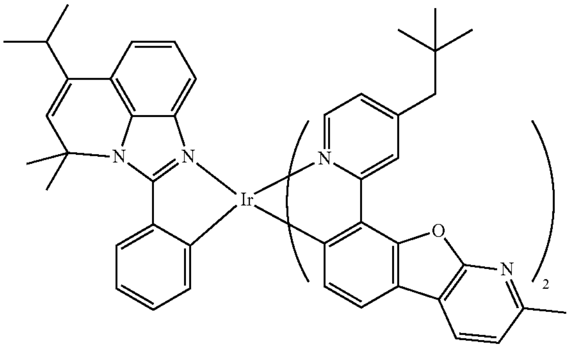
CPD 221
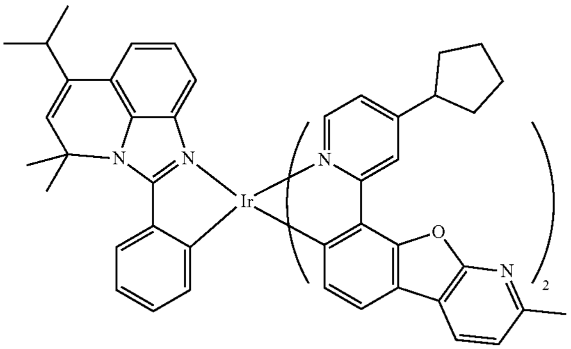
CPD 222
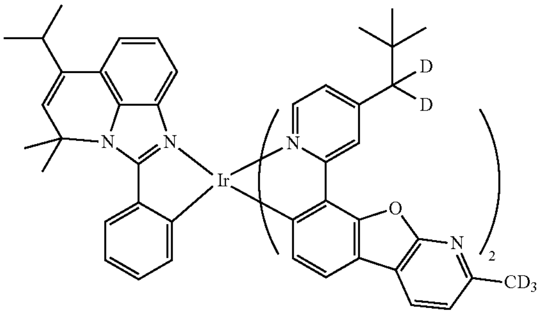
CPD 223
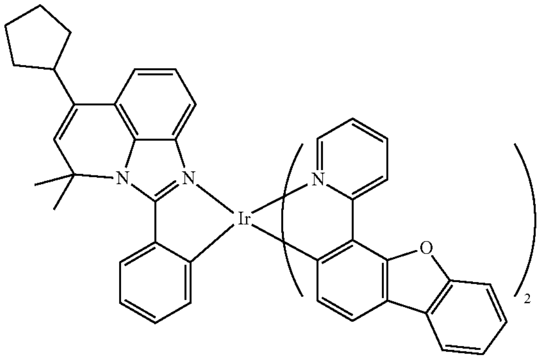
CPD 224
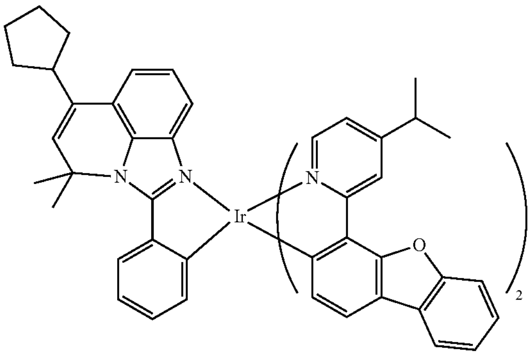
CPD 225
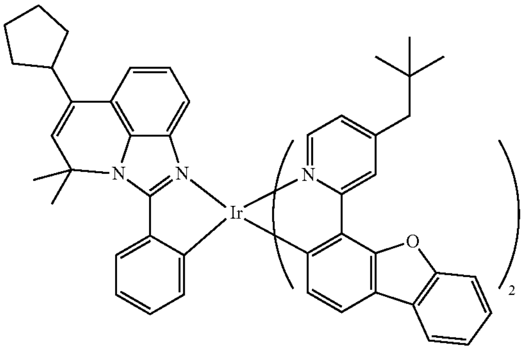

-continued
CPD 226
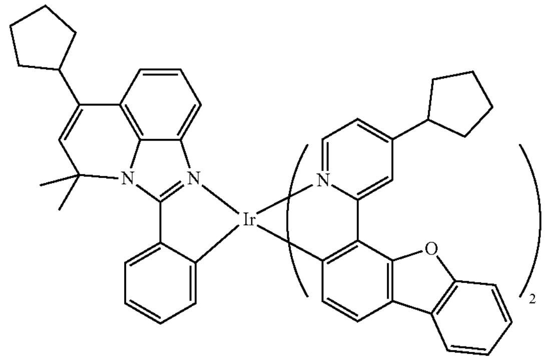
CPD 227
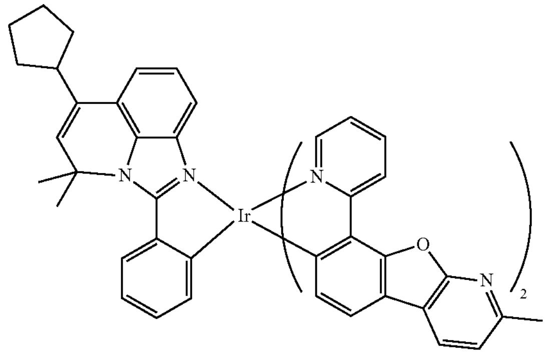
CPD 228
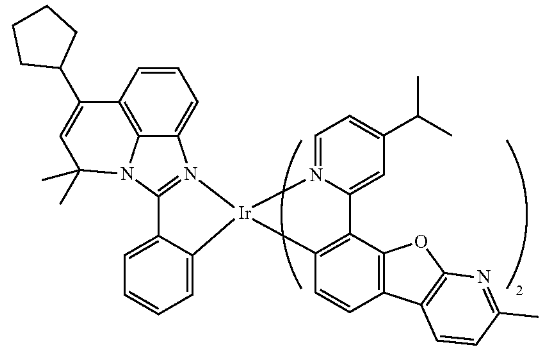
CPD 229
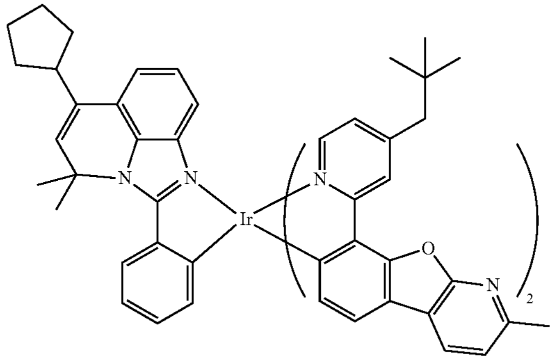
-continued
CPD 230
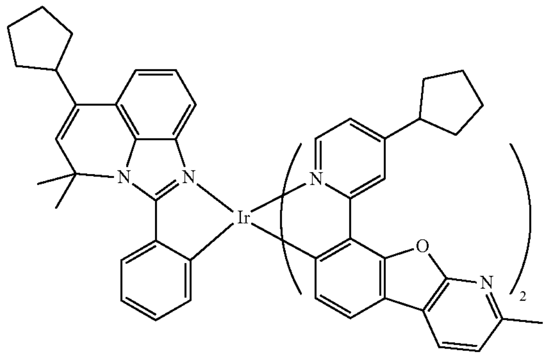
CPD 231
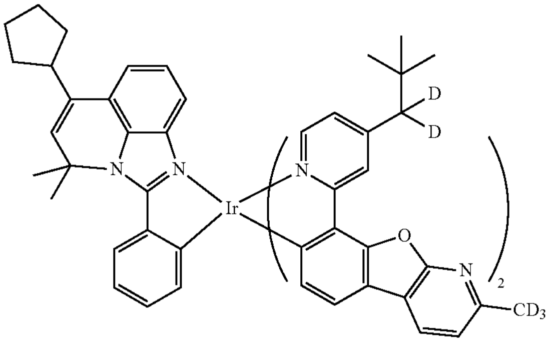
CPD 232
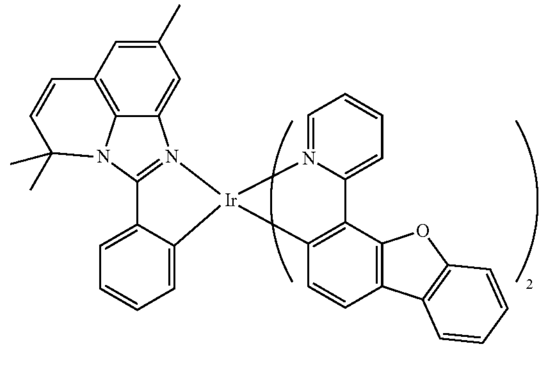
CPD 233
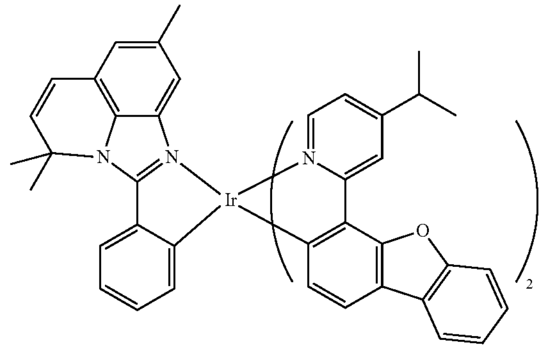

-continued
CPD 234
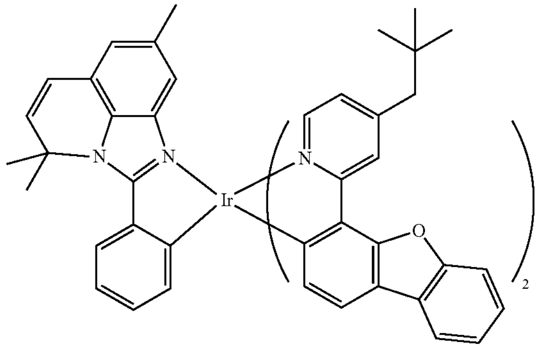
CPD 235
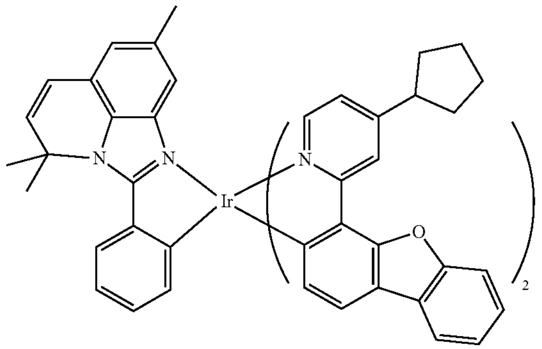
CPD 236
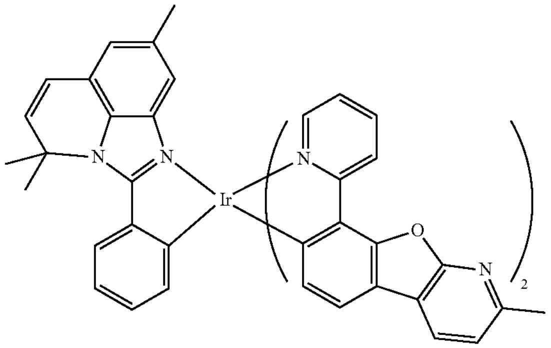
CPD 237
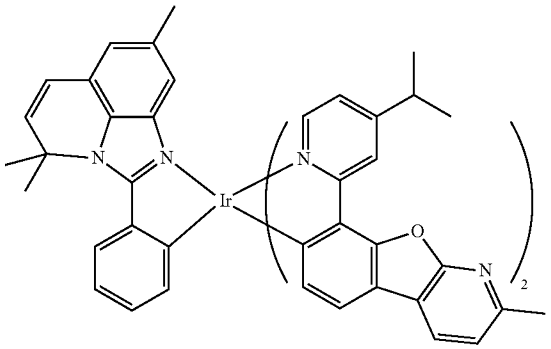
-continued
CPD 238
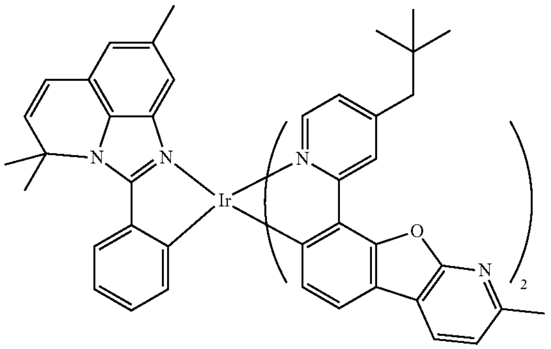
CPD 239
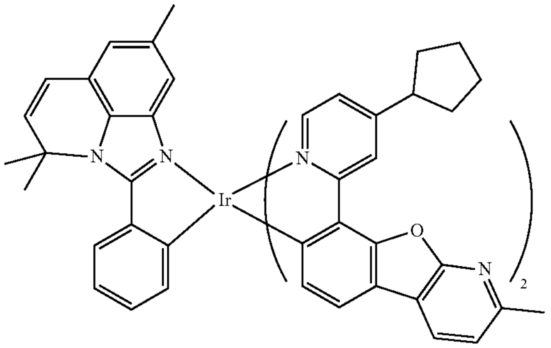
CPD 240
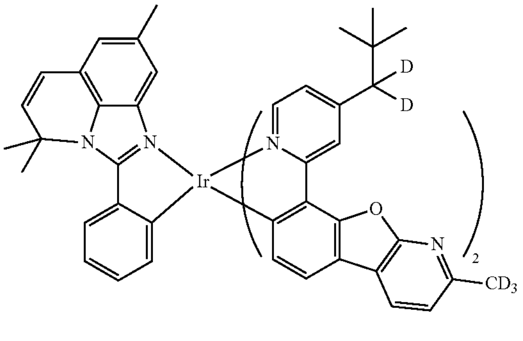
CPD 241
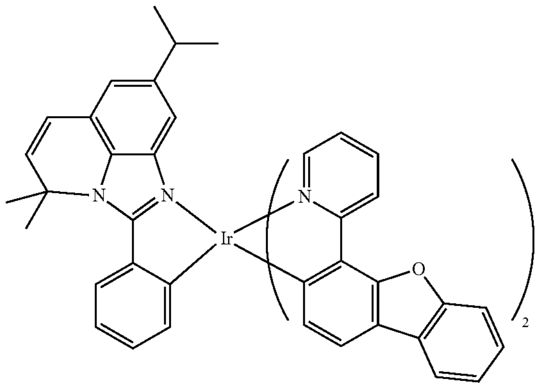

-continued
CPD 242
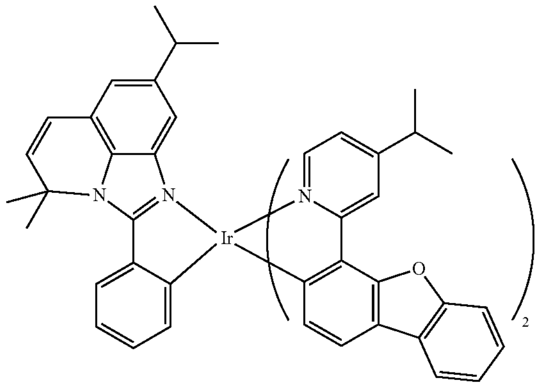
CPD 243
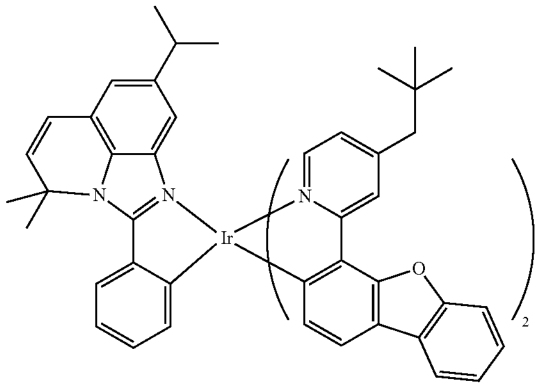
CPD 244
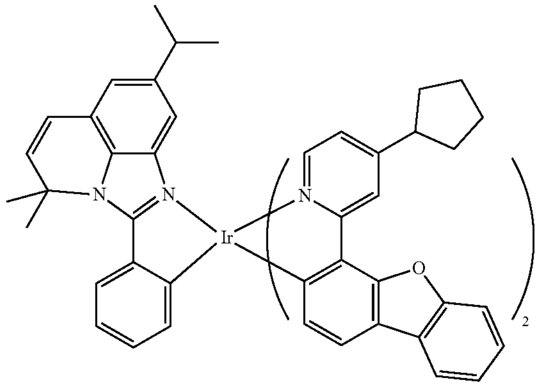
CPD 245
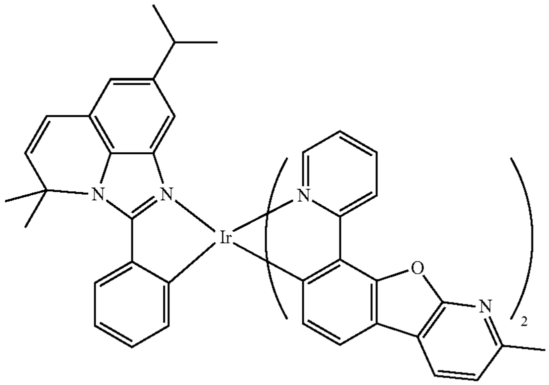
-continued
CPD 246
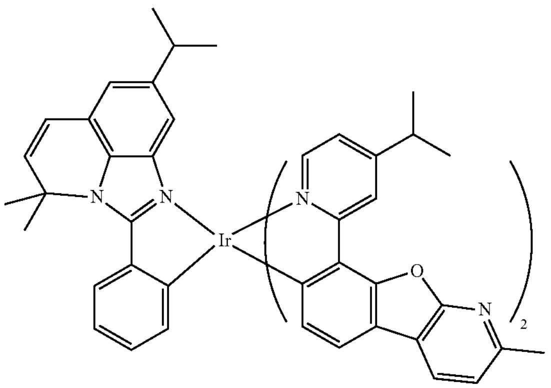
CPD 247
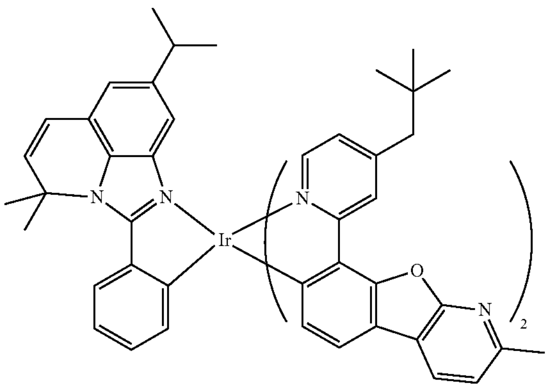
CPD 248
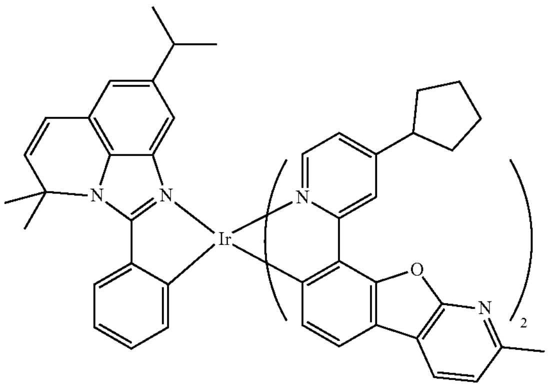
CPD 249
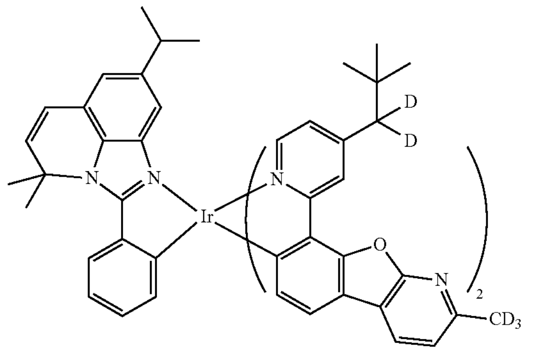

-continued
CPD 250
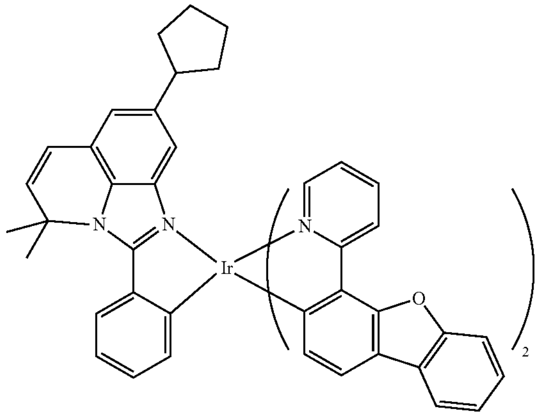
CPD 251
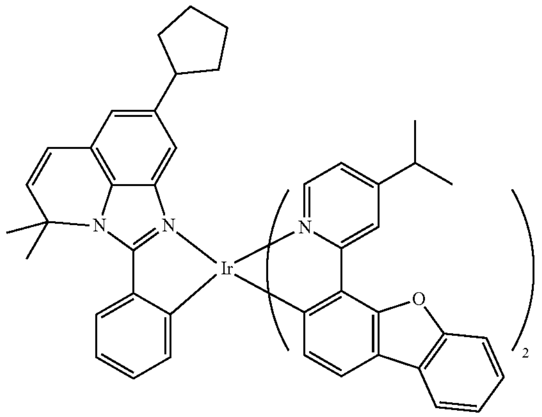
CPD 252
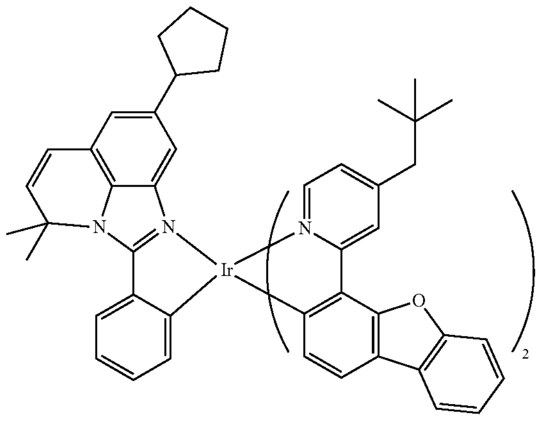
-continued
CPD 253
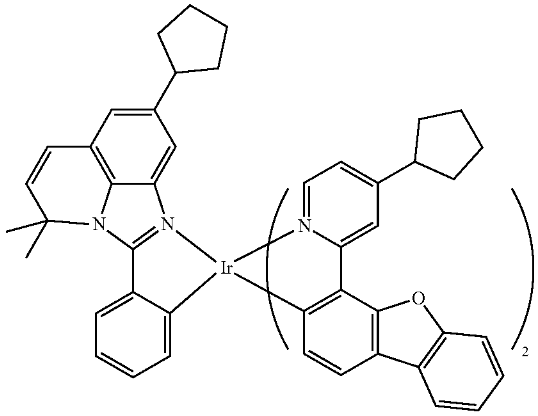
CPD 254
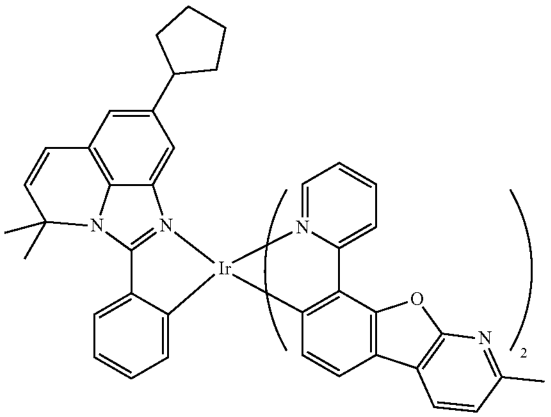
CPD 255
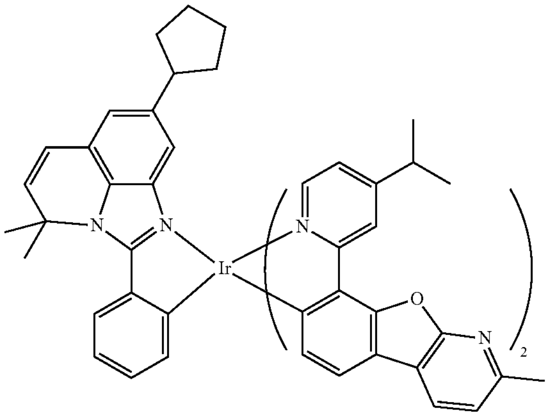

-continued
CPD 256
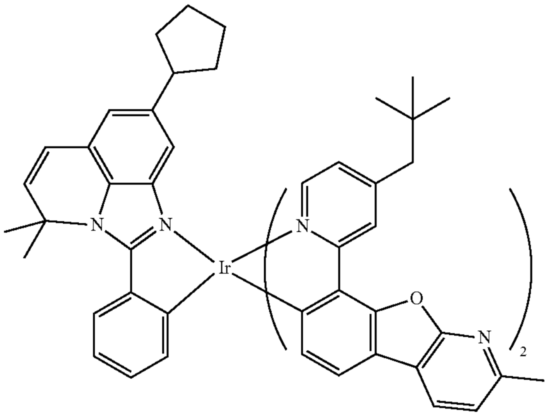
CPD 257
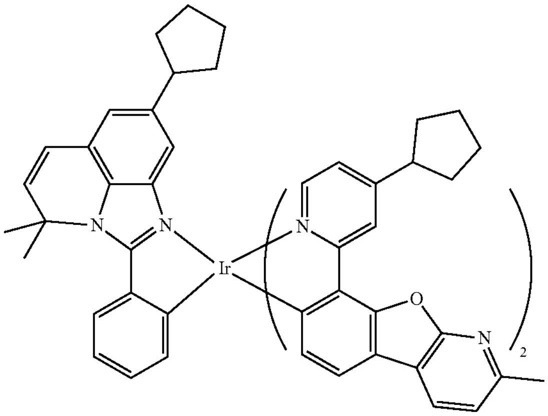
CPD 258
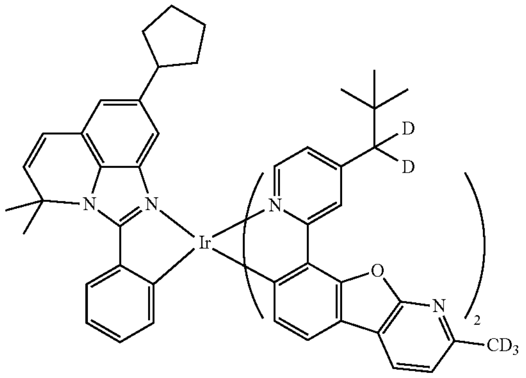
CPD 259
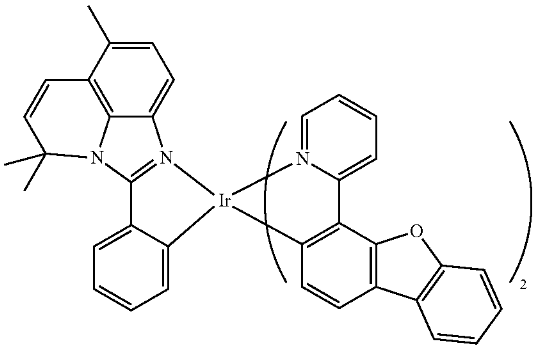
-continued
CPD 260
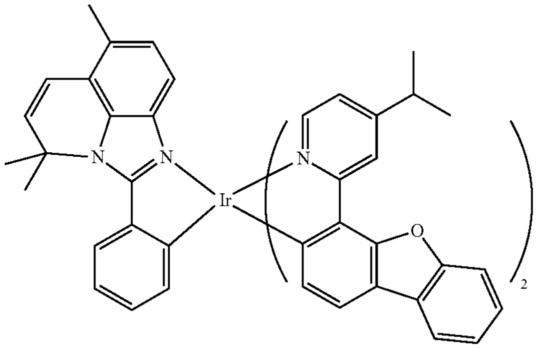
CPD 261
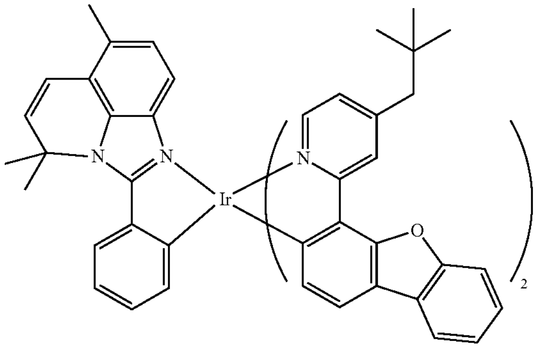
CPD 262
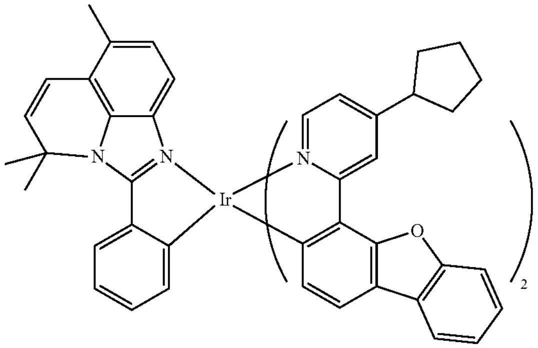
CPD 263
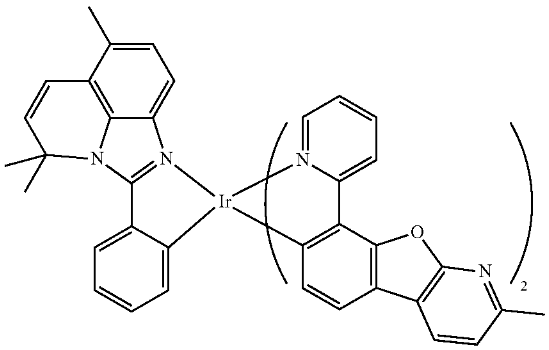

CPD 264
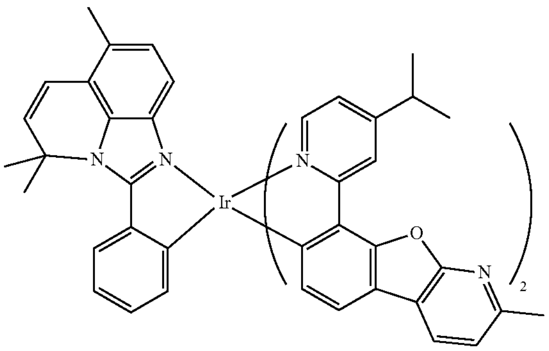
CPD 265
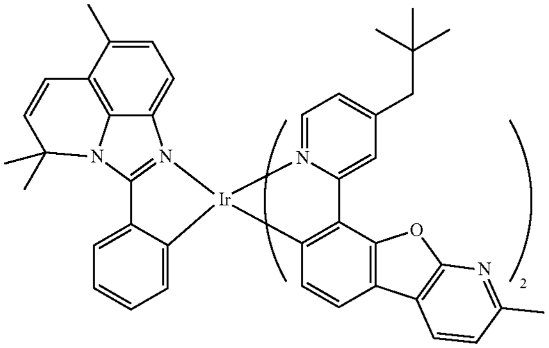
CPD 266
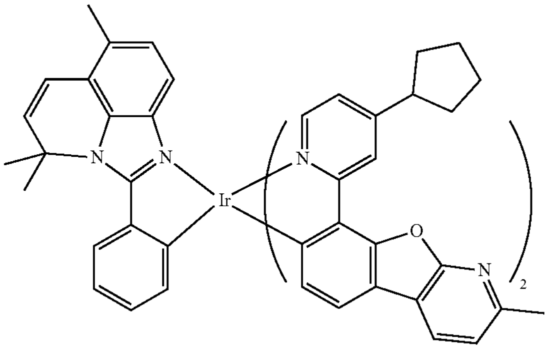
CPD 267
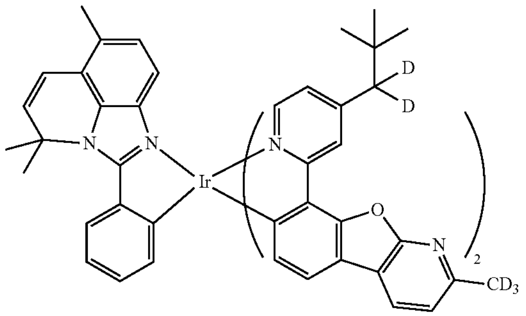
CPD 268
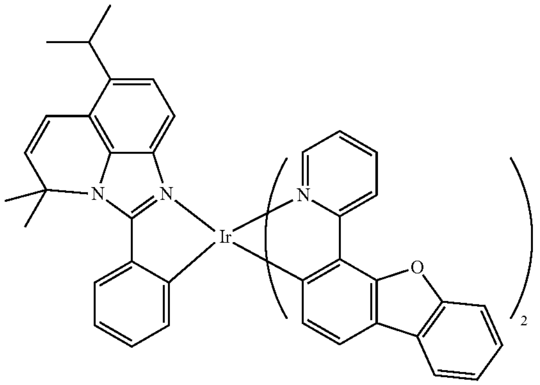
CPD 269
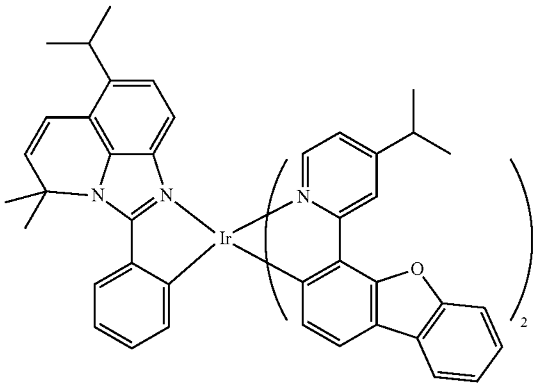
CPD 270
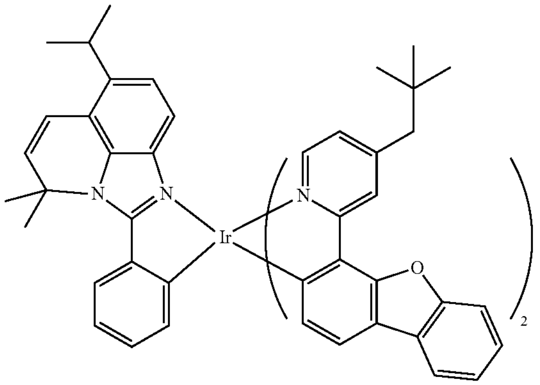
CPD 271
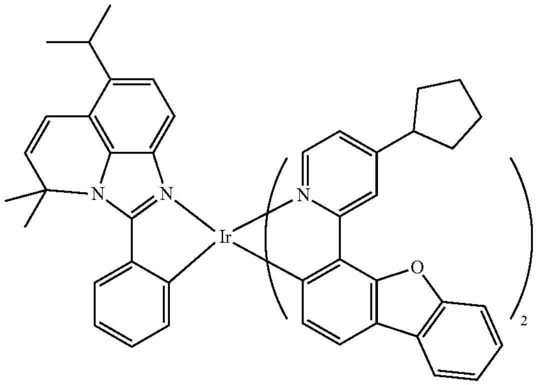

-continued
CPD 272
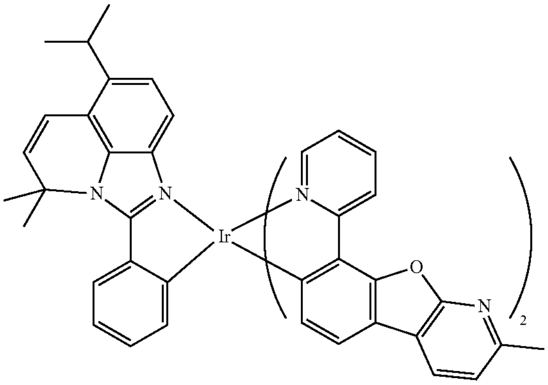
CPD 273
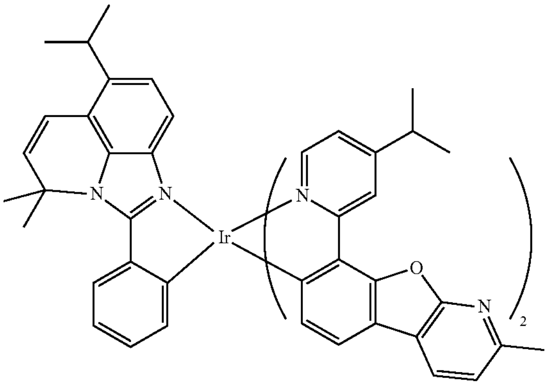
CPD 274
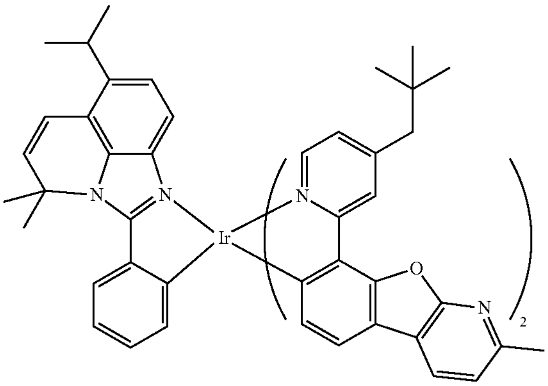
CPD 275
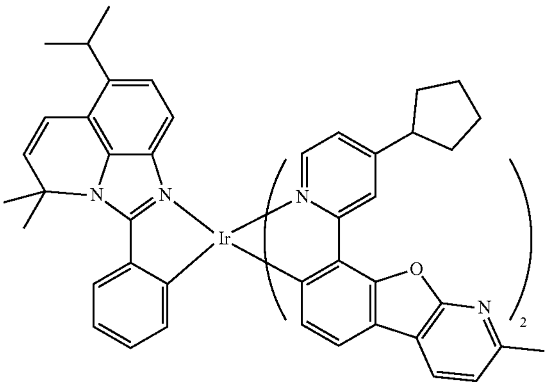
-continued
CPD 276
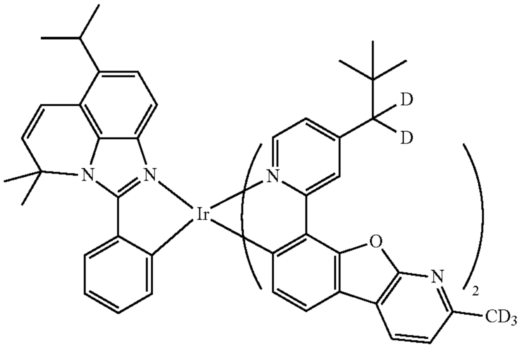
CPD 277
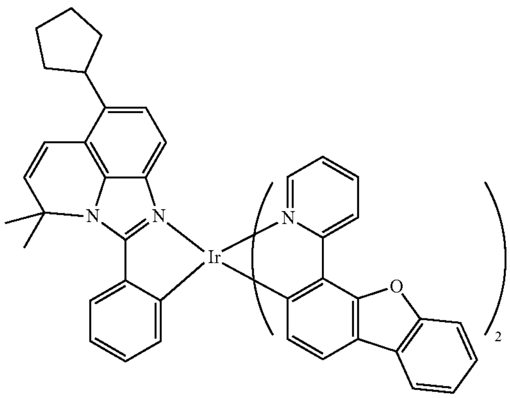
CPD 278
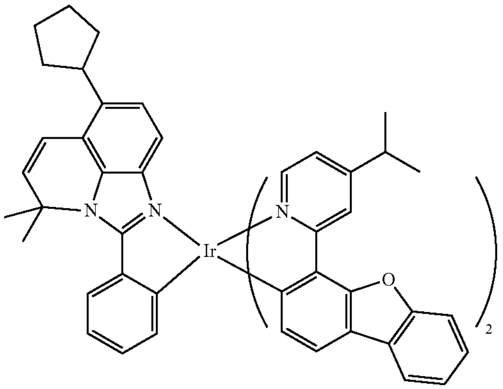
CPD 279
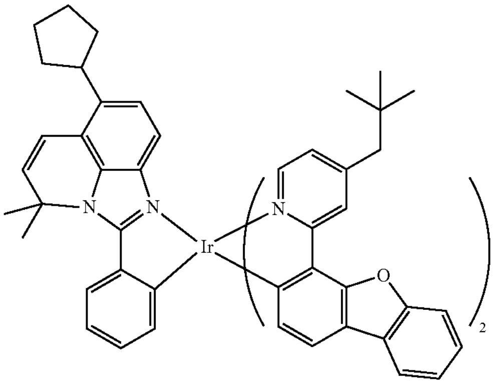

-continued
CPD 280
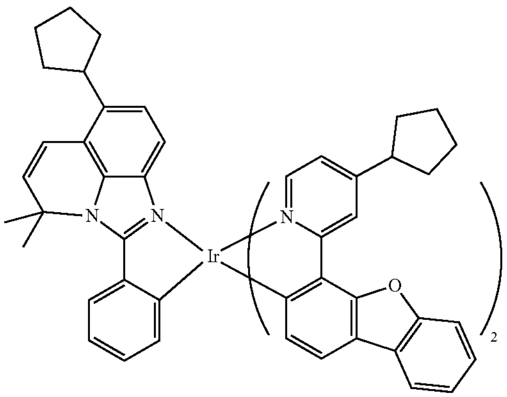
CPD 281
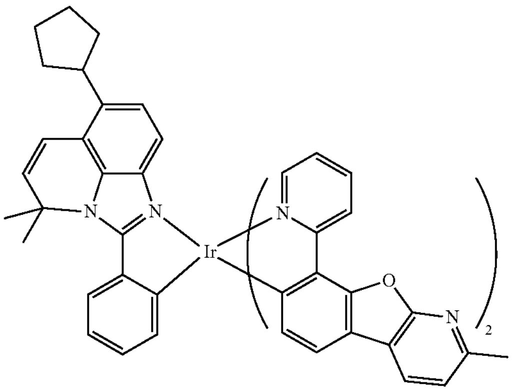
CPD 282
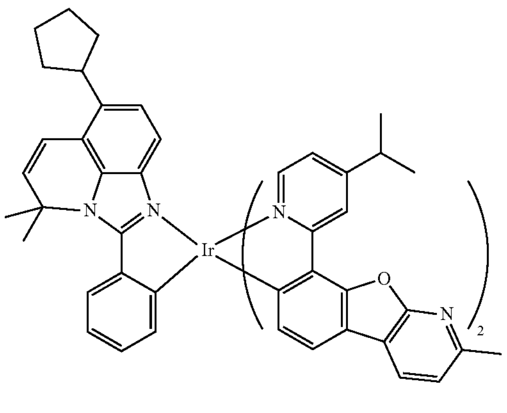
-continued
CPD 283
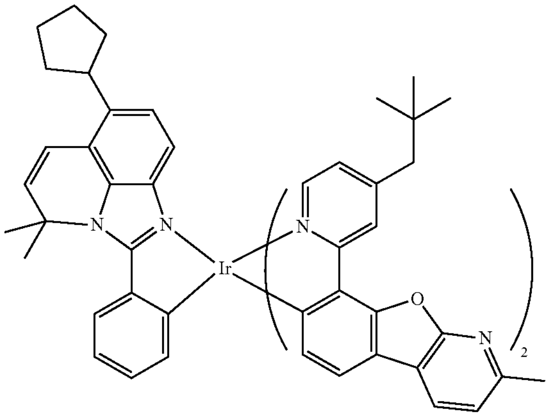
CPD 284
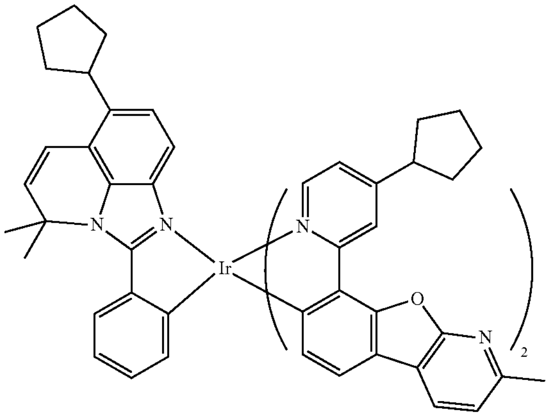
CPD 285
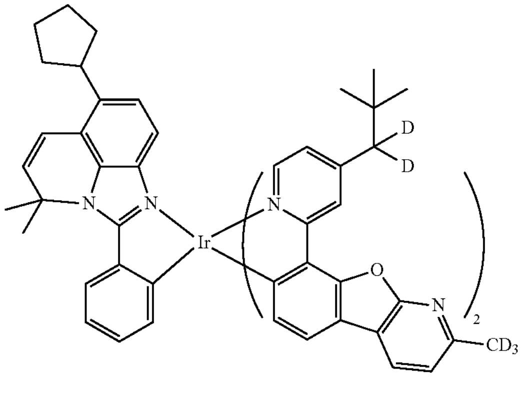
CPD 286
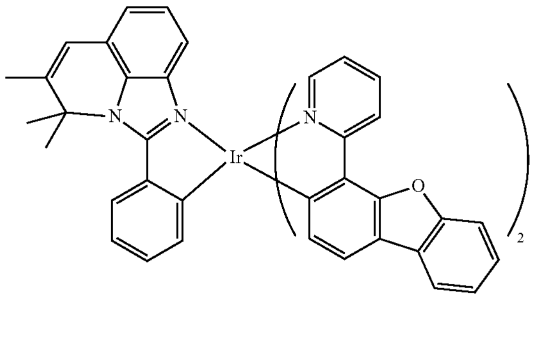

-continued
CPD 287
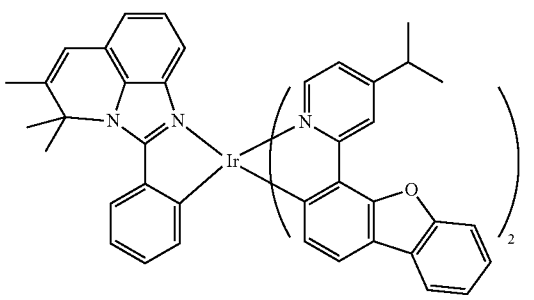
CPD 288
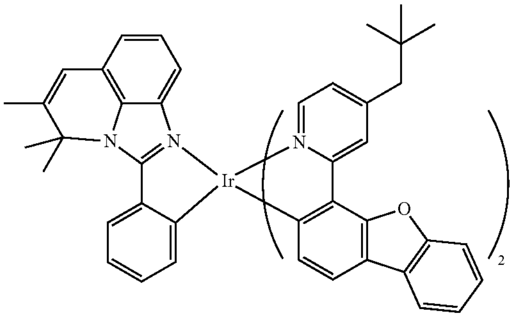
CPD 289
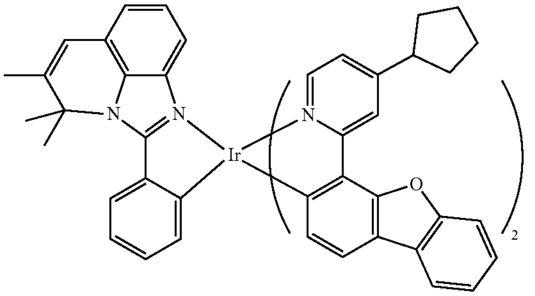
CPD 290
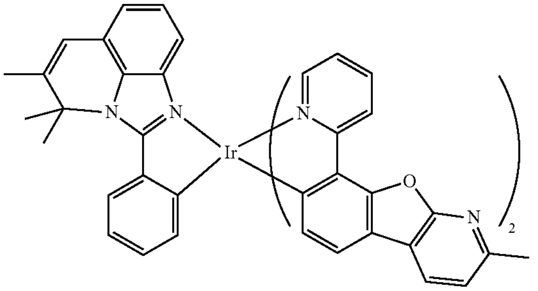
CPD 291
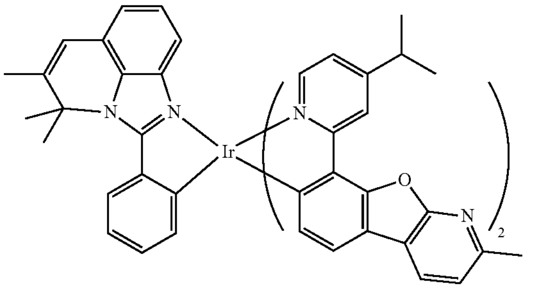
-continued
CPD 292
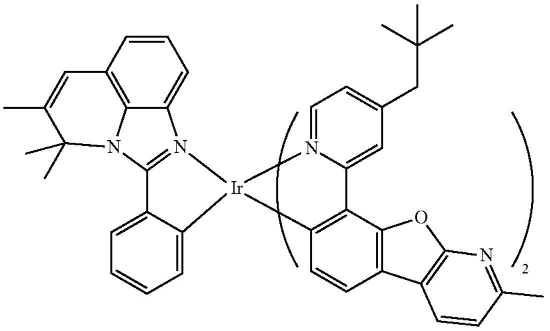
CPD 293
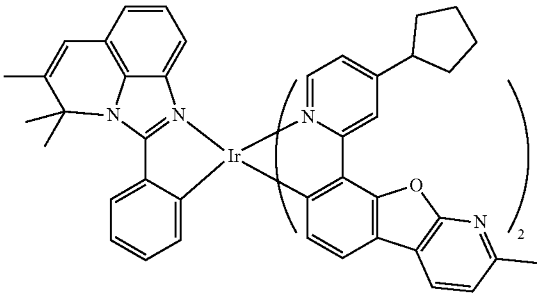
CPD 294
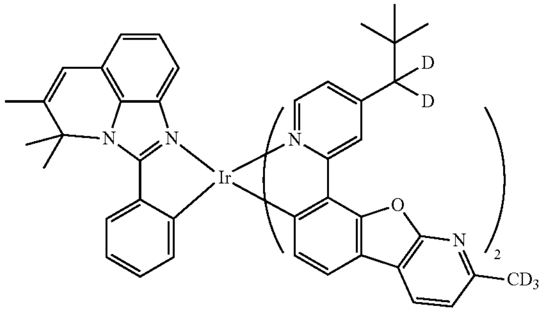
CPD 295
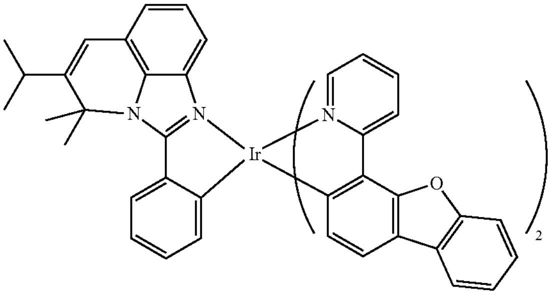
CPD 296
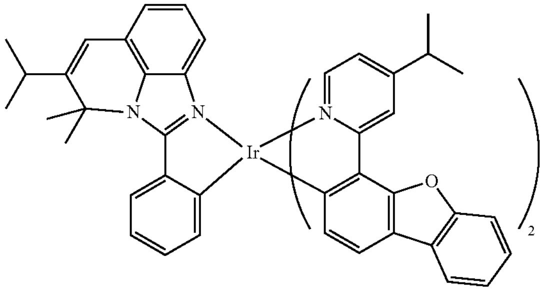

-continued
CPD 297
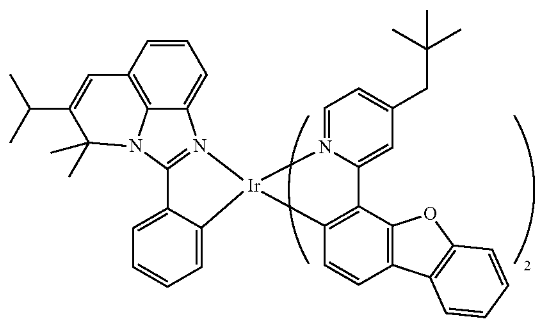
CPD 298
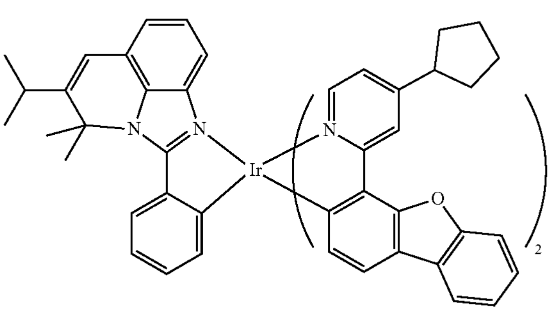
CPD 299
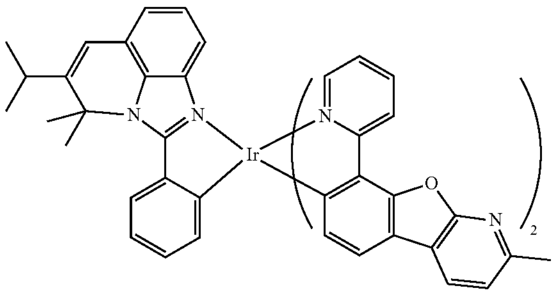
CPD 300
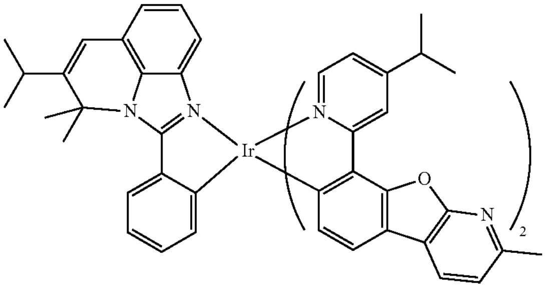
CPD 301
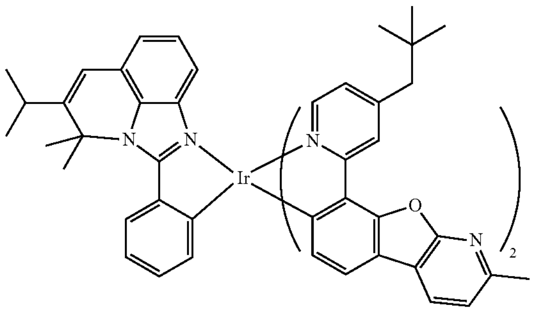
-continued
CPD 302
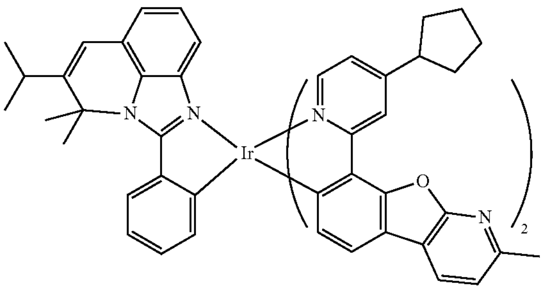
CPD 303
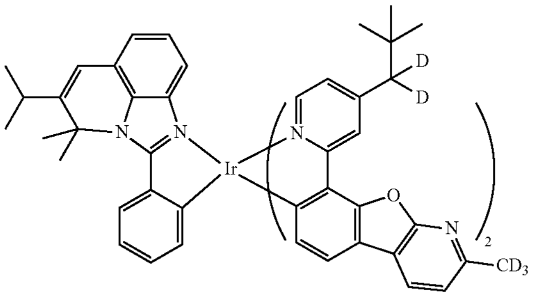
CPD 304
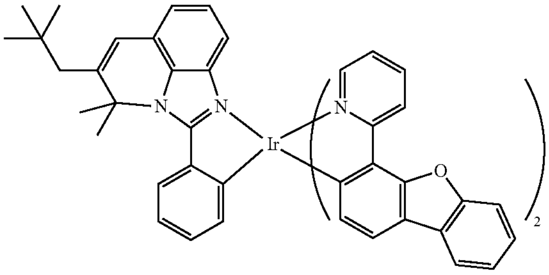
CPD 305
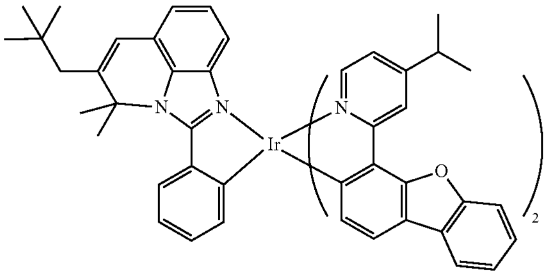
CPD 306
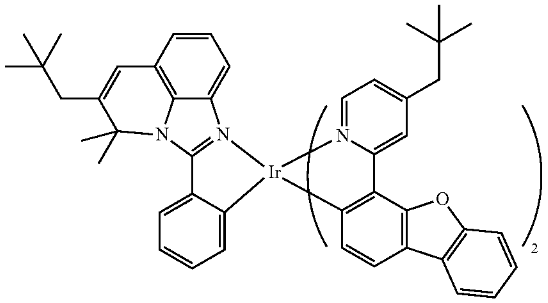

-continued
CPD 307
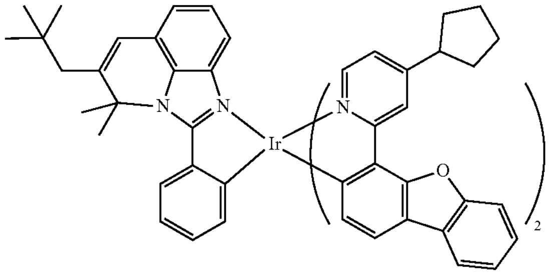
CPD 308
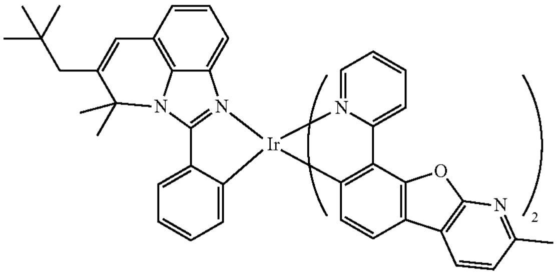
CPD 309
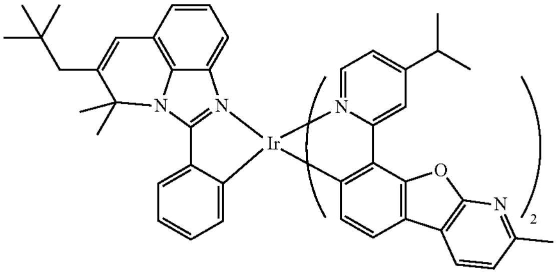
CPD 310
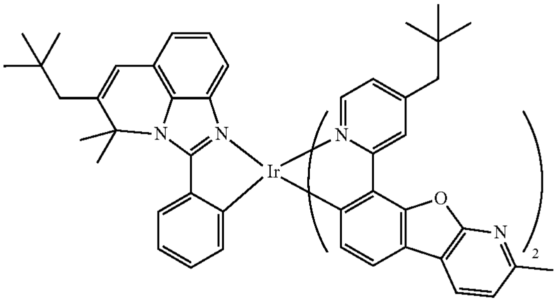
CPD 311
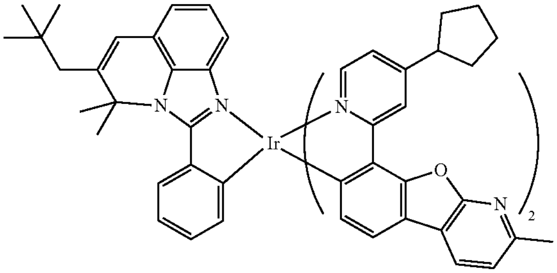
-continued
CPD 312
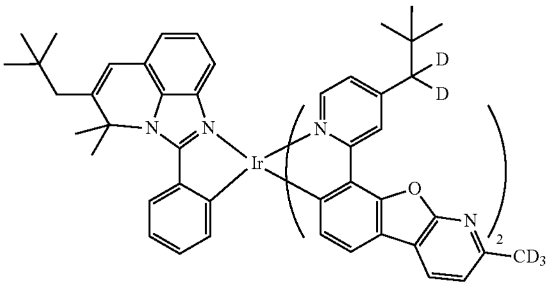
CPD 313
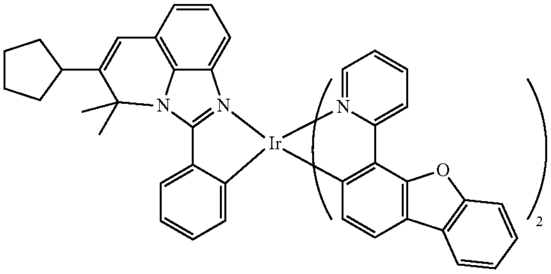
CPD 314
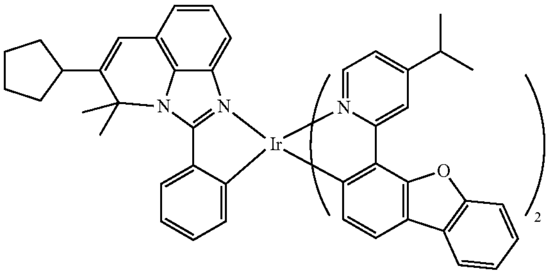
CPD 315
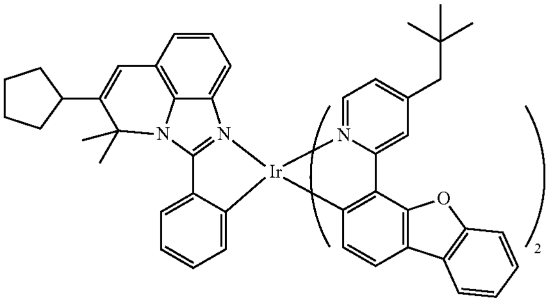
CPD 316
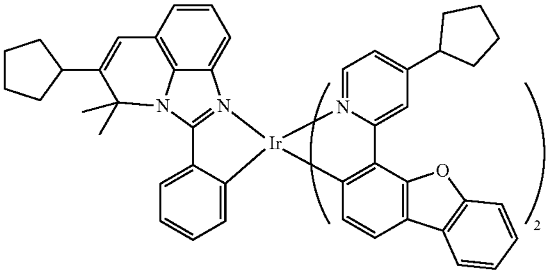

-continued
CPD 317
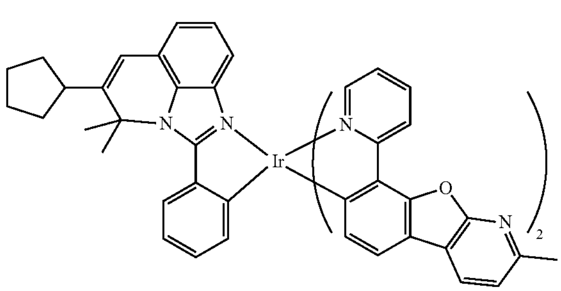
CPD 318
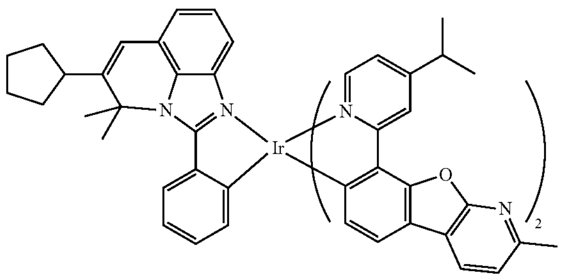
CPD 319
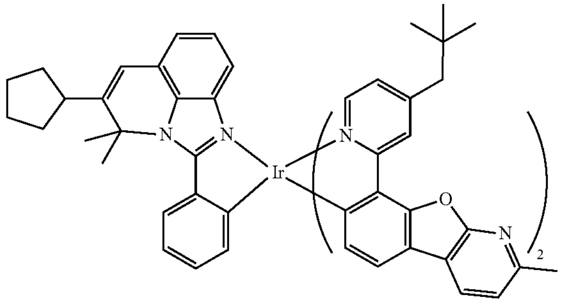
CPD 320
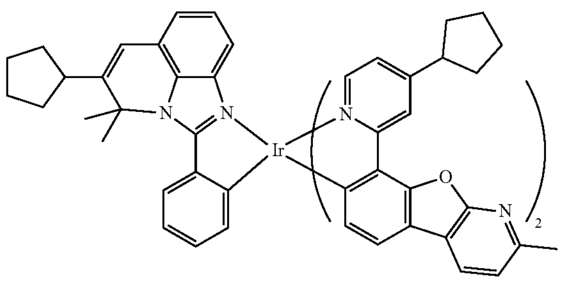
CPD 321
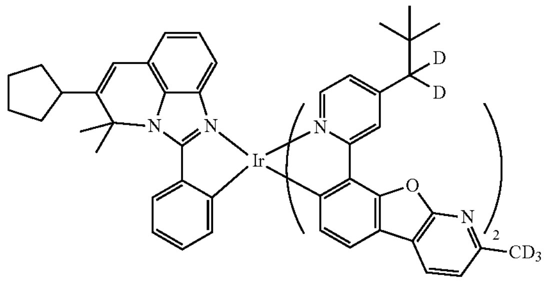
-continued
CPD 322
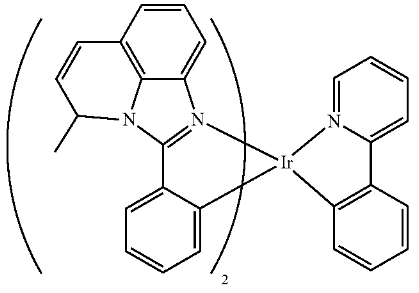
CPD 323
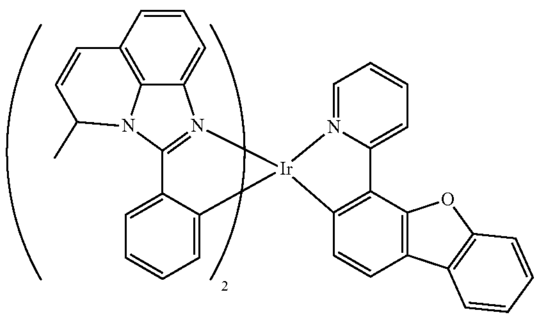
CPD 324
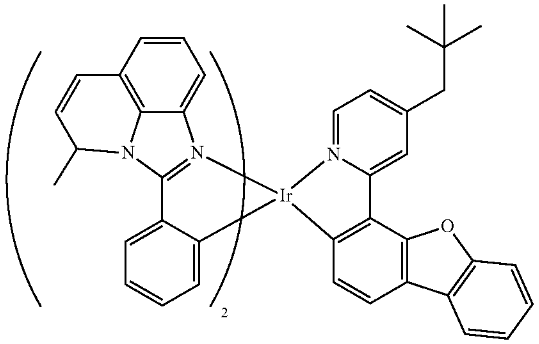
CPD 325
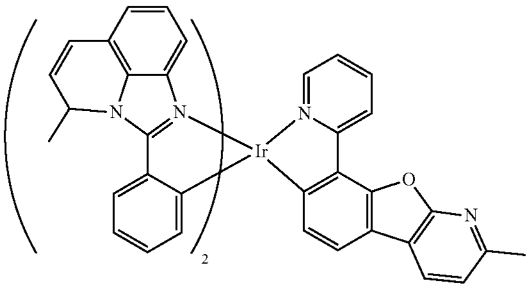
CPD 326
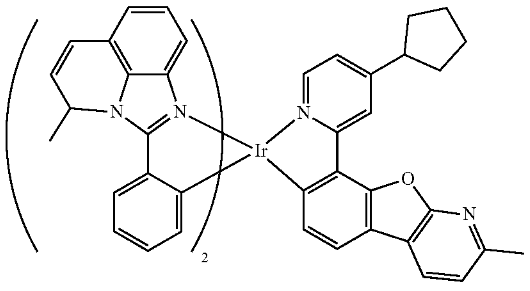

-continued
CPD 327
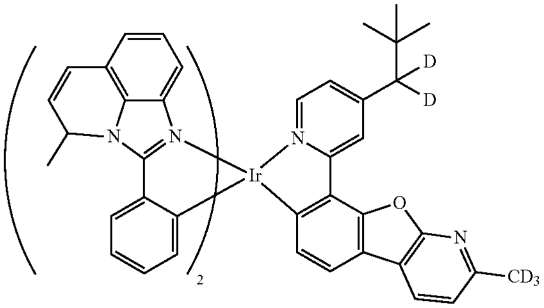
CPD 328
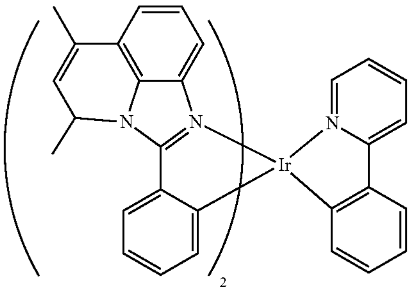
CPD 329
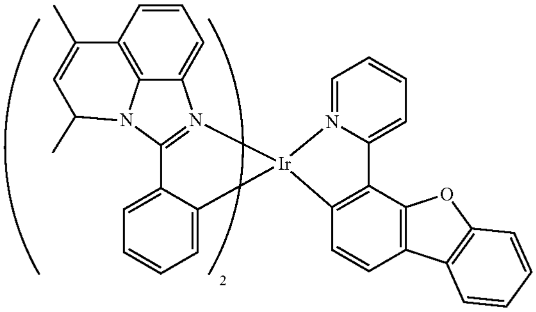
CPD 330
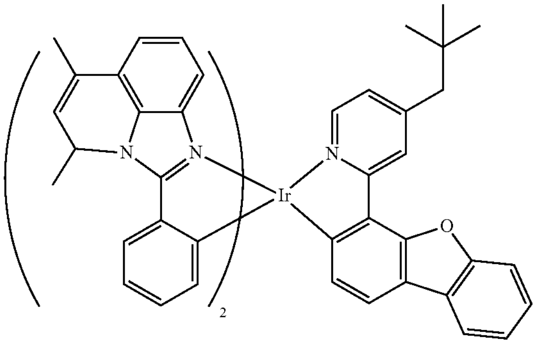
CPD 331
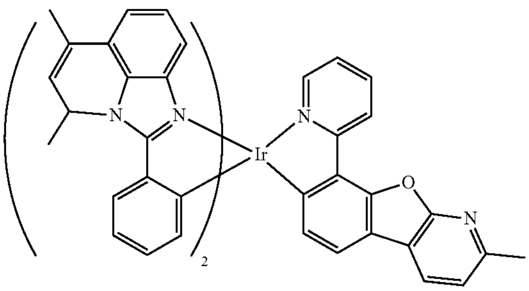
-continued
CPD 332
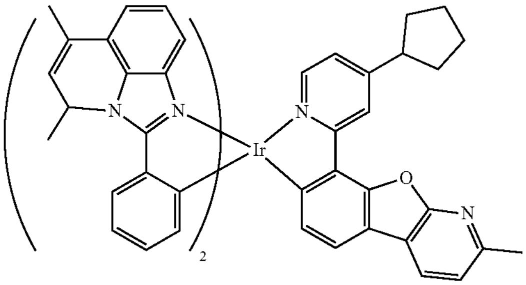
CPD 333
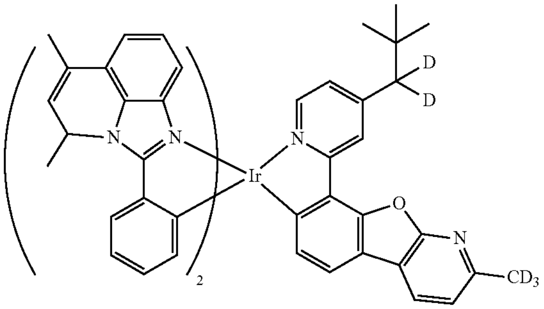
CPD 334
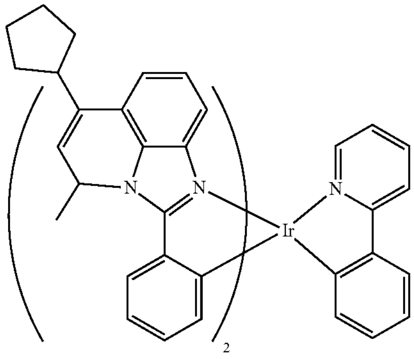
CPD 335
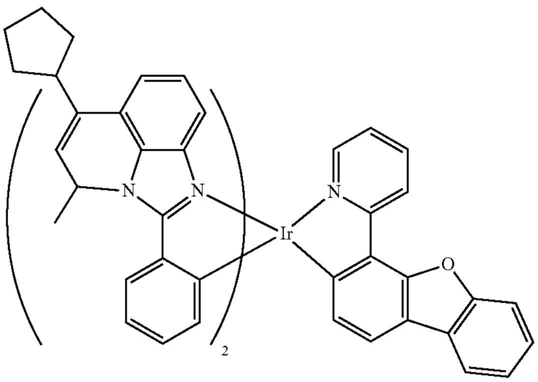

-continued
CPD 336
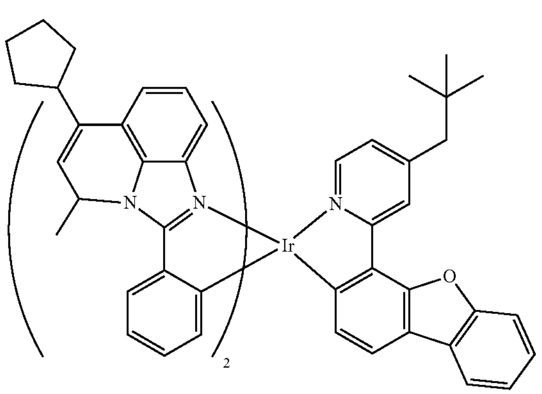
CPD 337
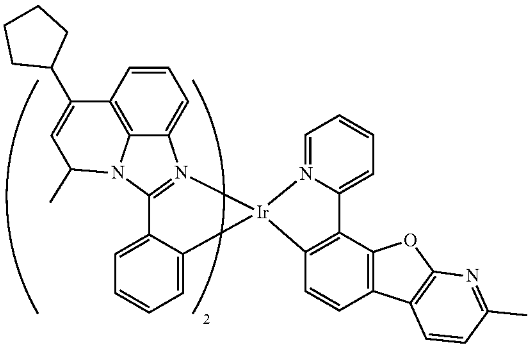
CPD 338
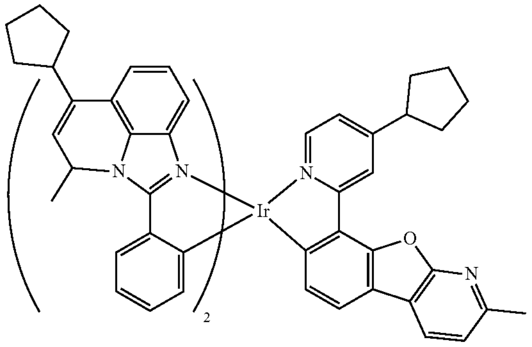
CPD 339
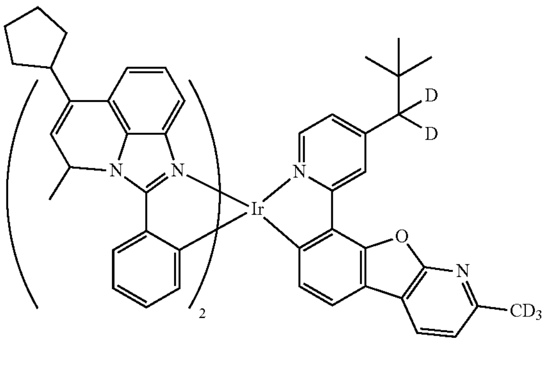
-continued
CPD 340
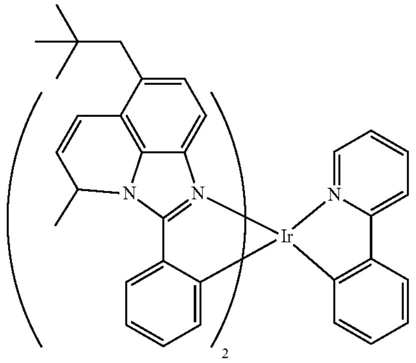
CPD 341
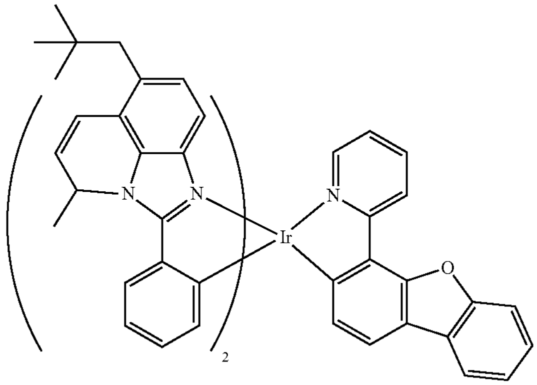
CPD 342
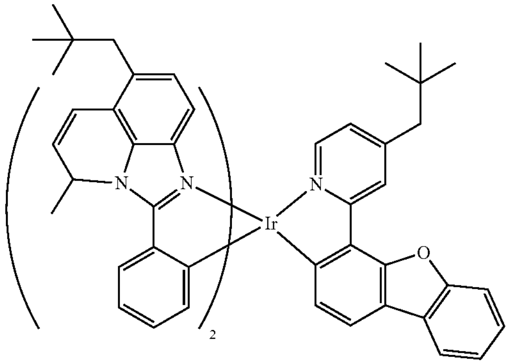
CPD 343
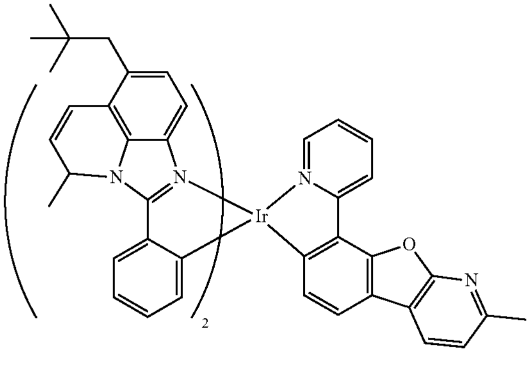

-continued
CPD 344
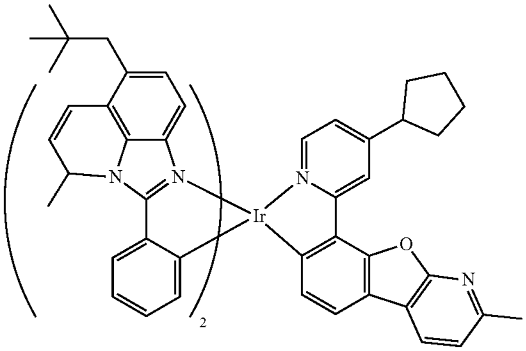
CPD 345
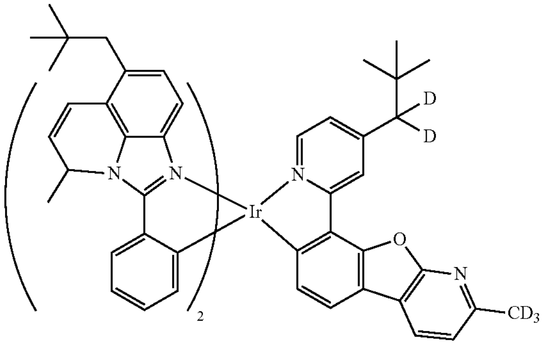
CPD 346
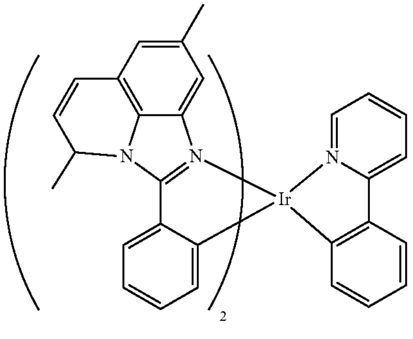
CPD 347
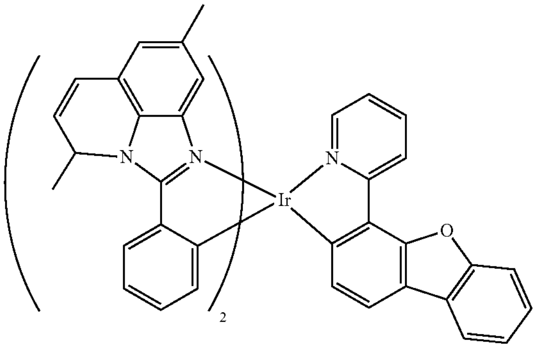
-continued
CPD 348
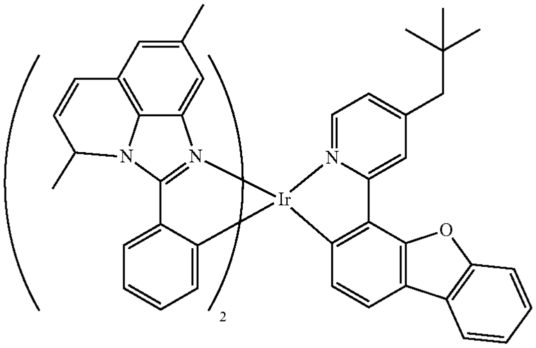
CPD 349
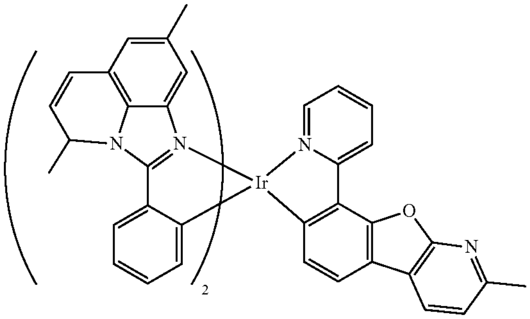
CPD 350
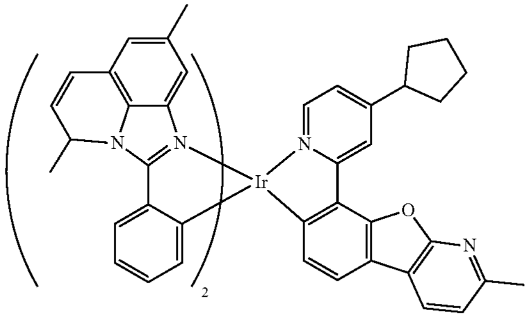
CPD 351
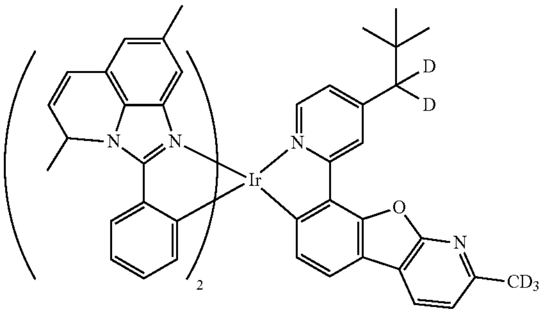

-continued
CPD 352
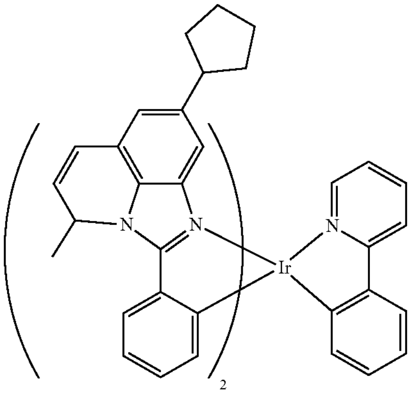
CPD 353
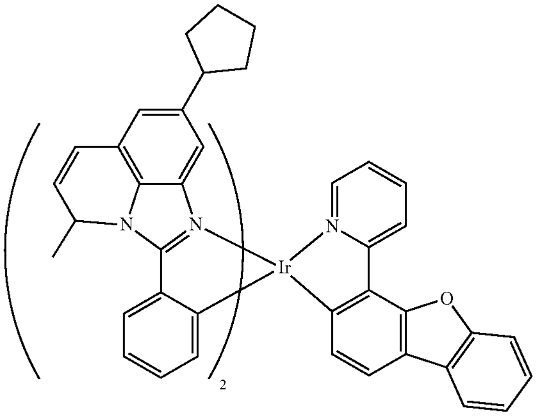
CPD 354
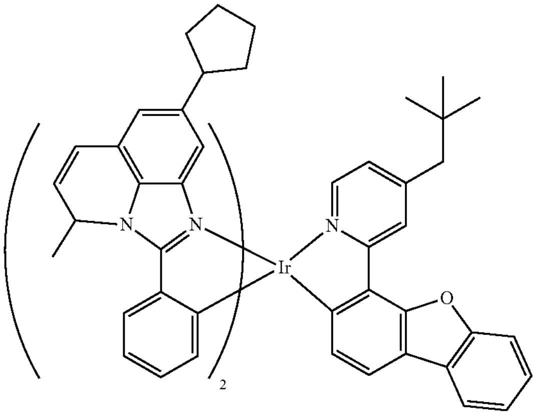
-continued
CPD 355
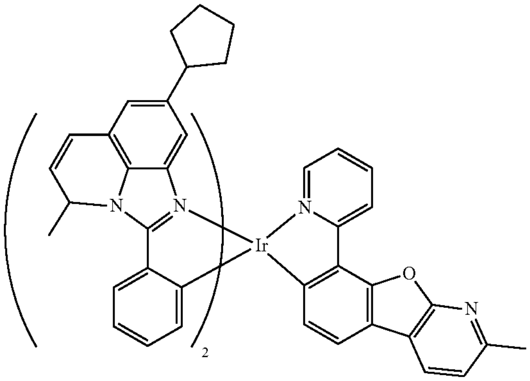
CPD 356
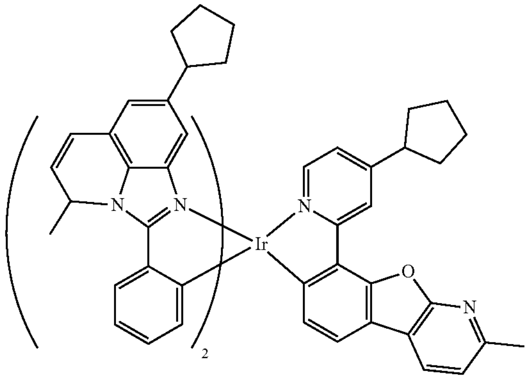
CPD 357
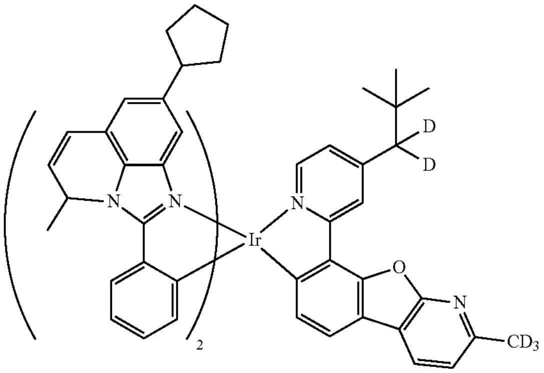
CPD 358
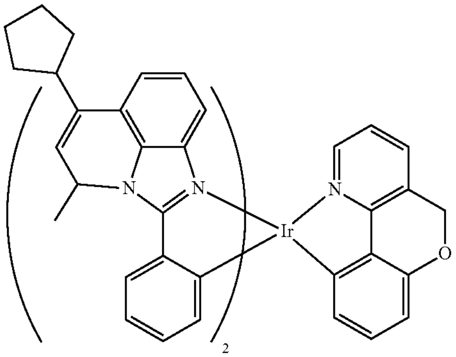

-continued
CPD 359
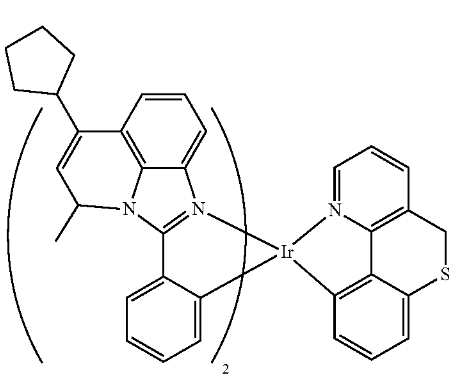
CPD 360
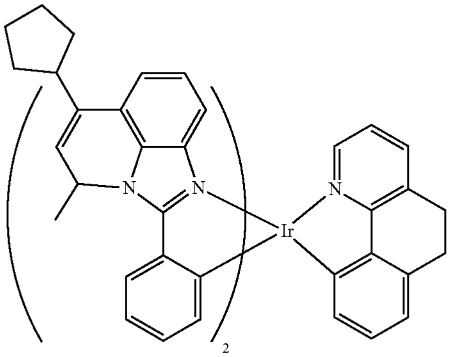
CPD 361
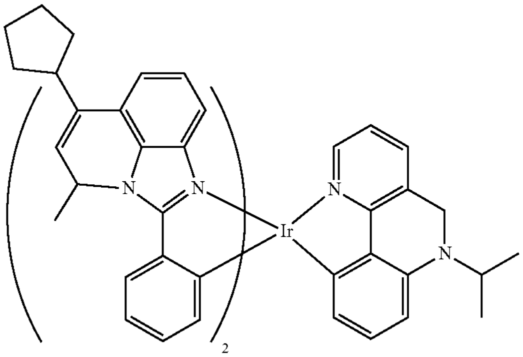
CPD 362
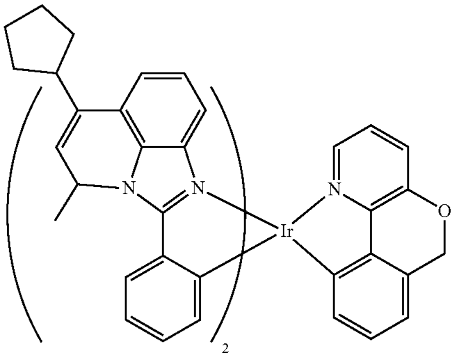
-continued
CPD 363
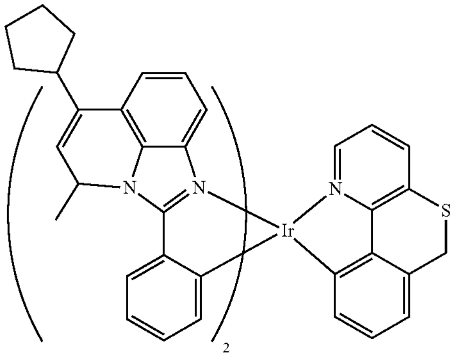
CPD 364
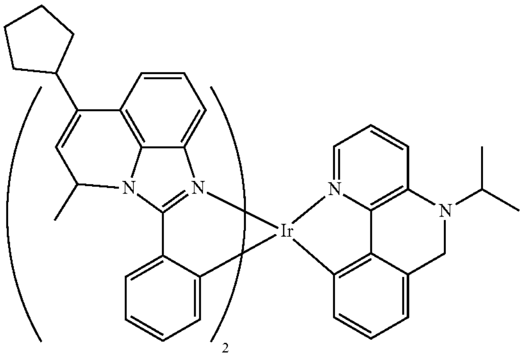
CPD 365
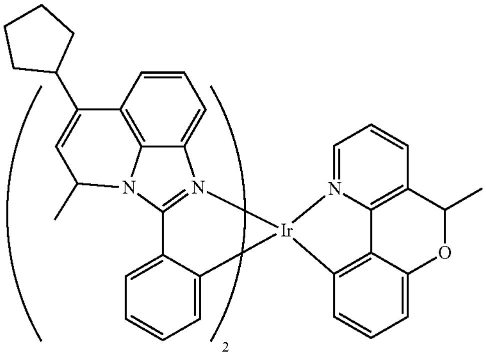
CPD 366
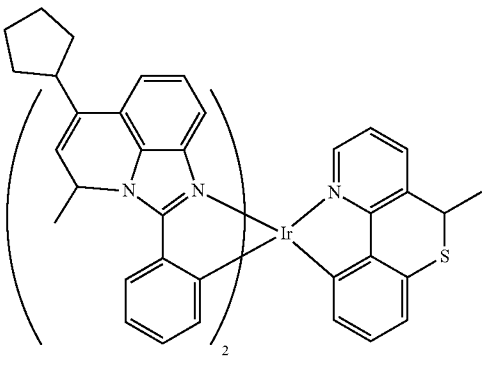

-continued
CPD 367
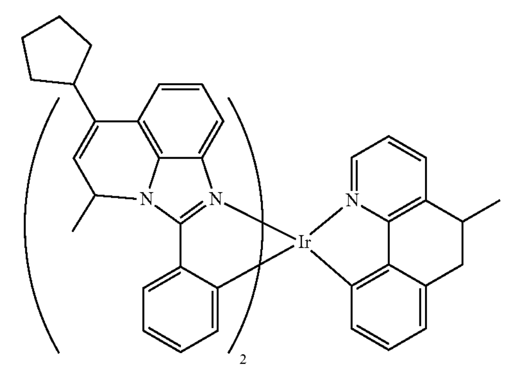
CPD 368
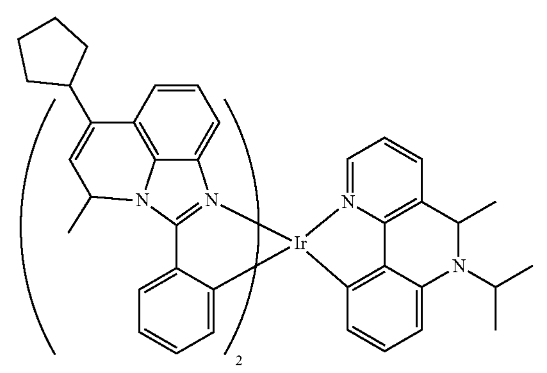
CPD 369
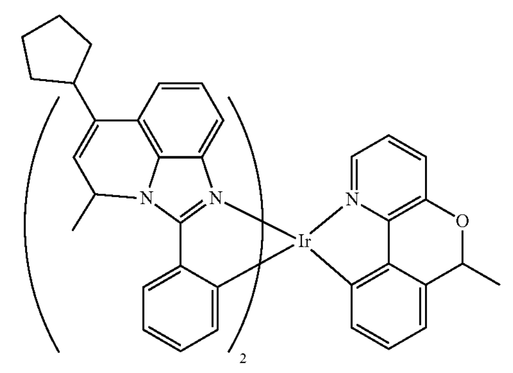
CPD 370
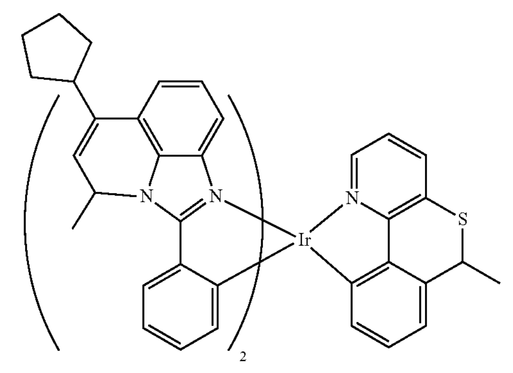
-continued
CPD 371
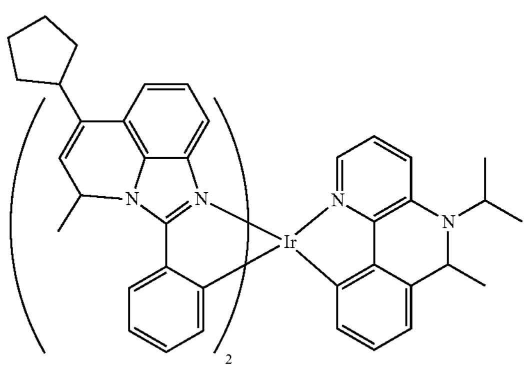
CPD 372
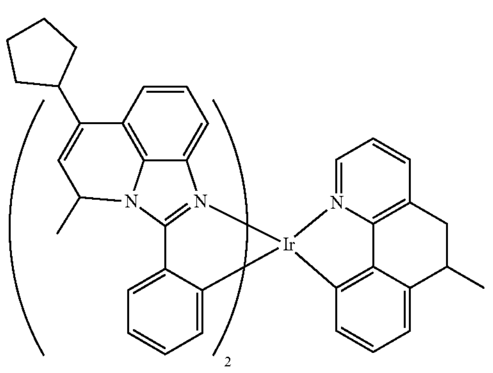
CPD 373
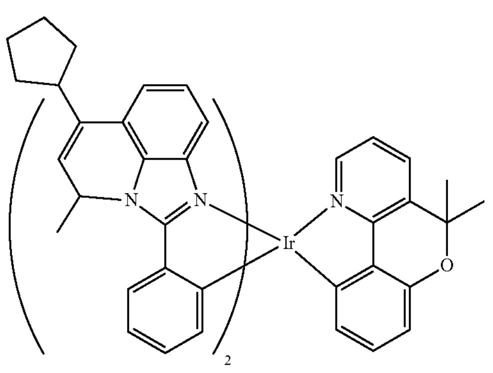
CPD 374
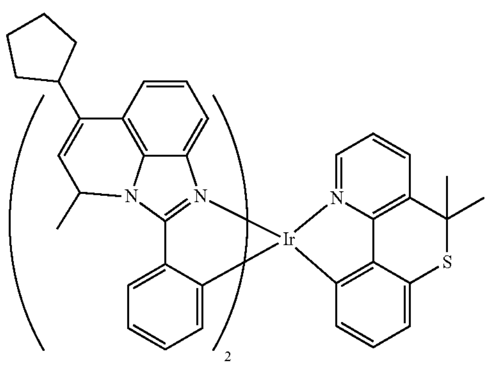

-continued
CPD 375
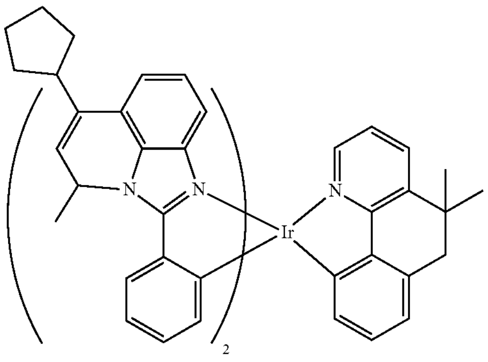
CPD 376
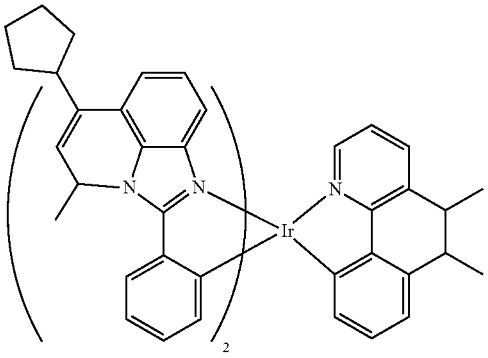
CPD 377
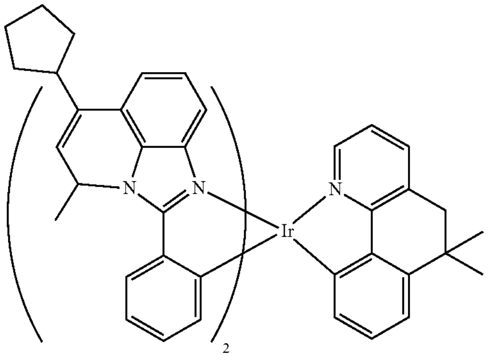
CPD 378
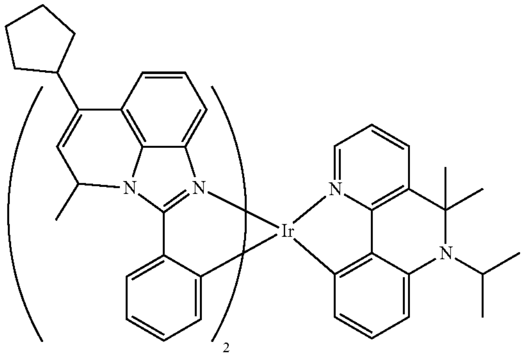
-continued
CPD 379
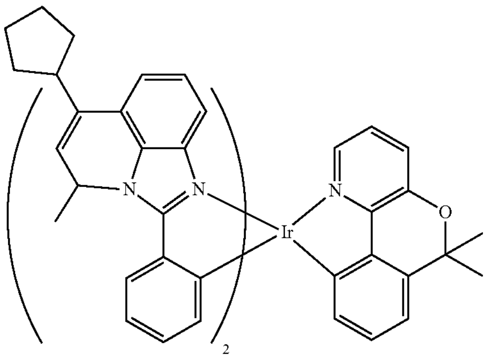
CPD 380
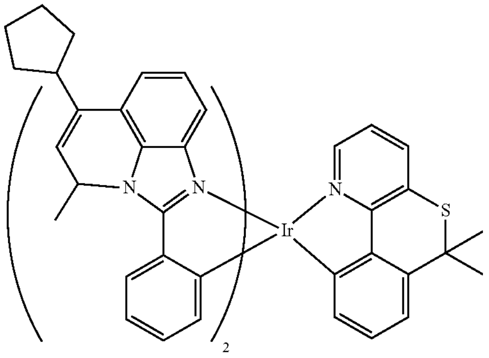
CPD 381
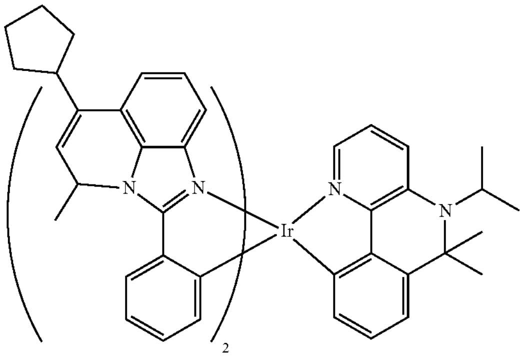
CPD 382
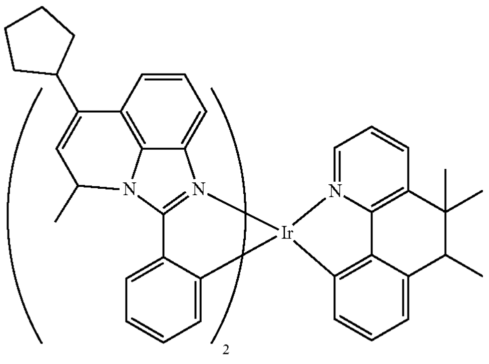

-continued

CPD 383

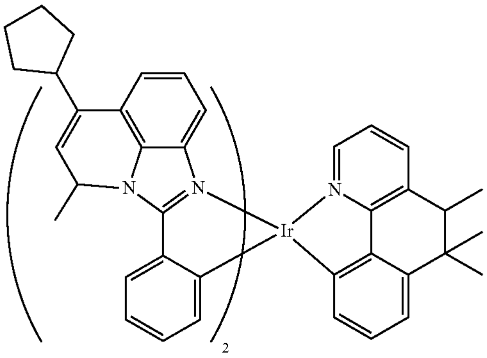

CPD 384

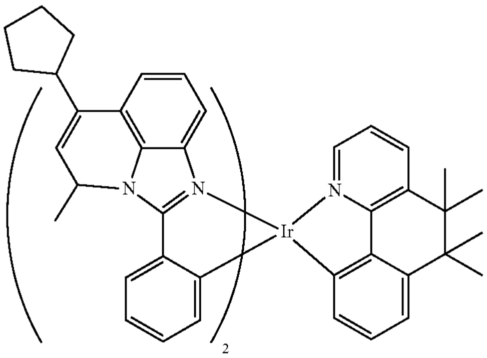

One of objectives of the present invention is to provide an OLED phosphorescent material containing the compound.

One of objectives of the present invention is to provide an OLED containing the compound.

The material of the present invention has the advantages of high optical and electrochemical stability, narrow emission half-peak width, high color saturation, high luminous efficiency, long device service life and the like. As a phosphorescent material, the material of the present invention can convert a triplet state into light, thereby improving the luminous efficiency of organic electroluminescent devices and reducing energy consumption. In particular, the compound has the potential for application in the AMOLED industry as a green light-emitting dopant.

DETAILED DESCRIPTION OF EMBODIMENTS

A compound of the present invention has a structure formula represented by Formula (1):

(1)

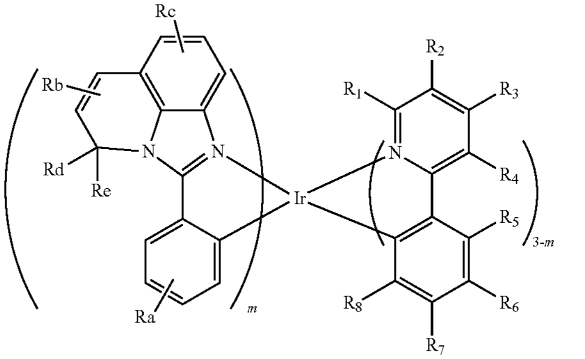

where

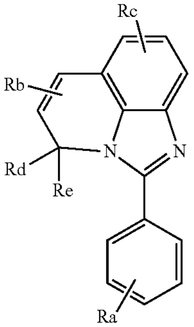

is L1, and

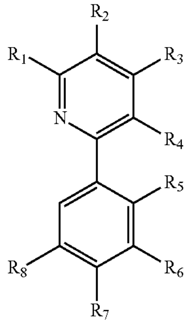

is L2;

m is 1, 2 or 3, two L2 groups may be the same or different when the m is 1, and multiple L1 groups are the same or different when the m is greater than 1;

Ra, Rb and Rc independently indicate no substitution to a maximum substitution possibility;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

at least one of the Rd and the Re is not hydrogen;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

any two adjacent groups of the $R_1$-$R_4$ or $R_5$-$R_8$ may be connected to each other to form an aliphatic ring structure or an aromatic ring structure;

the heteroalkyl is alkyl at least containing one heteroatom such as O, N or S;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

In Formula (1), in a case of 2 or more Ra, Rb or Rc, multiple Ra, Rb or Rc may be the same or different, respectively.

In Formula (1), in a case of 2 or more substituents, multiple substituents may be the same or different, respectively.

In Formula (1), at least one of the Rb and the Rc is deuterium, fluorine, substituted or unsubstituted $C_1$-$C_6$ alkyl, or substituted or unsubstituted $C_3$-$C_6$ cycloalkyl, indicating that the Rb is selected from the above groups while the Rc is not selected from the above groups, the Rc is selected from the above groups while the Rb is not selected from the above groups, or the Rb and the Rc are both selected from the above groups.

Examples of various groups of the compound represented by Formula (1) are described below.

It is to be noted that in the specification, "$C_a$-$C_b$" in the term "substituted or unsubstituted $C_a$-$C_b$ X group" refers to the number of carbons when the X group is unsubstituted, excluding the number of carbons of a substituent when the X group is substituted.

As a linear or branched alkyl, the $C_1$-$C_{10}$ alkyl specifically includes methyl, ethyl, propyl, isopropyl, n-butyl, isobutyl, sec-butyl, tert-butyl, n-pentyl and isomers thereof, n-hexyl and isomers thereof, n-heptyl and isomers thereof, n-octyl and isomers thereof, n-nonyl and isomers thereof, and n-decyl and isomers thereof, optionally includes methyl, ethyl, propyl, isopropyl, n-butyl, isobutyl, sec-butyl, and tert-butyl, and more optionally includes propyl, isopropyl, isobutyl, sec-butyl, and tert-butyl.

The $C_3$-$C_{20}$ cycloalkyl may include cyclopropyl, cyclobutyl, cyclopentyl, cyclohexyl, 1-adamantyl, 2-adamantyl, 1-norbornyl, and 2-norbornyl, and optionally includes cyclopentyl and cyclohexyl.

The $C_2$-$C_{10}$ alkenyl may include vinyl, propenyl, allyl, 1-butadienyl, 2-butadienyl, 1-hexatrienyl, 2-hexatrienyl, and 3-hexatrienyl, and optionally includes propenyl and allyl.

As a linear or branched alkyl or cycloalkyl consisting of atoms other than carbon and hydrogen, the $C_1$-$C_{10}$ heteroalkyl may include mercaptomethyl methyl, methoxymethyl, ethoxymethyl, tert-butoxyl methyl, N,N-dimethyl methyl, epoxy butyl, epoxy pentyl, and epoxy hexyl, and optionally includes methoxymethyl and epoxy pentyl.

Specific examples of the aryl include phenyl, naphthyl, anthracyl, phenanthryl, tetracenyl, pyrenyl, chrysenyl, benzo[c]phenanthryl, benzo[g]chrysenyl, fluorenyl, benzofluorenyl, dibenzofluorenyl, biphenyl, triphenyl, tetraphenyl, and fluoranthracyl, and optionally include phenyl and naphthyl.

Specific examples of the heteroaryl may include pyrrolyl, pyrazinyl, pyridyl, pyrimidinyl, triazinyl, indolyl, isoindolyl, imidazolyl, furyl, benzofuryl, isobenzofuryl, dibenzofuryl, dibenzothienyl, azodibenzofuryl, azodibenzothienyl, diazodibenzofuryl, diazodibenzothienyl, quinolyl, isoquinolyl, quinoxalinyl, carbazolyl, phenanthridinyl, acridinyl, phenanthrolinyl, phenazinyl, phenothiazinyl, phenoxazinyl, oxazolinyl, oxadiazolyl, furzanyl, thienyl, benzothienyl, dihydroacridinyl, azocarbazolyl, diazocarbazolyl, and quinazolinyl, and optionally include pyridyl, pyrimidinyl, triazinyl, dibenzofuryl, dibenzothienyl, azodibenzofuryl, azodibenzothienyl, diazodibenzofuryl, diazodibenzothienyl, carbazolyl, azocarbazolyl, and diazocarbazolyl.

The following embodiments are merely described to facilitate the understanding of the technical invention, and should not be considered as specific limitations of the present invention.

All raw materials, solvents and the like involved in the synthesis of compounds in the present invention are purchased from Alfa, Acros, and other suppliers known to persons skilled in the art.

Synthesis of a Common Intermediate L1

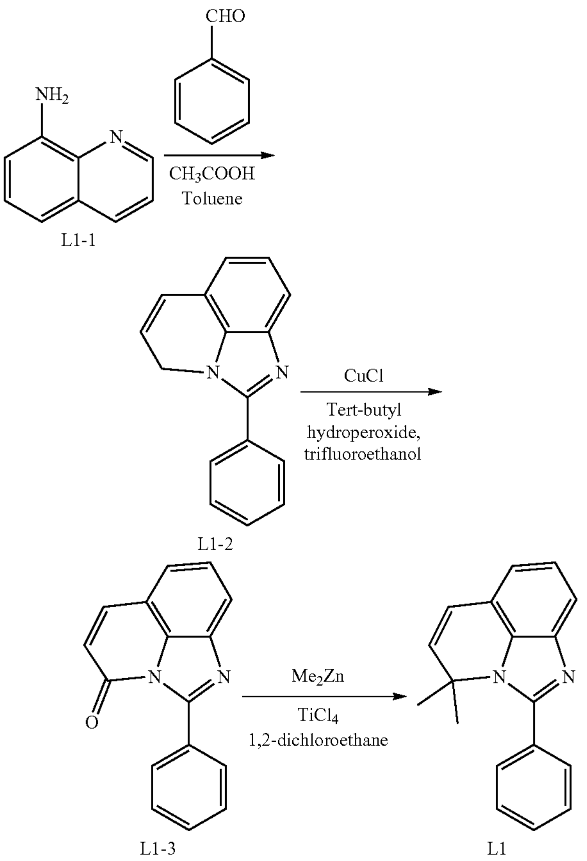

Synthesis of a Compound L1-2

A compound L1-1 (40.0 g, 0.28 mol, 1.0 eq), La001-2 (35.33 g, 0.33 mol, 1.20 eq), acetic acid (25 g, 0.42 mol, 1.5 eq) and toluene (200 ml) were added into a 500 ml three-necked flask, vacuumization was performed for nitrogen replacement for 3 times, and stirring was performed at 110°

C. for reflux for 18 hours under the protection of nitrogen. According to monitoring by thin-layer chromatography (TLC), the raw material L1-1 was completely reacted. Cooling was performed to room temperature, and 120 ml of deionized water was added for water washing and liquid separation. An organic phase on an upper layer was collected, concentrated to remove an organic solvent, spin-dried and separated by column chromatography (with an eluting agent including ethyl acetate and n-hexane at a ratio of 1:20), followed by drying to obtain 40.73 g of a grayish white solid compound L1-2 with a yield of 63.2%. The mass spectrum was: 233.28 (M+H).

Synthesis of a Compound L1-3

The compound L1-2 (30 g, 129.1 mmol, 1.0 eq), cuprous chloride (1.28 g, 12.92 mmol, 0.1 eq), tert-butyl hydroperoxide (23.28 g, 258.3 mmol, 2.0 eq) and trifluoroethanol (300 ml) were sequentially added into a 1 L three-necked flask, vacuumization was performed for nitrogen replacement for 3 times, and the above compounds were heated to about 50° C. in an oil bath and stirred for 6 hours. According to monitoring of a sample by TLC, the raw material L1-2 was basically completely reacted. Cooling was performed to room temperature, and deionized water was added for water washing for 3 times (150 ml/time). Then, liquid separation was performed, and an organic phase was concentrated under reduced pressure to obtain a solid. The crude product was separated by column chromatography (with a mixture of ethyl acetate (EA) and n-hexane (Hex) at a ratio of 1:10), and a resulting product was dried to obtain 19.3 g of a white-like solid compound L1-3 with a yield of 60.8%. The mass spectrum was: 247.2 (M+H).

Synthesis of a Compound L1

The compound L1-3 (15 g, 60.91 mmol, 1.0 eq), dimethyl zinc (17.44 g, 182.7 mmol, 3.0 eq) and 1,2-dichloromethane (300 ml) were sequentially added into a 1 L three-necked flask, vacuumization was performed for nitrogen replacement for 3 times, and the reaction system was cooled to −30° C. Titanium tetrachloride (34.66 g, 182.7 mmol, 3.0 eq) was slowly added dropwise, and after the dropping was completed, the above compounds were stirred at room temperature for 2 hours. According to monitoring of a sample by TLC, the raw material L1-3 was basically completely reacted. Deionized water (200 ml) was slowly added for quenching, and ethyl acetate (350 ml) was added. Then, stirring was performed for extraction and liquid separation, and an organic phase was concentrated under reduced pressure to obtain a solid. The crude product was separated by column chromatography (with a mixture of EA and Hex at a ratio of 1:20), and a resulting product was dried to obtain 12.18 g of a white-like solid compound L1 with a yield of 76.8%. The mass spectrum was: 261.3 (M+H).

Synthesis of a Compound CPD 1

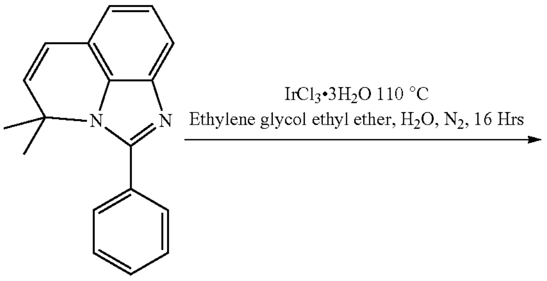

L1

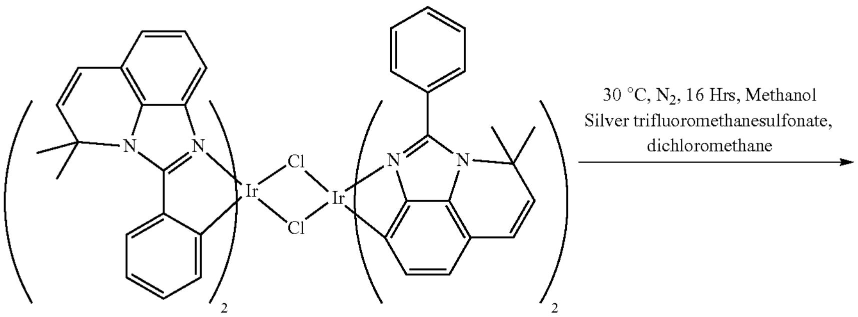

CPD 1-1

-continued

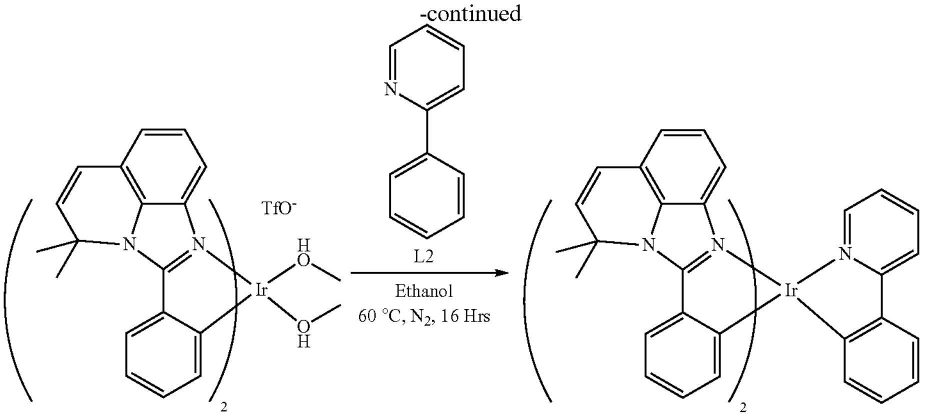

CPD 1-2 CPD 1

Synthesis of a Compound CPD 1-1

The compound L1 (27.0 g, 103.7 mmol, 3.0 eq) and $IrCl_3 \cdot 3H_2O$ (12.19 g, 34.57 mol, 1.0 eq) were added into a 1 L one-necked flask, ethylene glycol ethyl ether (270 ml) and deionized water (90 ml) were added, vacuumization was performed for replacement for 3 times, and a mixture was stirred at 110° C. for reflux for 16 hours under the protection of $N_2$. After cooling was performed to room temperature, filtration was performed. A filter reside was sequentially washed with methanol (100 ml*3) and n-hexane (100 ml*3) and then dried to obtain 22.86 g of a compound CPD 1-1 with a yield of 88.6%. The obtained compound was directly used in the next step without purification.

Synthesis of a Compound CPD 1-2

The dimer CPD 1-1 (20.0 g, 26.8 mmol, 1.0 eq) and dichloromethane (1.5 L) were added into a 3 L three-necked flask and stirred for dissolution. Silver trifluoromethanesulfonate (13.77 g, 53.6 mmol, 2.0 eq) was dissolved in methanol (1.2 L) and then added into the original reaction solution flask, vacuumization was performed for replacement for 3 times, and a mixture was stirred at room temperature for 16 hours under the protection of $N_2$. Then, a reaction solution was filtered with diatomite. A filter residue was rinsed with dichloromethane (150 ml), and a filtrate was spin-dried to obtain 13.69 g of a compound CPD 1-2 with a yield of 80.5%. The obtained compound was directly used in the next step without purification.

Synthesis of a Compound CPD 1

The compound CPD 1-2 (7.5 g, 8.12 mmol, 1.0 eq) and L2 (2.52 g, 16.23 mmol, 2.0 eq) were added into a 250 ml three-necked flask, ethanol (75 ml) was added, vacuumization was performed for replacement for 3 times, and stirring was performed for reflux for 16 hours under the protection of $N_2$. After cooling was performed to room temperature, filtration was performed. A solid was collected, dissolved in dichloromethane (150 ml) and filtered with silica gel. A filter cake was rinsed with dichloromethane (50 ml), and a filtrate was spin-dried and separated by column chromatography (with a developing agent including dichloromethane and n-hexane at a ratio of 1:5) to obtain a crude product. Then, the crude product was recrystallized with tetrahydrofuran/methanol for 2 times (the ratio of the product to the tetrahydrofuran to the methanol was 1:5:5) and beaten with n-hexane (80 ml) for 1 time, followed by drying to obtain 4.62 g of a compound CPD 1 with a yield of 65.8%. 4.62 g of the crude product CPD 1 was sublimated and purified to obtain 2.88 g of sublimated and purified CPD 1 with a yield of 62.33%. The mass spectrum was: 866.06 (M+H). $^1H$ NMR (400 MHz, $CDCl_3$) δ 8.37 (d, 1H), 8.16 (d, 1H), 7.77 (m, 3H), 7.56-7.34 (m, 9H), 7.22-7.02 (m, 5H), 6.90 (m, 3H), 6.50 (d, 2H), 5.76 (d, 2H), 1.75 (s, 12H).

Synthesis of a Compound CPD 6

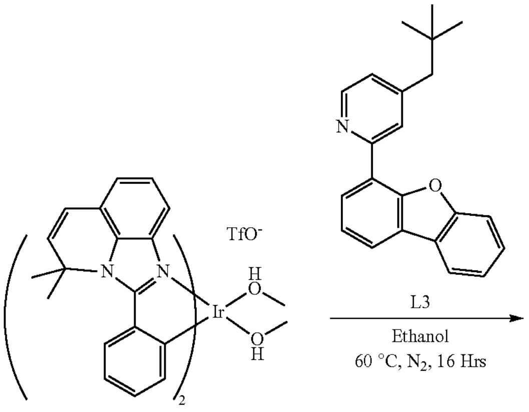

CPD 1-2

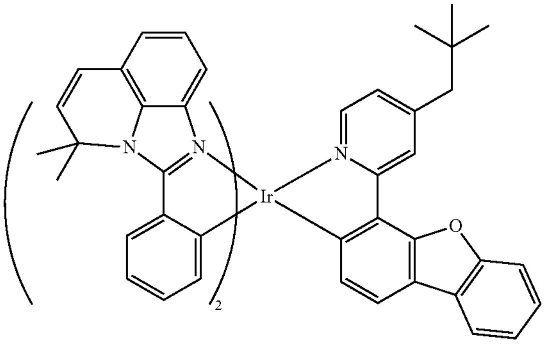

CPD 6

With reference to synthesis and purification methods of the compound CPD 1, only the corresponding raw materials were required to be changed, and 5.11 g of a target compound CPD 6 with a yield of 63.8% was obtained. 5.11 g of the crude product CPD 6 was sublimated and purified to obtain 3.24 g of sublimated and purified CPD 6 with a yield of 63.4%. The mass spectrum was: 1026.27 (M+H). $^1H$ NMR (400 MHz, DMSO) δ 8.50 (d, 1H), 7.98 (d, 1H), 7.87-7.66 (m, 4H), 7.58-7.27 (m, 9H), 7.22-7.01 (m, 6H), 6.52 (m, 4H), 5.76 (m, 2H), 3.21 (s, 2H), 1.75 (s, 12H), 0.85 (s, 9H).

Synthesis of a Compound CPD 12

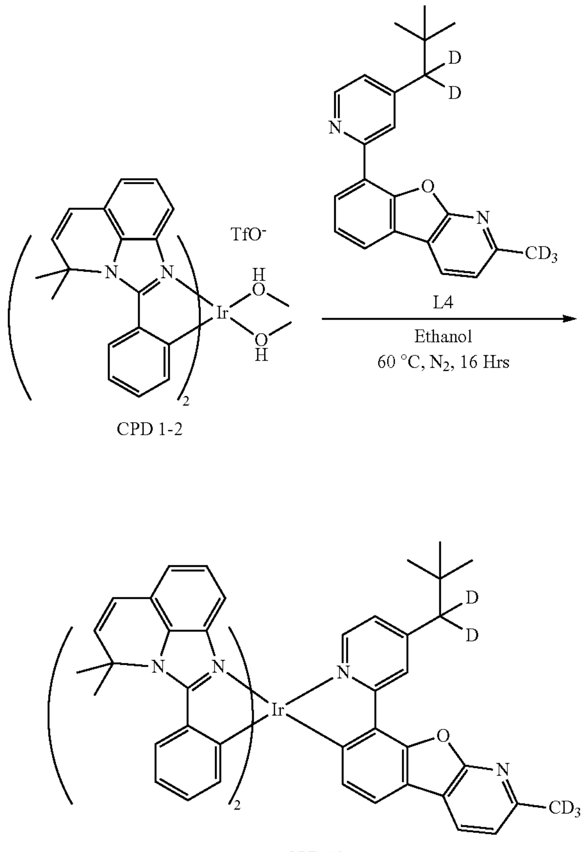

CPD 1-2

L4

CPD 12

With reference to synthesis and purification methods of the compound CPD 1, only the corresponding raw materials were required to be changed, and 3.66 g of a target compound CPD 12 with a yield of 48.3% was obtained. 3.66 g of the crude product CPD 12 was sublimated and purified to obtain 2.12 g of sublimated and purified CPD 12 with a yield of 65.43%. The mass spectrum was: 1046.31 (M+H). $^{1}H$ NMR (400 MHz, DMSO) δ 8.49 (d, J=5.0 Hz, 2H), 7.88-7.66 (m, 4H), 7.46 (m, 9H), 7.21-6.98 (m, 6H), 6.61 (d, 2H), 5.76 (s, 2H), 1.76 (s, 12H), 1.01 (s, 9H).

Synthesis of a Common Intermediate L5

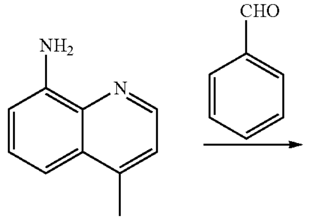

L5-1

-continued

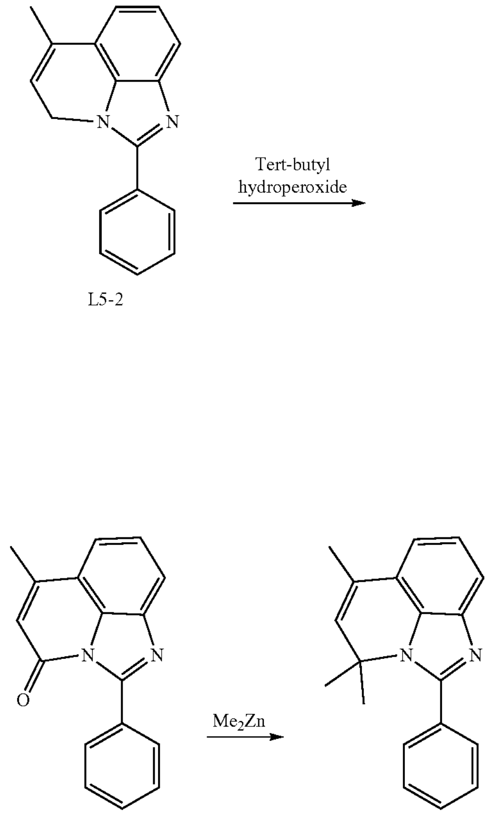

L5-2

L5-3

L5

Synthesis of a Compound L5-2

With reference to synthesis and purification methods of the compound L1-2, only the corresponding raw materials were required to be changed, and 16.3 g of a target compound L5-2 with a yield of 63.5% was obtained. The mass spectrum was: 247.3 (M+H).

Synthesis of a Compound L5-3

With reference to synthesis and purification methods of the compound L1-3, only the corresponding raw materials were required to be changed, and 11.8 g of a target compound L5-3 with a yield of 53.8% was obtained. The mass spectrum was: 261.2 (M+H).

Synthesis of a Compound L5

With reference to synthesis and purification methods of the compound L1, only the corresponding raw materials were required to be changed, and 9.8 g of a target compound L5 with a yield of 67.9% was obtained. The mass spectrum was: 275.3 (M+H).

Synthesis of a Compound CPD 19

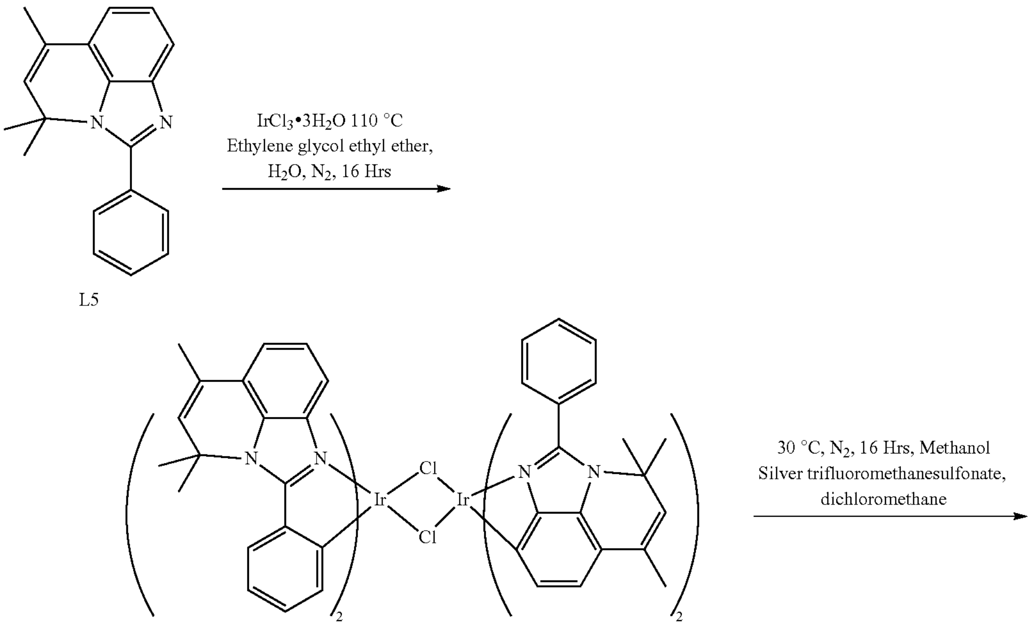

L5

CPD 19-1

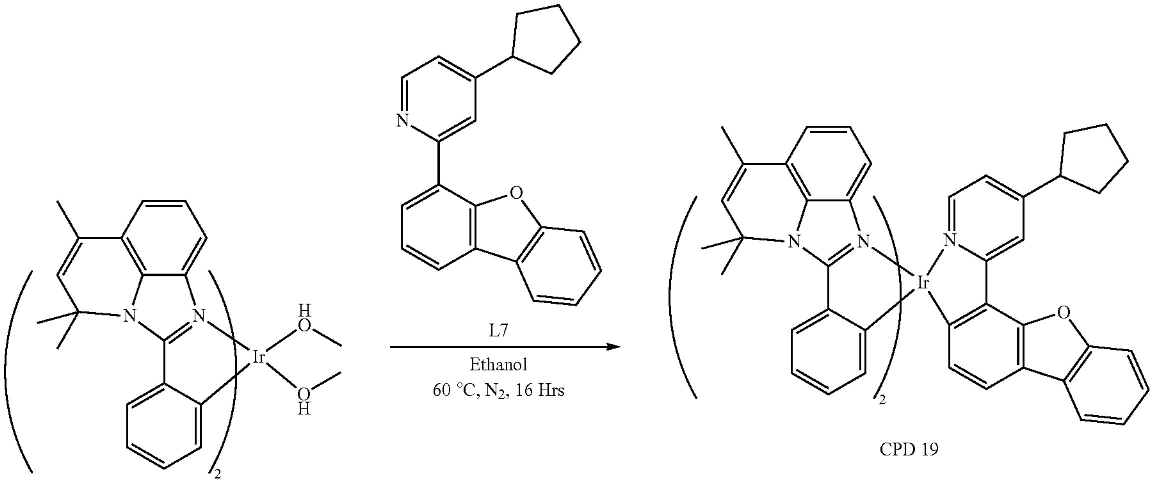

L7

CPD 19-2

CPD 19

Synthesis of a Compound CPD 19-1

With reference to synthesis and purification methods of the compound CPD 1-1, only the corresponding raw materials were required to be changed, and an obtained compound was directly used in the next step without purification.

Synthesis of a Compound CPD 19-2

With reference to synthesis and purification methods of the compound CPD 1-2, only the corresponding raw materials were required to be changed, and an obtained compound was directly used in the next step without purification.

Synthesis of a Compound CPD 19

With reference to synthesis and purification methods of the compound CPD 1, only the corresponding raw materials were required to be changed, and 3.77 g of a target compound CPD 19 with a yield of 56.8% was obtained. 3.77 g of the crude product CPD 19 was sublimated and purified to obtain 2.45 g of sublimated and purified CPD 19 with a yield of 64.98%. The mass spectrum was: 1052.3 (M+H). $^1H$ NMR (400 MHz, $CDCl_3$) δ 8.52 (d, 1H), 7.98 (d, 1H), 7.87-7.66 (m, 6H), 7.58-7.27 (m, 9H), 7.17 (d, 3H), 7.06 (d, J=10.0 Hz, 3H), 5.54 (s, 2H), 2.97 (m, 1H), 1.99 (d, J=23.0 Hz, 8H), 1.85-1.58 (m, 18H).

Synthesis of a Common Intermediate L8

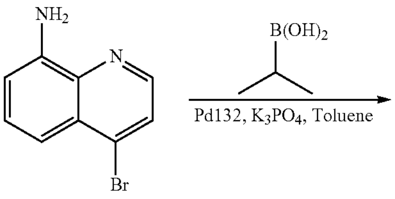

L8-1

-continued

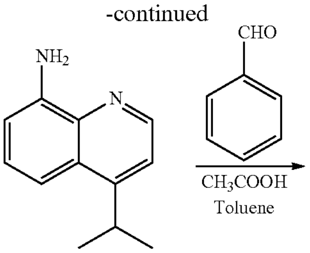

L8-2

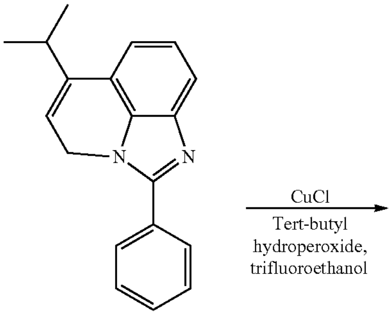

L8-3

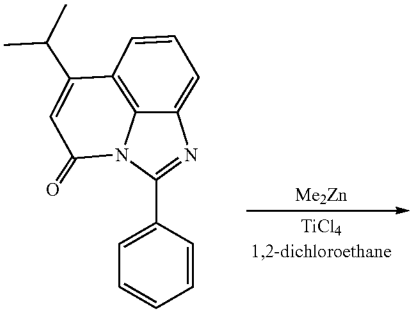

L8-4

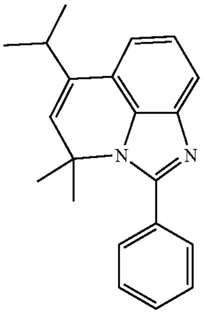

L8

Synthesis of a Compound L8-2

A compound L8-1 (22 g, 98.62 mmol, 1.0 eq), isopropylboronic acid (10.4 g, 118.35 mmol, 1.2 eq), bis(di-tert-butyl (4-dimethylaminophenyl)phosphine)dichloropalladium (II) (1.4 g, 1.97 mmol, 0.02 eq), $K_3PO_4$ (41.87 g, 197.25 mmol, 2.0 eq) and toluene (220 ml) were sequentially added into a 500 ml three-necked flask, vacuumization was performed for nitrogen replacement for 3 times, and the above compounds were heated to about 70° C. in an oil bath and stirred for 16 hours. According to monitoring of a sample by TLC, the raw material L8-1 was basically completely reacted. Cooling was performed to room temperature, and deionized water was added for water washing for 3 times (120 ml/time). Then, liquid separation was performed, and an organic phase was concentrated under reduced pressure to obtain a solid. The crude product was separated by column chromatography (with a mixture of EA and Hex at a ratio of 1:20), and a resulting product was dried to obtain 14.83 g of a white-like solid compound L8-2 with a yield of 78.3%. The mass spectrum was: 187.25 (M+H).

Synthesis of a Compound L8-3

With reference to synthesis and purification methods of the compound L1-2, only the corresponding raw materials were required to be changed, and 17.1 g of a target compound L8-3 with a yield of 57.7% was obtained. The mass spectrum was: 275.3 (M+H).

Synthesis of a Compound L8-4

With reference to synthesis and purification methods of the compound L1-3, only the corresponding raw materials were required to be changed, and 13.4 g of a target compound L8-4 with a yield of 50.7% was obtained. The mass spectrum was: 289.3 (M+H).

Synthesis of a Compound L8

With reference to synthesis and purification methods of the compound L1, only the corresponding raw materials were required to be changed, and 8.7 g of a target compound L8 with a yield of 63.9% was obtained. The mass spectrum was: 303.4 (M+H).

Synthesis of a Compound CPD 34

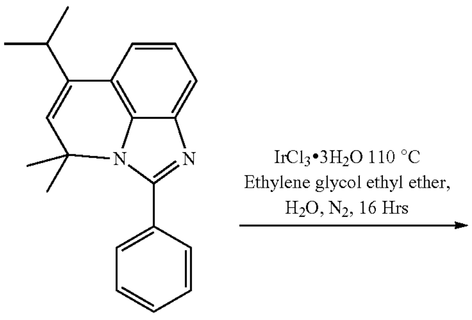

L8

-continued

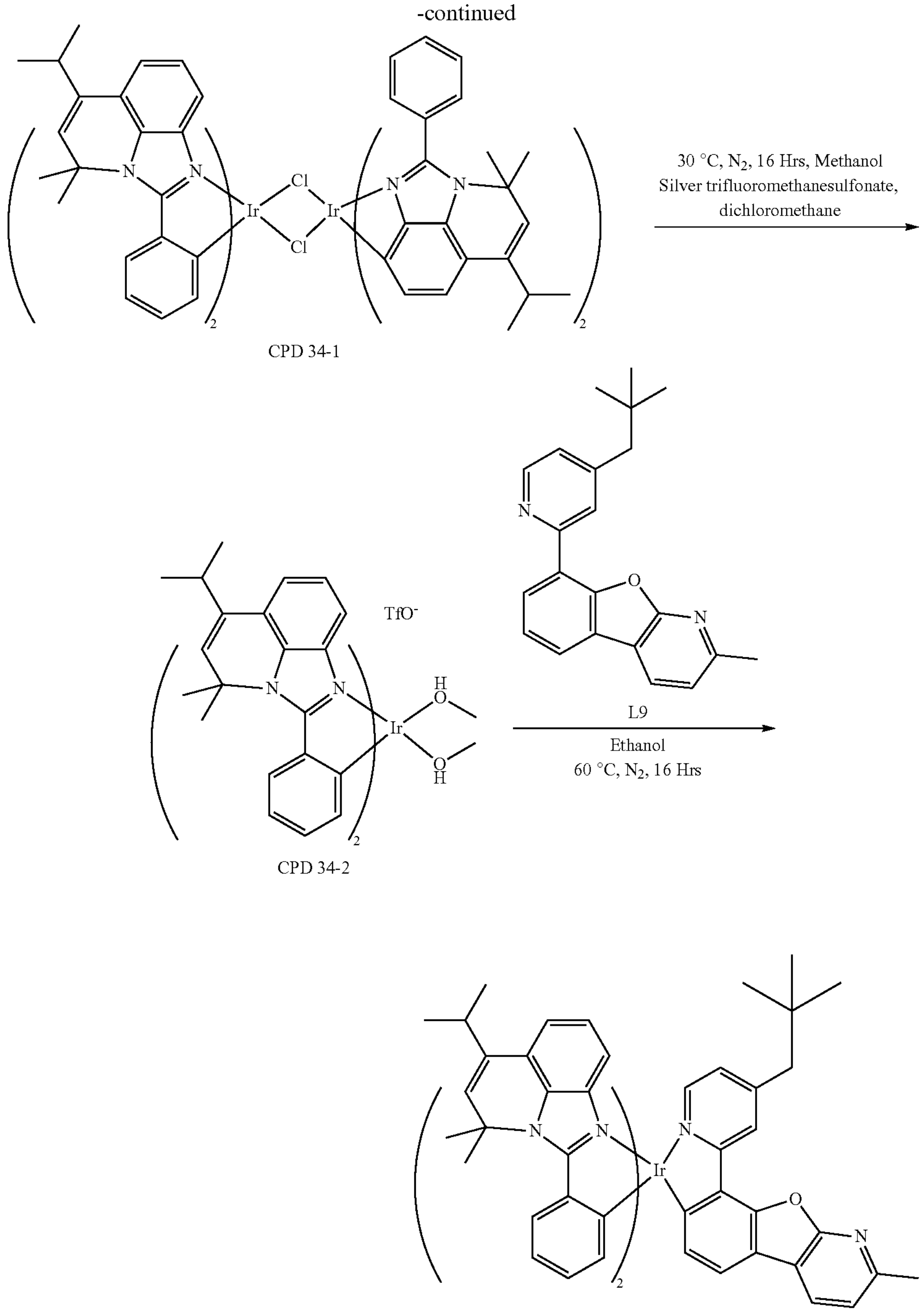

CPD 34-1

CPD 34-2

CPD 34

Synthesis of a Compound CPD 34-1

With reference to synthesis and purification methods of the compound CPD 1-1, only the corresponding raw materials were required to be changed, and an obtained compound was directly used in the next step without purification.

Synthesis of a Compound CPD 34-2

With reference to synthesis and purification methods of the compound CPD 1-2, only the corresponding raw materials were required to be changed, and an obtained compound was directly used in the next step without purification.

Synthesis of a Compound CPD 34

With reference to synthesis and purification methods of the compound CPD 1, only the corresponding raw materials were required to be changed, and 3.05 g of a target compound CPD 34 with a yield of 47.6% was obtained. 3.05 g of the crude product CPD 34 was sublimated and purified to obtain 1.87 g of sublimated and purified CPD 34 with a yield of 61.31%. The mass spectrum was: 1025.44 (M+H). $^1$H NMR (400 MHz, $CDCl_3$) δ 8.47 (d, J=26.0 Hz, 2H), 7.87-7.66 (m, 4H), 7.46 (d, J=40.0 Hz, 6H), 7.22-6.97 (m, 9H), 5.54 (s, 2H), 3.21 (s, 2H), 2.94 (m, 2H), 2.68 (s, 3H), 1.74 (s, 12H), 0.94 (d, J=95.0 Hz, 21H).

Synthesis of a Common Intermediate L10

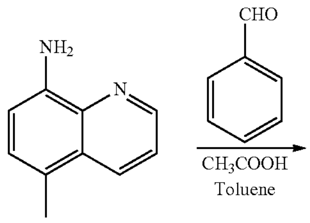

L10-1

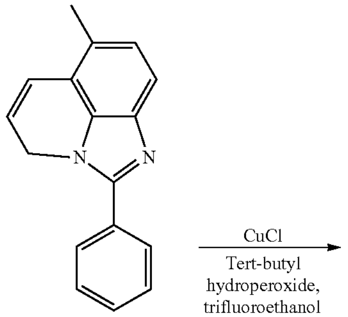

L10-2

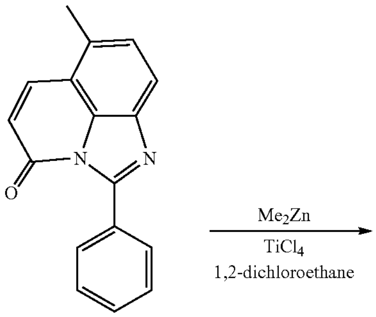

L10-3

-continued

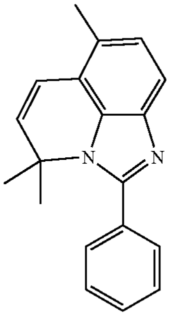

L10

Synthesis of a Compound L10-2

With reference to synthesis and purification methods of the compound L1-2, only the corresponding raw materials were required to be changed, and 13.7 g of a target compound L10-2 with a yield of 69.4% was obtained. The mass spectrum was: 247.3 (M+H).

Synthesis of a Compound L10-3

With reference to synthesis and purification methods of the compound L1-3, only the corresponding raw materials were required to be changed, and 10.7 g of a target compound L10-3 with a yield of 65.2% was obtained. The mass spectrum was: 261.2 (M+H).

Synthesis of a Compound L10

With reference to synthesis and purification methods of the compound L1, only the corresponding raw materials were required to be changed, and 8.64 g of a target compound L10 with a yield of 63.9% was obtained. The mass spectrum was: 275.3 (M+H).

Synthesis of a Compound CPD 50

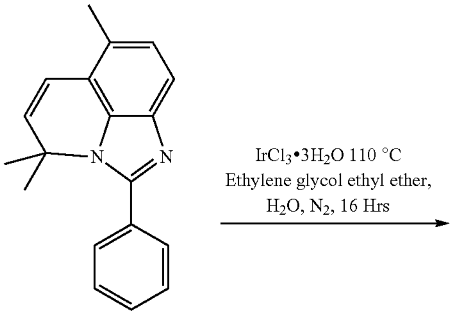

L10

-continued

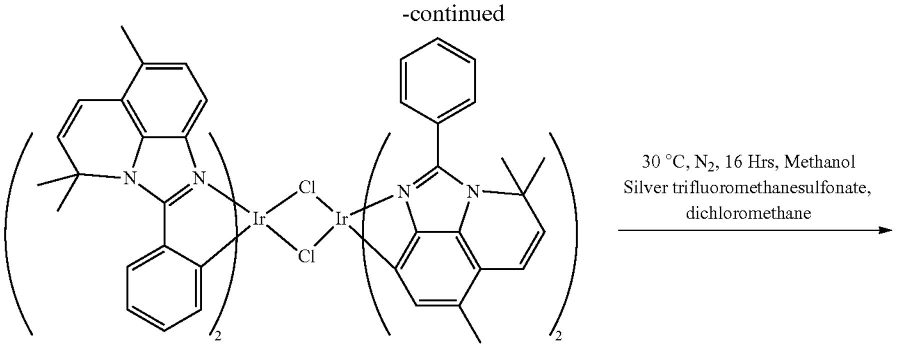

CPD 50-1

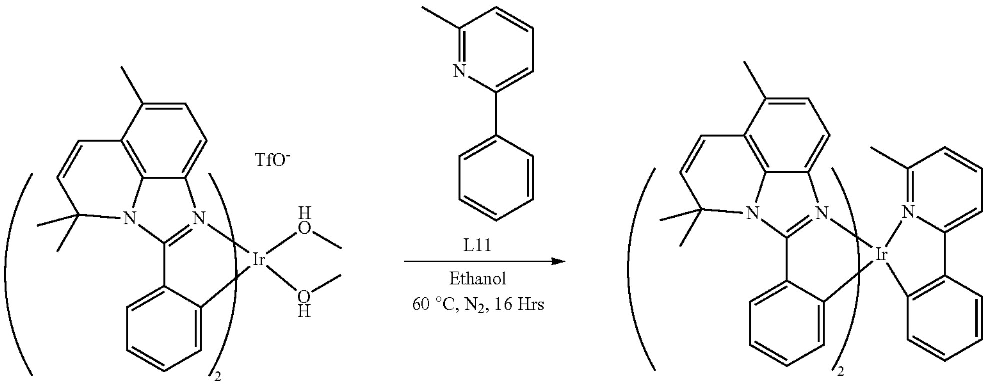

CPD 50-2

CPD 50

Synthesis of a Compound CPD 50-1

With reference to synthesis and purification methods of the compound CPD 1-1, only the corresponding raw materials were required to be changed, and an obtained compound was directly used in the next step without purification.

Synthesis of a Compound CPD 50-2

With reference to synthesis and purification methods of the compound CPD 1-2, only the corresponding raw materials were required to be changed, and an obtained compound was directly used in the next step without purification.

Synthesis of a Compound CPD 50

With reference to synthesis and purification methods of the compound CPD 1, only the corresponding raw materials were required to be changed, and 3.52 g of a target compound CPD 50 with a yield of 50.9% was obtained. 3.52 g of the crude product CPD 50 was sublimated and purified to obtain 2.23 g of sublimated and purified CPD 50 with a yield of 63.35%. The mass spectrum was: 908.13 (M+H). $^1$H NMR (400 MHz, $CDCl_3$) δ 8.46 (m, 1H), 8.21 (m, 2H), 7.78-7.44 (m, 9H), 7.02 (m, 6H), 6.59 (d, J=22.3 Hz, 3H), 5.92 (s, 2H), 2.76 (s, 3H), 2.22 (s, 6H), 1.74 (s, 12H).

Synthesis of a Common Intermediate L12

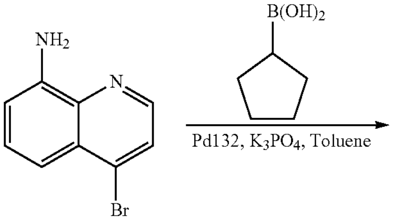

L12-1

-continued

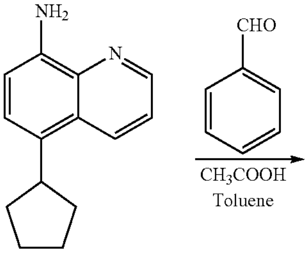

L12-2

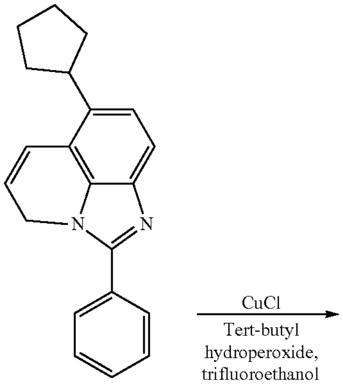

L12-3

-continued

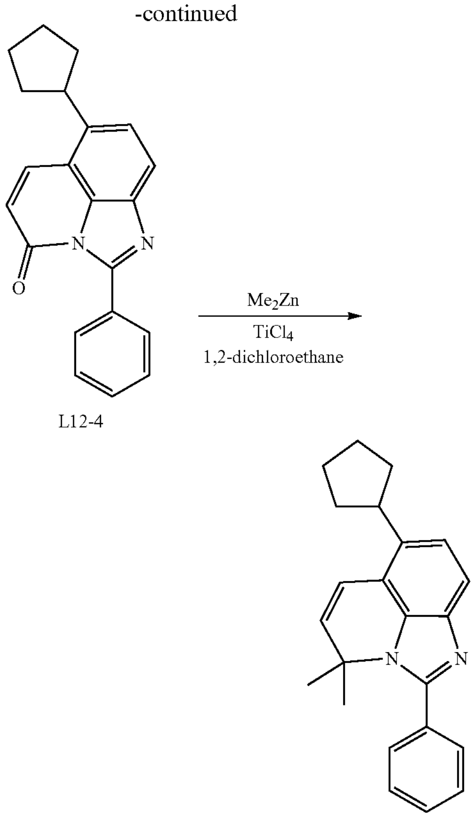

L12-4

L12

Synthesis of a Compound L12-2

With reference to synthesis and purification methods of the compound L8-2, only the corresponding raw materials were required to be changed, and 15.6 g of a target compound L12-2 with a yield of 63.7% was obtained. The mass spectrum was: 213.3 (M+H).

Synthesis of a Compound L12-3

With reference to synthesis and purification methods of the compound L1-2, only the corresponding raw materials were required to be changed, and 12.4 g of a target compound L12-3 with a yield of 52.3% was obtained. The mass spectrum was: 301.4 (M+H).

Synthesis of a Compound L12-4

With reference to synthesis and purification methods of the compound L1-3, only the corresponding raw materials were required to be changed, and 11.3 g of a target compound L12-4 with a yield of 61.7% was obtained. The mass spectrum was: 315.3 (M+H).

Synthesis of a Compound L12

With reference to synthesis and purification methods of the compound L1, only the corresponding raw materials were required to be changed, and 7.9 g of a target compound L12 with a yield of 56.4% was obtained. The mass spectrum was: 329.4 (M+H).

Synthesis of a Compound CPD 78

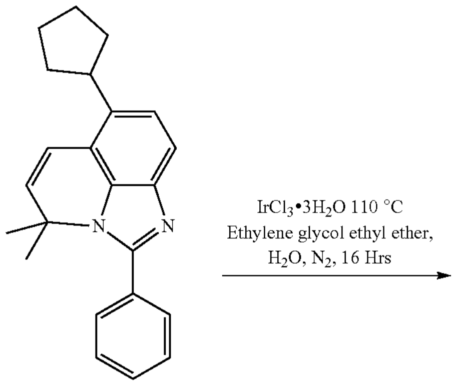

L12

-continued

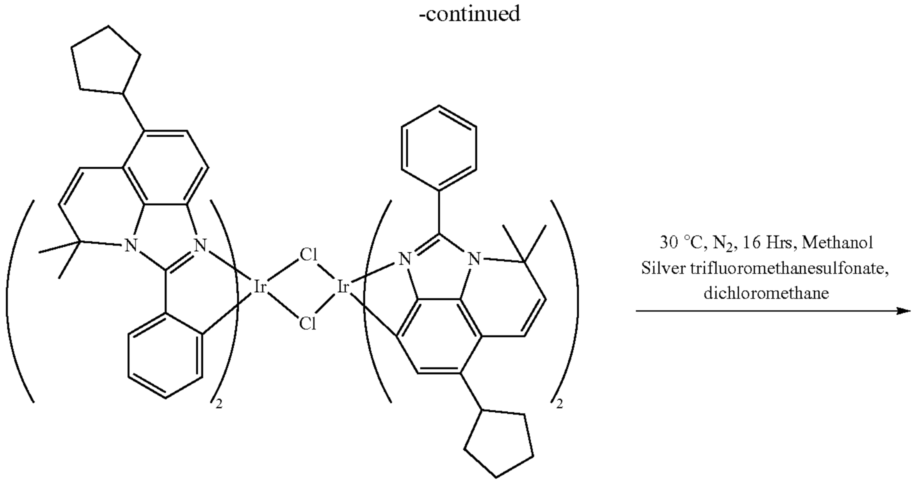

CPD 78-1

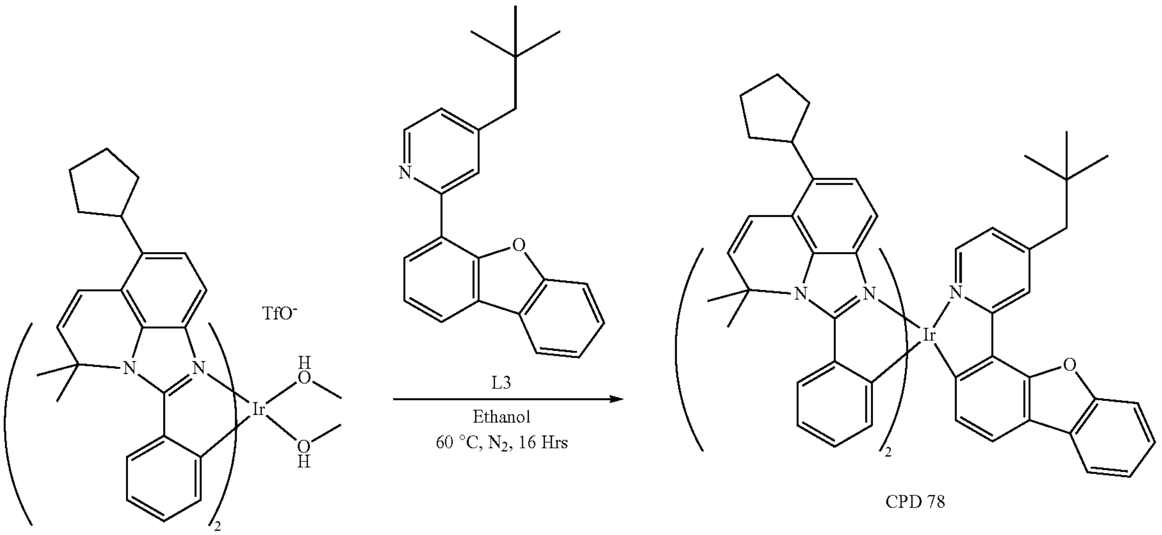

CPD 78-2

CPD 78

Synthesis of a Compound CPD 78-1

With reference to synthesis and purification methods of the compound CPD 1-1, only the corresponding raw materials were required to be changed, and an obtained compound was directly used in the next step without purification.

Synthesis of a Compound CPD 78-2

With reference to synthesis and purification methods of the compound CPD 1-2, only the corresponding raw materials were required to be changed, and an obtained compound was directly used in the next step without purification.

Synthesis of a Compound CPD 78

With reference to synthesis and purification methods of the compound CPD 1, only the corresponding raw materials were required to be changed, and 3.31 g of a target compound CPD 78 with a yield of 51.3% was obtained. 3.31 g of the crude product CPD 78 was sublimated and purified to obtain 1.87 g of sublimated and purified CPD 78 with a yield of 56.49%. The mass spectrum was: 1162.5 (M+H). $^1H$ NMR (400 MHz, $CDCl_3$) δ8.53 (d, 1H), 7.98 (d, 1H), 7.88-7.60 (m, 6H), 7.58-7.24 (m, 7H), 7.05 (m, 6H), 6.56 (d, 2H), 5.92 (d, 2H), 3.21 (s, 2H), 3.09 (m, 2H), 2.00 (m, 4H), 1.86-1.54 (m, 24H), 0.85 (s, 9H).

Synthesis of a Common Intermediate L13

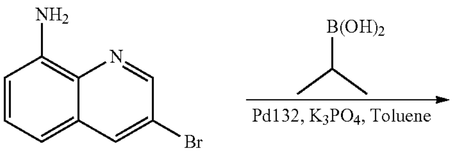

L13-1

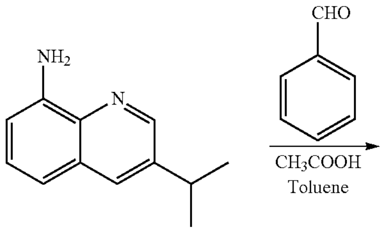

L13-2

-continued

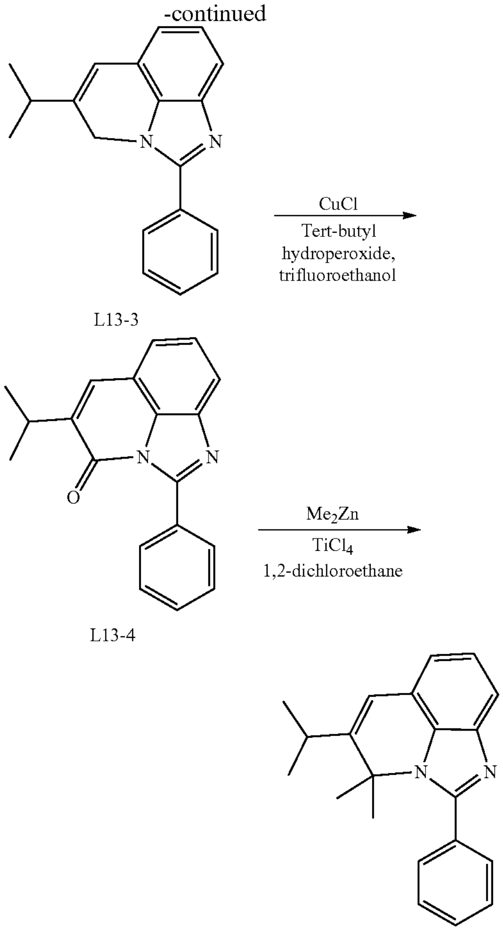

L13-3

L13-4

L13

Synthesis of a Compound L13-2

With reference to synthesis and purification methods of the compound L8-2, only the corresponding raw materials were required to be changed, and 16.9 g of a target compound L13-2 with a yield of 53.7% was obtained. The mass spectrum was: 187.2 (M+H).

Synthesis of a Compound L13-3

With reference to synthesis and purification methods of the compound L1-2, only the corresponding raw materials were required to be changed, and 14.7 g of a target compound L13-3 with a yield of 57.2% was obtained. The mass spectrum was: 275.3 (M+H).

Synthesis of a Compound L13-4

With reference to synthesis and purification methods of the compound L1-3, only the corresponding raw materials were required to be changed, and 12.6 g of a target compound L13-4 with a yield of 58.1% was obtained. The mass spectrum was: 289.3 (M+H).

Synthesis of a Compound L13

With reference to synthesis and purification methods of the compound L1, only the corresponding raw materials were required to be changed, and 10.2 g of a target compound L13 with a yield of 55.4% was obtained. The mass spectrum was: 303.4 (M+H).

Synthesis of a Compound CPD 107

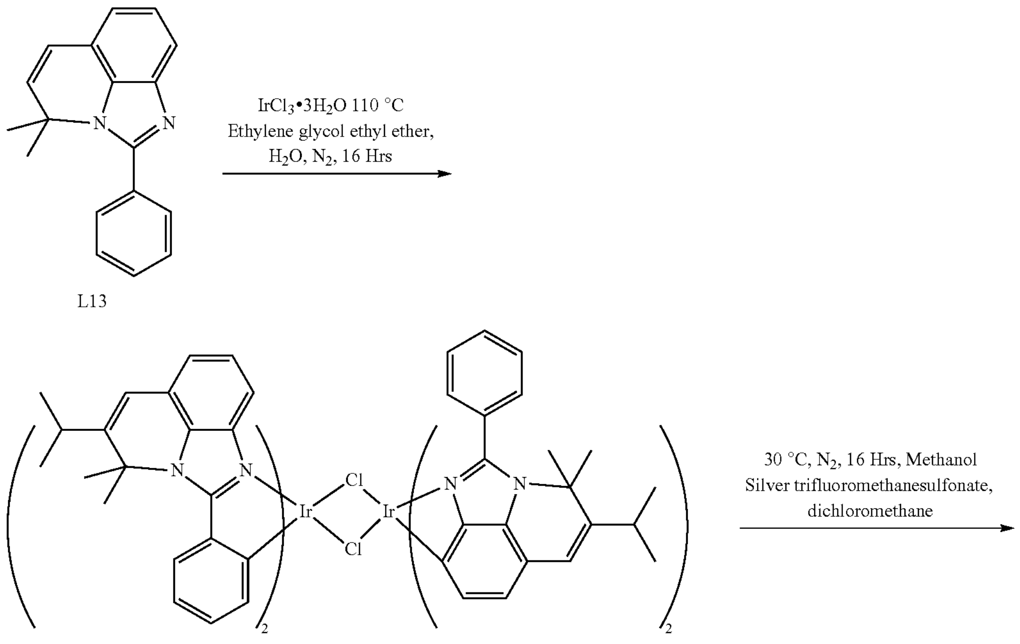

L13

CPD 107-1

-continued

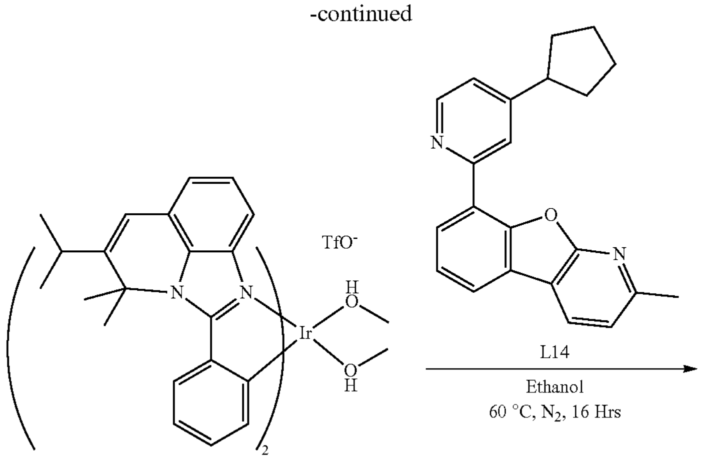

CPD 107-2

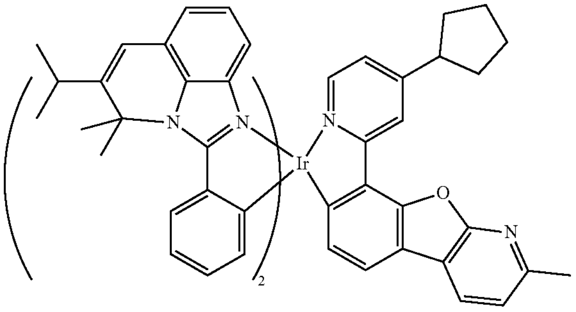

CPD 107

Synthesis of a Compound CPD 107-1

With reference to synthesis and purification methods of the compound CPD 1-1, only the corresponding raw materials were required to be changed, and an obtained compound was directly used in the next step without purification.

Synthesis of a Compound CPD 107-2

With reference to synthesis and purification methods of the compound CPD 1-2, only the corresponding raw materials were required to be changed, and an obtained compound was directly used in the next step without purification.

Synthesis of a Compound CPD 107

With reference to synthesis and purification methods of the compound CPD 1, only the corresponding raw materials were required to be changed, and 2.88 g of a target compound CPD 107 with a yield of 46.3% was obtained. 2.88 g of the crude product CPD 107 was sublimated and purified to obtain 1.46 g of sublimated and purified CPD 107 with a yield of 50.69%. The mass spectrum was: 1123.4 (M+H). $^1$H NMR (400 MHz, $CDCl_3$) δ8.52 (d, 1H), 8.31 (d, 1H), 7.87-7.64 (m, 4H), 7.46 (d, J=40.0 Hz, 6H), 7.25-6.96 (m, 9H), 6.85 (m, 2H), 2.68 (s, 3H), 2.49 (m, 1H), 2.30 (m, 2H), 2.02 (m, 2H), 1.87-1.59 (m, 18H), 1.04 (d, 12H).

Synthesis of a Common Intermediate L15

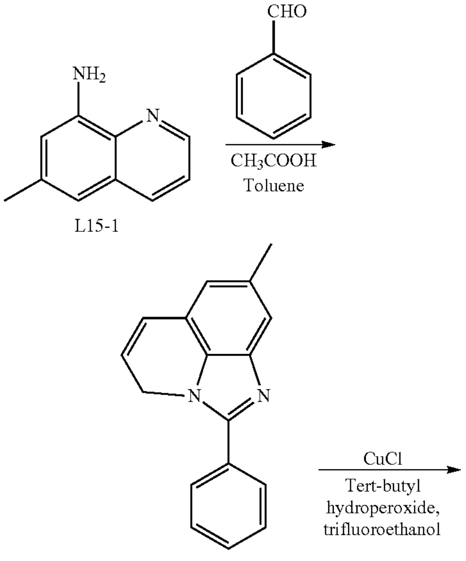

L15-1

L15-2

-continued

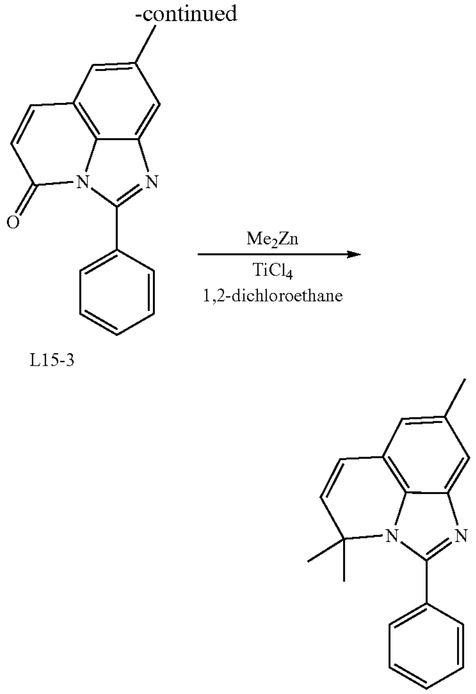

L15-3

L15

Synthesis of a Compound L15-2

With reference to synthesis and purification methods of the compound L1-2, only the corresponding raw materials were required to be changed, and 14.8 g of a target compound L15-2 with a yield of 66.3% was obtained. The mass spectrum was: 247.3 (M+H).

Synthesis of a Compound L15-3

With reference to synthesis and purification methods of the compound L1-3, only the corresponding raw materials were required to be changed, and 13.1 g of a target compound L15-3 with a yield of 70.2% was obtained. The mass spectrum was: 261.2 (M+H).

Synthesis of a Compound L15

With reference to synthesis and purification methods of the compound L1, only the corresponding raw materials were required to be changed, and 9.3 g of a target compound L15 with a yield of 67.3% was obtained. The mass spectrum was: 275.3 (M+H).

Synthesis of a Compound CPD 136

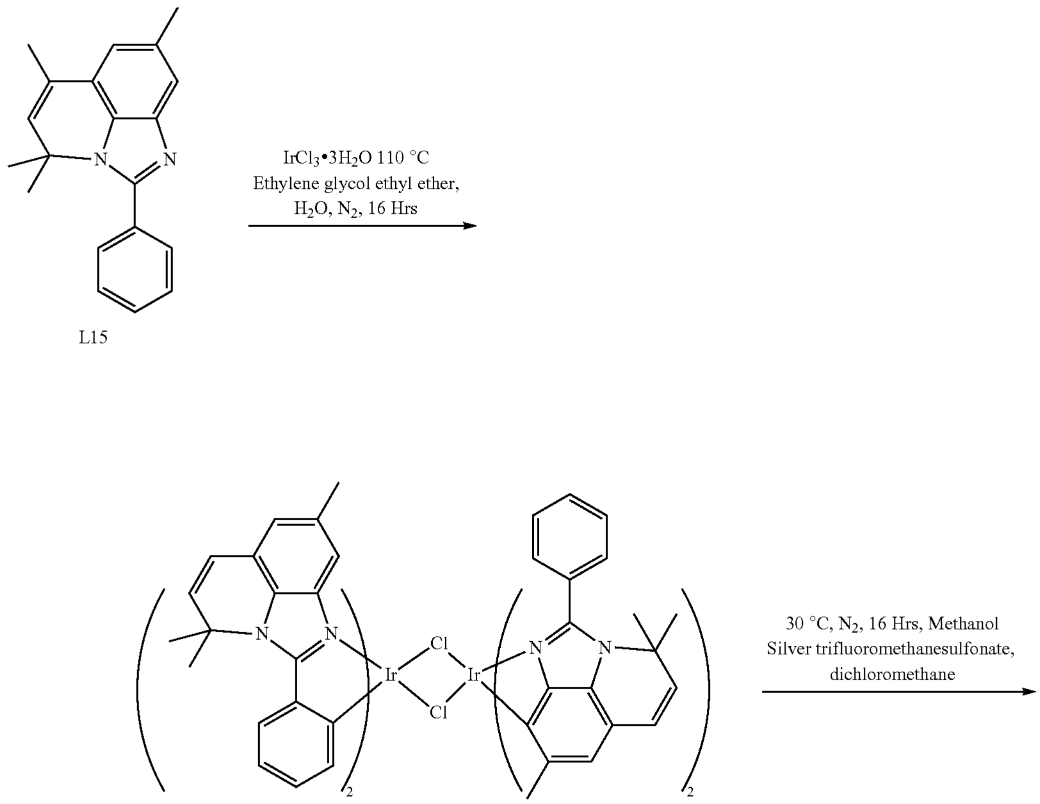

L15

CPD 136-1

-continued

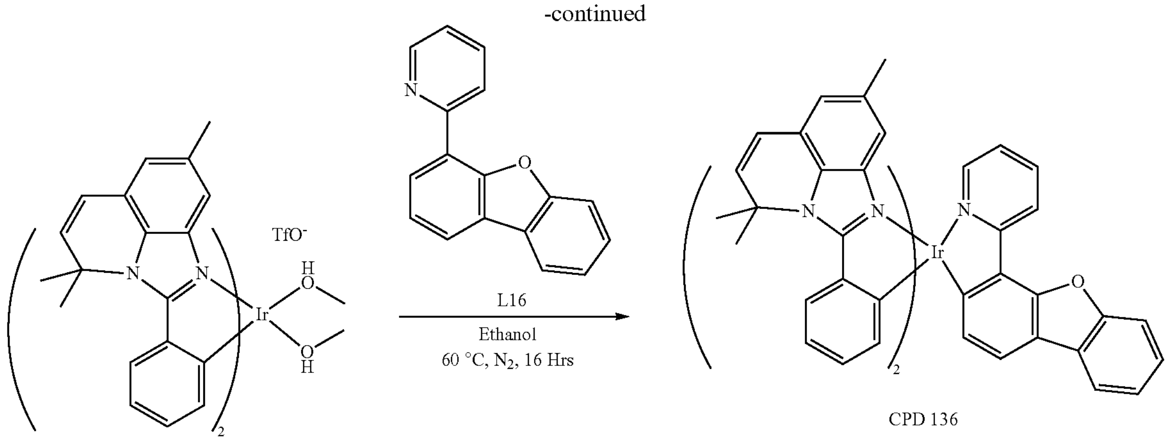

CPD 136-2

CPD 136

Synthesis of a Compound CPD 136-1

With reference to synthesis and purification methods of the compound CPD 1-1, only the corresponding raw materials were required to be changed, and an obtained compound was directly used in the next step without purification.

Synthesis of a Compound CPD 136-2

With reference to synthesis and purification methods of the compound CPD 1-2, only the corresponding raw materials were required to be changed, and an obtained compound was directly used in the next step without purification.

Synthesis of a Compound CPD 136

With reference to synthesis and purification methods of the compound CPD 1, only the corresponding raw materials were required to be changed, and 3.31 g of a target compound CPD 136 with a yield of 52.3% was obtained. 3.31 g of the crude product CPD 136 was sublimated and purified to obtain 1.94 g of sublimated and purified CPD 136 with a yield of 58.61%. The mass spectrum was: 984.1 (M+H). $^1$H NMR (400 MHz, $CDCl_3$) δ 8.37 (d, 1H), 7.98 (d, 1H), 7.73 (d, J=40.0 Hz, 3H), 7.63-7.26 (m, 10H), 7.16 (m, 6H), 6.90 (d, 1H), 6.54 (d, 2H), 5.76 (s, 2H), 2.31 (s, 6H), 1.74 (s, 12H).

Synthesis of a Common Intermediate L17

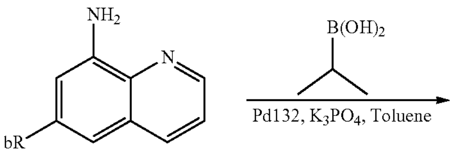

L17-1

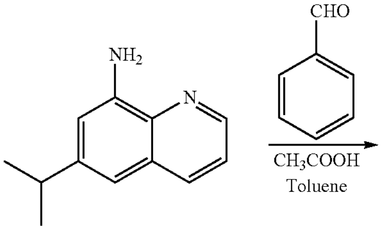

L17-2

-continued

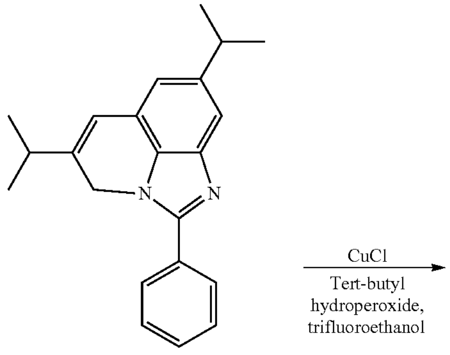

L17-3

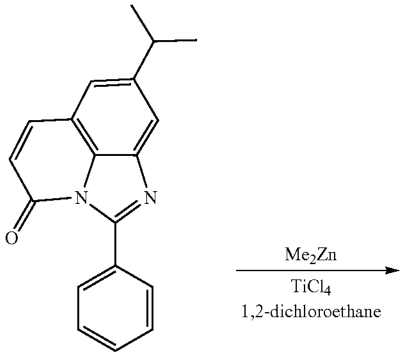

L17-4

-continued

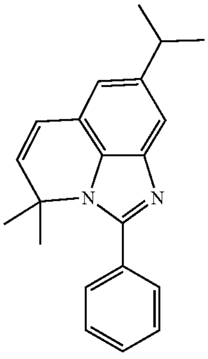

L17

Synthesis of a Compound L17-2

With reference to synthesis and purification methods of the compound L8-2, only the corresponding raw materials were required to be changed, and 16.9 g of a target compound L17-2 with a yield of 53.7% was obtained. The mass spectrum was: 187.2 (M+H).

Synthesis of a Compound L17-3

With reference to synthesis and purification methods of the compound L1-2, only the corresponding raw materials were required to be changed, and 14.7 g of a target compound L17-3 with a yield of 57.2% was obtained. The mass spectrum was: 275.3 (M+H).

Synthesis of a Compound L17-4

With reference to synthesis and purification methods of the compound L1-3, only the corresponding raw materials were required to be changed, and 12.6 g of a target compound L17-4 with a yield of 58.1% was obtained. The mass spectrum was: 289.3 (M+H).

Synthesis of a Compound L17

With reference to synthesis and purification methods of the compound L1, only the corresponding raw materials were required to be changed, and 10.2 g of a target compound L17 with a yield of 55.4% was obtained. The mass spectrum was: 303.4 (M+H).

Synthesis of a Compound CPD 150

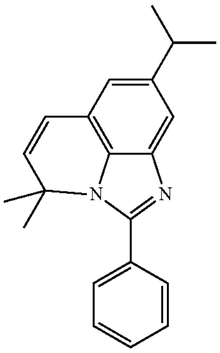

L17

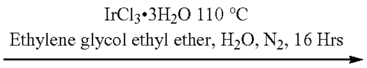

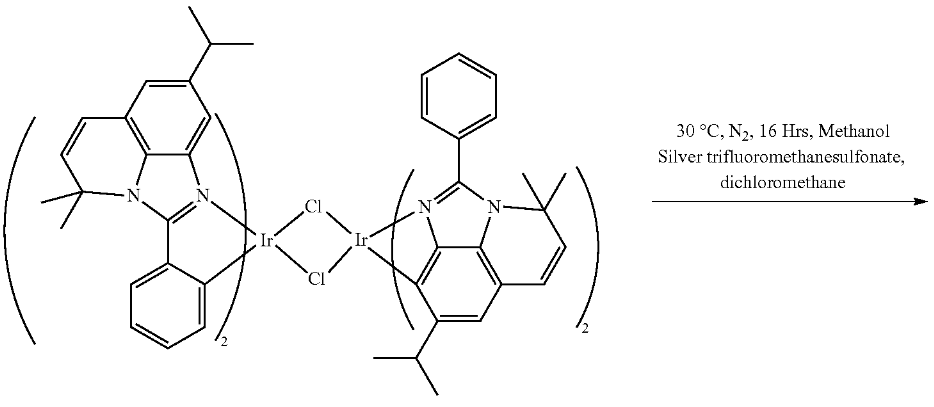

CPD 150-1

-continued

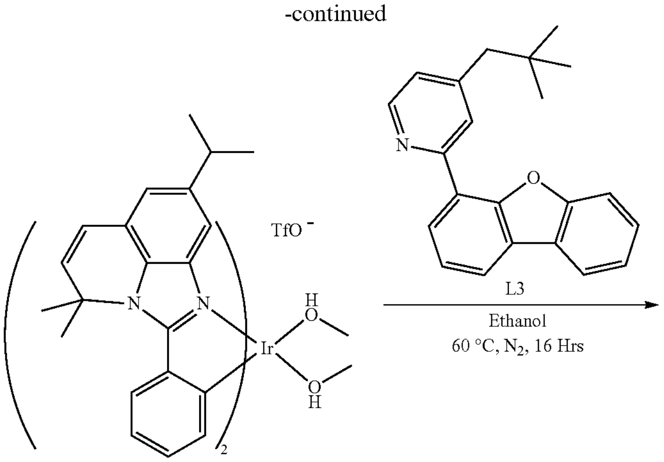

CPD 150-2

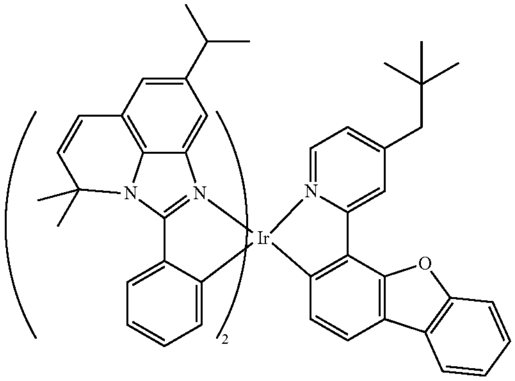

CPD 150

Synthesis of a Compound CPD 150-1

With reference to synthesis and purification methods of the compound CPD 1-1, only the corresponding raw materials were required to be changed, and an obtained compound was directly used in the next step without purification.

Synthesis of a Compound CPD 150-2

With reference to synthesis and purification methods of the compound CPD 1-2, only the corresponding raw materials were required to be changed, and an obtained compound was directly used in the next step without purification.

Synthesis of a Compound CPD 150

With reference to synthesis and purification methods of the compound CPD 1, only the corresponding raw materials were required to be changed, and 3.02 g of a target compound CPD 150 with a yield of 53.1% was obtained. 3.02 g of the crude product CPD 150 was sublimated and purified to obtain 1.68 g of sublimated and purified CPD 150 with a yield of 55.6%. The mass spectrum was: 1110.43 (M+H). $^1$H NMR (400 MHz, $CDCl_3$) δ 8.50 (d, 1H), 7.98 (d, 1H), 7.88-7.66 (m, 7H), 7.59-7.25 (m, 11H), 7.05 (d, 1H), 6.56 (d, 2H), 5.76 (d, 2H), 3.21 (s, 2H), 2.87 (m, 2H), 1.74 (s, 12H), 1.20 (d, 12H), 0.85 (s, 9H).

Synthesis of a Common Intermediate L18

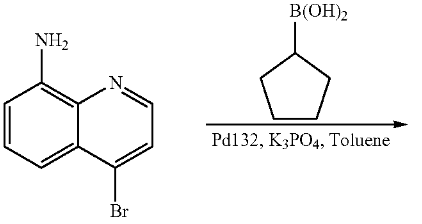

L12-1

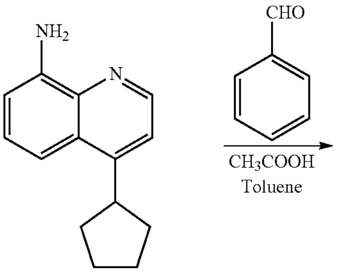

L18-1

-continued

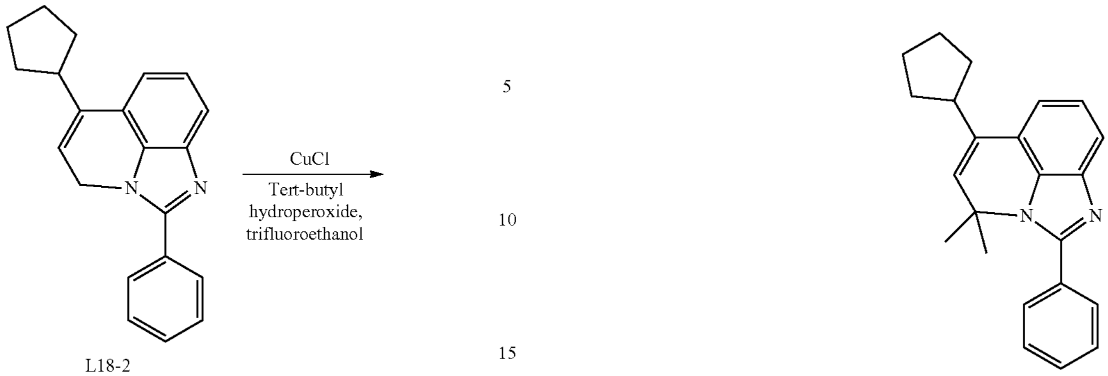

L18-2

L18

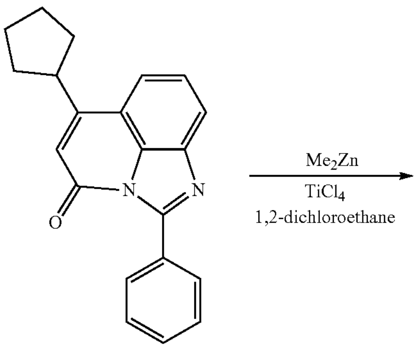

L18-3

Synthesis of a Compound L18-1

With reference to synthesis and purification methods of the compound L8-2, only the corresponding raw materials were required to be changed, and 15.4 g of a target compound L18-1 with a yield of 58.9% was obtained. The mass spectrum was: 213.2 (M+H).

Synthesis of a Compound L18-2

With reference to synthesis and purification methods of the compound L1-2, only the corresponding raw materials were required to be changed, and 14.6 g of a target compound L18-2 with a yield of 60.7% was obtained. The mass spectrum was: 301.4 (M+H).

Synthesis of a Compound L18-3

With reference to synthesis and purification methods of the compound L1-3, only the corresponding raw materials were required to be changed, and 11.3 g of a target compound L18-3 with a yield of 53.8% was obtained. The mass spectrum was: 315.3 (M+H).

Synthesis of a Compound L18

With reference to synthesis and purification methods of the compound L1, only the corresponding raw materials were required to be changed, and 8.9 g of a target compound L18 with a yield of 62.1% was obtained. The mass spectrum was: 329.4 (M+H).

Synthesis of a Compound CPD 171

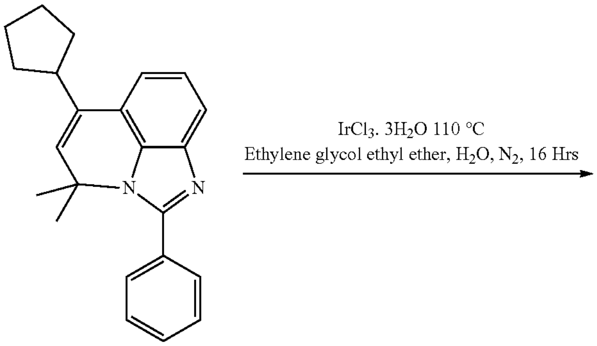

L18

-continued

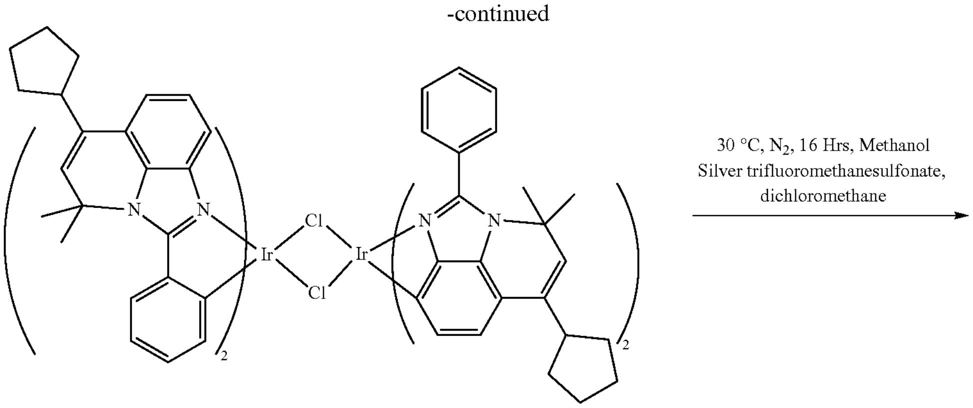

CPD 171-1

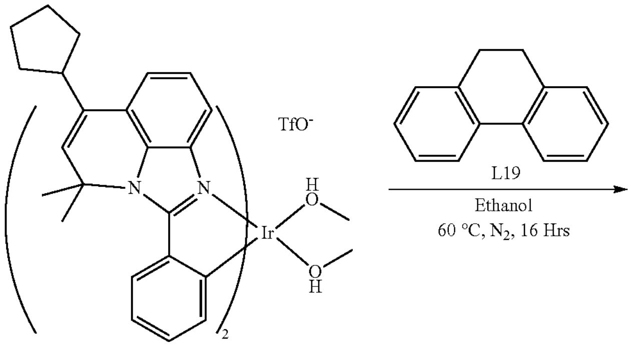

CPD 171-2

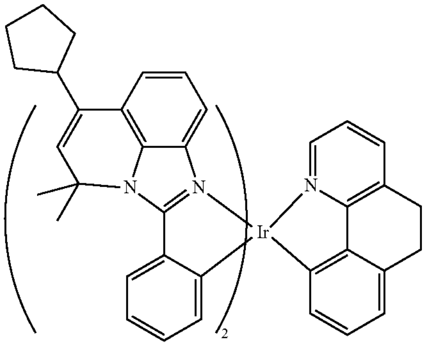

CPD 171

Synthesis of a Compound CPD 171-1

With reference to synthesis and purification methods of the compound CPD 1-1, only the corresponding raw materials were required to be changed, and an obtained compound was directly used in the next step without purification.

Synthesis of a Compound CPD 171-2

With reference to synthesis and purification methods of the compound CPD 1-2, only the corresponding raw materials were required to be changed, and an obtained compound was directly used in the next step without purification.

Synthesis of a Compound CPD 171

With reference to synthesis and purification methods of the compound CPD 1, only the corresponding raw materials were required to be changed, and 2.65 g of a target compound CPD 171 with a yield of 43.8% was obtained. 2.65 g of the crude product CPD 171 was sublimated and purified to obtain 1.44 g of sublimated and purified CPD 171 with a yield of 54.3%. The mass spectrum was: 1028.3 (M+H). $^1H$ NMR (400 MHz, $CDCl_3$) δ 8.35 (d, 1H), 7.77 (m, 3H), 7.46 (d, J=40.0 Hz, 7H), 7.36-7.03 (m, 6H), 6.67 (m, 3H), 5.54 (s, 2H), 2.97 (d, J=20.0 Hz, 4H), 2.80 (m, 2H), 1.87-1.44 (m, 24H), 1.30 (m, 4H).

Synthesis of a Compound CPD 195

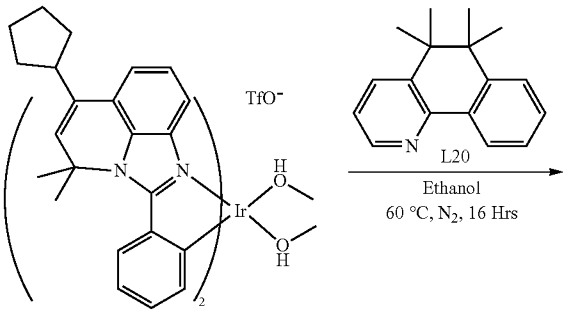

CPD 171-2

-continued

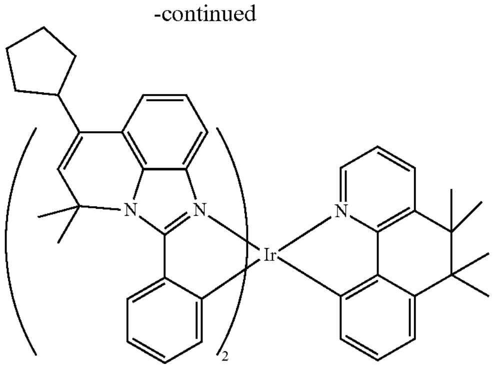

CPD 195

With reference to synthesis and purification methods of the compound CPD 1, only the corresponding raw materials were required to be changed, and 2.73 g of a target compound CPD 195 with a yield of 47.9% was obtained. 2.73 g of the crude product CPD 195 was sublimated and purified to obtain 1.48 g of sublimated and purified CPD 195 with a yield of 54.2%. The mass spectrum was: 1084.4 (M+H). $^{1}H$ NMR (400 MHz, $CDCl_3$) δ8.55 (d, 1H), 7.77 (d, 2H), 7.61-7.25 (m, 9H), 7.12 (m, 7H), 6.67 (t, 1H), 5.54 (s, 2H), 2.42 (m, 2H), 1.92-1.43 (m, 24H), 1.32 (m, 16H).

Synthesis of a Compound CPD 198

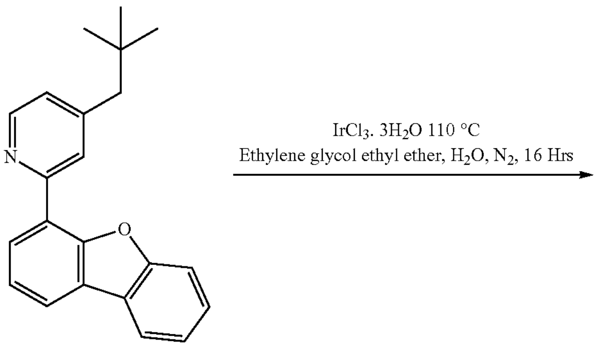

L3

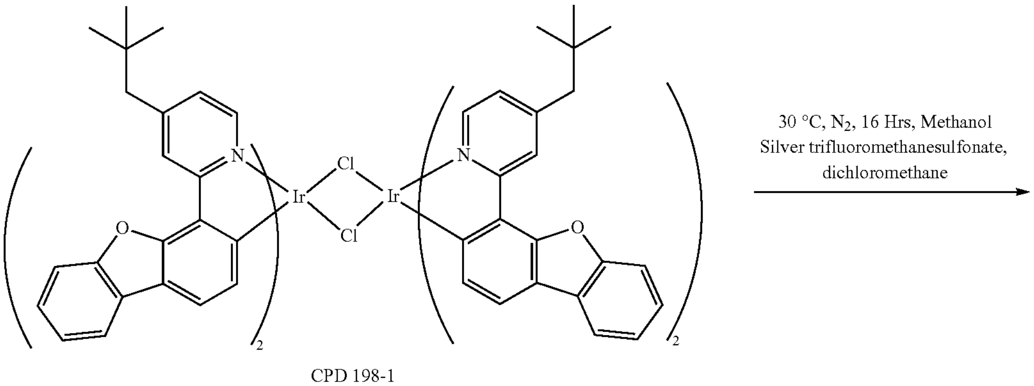

CPD 198-1

-continued

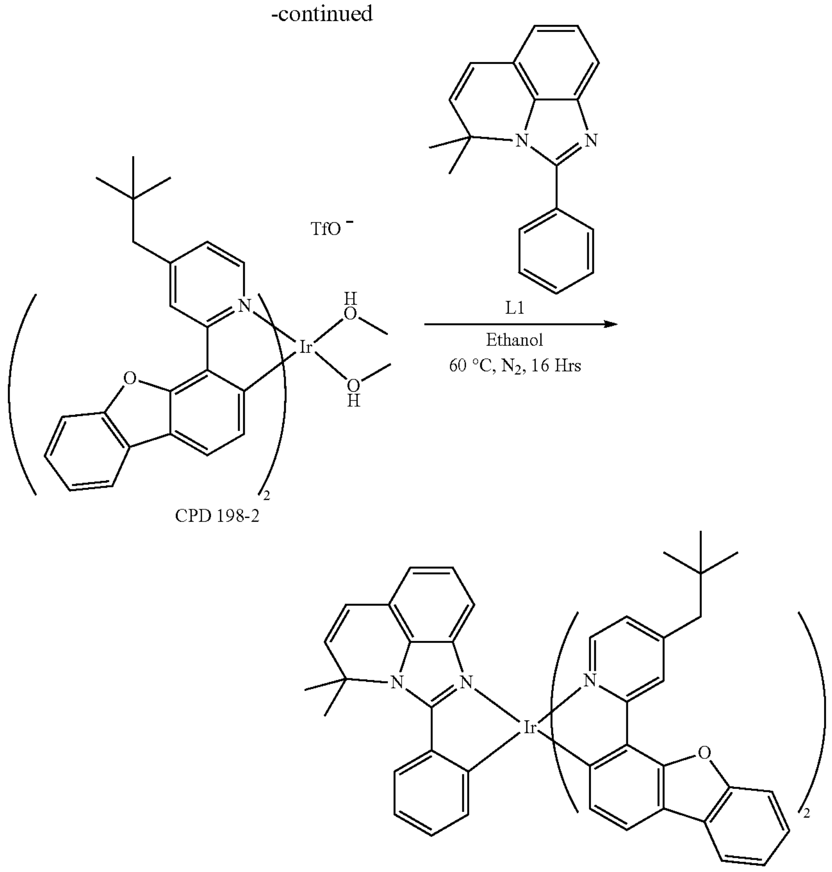

CPD 198

Synthesis of a Compound CPD 198-1

With reference to synthesis and purification methods of the compound CPD 1-1, only the corresponding raw materials were required to be changed, and an obtained compound was directly used in the next step without purification.

Synthesis of a Compound CPD 198-2

With reference to synthesis and purification methods of the compound CPD 1-2, only the corresponding raw materials were required to be changed, and an obtained compound was directly used in the next step without purification.

Synthesis of a Compound CPD 198

With reference to synthesis and purification methods of the compound CPD 1, only the corresponding raw materials were required to be changed, and 2.53 g of a target compound CPD 198 with a yield of 40.7% was obtained. 2.53 g of the crude product CPD 198 was sublimated and purified to obtain 1.21 g of sublimated and purified CPD 198 with a yield of 48.7%. The mass spectrum was: 1026.3 (M+H). $^1H$ NMR (400 MHz, $CDCl_3$) δ 8.50 (d, 1H), 7.98 (d, 1H), 7.87-7.66 (m, 6H), 7.59-7.27 (m, 9H), 7.22-7.00 (m, 6H), 6.53 (d, 2H), 5.76 (d, 2H), 3.21 (s, 2H), 1.74 (s, 12H), 0.85 (s, 9H).

Synthesis of a Compound CPD 244

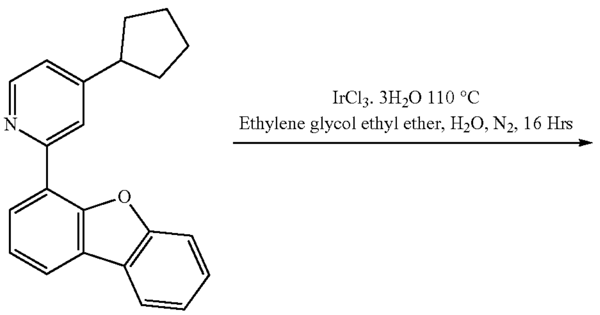

L7

-continued

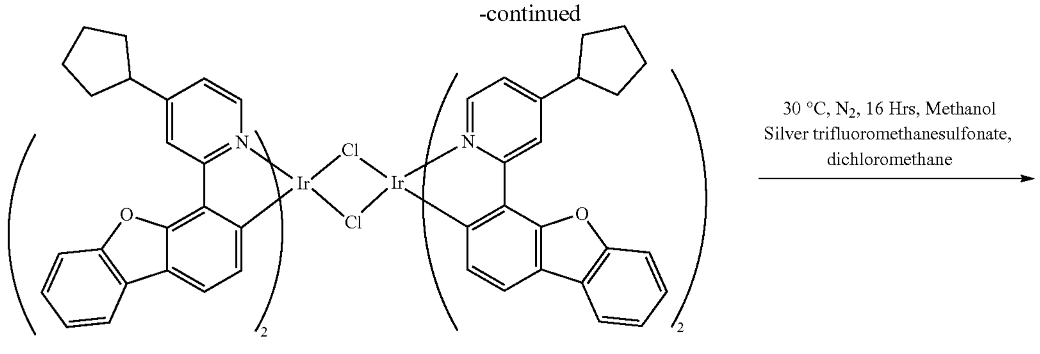

CPD 244-1

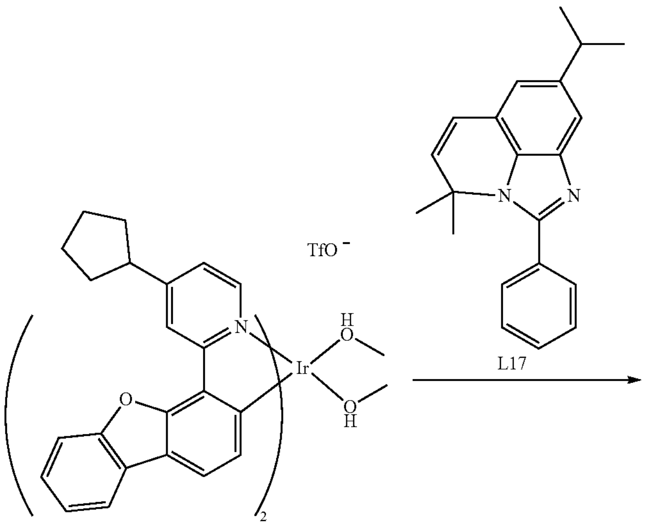

L17

CPD 244-2

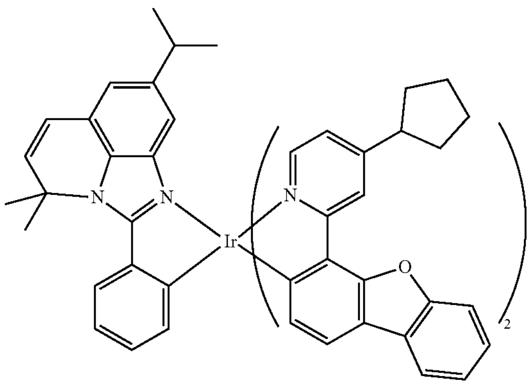

CPD 244

Synthesis of a Compound CPD 244-1

With reference to synthesis and purification methods of the compound CPD 1-1, only the corresponding raw materials were required to be changed, and an obtained compound was directly used in the next step without purification.

Synthesis of a Compound CPD 244-2

With reference to synthesis and purification methods of the compound CPD 1-2, only the corresponding raw materials were required to be changed, and an obtained compound was directly used in the next step without purification.

Synthesis of a Compound CPD 244

With reference to synthesis and purification methods of the compound CPD 1, only the corresponding raw materials were required to be changed, and 2.61 g of a target compound CPD 244 with a yield of 46.1% was obtained. 2.61 g of the crude product CPD 244 was sublimated and purified to obtain 1.55 g of sublimated and purified CPD 244 with a yield of 59.3%. The mass spectrum was: 1108.4 (M+H). $^1H$ NMR (400 MHz, $CDCl_3$) δ 8.54 (d, 1H), 7.98 (d, 1H), 7.87-7.65 (m, 4H), 7.58-7.26 (m, 11H), 7.05 (m, 4H), 6.51 (d, 2H), 5.76 (d, 2H), 2.85 (m, 3H), 2.03 (m, 2H), 1.85-1.59 (m, 18H), 1.20 (s, 12H).

Synthesis of a Common Intermediate L21
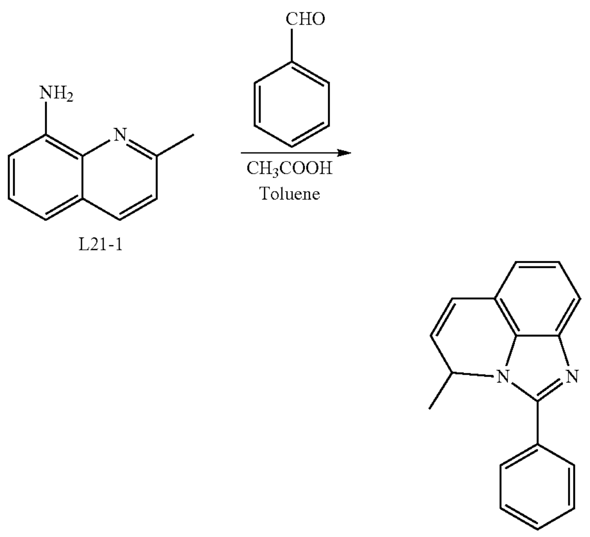
L21-1
L21
Synthesis of a Compound L21
With reference to synthesis and purification methods of the compound L1-2, only the corresponding raw materials were required to be changed, and 15.3 g of a target compound L21 with a yield of 65.7% was obtained. The mass spectrum was: 247.3 (M+H).
Synthesis of a Compound CPD 324
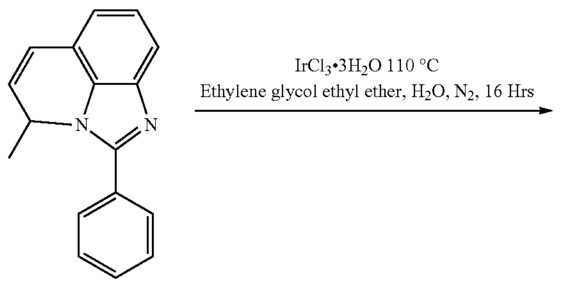
L21
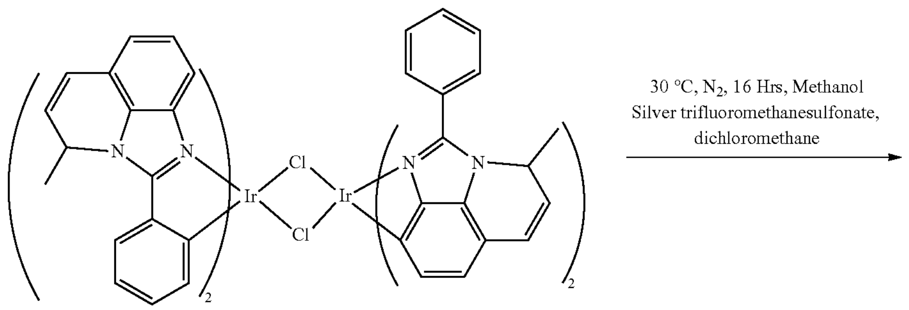
CPD 1-1

-continued

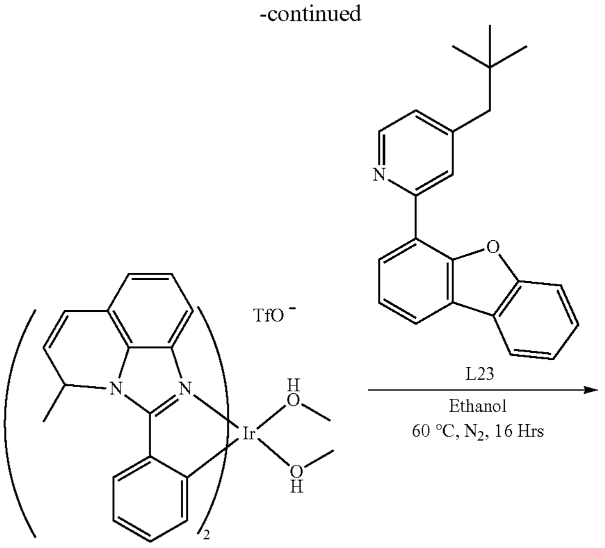

CPD 1-2

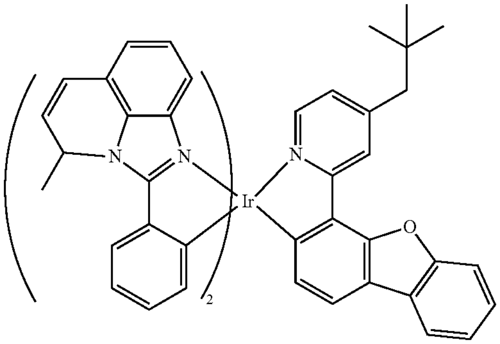

CPD 324

Synthesis of a Compound CPD 324-1

With reference to synthesis and purification methods of the compound CPD 1-1, only the corresponding raw materials were required to be changed, and an obtained compound was directly used in the next step without purification.

Synthesis of a Compound CPD 324-2

With reference to synthesis and purification methods of the compound CPD 1-2, only the corresponding raw materials were required to be changed, and an obtained compound was directly used in the next step without purification.

Synthesis of a Compound CPD 324

With reference to synthesis and purification methods of the compound CPD 1, only the corresponding raw materials were required to be changed, and 2.66 g of a target compound CPD 324 with a yield of 45.9% was obtained. 2.66 g of the crude product CPD 324 was sublimated and purified to obtain 1.27 g of sublimated and purified CPD 324 with a yield of 47.7%. The mass spectrum was: 998.2 (M+H). $^1$H NMR (400 MHz, $CDCl_3$) δ 8.52 (d, 1H), 7.98 (d, 1H), 7.89-7.66 (m, 6H), 7.60-7.26 (m, 9H), 7.25-7.00 (m, 6H), 6.55 (d, 2H), 5.76 (q, 2H), 5.58 (dt, 2H), 3.21 (s, 2H), 1.72 (d, 6H), 0.85 (s, 9H).

Synthesis of a Common Intermediate L22

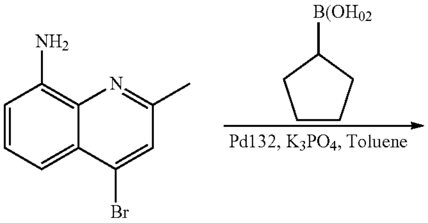

L22-1

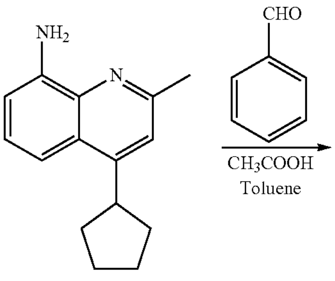

L-22-2

-continued

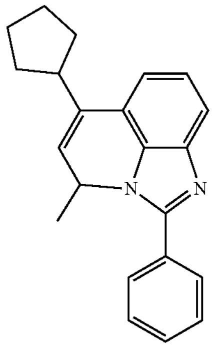

L22

Synthesis of a Compound L22-2

With reference to synthesis and purification methods of the compound L8-2, only the corresponding raw materials were required to be changed, and 12.2 g of a target compound L22-2 with a yield of 62.7% was obtained. The mass spectrum was: 227.3 (M+H).

Synthesis of a Compound L22

With reference to synthesis and purification methods of the compound L1-2, only the corresponding raw materials were required to be changed, and 8.5 g of a target compound L22 with a yield of 48.6% was obtained. The mass spectrum was: 315.4 (M+H).

Synthesis of a Compound CPD 337

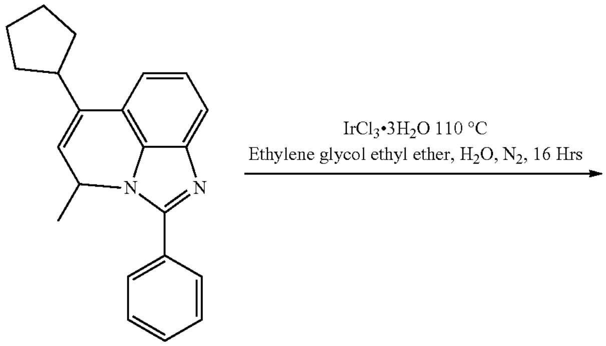

L22

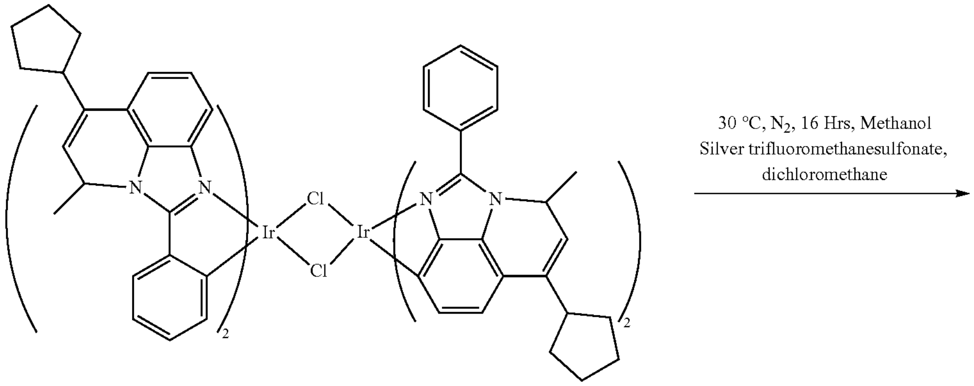

CPD 377-1

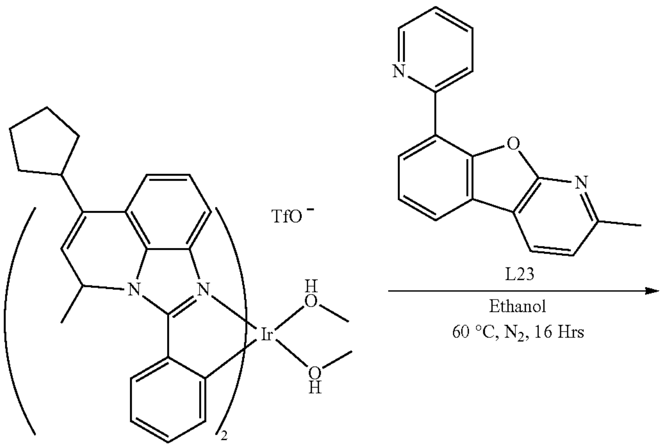

CPD 337-2

-continued

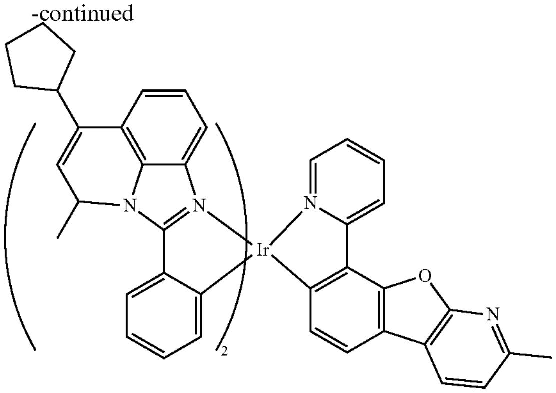

CPD 337

Synthesis of a Compound CPD 337-1

With reference to synthesis and purification methods of the compound CPD 1-1, only the corresponding raw materials were required to be changed, and an obtained compound was directly used in the next step without purification.

Synthesis of a Compound CPD 337-2

With reference to synthesis and purification methods of the compound CPD 1-2, only the corresponding raw materials were required to be changed, and an obtained compound was directly used in the next step without purification.

Synthesis of a Compound CPD 337

With reference to synthesis and purification methods of the compound CPD 1, only the corresponding raw materials were required to be changed, and 3.22 g of a target compound CPD 337 with a yield of 46.1% was obtained. 3.22 g of the crude product CPD 337 was sublimated and purified to obtain 1.37 g of sublimated and purified CPD 337 with a yield of 42.5%. The mass spectrum was: 1079.3 (M+H). $^{1}H$ NMR (400 MHz, $CDCl_3$) δ8.49 (d, 1H), 8.23 (d, 1H), 7.73 (dd, J=40.0 Hz, 3H), 7.56-7.30 (m, 9H), 7.25-6.85 (m, 8H), 5.91 (m, 2H), 5.54 (d, 2H), 2.68 (s, 3H), 2.55 (dt, 2H), 1.64 (m, 18H), 1.30 (m, 4H).

Synthesis of a Common Intermediate L24

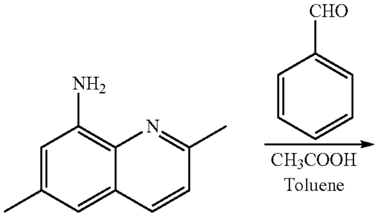

L24-1

-continued

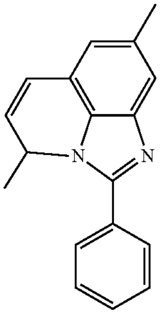

L24

Synthesis of a Compound L24

With reference to synthesis and purification methods of the compound L1-2, only the corresponding raw materials were required to be changed, and 14.2 g of a target compound L24 with a yield of 52.8% was obtained. The mass spectrum was: 261.3 (M+H).

Synthesis of a Compound CPD 348

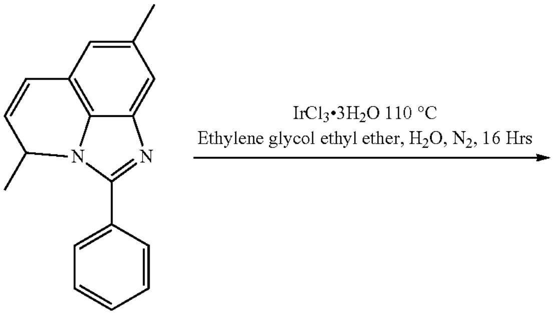

L24

-continued

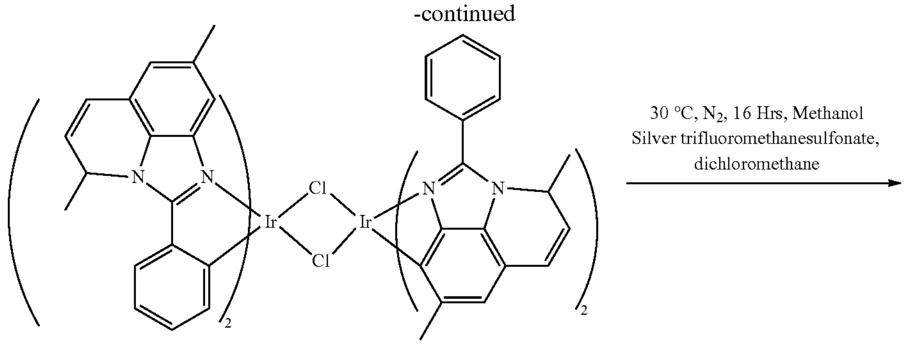

CPD 348-1

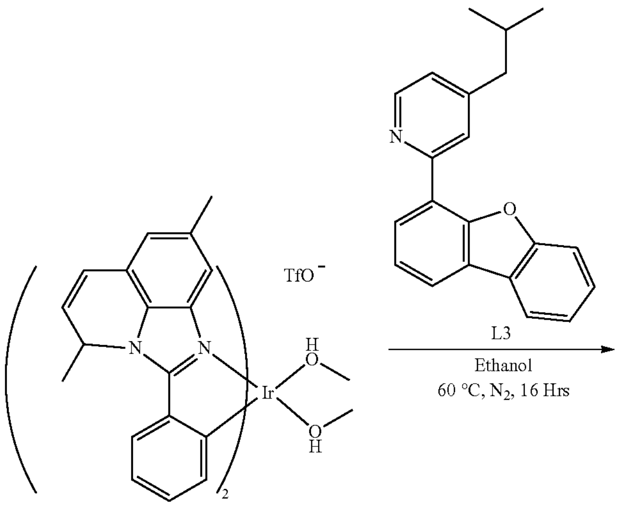

CPD 348-2

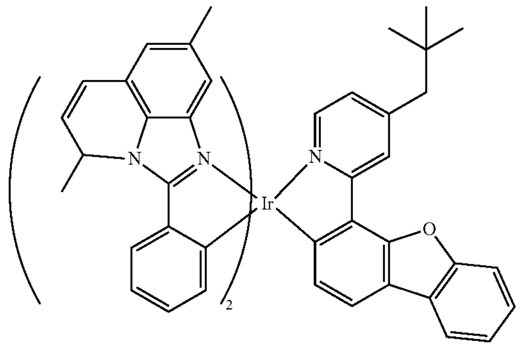

CPD 348

Synthesis of a Compound CPD 348-1

With reference to synthesis and purification methods of the compound CPD 1-1, only the corresponding raw materials were required to be changed, and an obtained compound was directly used in the next step without purification.

Synthesis of a Compound CPD 348-2

With reference to synthesis and purification methods of the compound CPD 1-2, only the corresponding raw materials were required to be changed, and an obtained compound was directly used in the next step without purification.

Synthesis of a Compound CPD 348

With reference to synthesis and purification methods of the compound CPD 1, only the corresponding raw materials were required to be changed, and 2.66 g of a target compound CPD 348 with a yield of 43.7% was obtained. 2.66 g of the crude product CPD 348 was sublimated and purified to obtain 1.38 g of sublimated and purified CPD 348 with a yield of 51.8%. The mass spectrum was: 1026.2 (M+H). $^1$H NMR (400 MHz, $CDCl_3$) δ 8.55 (d, 1H), 7.98 (dd, 1H), 7.88-7.65 (m, 7H), 7.59-7.25 (m, 9H), 7.18 (d, 2H), 7.05 (dd, 1H), 6.49 (d, 2H), 5.76 (m, 2H), 5.49 (m, 2H), 3.21 (s, 2H), 2.31 (s, 6H), 1.67 (d, 6H), 0.85 (s, 9H).

Synthesis of a Compound CPD 360

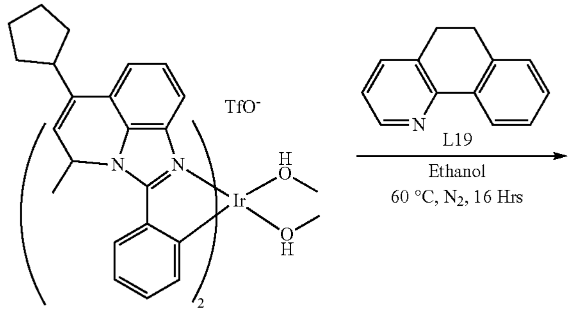

CPD 337-2

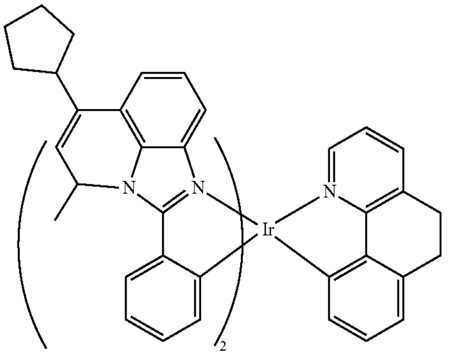

CPD 360

With reference to synthesis and purification methods of the compound CPD 1, only the corresponding raw materials were required to be changed, and 2.59 g of a target compound CPD 360 with a yield of 43.7% was obtained. 2.59 g of the crude product CPD 360 was sublimated and purified to obtain 1.41 g of sublimated and purified CPD 360 with a yield of 54.4%. The mass spectrum was: 1000.2 (M+H). $^1$H NMR (400 MHz, $CDCl_3$) δ8.45 (d, 1H), 7.77 (d, 2H), 7.46 (m, 7H), 7.34-7.02 (m, 8H), 6.67 (t, 2H), 5.53 (m, 4H), 2.97 (m, 4H), 2.60 (m, 2H), 1.85-1.60 (m, 14H), 1.55 (m, 4H), 1.30 (m, 4H).

Synthesis of a Compound CPD 381

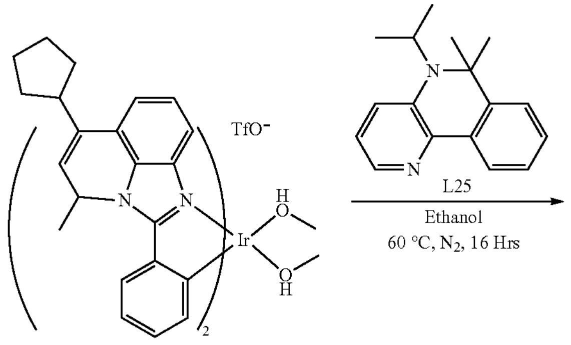

CPD 337-2

-continued

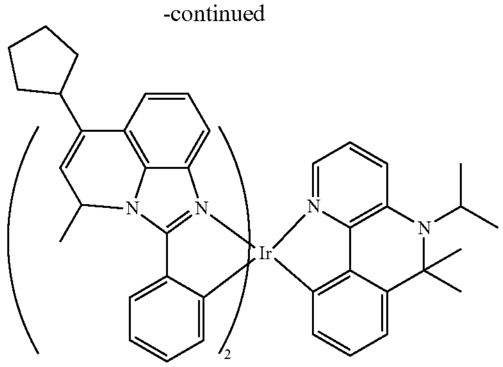

CPD 381

With reference to synthesis and purification methods of the compound CPD 1, only the corresponding raw materials were required to be changed, and 2.33 g of a target compound CPD 381 with a yield of 40.2% was obtained. 2.33 g of the crude product CPD 381 was sublimated and purified to obtain 1.12 g of sublimated and purified CPD 381 with a yield of 48.0%. The mass spectrum was: 1071.3 (M+H). $^1$H NMR (400 MHz, $CDCl_3$) δ8.53 (dd, 1H), 8.21 (dd, 2H), 7.76 (m, 8H), 7.42 (m, 4H), 7.20 (m, 5H), 6.35 (dt, 2H), 5.54 (dd, 2H), 4.15 (m, 1H), 2.58 (m, 2H), 1.67 (m, 18H), 1.33 (m, 10H), 1.17 (d, 6H).

Other compounds can be synthesized and sublimated by selecting corresponding materials based on same or similar methods.

Application Example: Manufacturing of an Organic Electroluminescent Device

A glass substrate with a size of 50 mm*50 mm*1.0 mm including an indium tin oxide (ITO, 100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Then, a layer of HTM1 was evaporated to form a thin film with a thickness of 60 nm. Then, a layer of HTM2 was evaporated on the HTM1 thin film to form a thin film with a thickness of 10 nm. Then, a main material 1, a main material 2 and a doping compound (including reference compounds X and CPD X) were co-evaporated on the HTM2 film layer to obtain a film with a thickness of 30 nm, wherein the ratio of the main material 1 to the main material 2 to the doping material was 45%:45%:10%. Then, an electron transport layer (ETL) and an electron injection layer (EIL) were sequentially evaporated on a light-emitting layer to obtain a film with a thickness of 35 nm, wherein the ratio of the ETL to the EIL was 50%:50%. Finally, a metal Al layer (100 nm) was evaporated to serve as an electrode.

-continued
HATCN
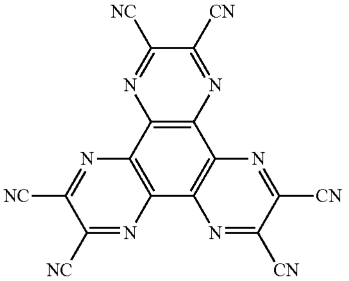
HTM1
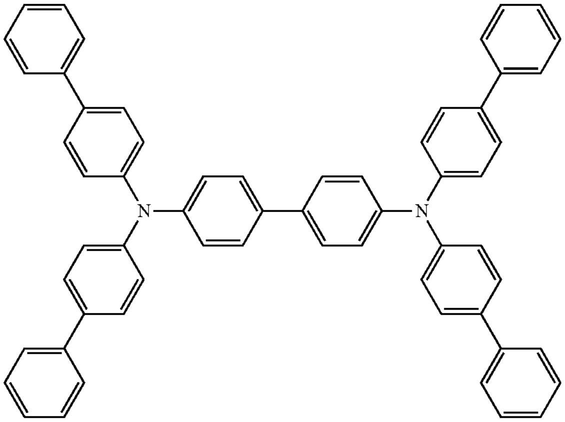
HTM2
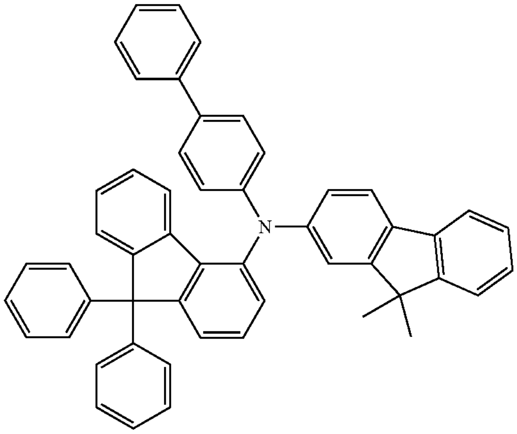
Main material 1
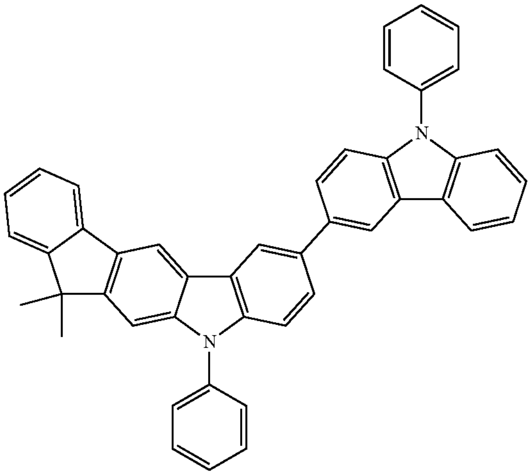
Main material 2
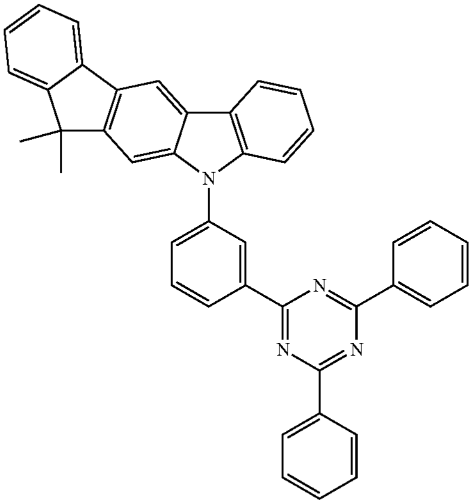
ETL
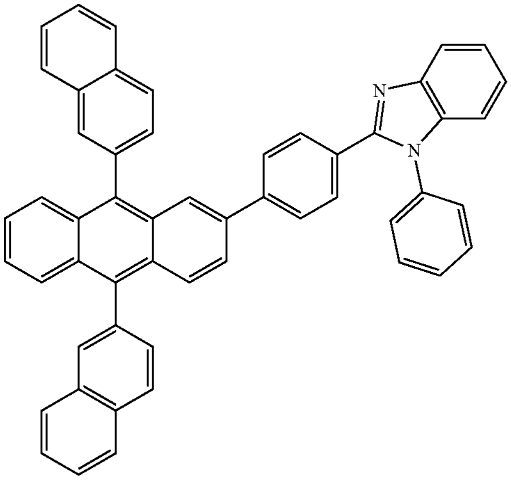

-continued

EIL

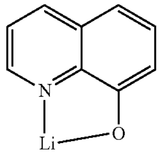

Reference compound 1

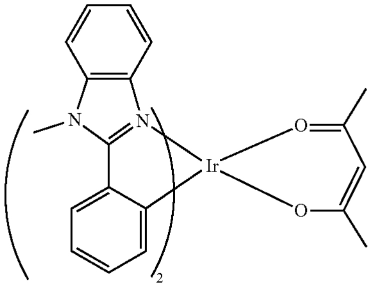

Reference compound 2

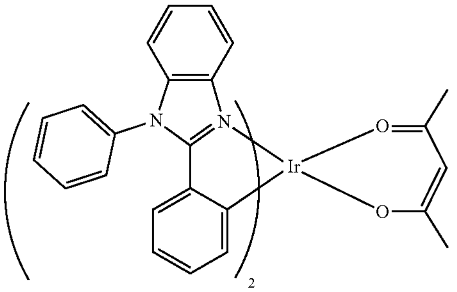

Reference compound 3

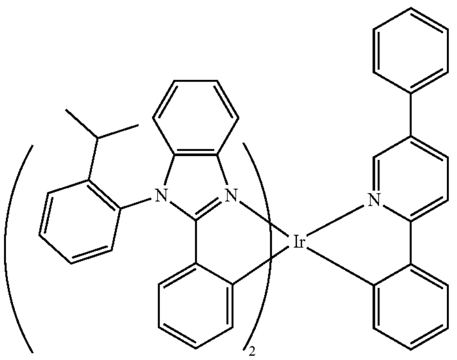

Reference compound 4

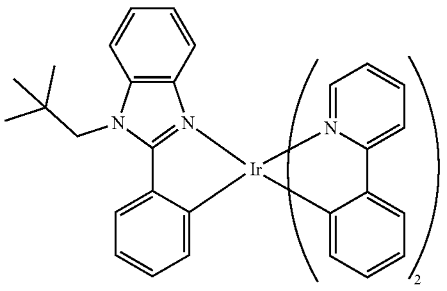

-continued

Reference compound 5

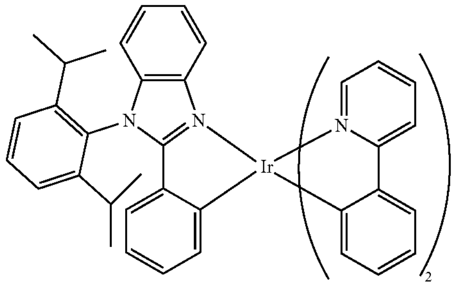

Reference compound 6

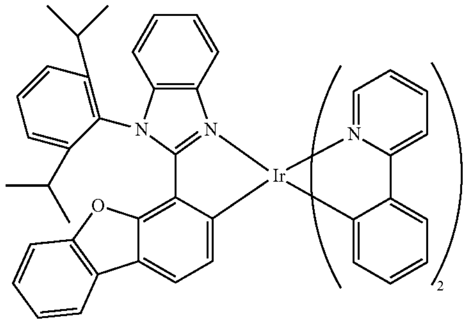

Reference compound 7

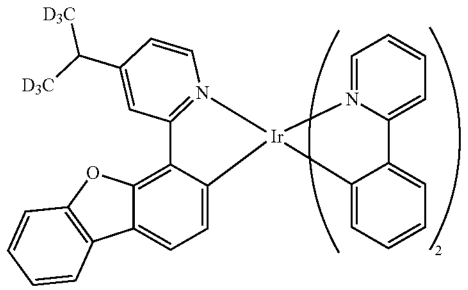

Evaluation: Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT95) when the brightness was reduced to 95% of the initial brightness was tested. Results are shown as follows.

| | Doping material | Peak wavelength nm | FWHM nm | Starting voltage V | Current efficiency Cd/A | LT95@ 10000 nits |
|---|---|---|---|---|---|---|
| Example 1 | CPD 1 | 522 | 53 | 4.43 | 80 | 271 |
| Example 2 | CPD 6 | 523 | 52 | 4.44 | 78 | 283 |
| Example 3 | CPD 12 | 523 | 51 | 4.46 | 83 | 276 |
| Example 4 | CPD 19 | 525 | 52 | 4.51 | 81 | 245 |
| Example 5 | CPD 34 | 525 | 55 | 4.52 | 79 | 259 |
| Example 6 | CPD 50 | 524 | 55 | 4.47 | 82 | 286 |
| Example 7 | CPD 78 | 526 | 52 | 4.49 | 84 | 307 |
| Example 8 | CPD 107 | 526 | 54 | 4.45 | 79 | 310 |
| Example 9 | CPD 136 | 525 | 54 | 4.42 | 81 | 279 |
| Example 10 | CPD 150 | 523 | 52 | 4.43 | 83 | 277 |
| Example 11 | CPD 171 | 525 | 52 | 4.47 | 82 | 293 |
| Example 12 | CPD 195 | 525 | 56 | 4.52 | 79 | 261 |
| Example 13 | CPD 198 | 526 | 52 | 4.42 | 83 | 244 |
| Example 14 | CPD 244 | 526 | 51 | 4.44 | 84 | 269 |
| Example 15 | CPD 324 | 524 | 51 | 4.46 | 83 | 253 |
| Example 16 | CPD 337 | 524 | 54 | 4.48 | 82 | 291 |
| Example 17 | CPD 348 | 526 | 49 | 4.47 | 83 | 322 |
| Example 18 | CPD 360 | 523 | 52 | 4.55 | 81 | 337 |
| Example 19 | CPD 381 | 523 | 49 | 4.56 | 83 | 281 |
| Comparative Example 1 | Reference compound 1 | 509 | 73 | 5.01 | 53 | 60 |
| Comparative Example 2 | Reference compound 2 | 530 | 76 | 5.11 | 77 | 152 |
| Comparative Example 3 | Reference compound 3 | 549 | 69 | 4.86 | 76 | 183 |
| Comparative Example 4 | Reference compound 4 | 523 | 75 | 5.06 | 52 | 98 |
| Comparative Example 5 | Reference compound 5 | 519 | 72 | 4.82 | 54 | 121 |
| Comparative Example 6 | Reference compound 6 | 528 | 66 | 4.76 | 72 | 130 |
| Comparative Example 7 | Reference compound 7 | 524 | 68 | 4.92 | 71 | 200 |

Through comparison of the data in the above table, it can be seen that compared with reference compounds, the compound of the present invention used as a dopant in an organic electroluminescent device has more excellent properties, such as driving voltage, luminous efficiency and device service life.

The above results show that the compound of the present invention has the advantages of high optical and electrochemical stability, narrow emission half-peak width, high color saturation, high luminous efficiency, long device service life and the like, and can be used in organic electroluminescent devices. In particular, the compound has the potential for application in the OLED industry as a green light-emitting dopant.

The invention claimed is:

1. An organometallic iridium compound, having a structure formula represented by Formula (1):

(1)

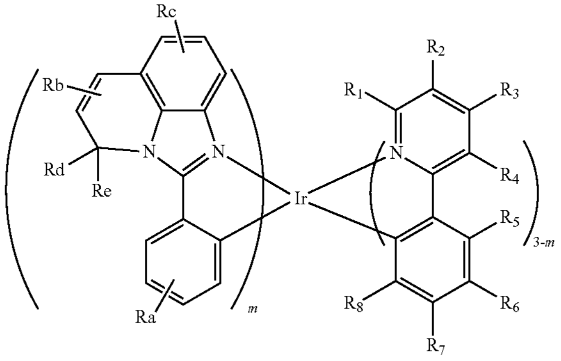

wherein

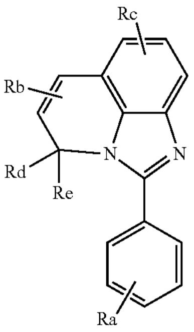

is L1, and

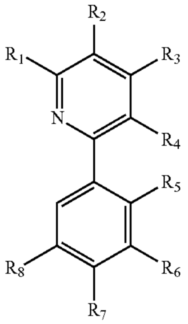

is L2;

m is 1, 2 or 3, two L2 groups are the same or different when the m is 1, and multiple L1 groups are the same or different when the m is greater than 1;

the number of Ra, Rb and Rc is from 1 to a maximum substitution number;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

at least one of the Rd and the Re is not hydrogen;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl, or any two adjacent groups of the $R_1$-$R_8$ may be connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, cyano, isocyano, phosphino, $C_1$-$C_6$ alkyl, $C_3$-$C_6$cycloalkyl, or amino substituted with $C_1$-$C_6$ alkyl, and the substitution ranges from a single substitution number to a maximum substitution number.

2. The organometallic iridium compound according to claim 1, wherein the m is 1 or 2, and the two L1 groups or the two L2 groups are the same.

3. The organometallic iridium compound according to claim 2, wherein at least one of the Rd and the Re is not hydrogen, and at least one of the Rd and the Re is substituted or unsubstituted $C_1$-$C_6$ alkyl, or substituted or unsubstituted $C_3$-$C_6$ cycloalkyl.

4. The organometallic iridium compound according to claim 3, wherein the Ra is hydrogen.

5. The organometallic iridium compound according to claim 3, wherein at least one of the $R_1$-$R_4$ is not hydrogen.

6. The organometallic iridium compound according to claim 3, wherein at least one of the $R_5$-$R_8$ is not hydrogen.

7. The organometallic iridium compound according to claim 3, wherein at least one of the $R_1$-$R_4$ is not hydrogen, and at least one of the $R_5$-$R_8$ is not hydrogen.

8. The organometallic iridium compound according to claim 7, wherein one of the $R_1$-$R_4$ is deuterium, $C_1$-$C_5$ alkyl substituted or unsubstituted with deuterium, or $C_3$-$C_5$ cycloalkyl substituted or unsubstituted with deuterium, one of the $R_5$-$R_8$ is deuterium, $C_1$-$C_5$ alkyl substituted or unsubstituted with deuterium, or $C_3$-$C_5$ cycloalkyl substituted or unsubstituted with deuterium, and the other groups are hydrogen.

9. The organometallic iridium compound according to claim 7, wherein the $R_5$ and the $R_6$, the $R_6$ and the $R_7$, or the $R_7$ and the $R_8$ are connected to each other to form a ring-fused structure represented by Formula (2):

(2)

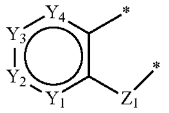

wherein * indicates a connecting position;

$Y_1$-$Y_4$ are independently $CR_0$ or N;

$Z_1$ is selected from O and S;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, cyano, isocyano, phosphino, $C_1$-$C_4$ alkyl, $C_1$-$C_4$ alkoxyl, $C_3$-$C_6$ cycloalkyl, or amino substituted with $C_1$-$C_4$ alkyl.

10. The organometallic iridium compound according to claim 7, wherein the $R_4$ and the $R_5$ are connected to each other to form an aliphatic ring structure represented by Formula (3):

(3)

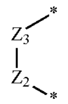

wherein * indicates a connecting position;

$Z_2$ and $Z_3$ are independently selected from O, S, $N(R_0)$ and $C(R_0)_2$, and at least one of the $Z_2$ and the $Z_3$ is $C(R_0)_2$;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, cyano, isocyano, phosphino, $C_1$-$C_4$ alkyl, $C_1$-$C_4$ alkoxyl, $C_3$-$C_6$ cycloalkyl, or amino substituted with $C_1$-$C_4$ alkyl.

11. The organometallic iridium compound according to any one of claim 1, wherein at least one of the Rb and the Rc is not hydrogen.

12. The organometallic iridium compound according to claim 11, wherein at least one of the Rb and the Rc is substituted or unsubstituted $C_1$-$C_6$ alkyl, or substituted or unsubstituted $C_3$-$C_6$ cycloalkyl.

13. The organometallic iridium compound according to claim 12, wherein one of the Rb and the Rc is substituted or unsubstituted $C_1$-$C_6$ alkyl, or substituted or unsubstituted $C_3$-$C_6$ cycloalkyl, and the other groups are hydrogen.

14. The organometallic iridium compound according to claim 3, wherein the L1 has one of the following structural formulas, or is partially or completely deuterated or fluorinated correspondingly,
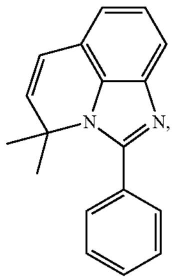
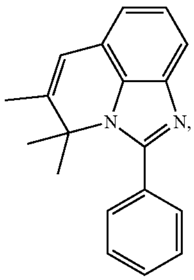
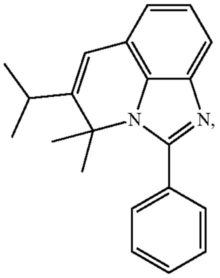
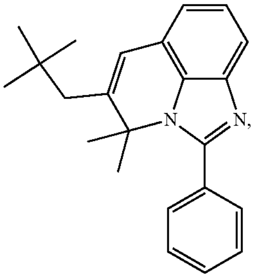
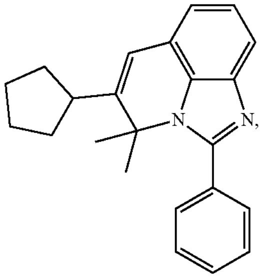
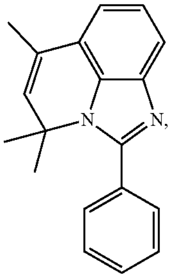
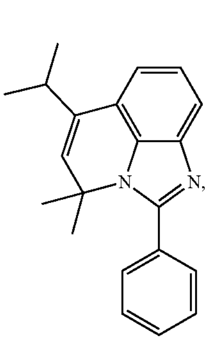
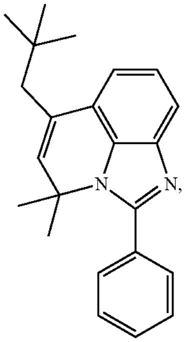
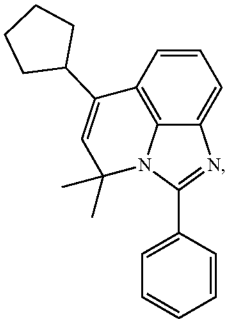
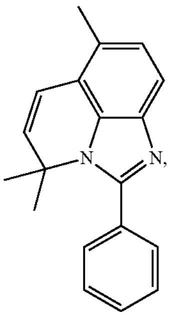
-continued
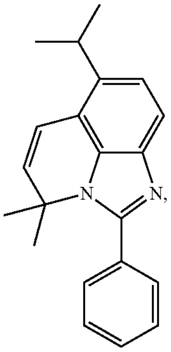
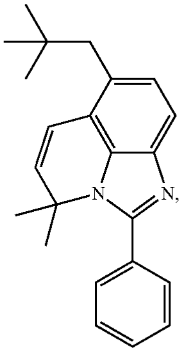
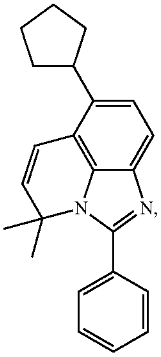
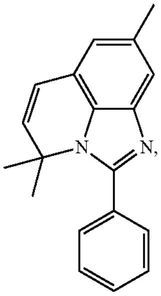
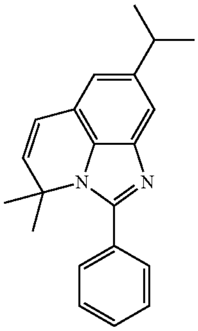
,
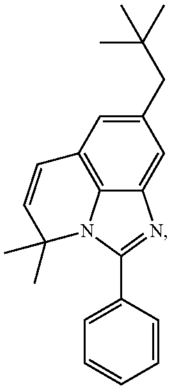
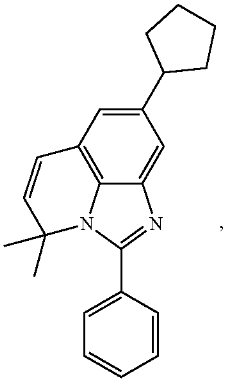
,
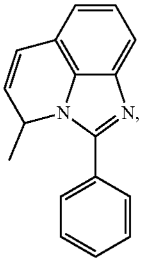
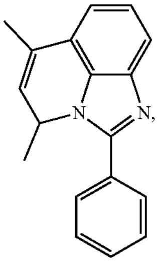
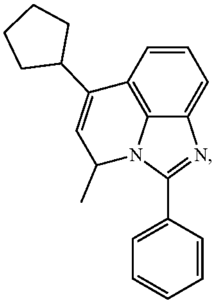

-continued
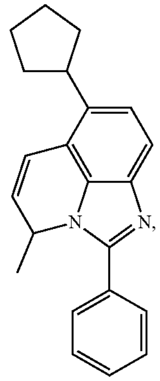
,
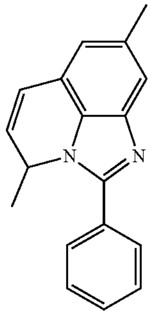
and
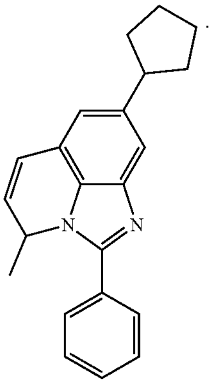
.
15. The organometallic iridium compound according to claim 3, wherein the L2 has one of the following structural formulas, or is partially or completely deuterated or fluorinated correspondingly,
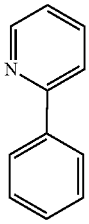
,
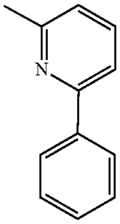
,
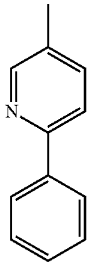
,
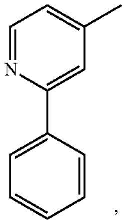
,
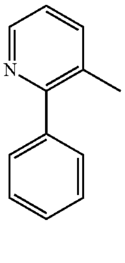
,
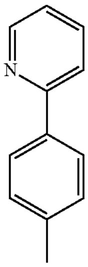
,
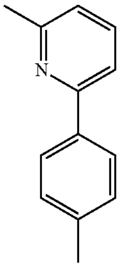
,
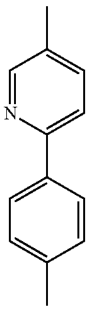
-continued
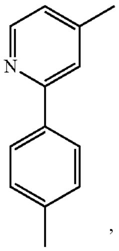
,
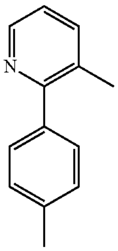
,
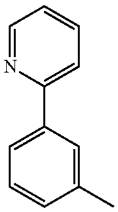
,
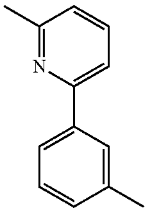
,
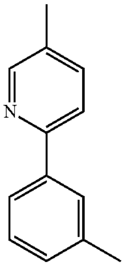
,
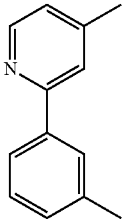
,
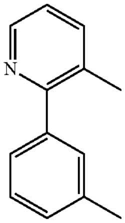
,
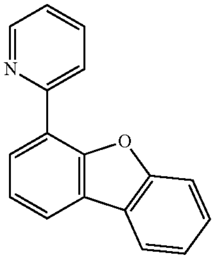
,
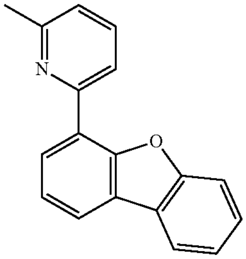
,
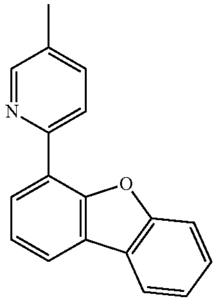
,
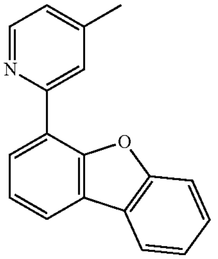
,
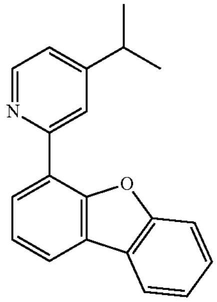
,
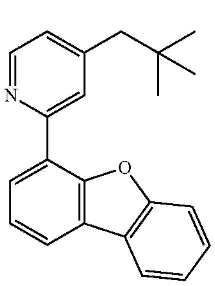
,
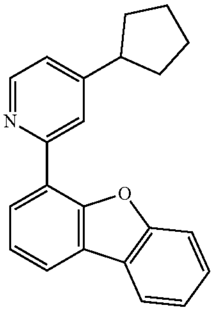
,
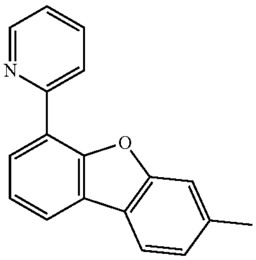
, -continued
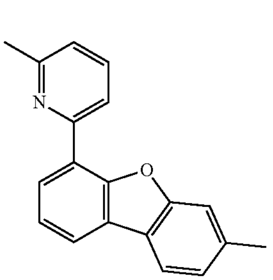,
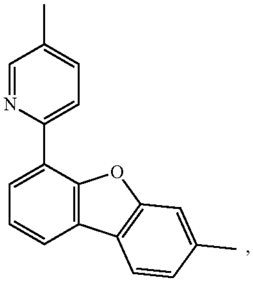,
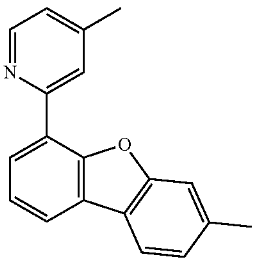,
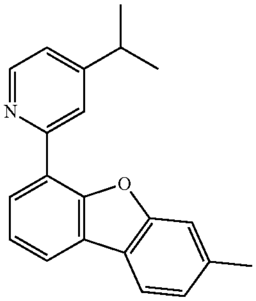,
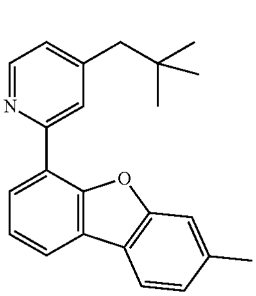,
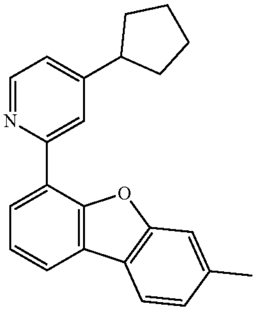,
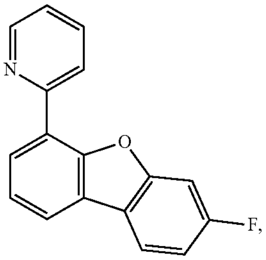
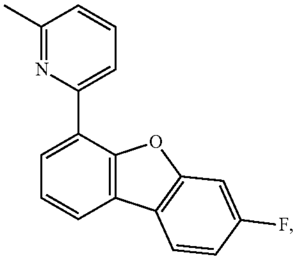
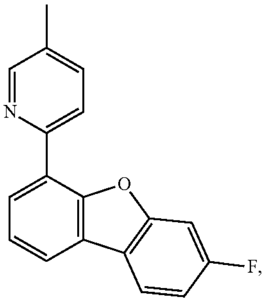
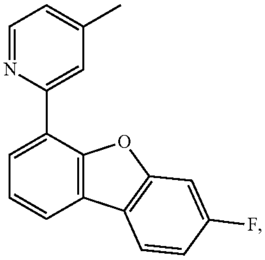
-continued
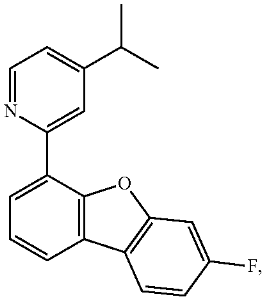
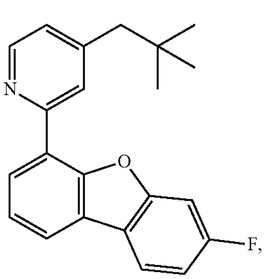
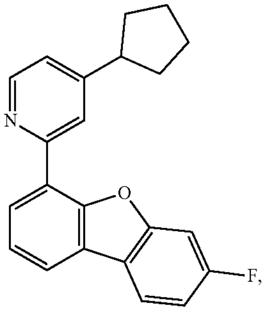
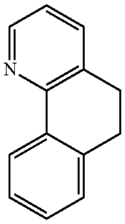,
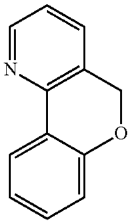,
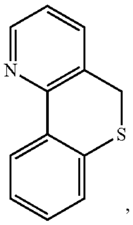,
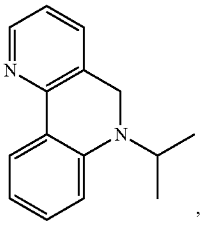,
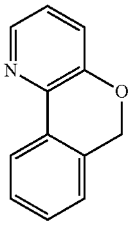,
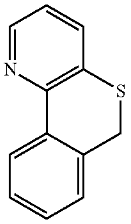,
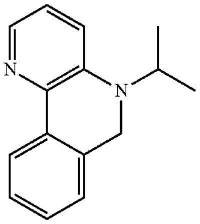,
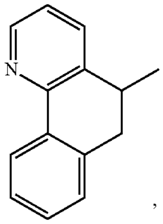,
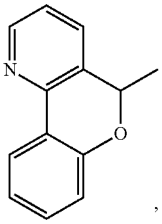,
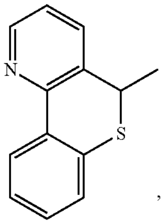,
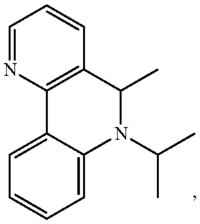,
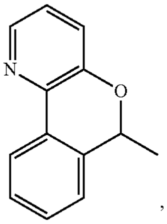,
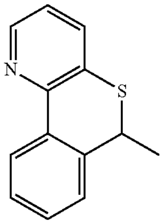,
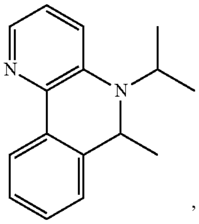,
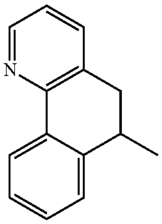,
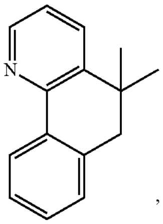,
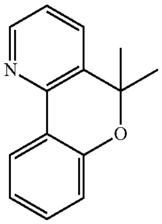, -continued
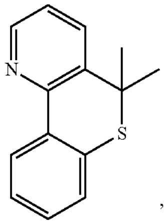,
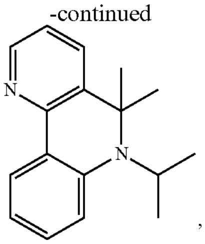,
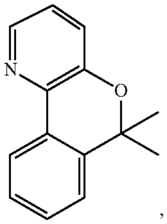,
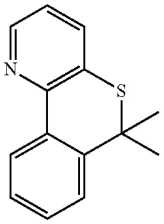,
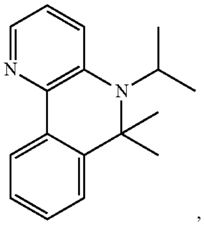,
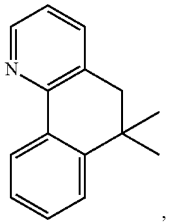,
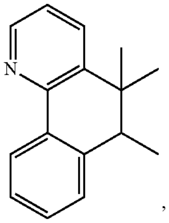,
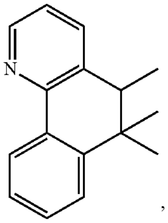,
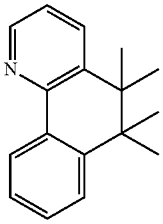
and
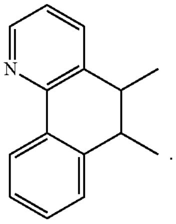.
16. The organometallic iridium compound according to claim 1, wherein the compound represented by Formula (1) has one of the following structural formulas, or is partially or completely deuterated or fluorinated correspondingly,
CPD 1
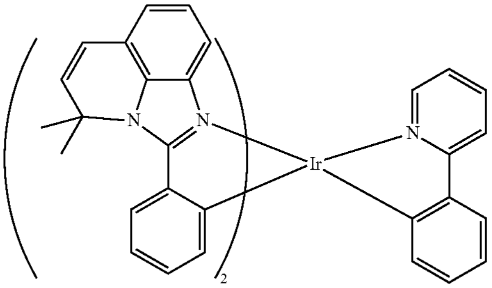
CPD 2
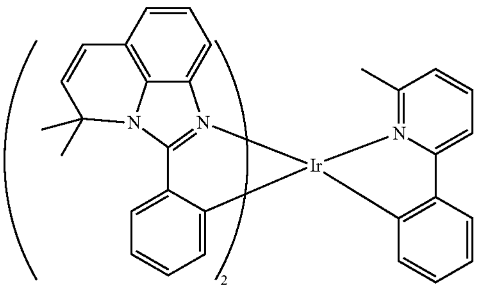
-continued
CPD 3
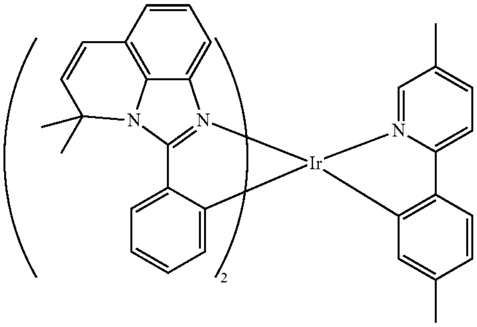
CPD 4
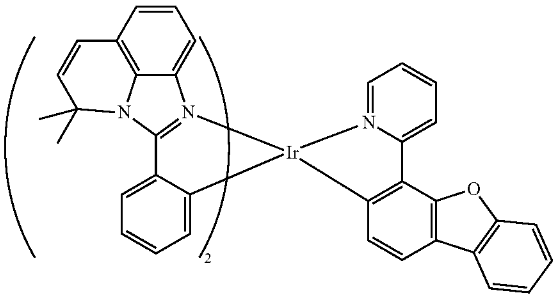
CPD 5
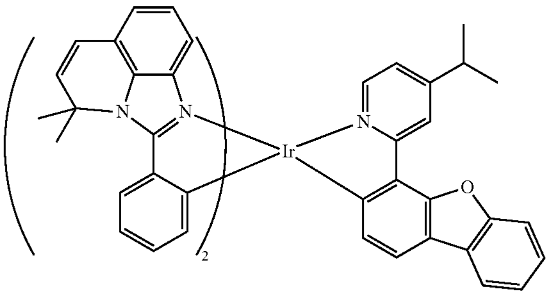
CPD 6
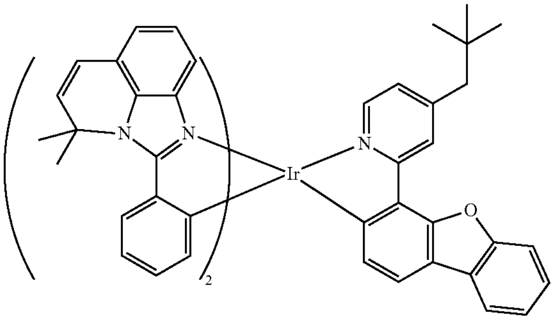
CPD 7
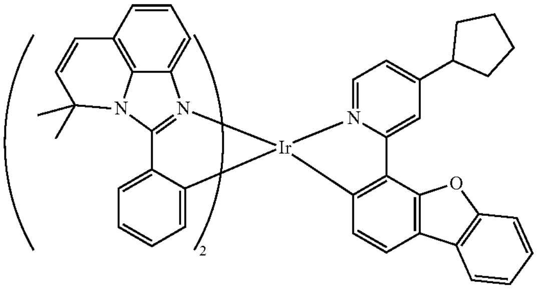

CPD 8
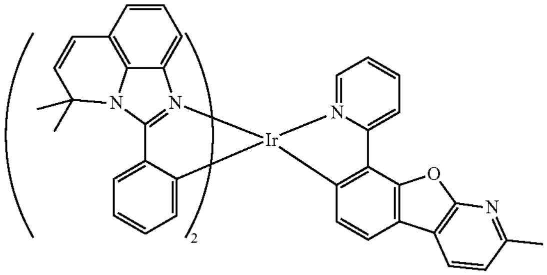
CPD 9
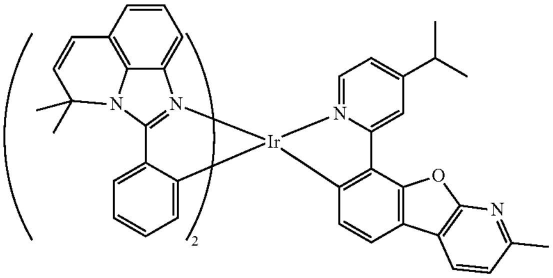
CPD 10
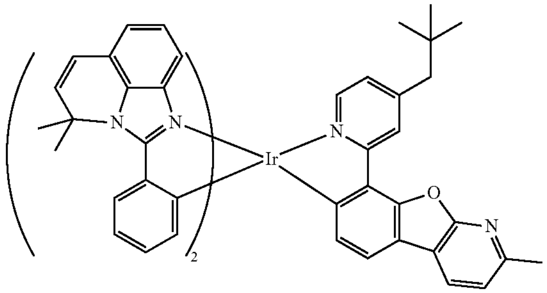
CPD 11
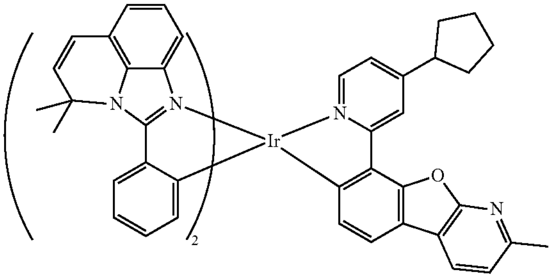
CPD 12
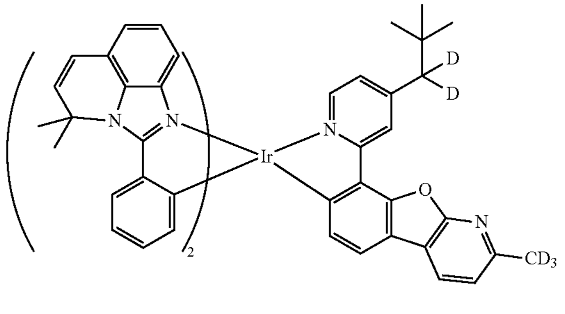
CPD 13
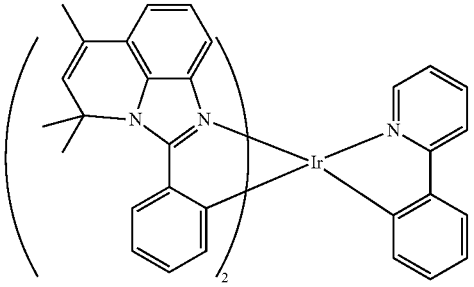
CPD 14
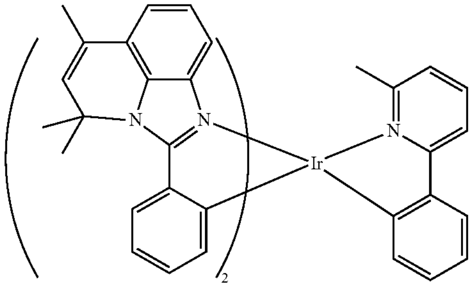
CPD 15
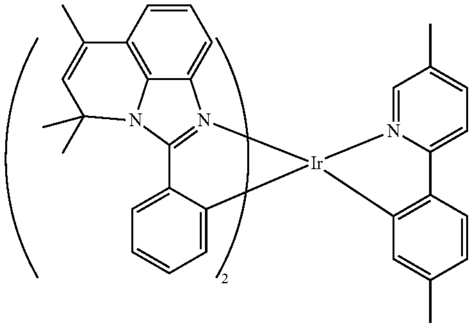
CPD 16
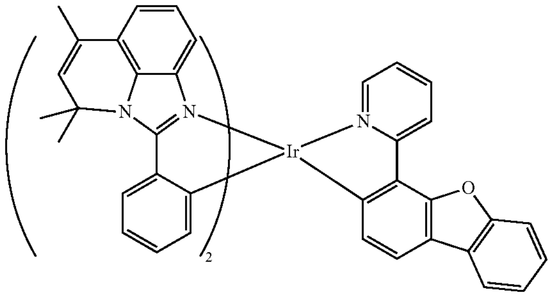
CPD 17
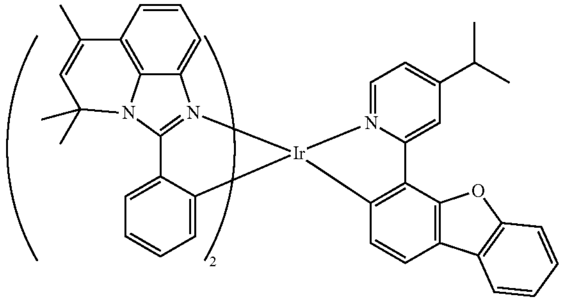

CPD 18
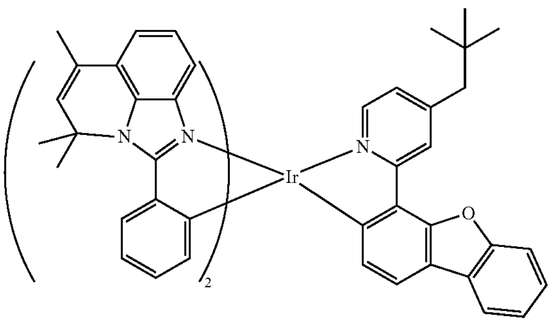
CPD 19
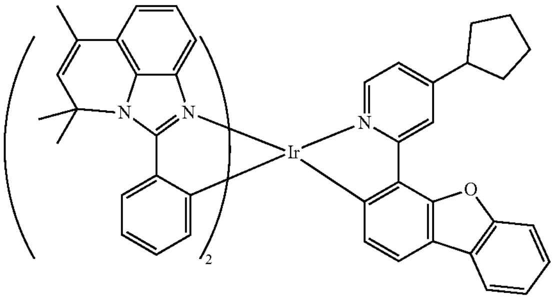
CPD 20
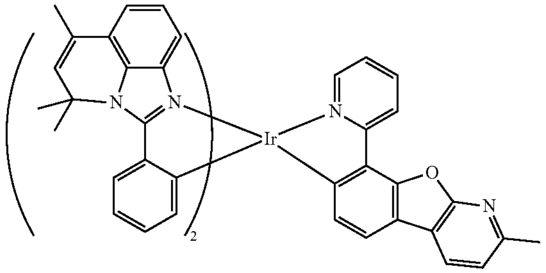
CPD 21
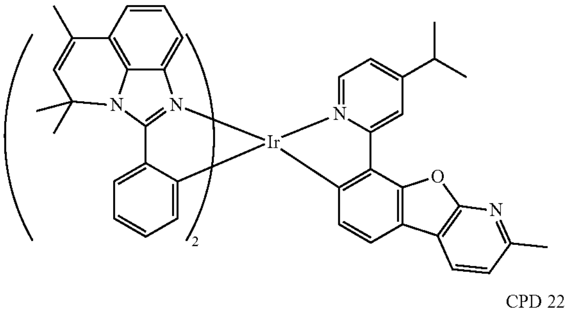
CPD 22
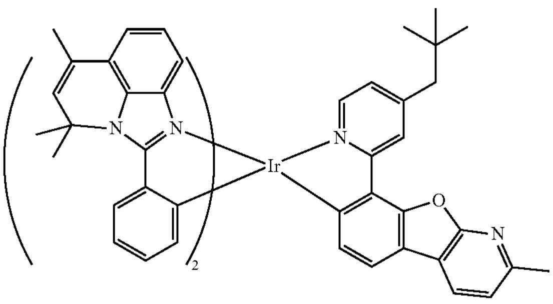
CPD 23
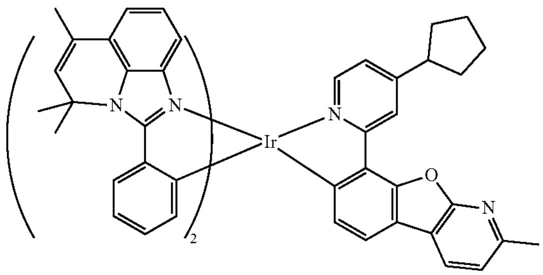
CPD 24
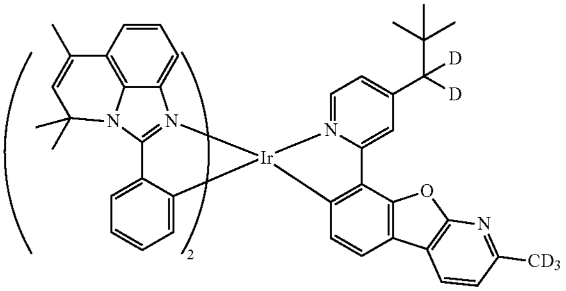
CPD 25
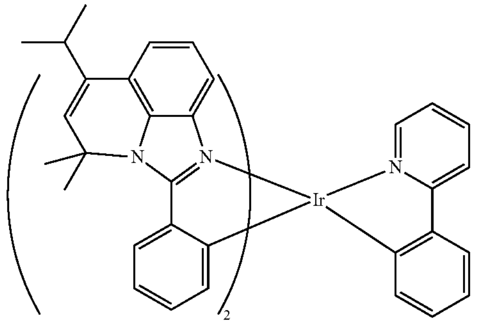
CPD 26
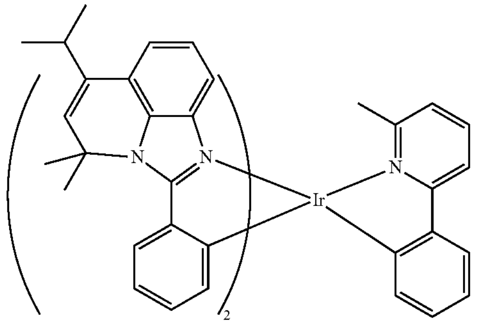
CPD 27
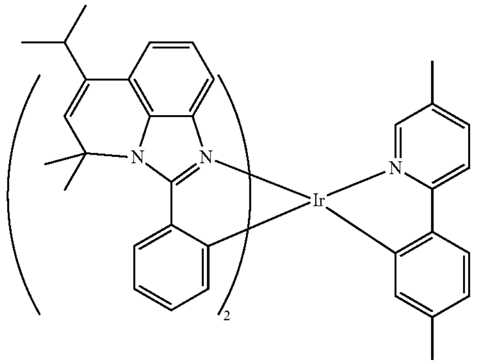

-continued
CPD 28
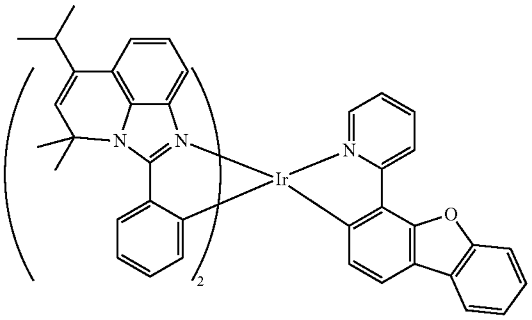
CPD 29
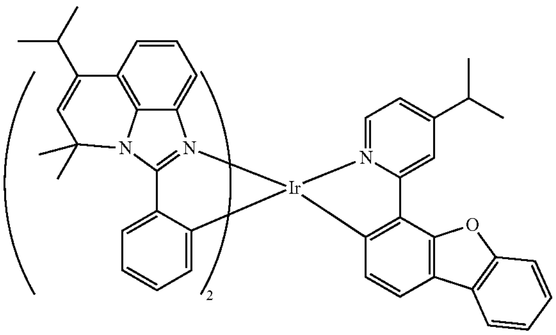
CPD 30
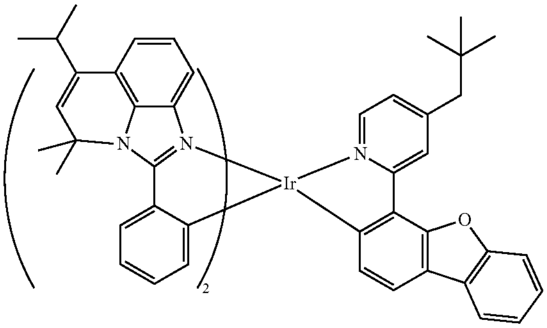
CPD 31
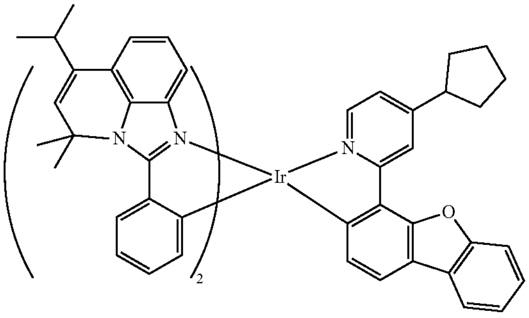
-continued
CPD 32
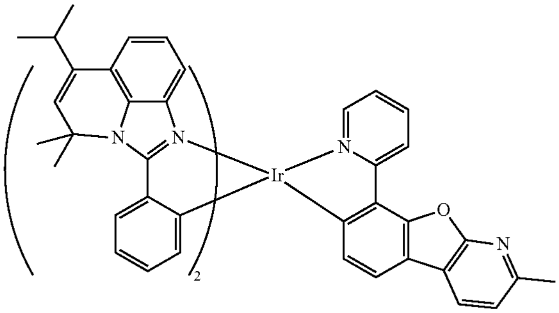
CPD 33
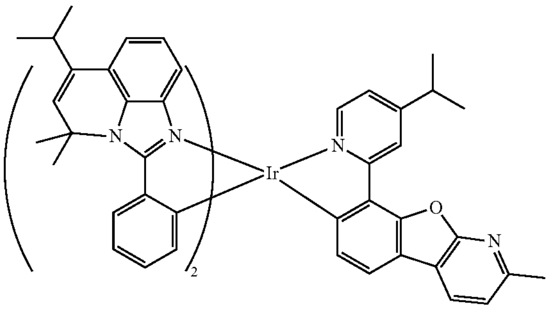
CPD 34
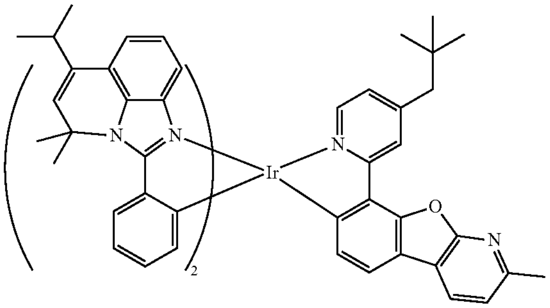
CPD 35
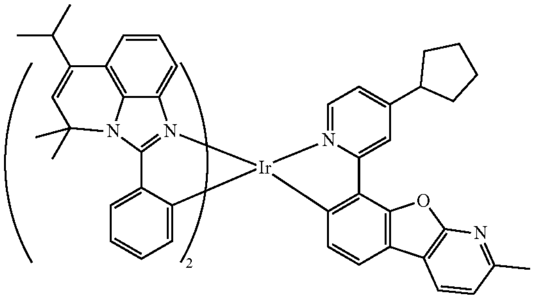
CPD 36
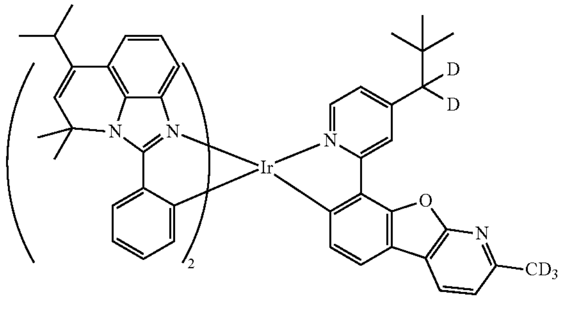

-continued
CPD 37
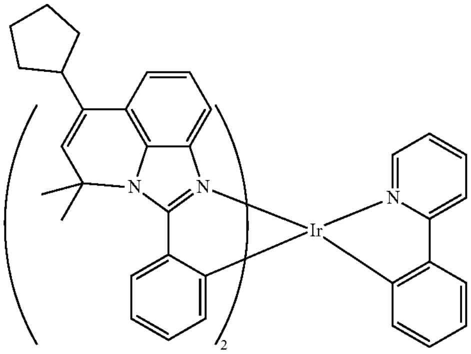
CPD 38
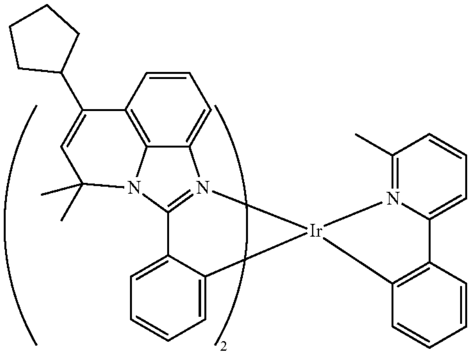
CPD 39
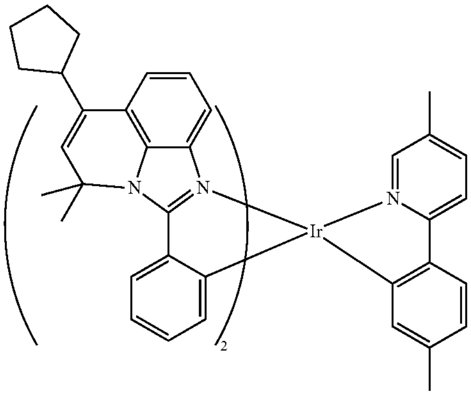
CPD 40
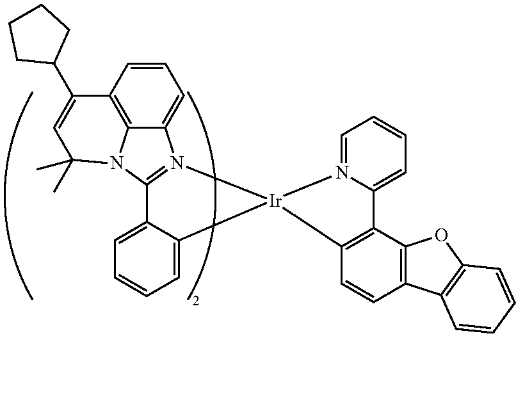
-continued
CPD 41
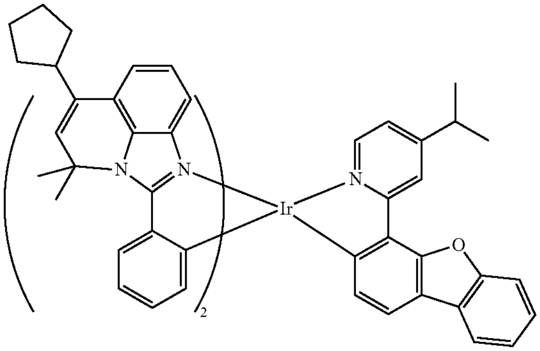
CPD 42
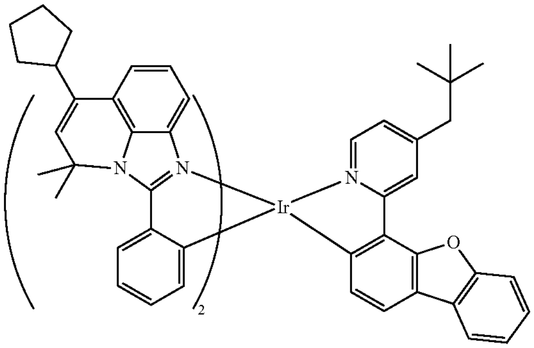
CPD 43
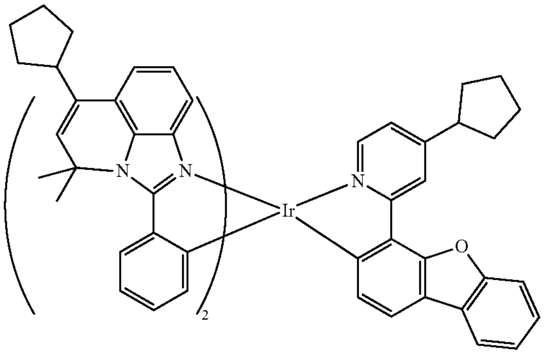
CPD 44
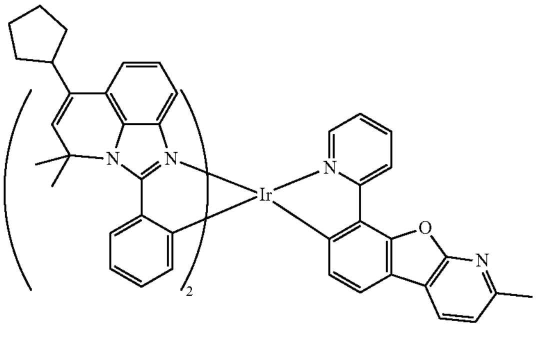

-continued
CPD 45
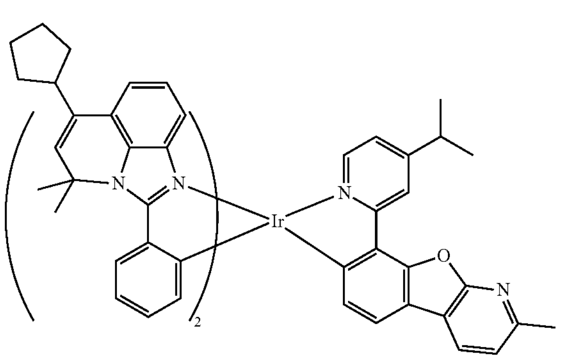
CPD 46
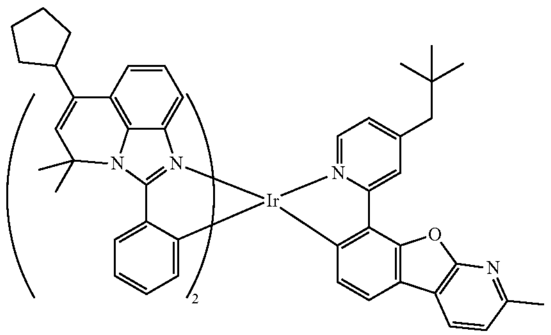
CPD 47
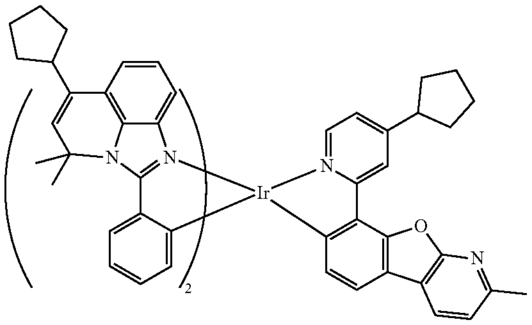
CPD 48
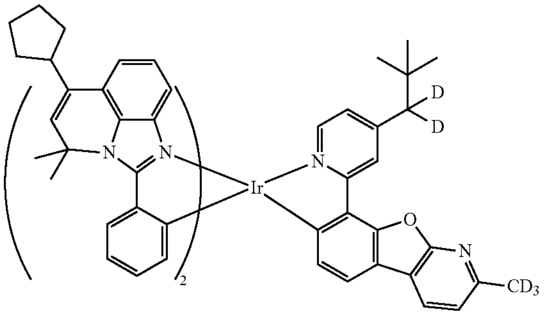
-continued
CPD 49
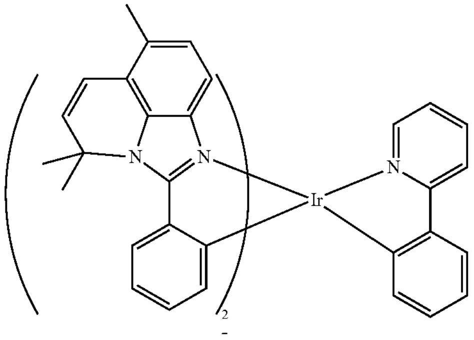
CPD 50
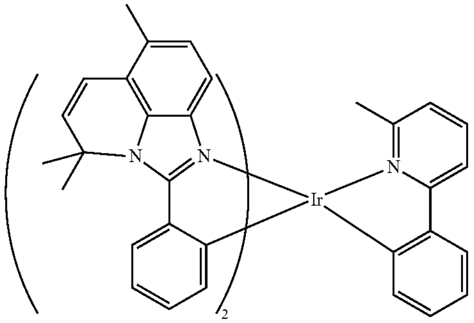
CPD 51
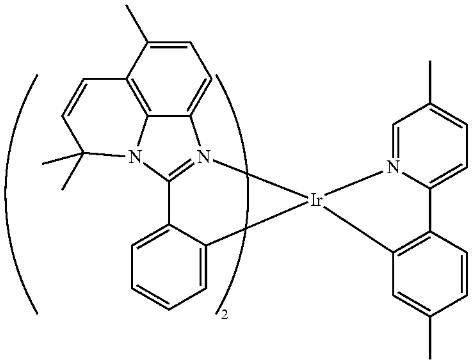
CPD 52
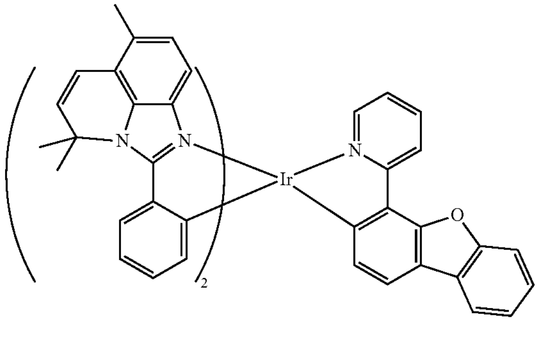

-continued
CPD 53
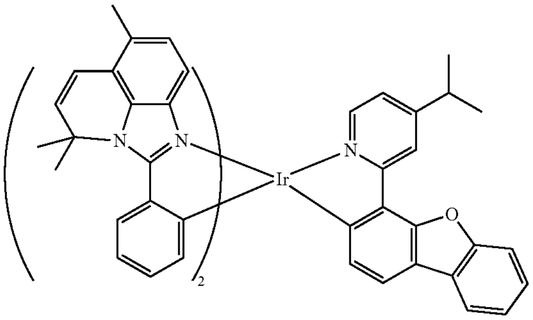
CPD 54
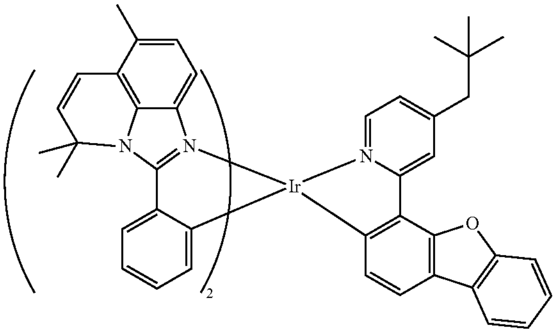
CPD 55
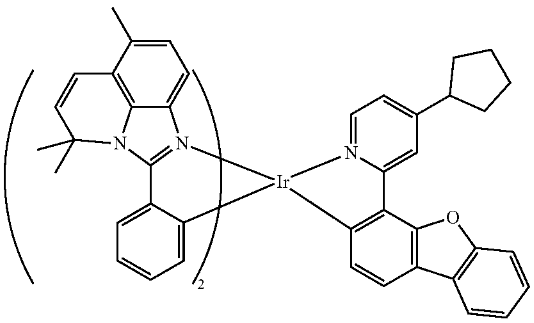
CPD 56
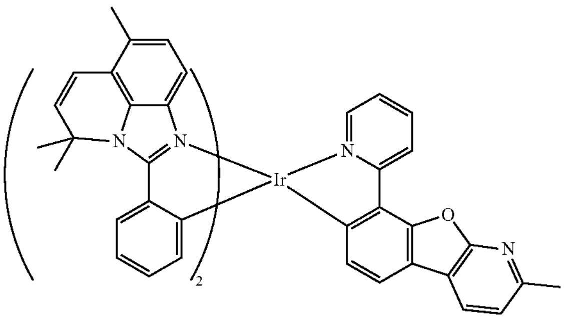
-continued
CPD 57
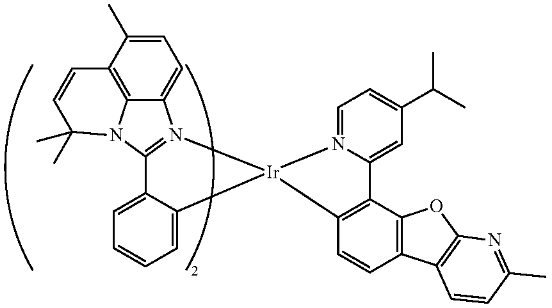
CPD 58
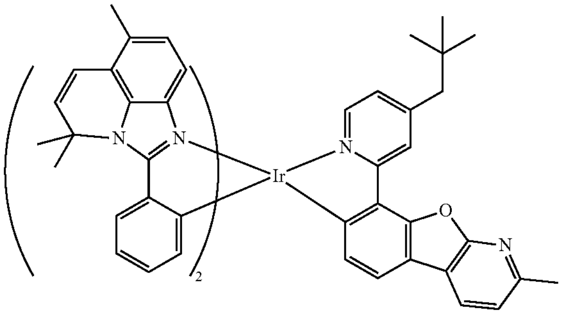
CPD 59
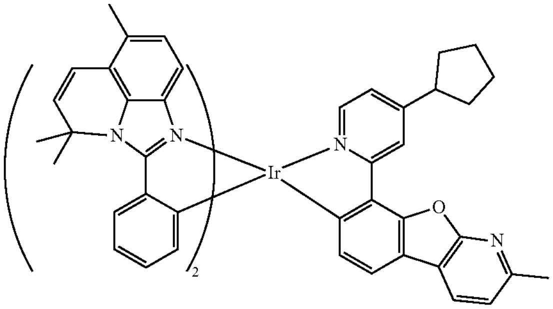
CPD 60
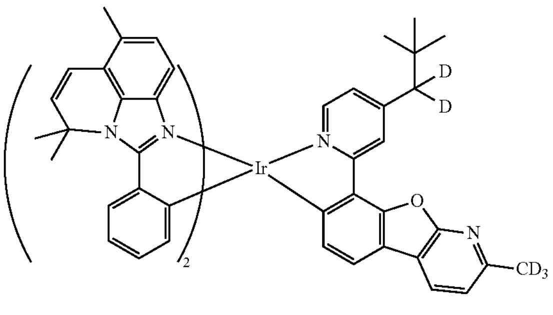

-continued
CPD 61
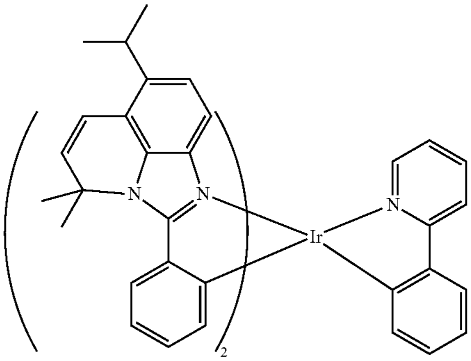
CPD 62
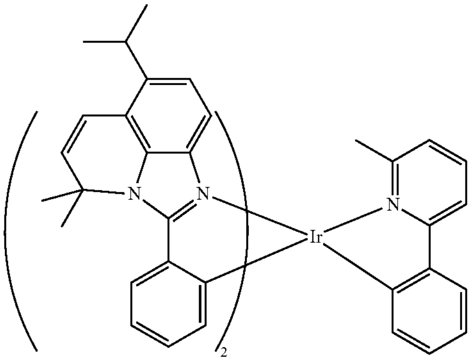
CPD 63
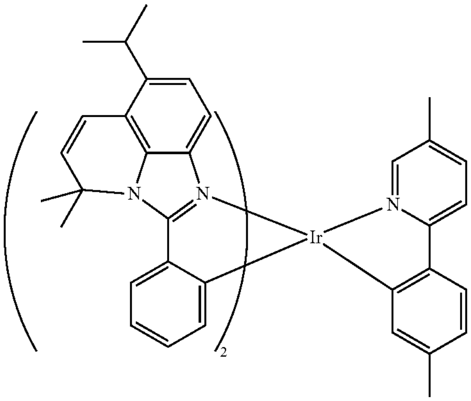
CPD 64
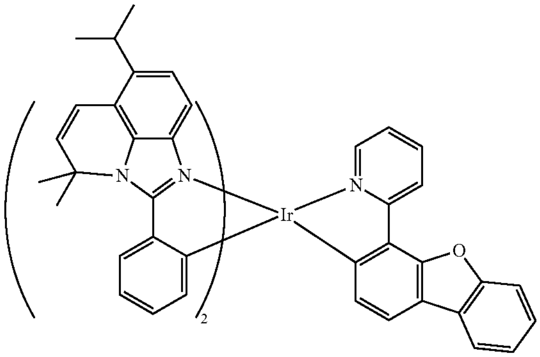
-continued
CPD 65
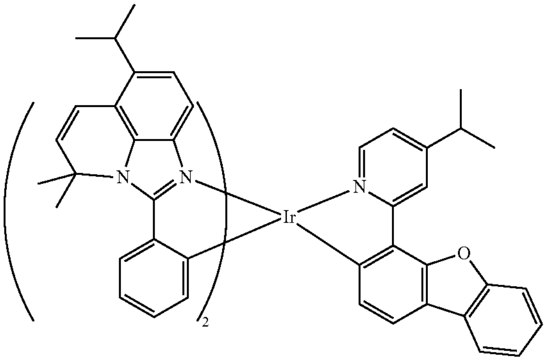
CPD 66
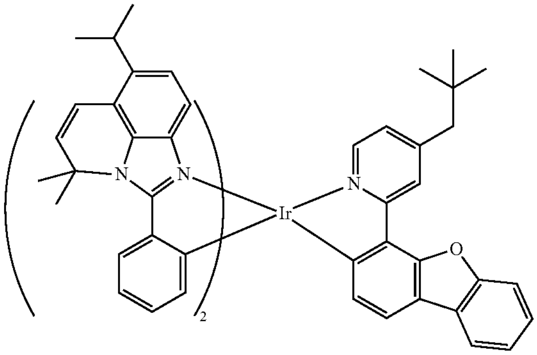
CPD 67
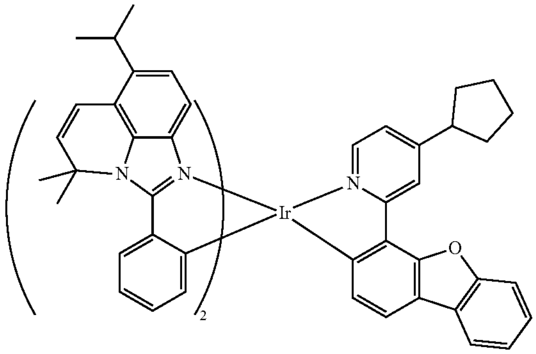
CPD 68
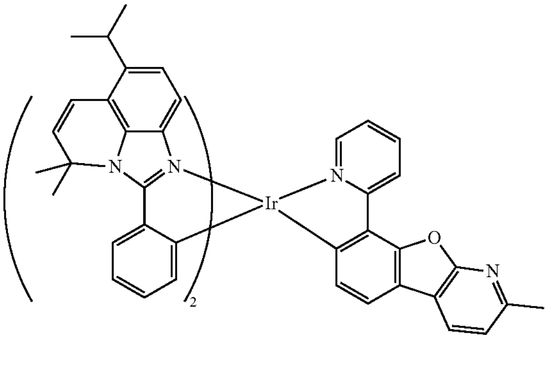

-continued
CPD 69
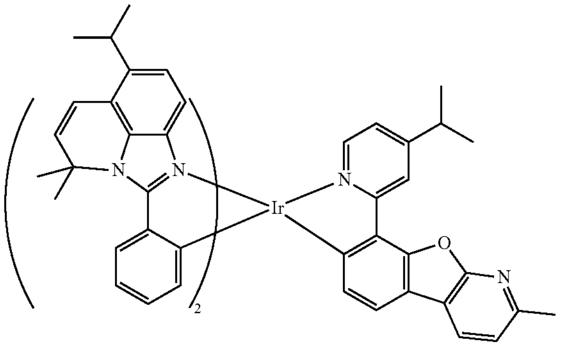
CPD 70
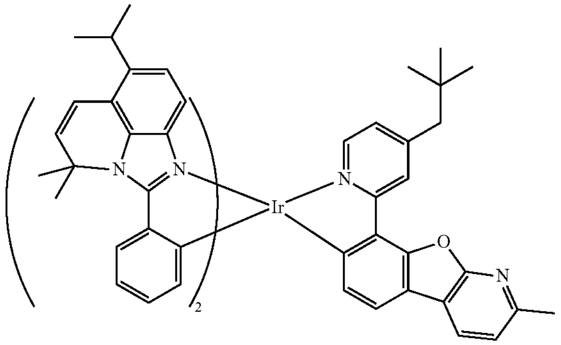
CPD 71
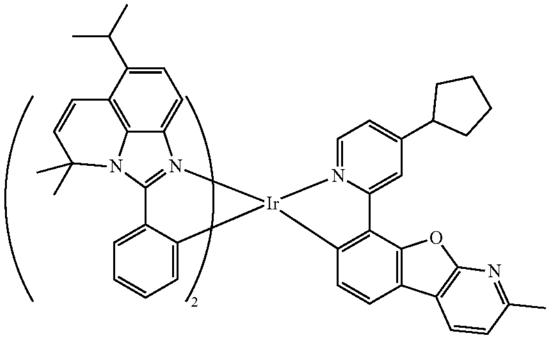
CPD 72
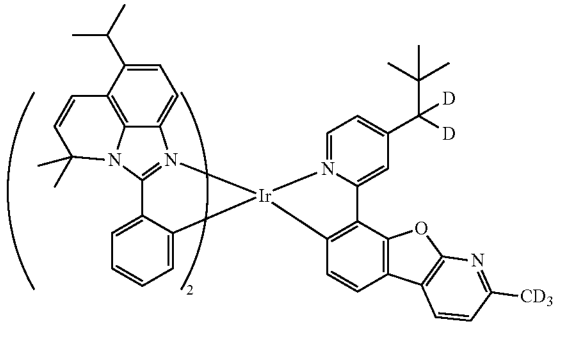
-continued
CPD 73
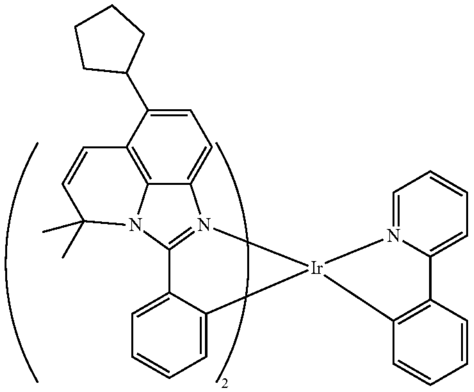
CPD 74
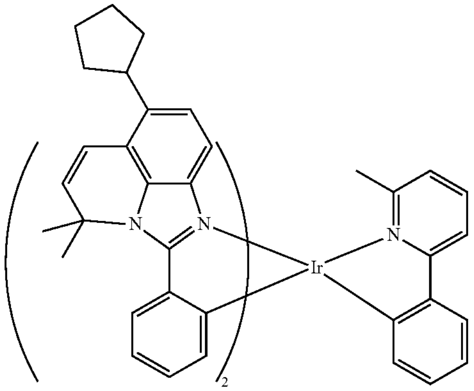
CPD 75
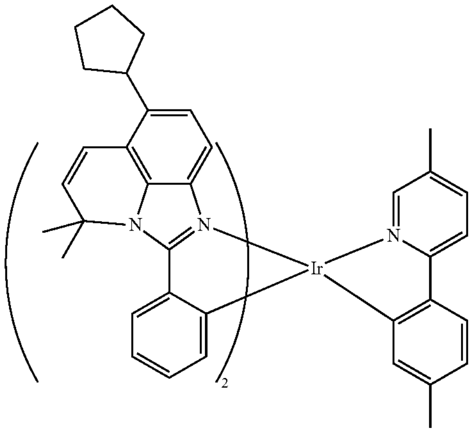
CPD 76
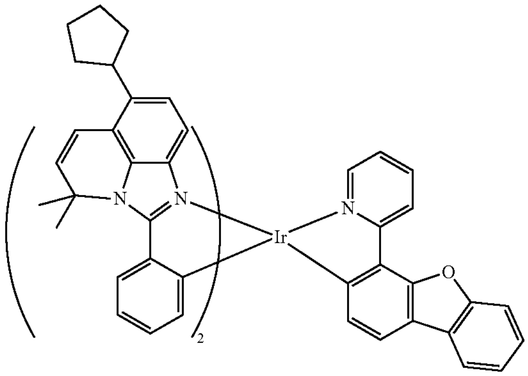

-continued
CPD 77
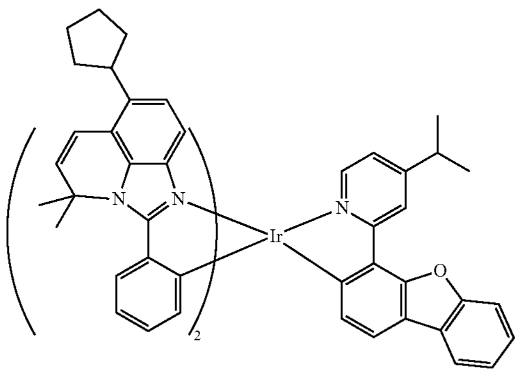
CPD 78
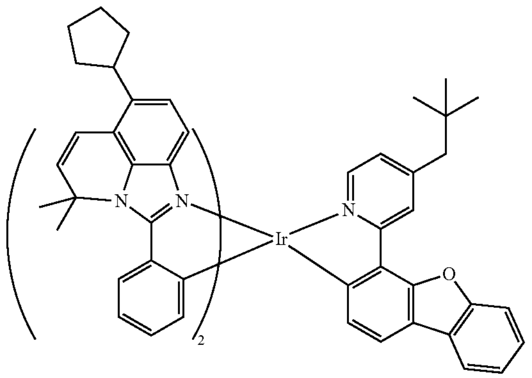
CPD 79
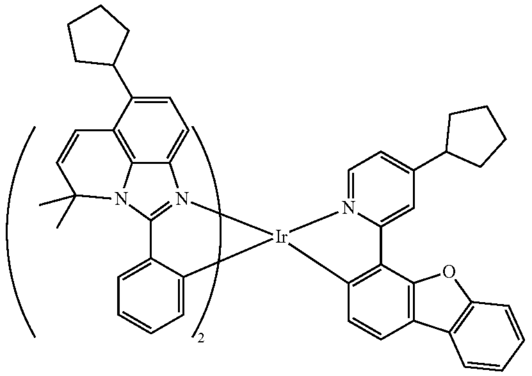
CPD 80
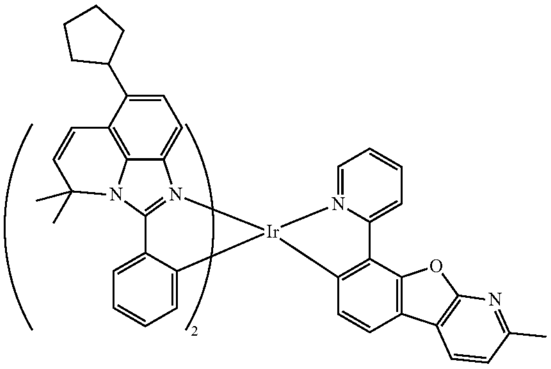
-continued
CPD 81
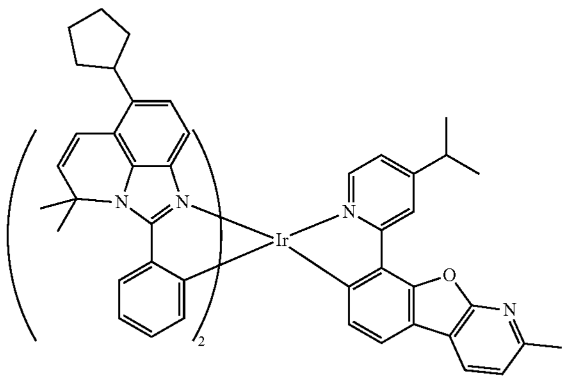
CPD 82
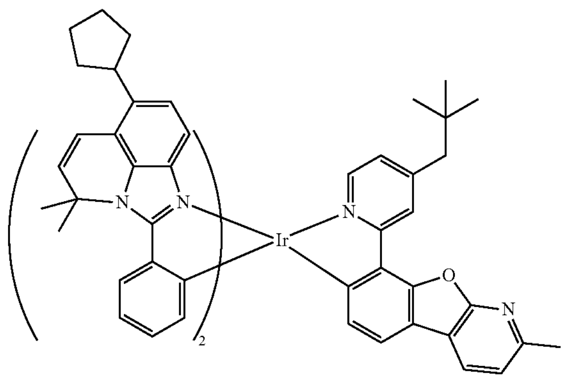
CPD 83
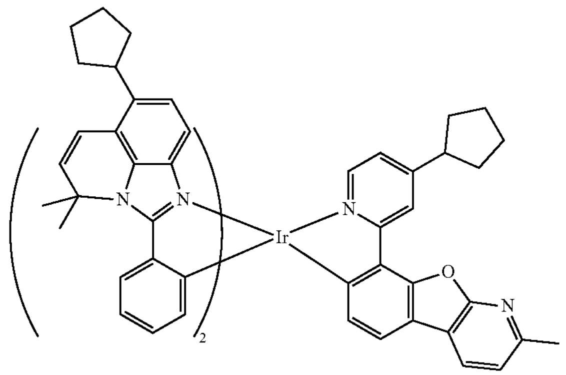
CPD 84
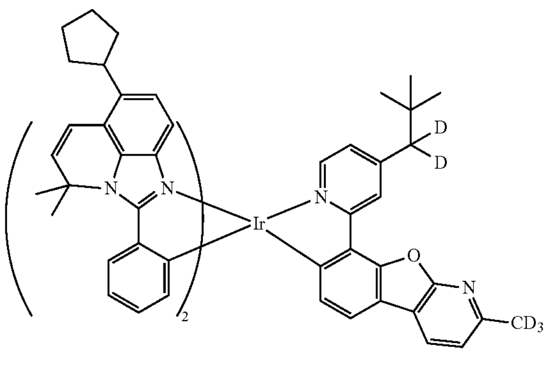

-continued
CPD 85
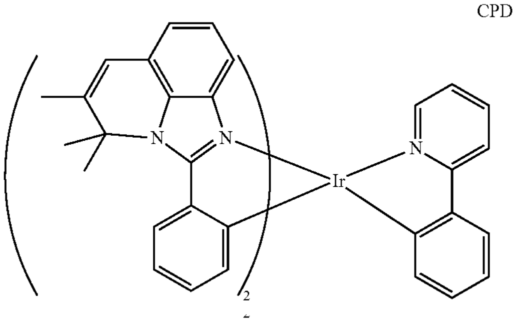
CPD 86
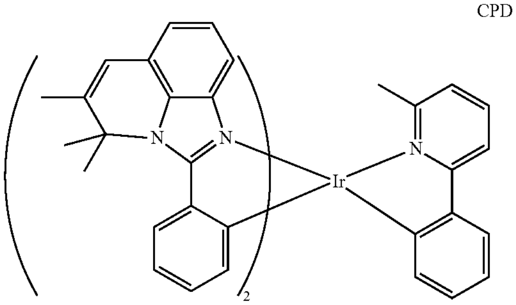
CPD 87
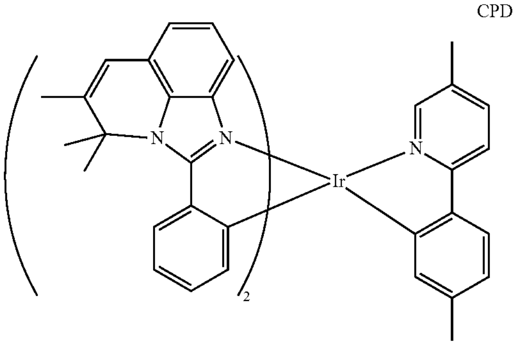
CPD 88
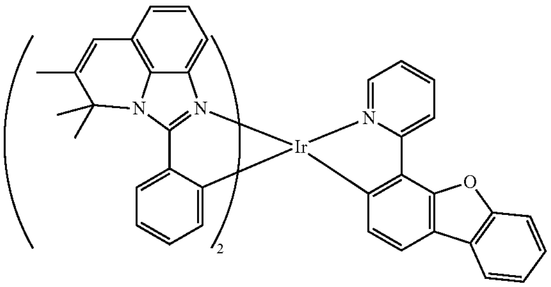
CPD 89
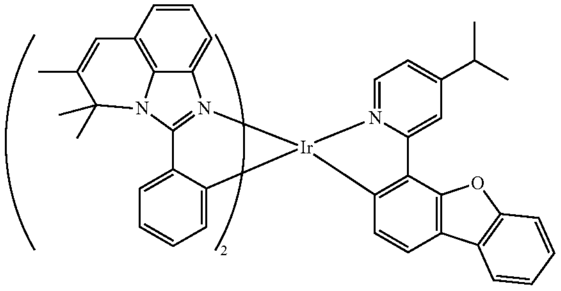
-continued
CPD 90
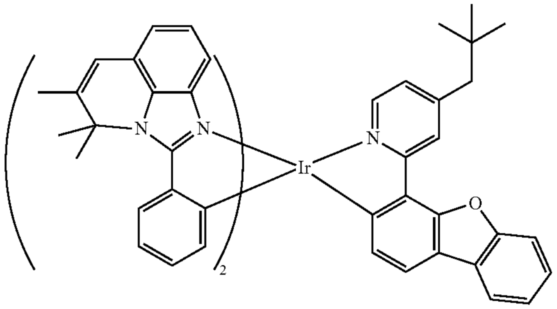
CPD 91
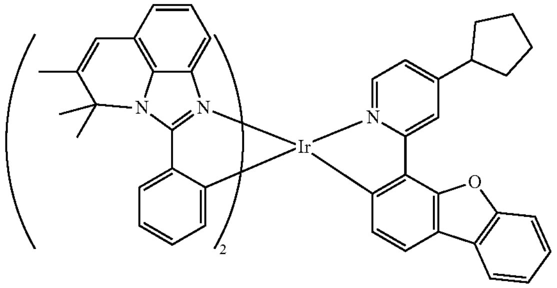
CPD 92
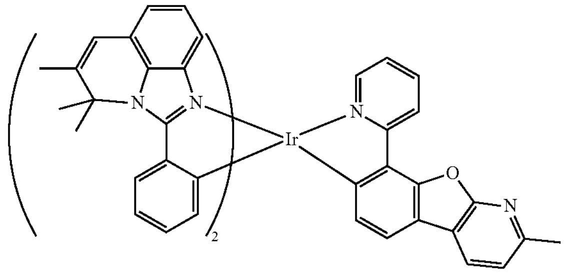
CPD 93
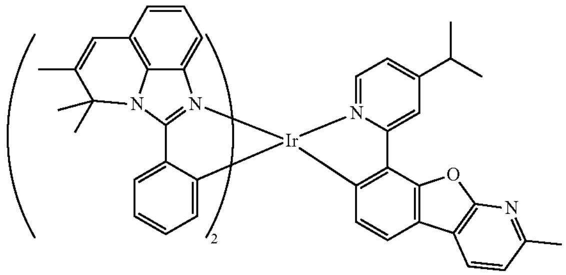
CPD 94
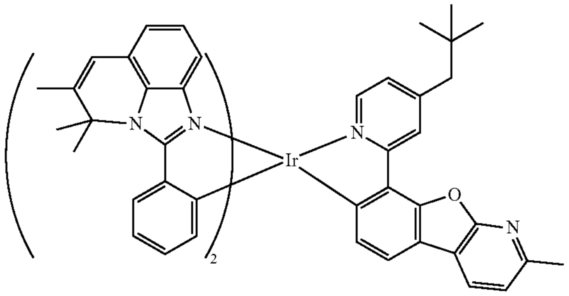

-continued
CPD 95
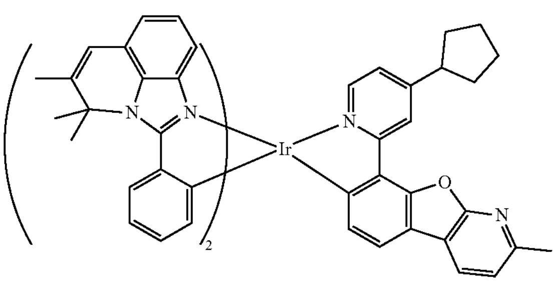
CPD 96
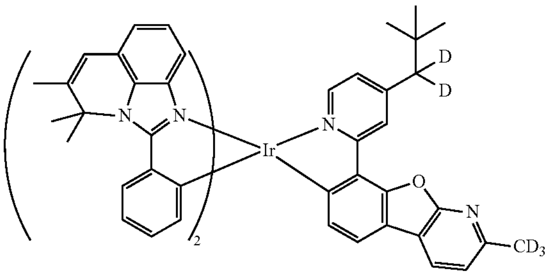
CPD 97
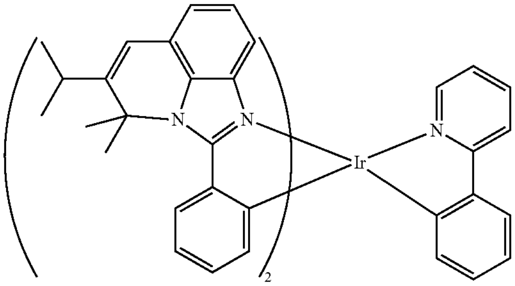
CPD 98
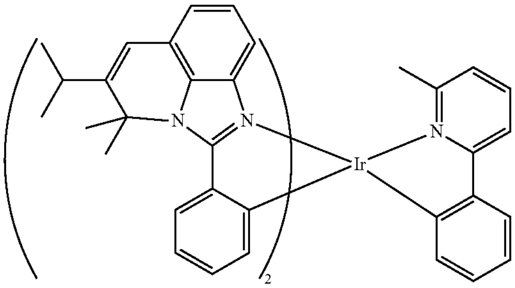
CPD 99
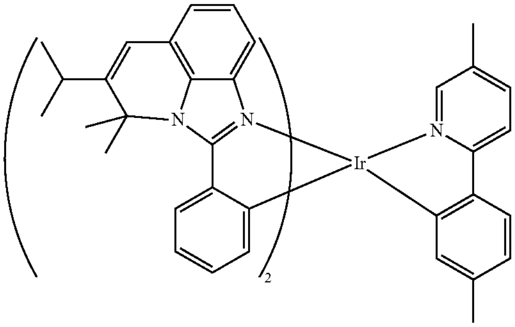
-continued
CPD 100
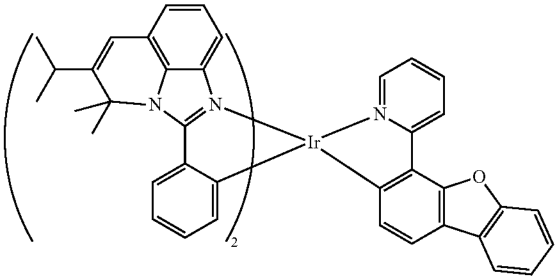
CPD 101
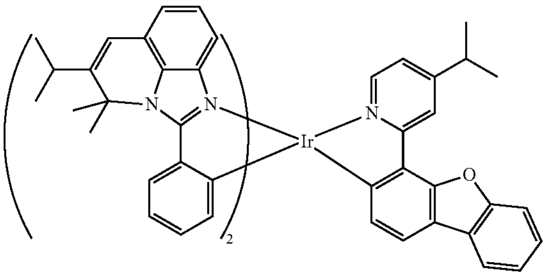
CPD 102
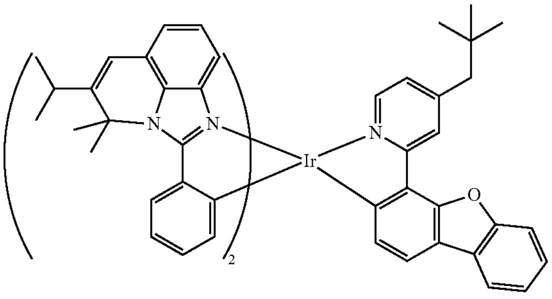
CPD 103
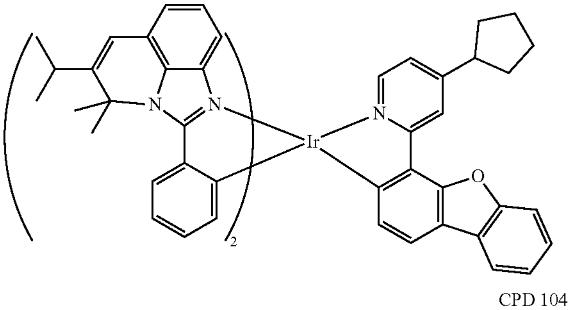
CPD 104
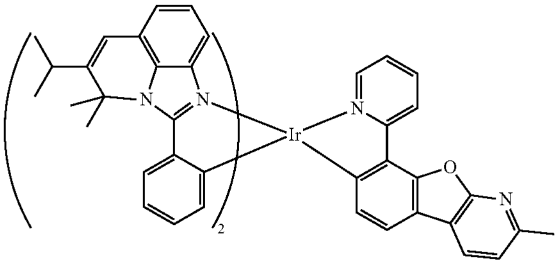

-continued
CPD 105
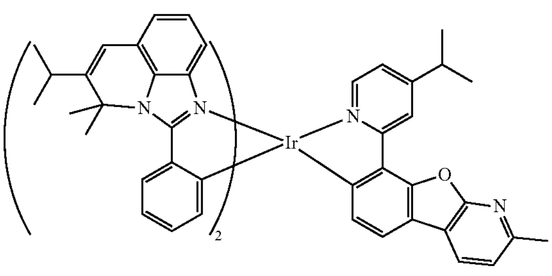
CPD 106
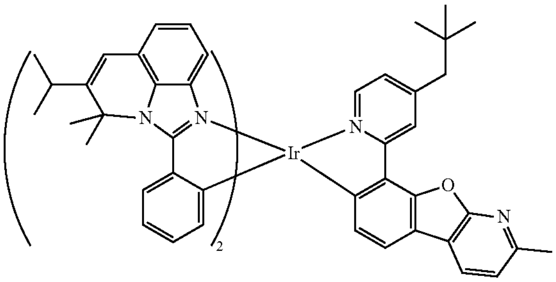
CPD 107
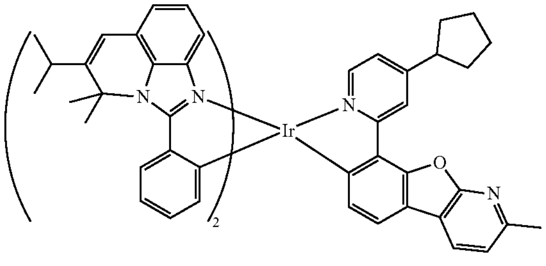
CPD 108
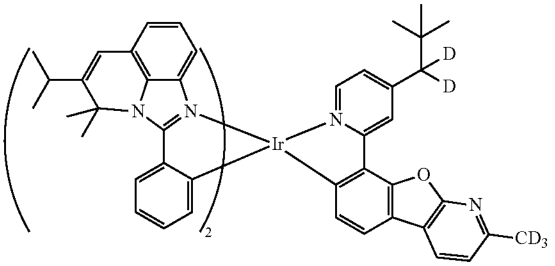
CPD 109
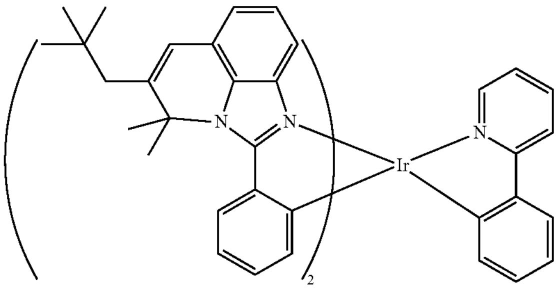
-continued
CPD 110
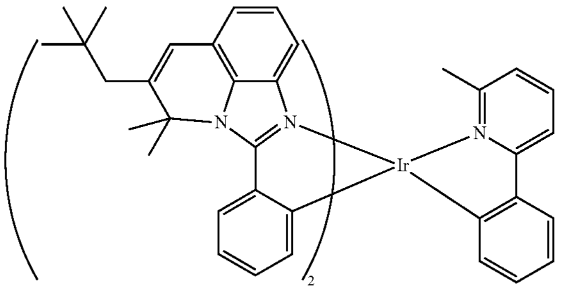
CPD 111
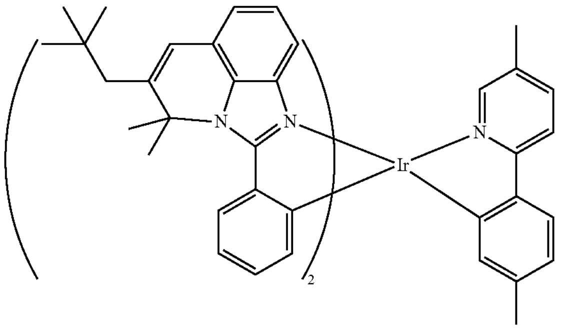
CPD 112
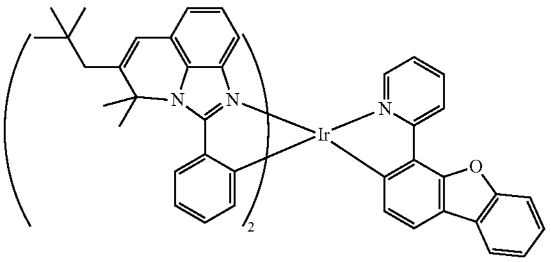
CPD 113
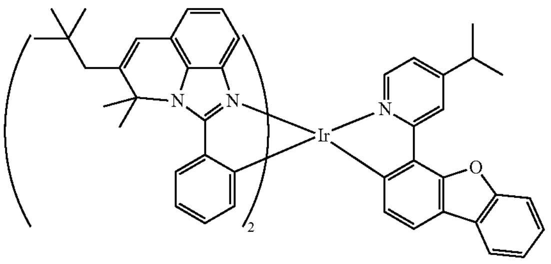
CPD 114
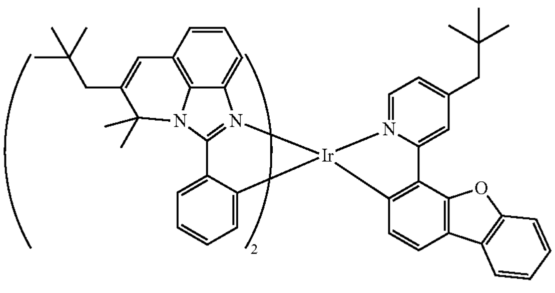

-continued
CPD 115
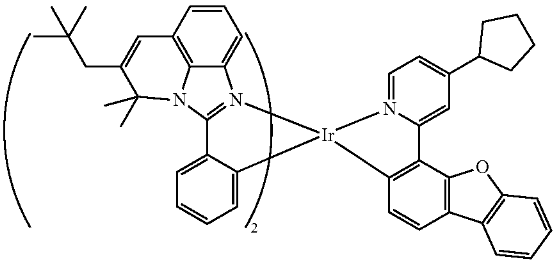
CPD 116
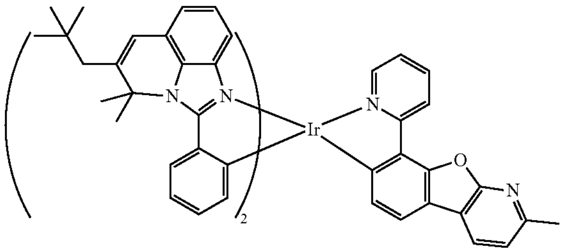
CPD 117
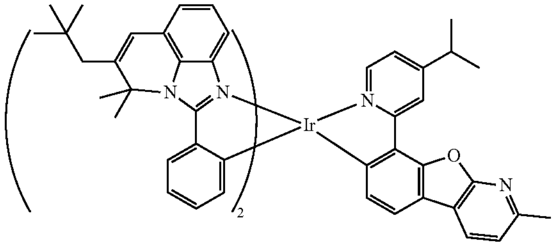
CPD 118
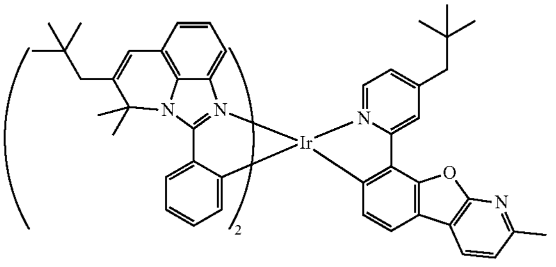
CPD 119
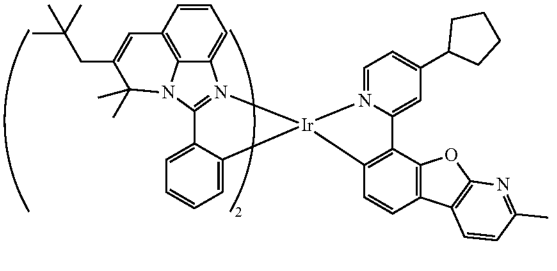
-continued
CPD 120
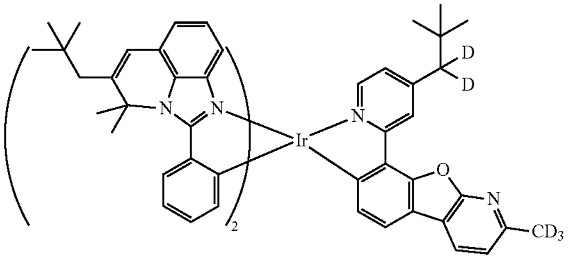
CPD 121
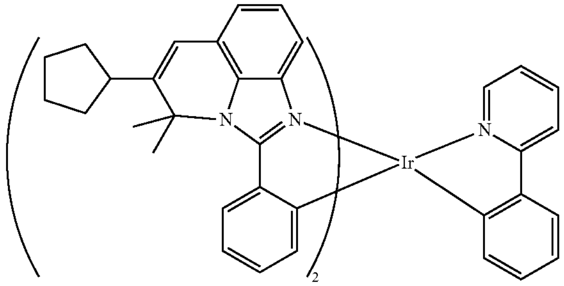
CPD 122
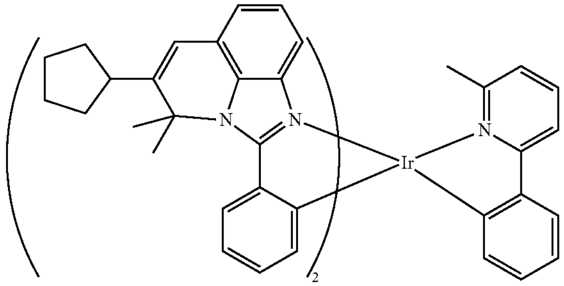
CPD 123
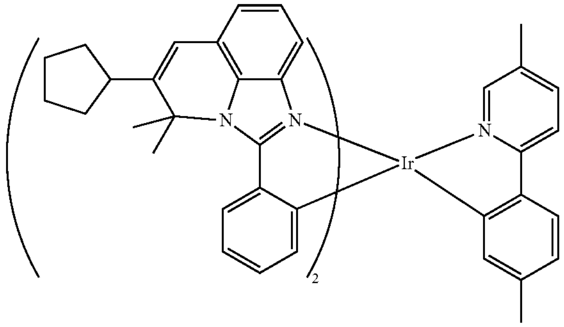
CPD 124
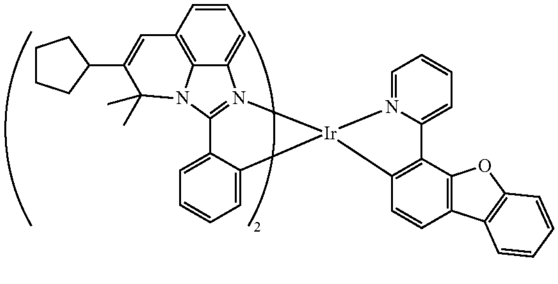

-continued
CPD 125
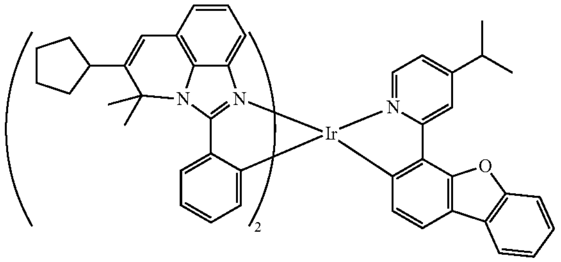
CPD 126
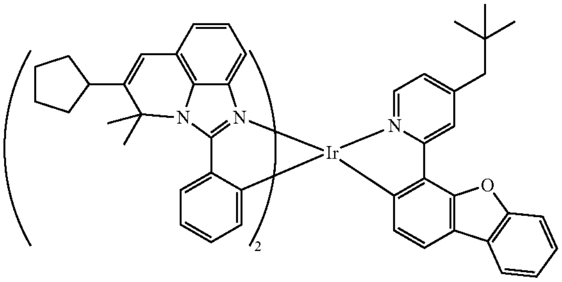
CPD 127
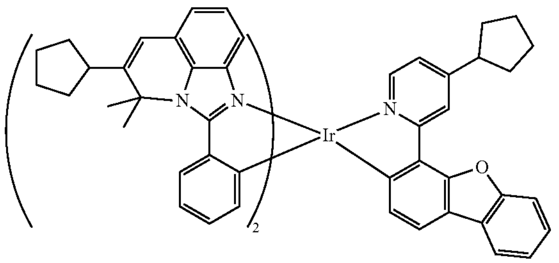
CPD 128
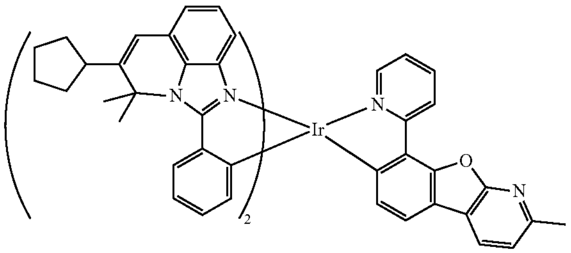
CPD 129
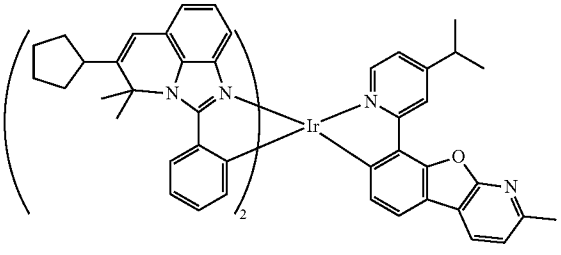
-continued
CPD 130
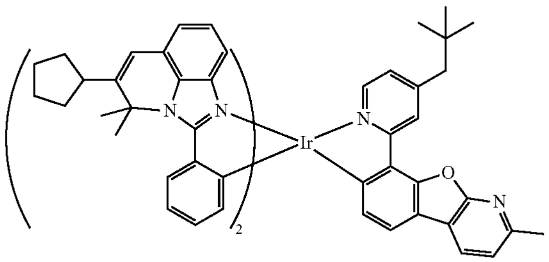
CPD 131
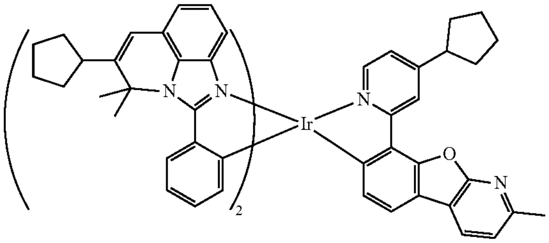
CPD 132
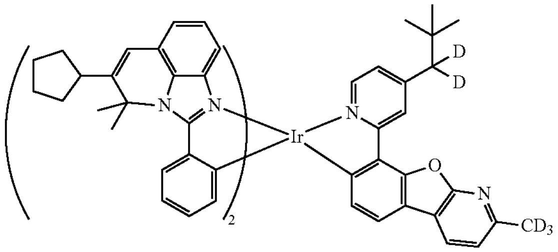
CPD 133
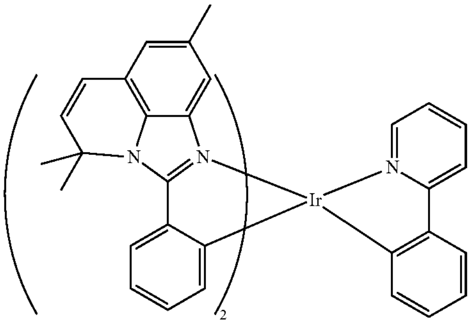
CPD 134
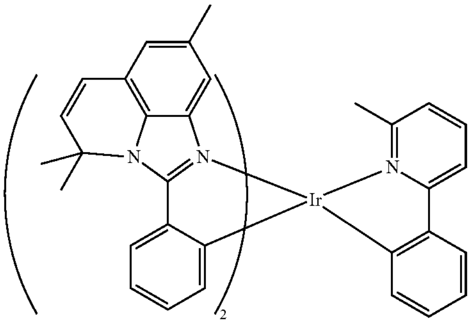

-continued
CPD 135
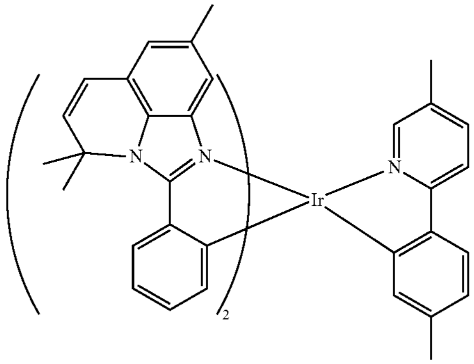
CPD 136
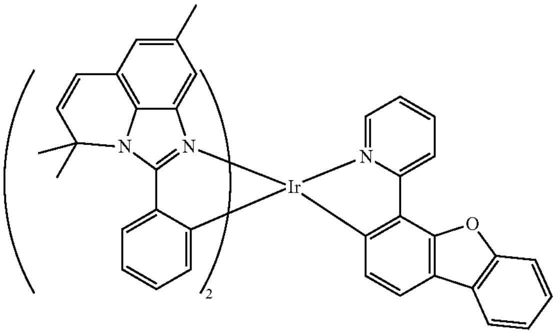
CPD 137
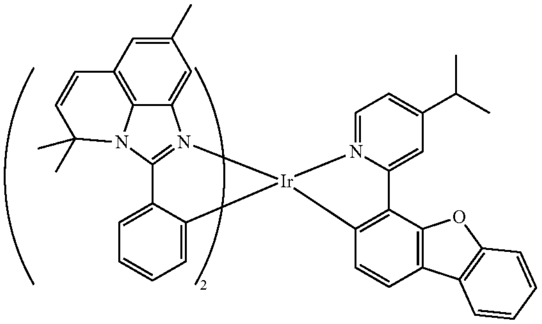
CPD 138
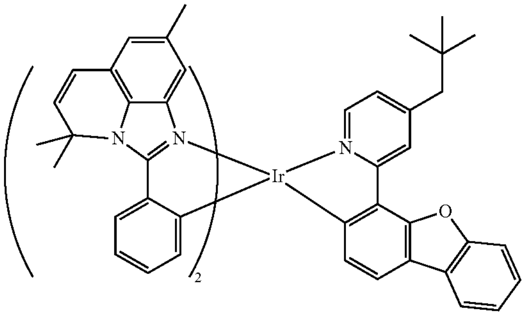
-continued
CPD 139
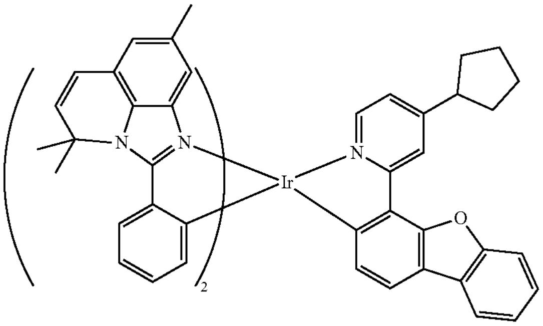
CPD 140
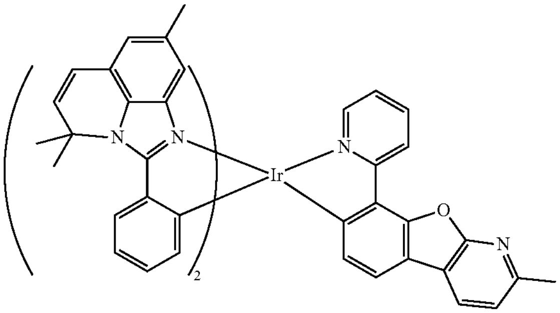
CPD 141
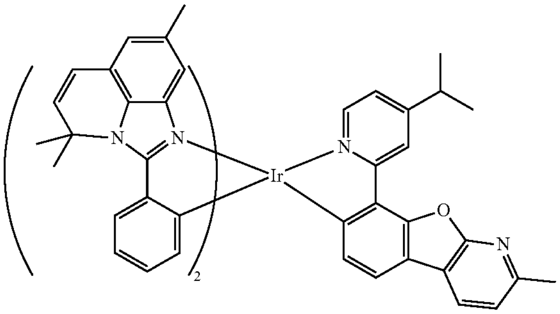
CPD 142
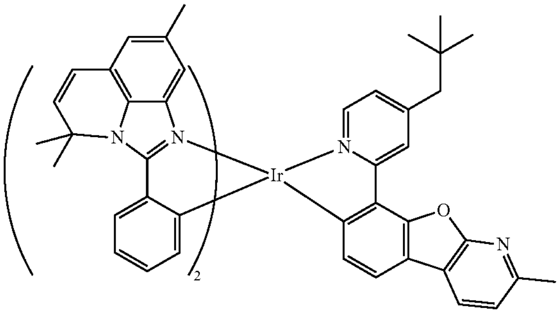

CPD 143
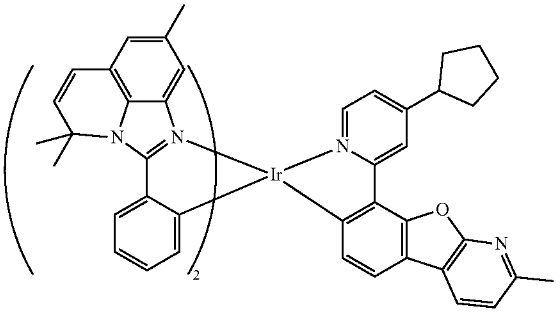
CPD 144
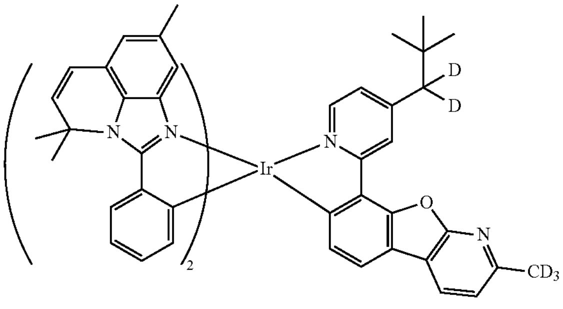
CPD 145
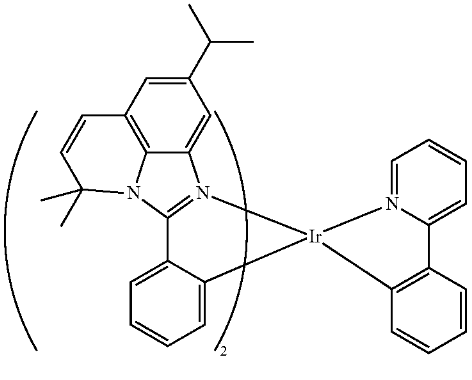
CPD 146
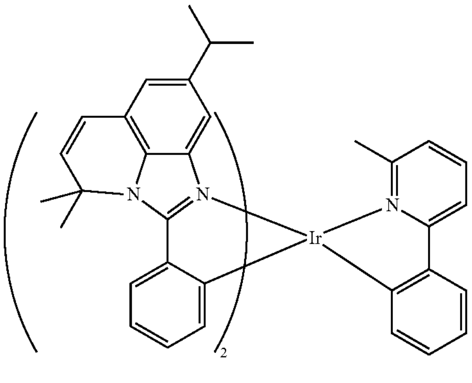
CPD 147
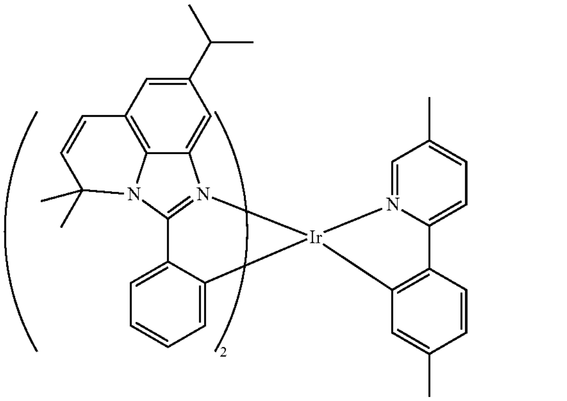
CPD 148
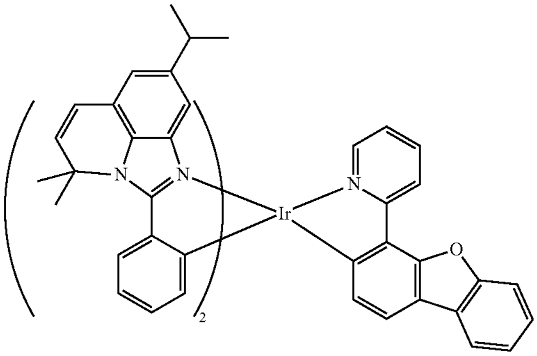
CPD 149
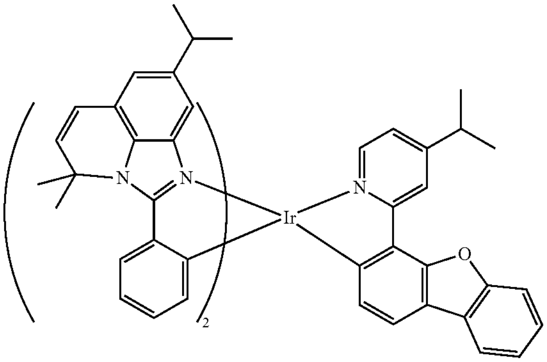
CPD 150
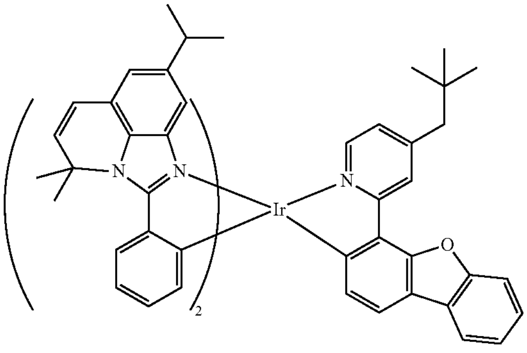

-continued
CPD 151
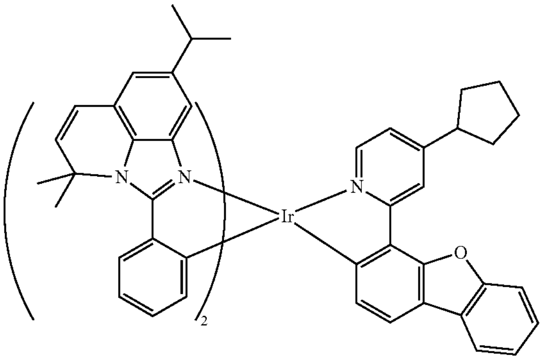
CPD 152
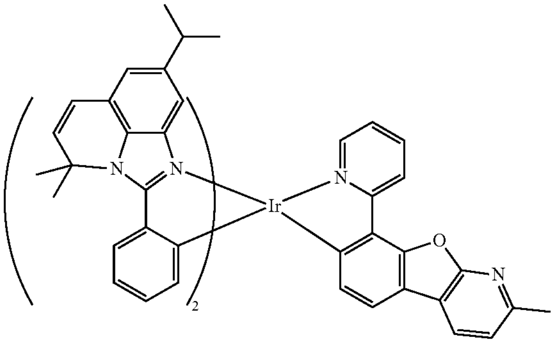
CPD 153
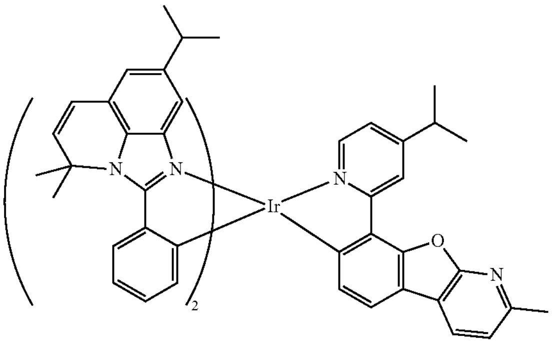
CPD 154
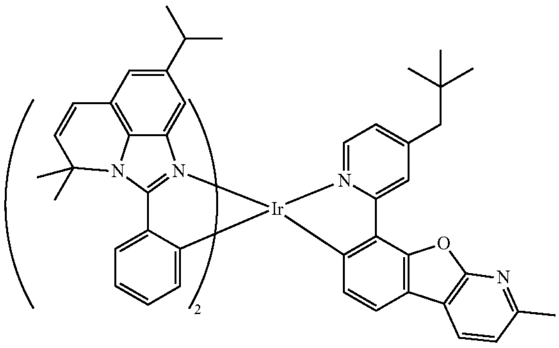
-continued
CPD 155
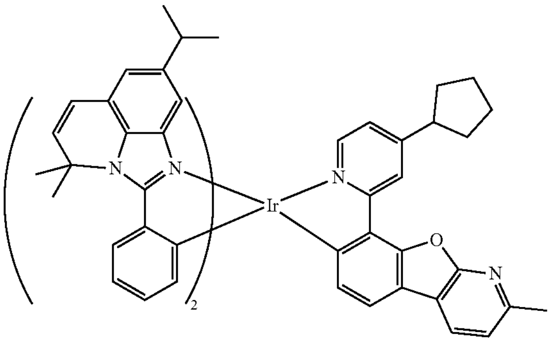
CPD 156
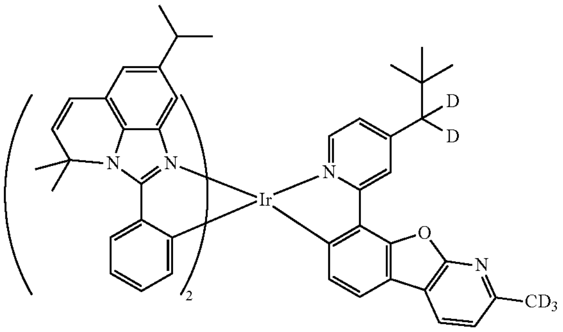
CPD 157
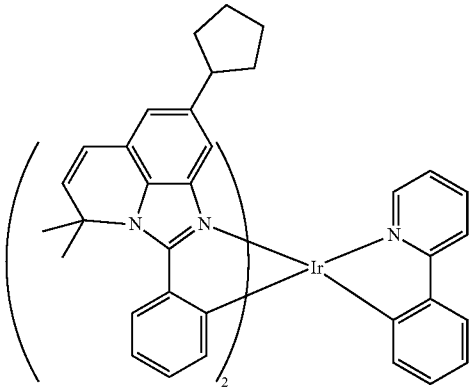
CPD 158
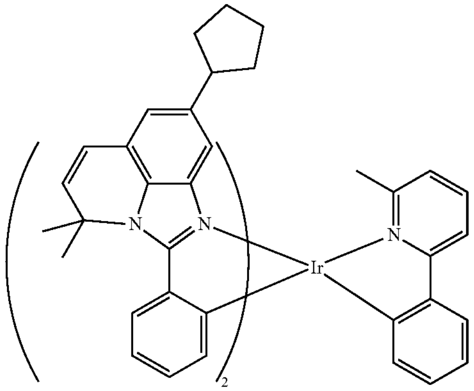

CPD 159
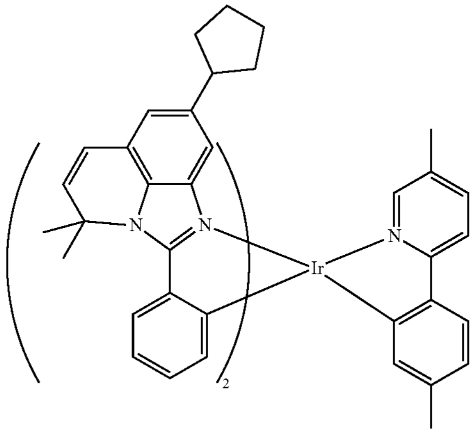
CPD 160
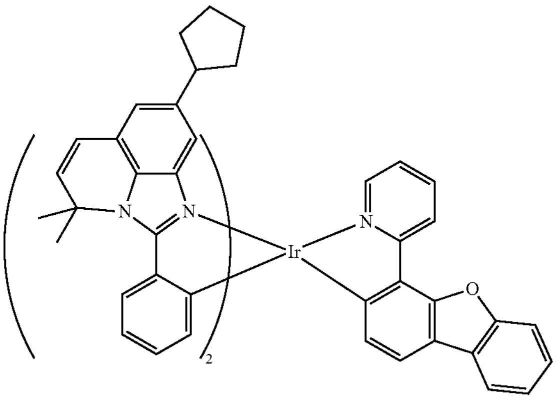
CPD 161
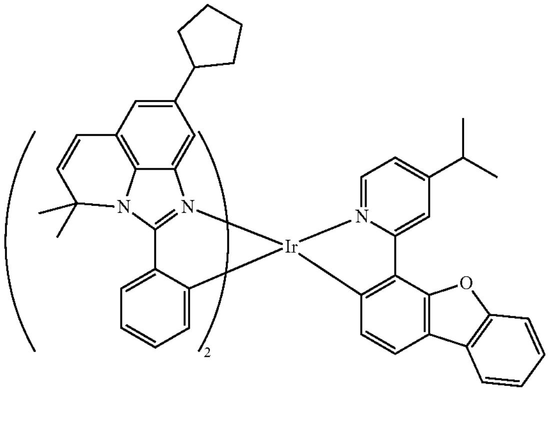
CPD 162
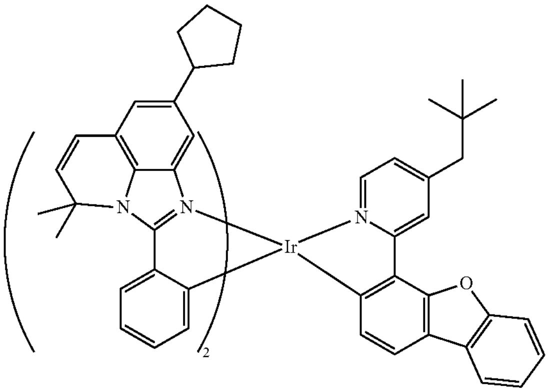
CPD 163
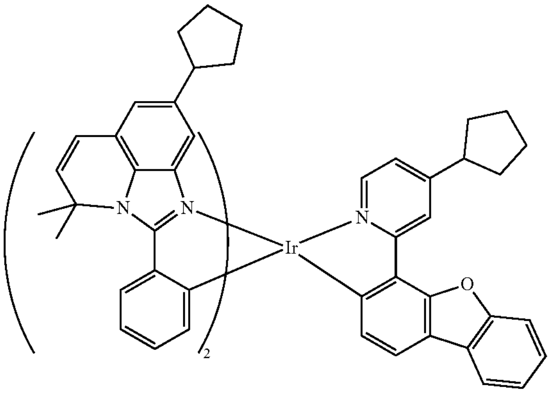
CPD 164
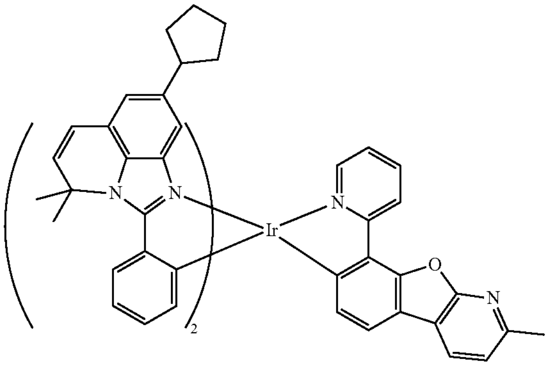
CPD 165
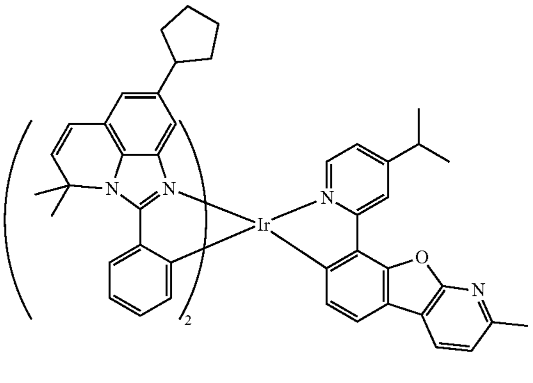

-continued
CPD 166
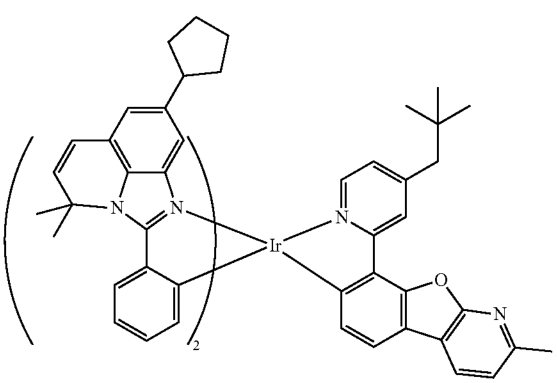
CPD 167
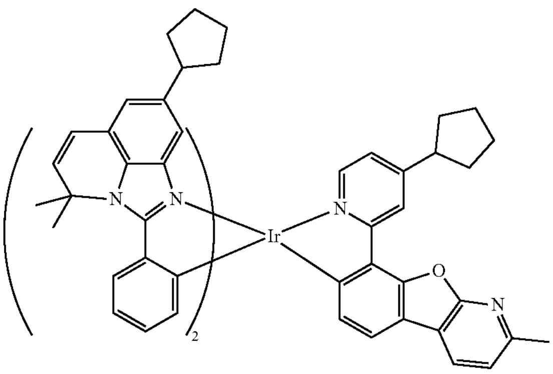
CPD 168
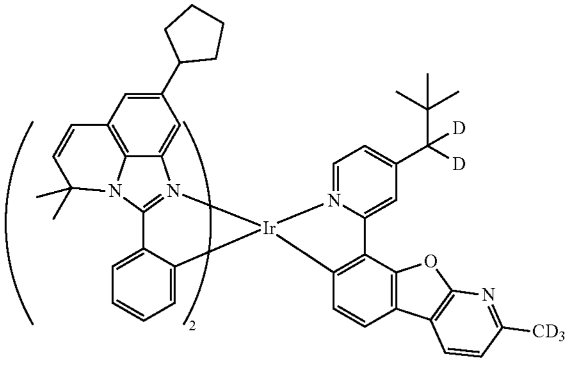
CPD 169
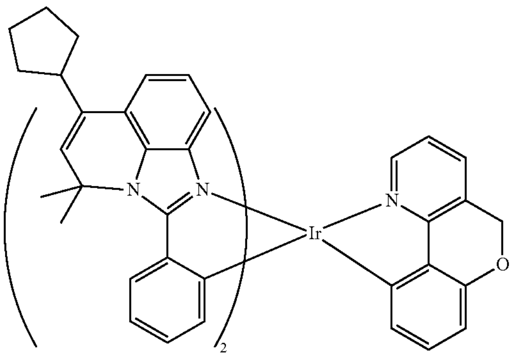
-continued
CPD 170
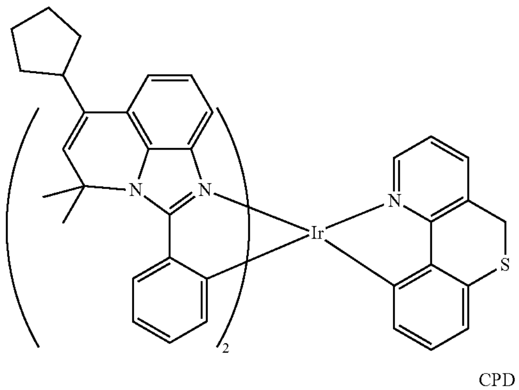
CPD 171
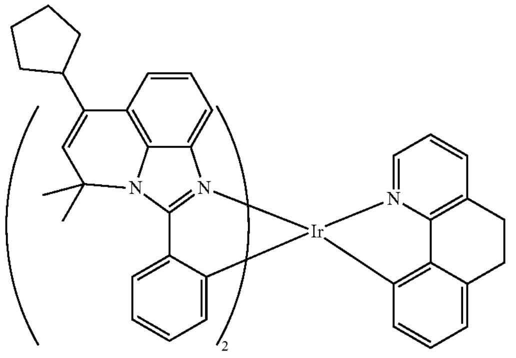
CPD 172
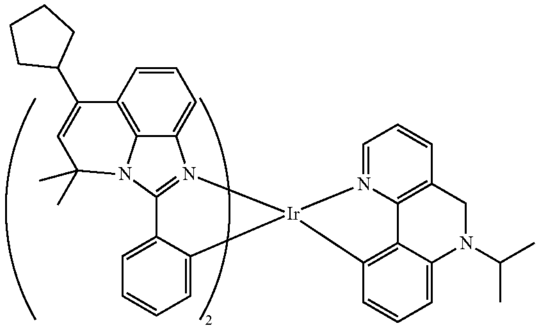
CPD 173
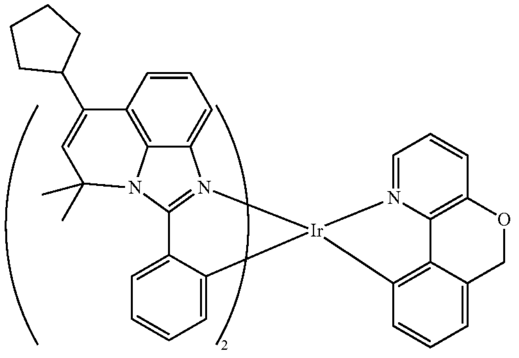

-continued
CPD 174
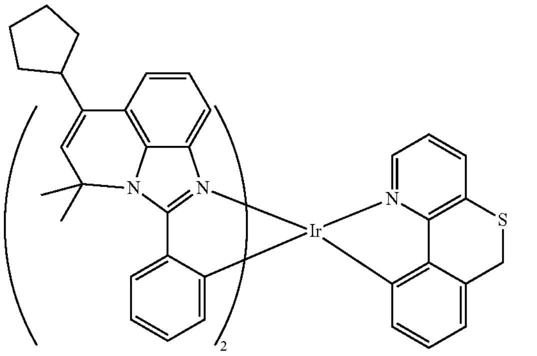
CPD 175
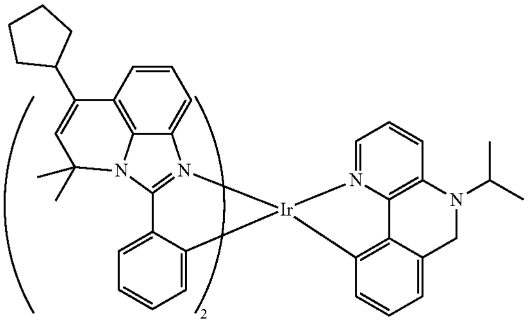
CPD 176
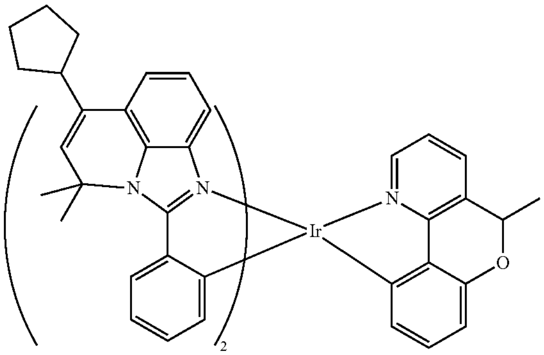
CPD 177
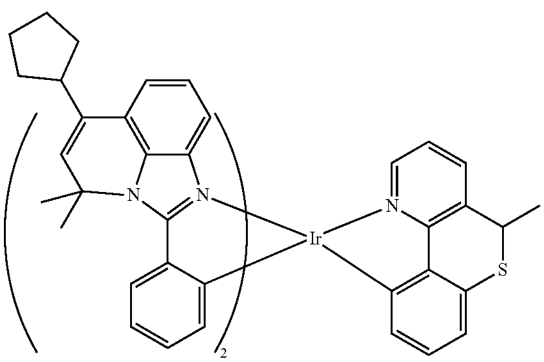
-continued
CPD 178
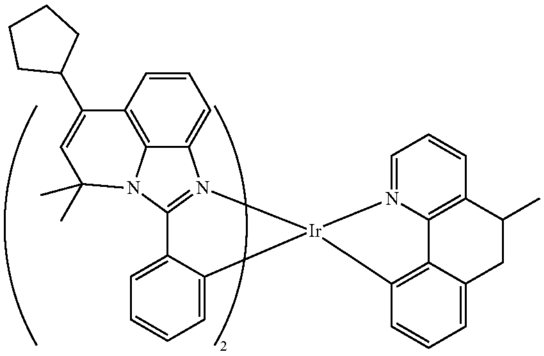
CPD 179
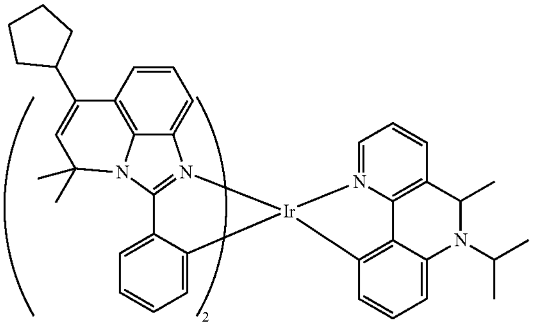
CPD 180
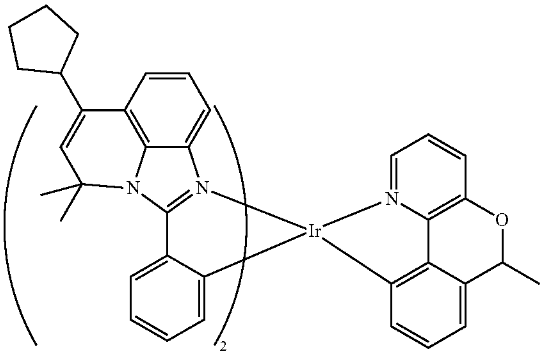
CPD 181
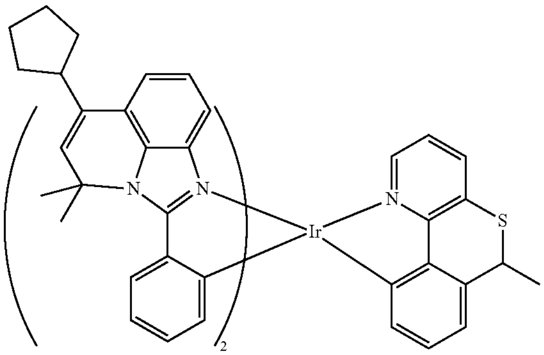

-continued
CPD 182
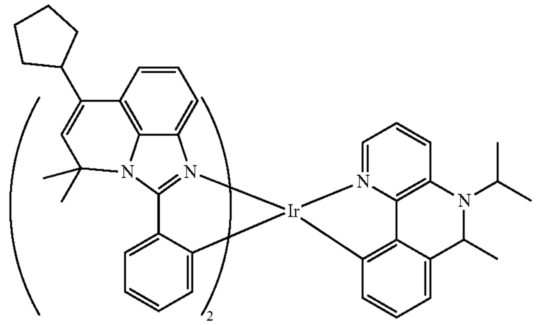
CPD 183
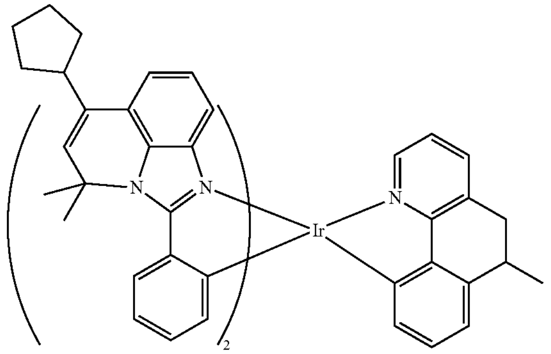
CPD 184
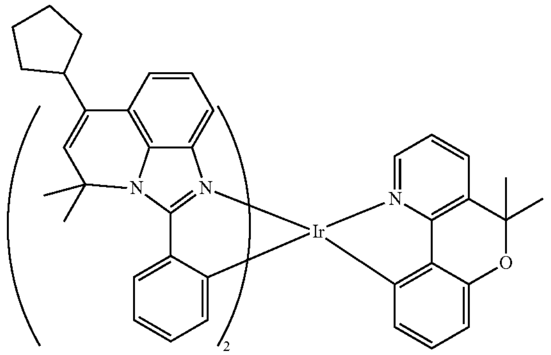
CPD 185
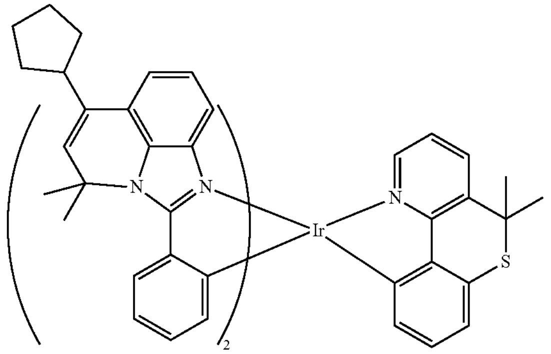
-continued
CPD 186
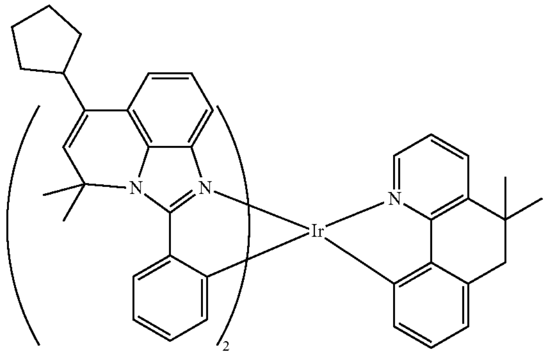
CPD 187
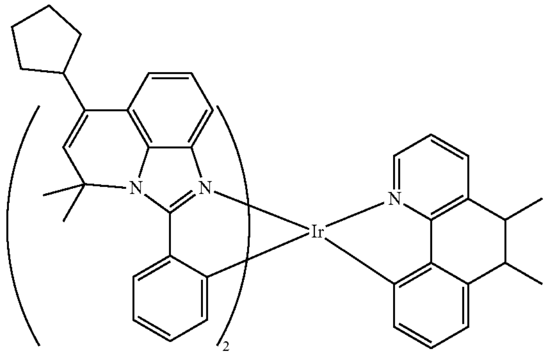
CPD 188
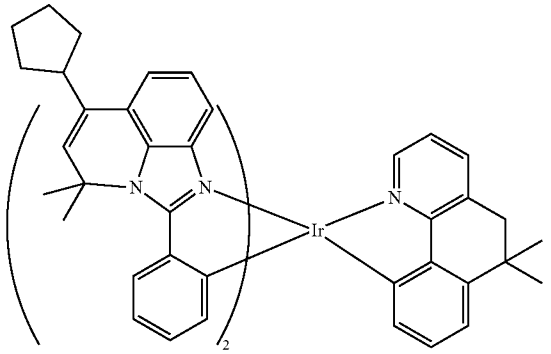
CPD 189
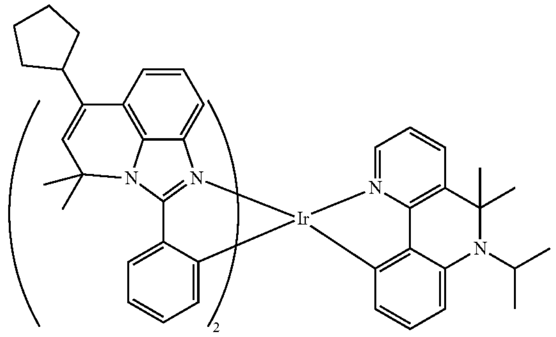

-continued
CPD 190
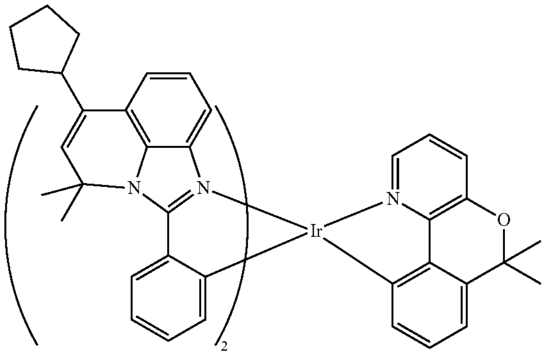
CPD 191
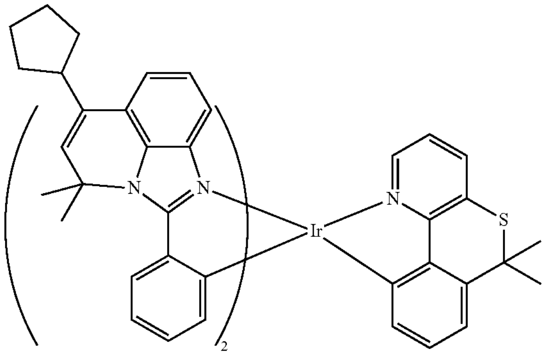
CPD 192
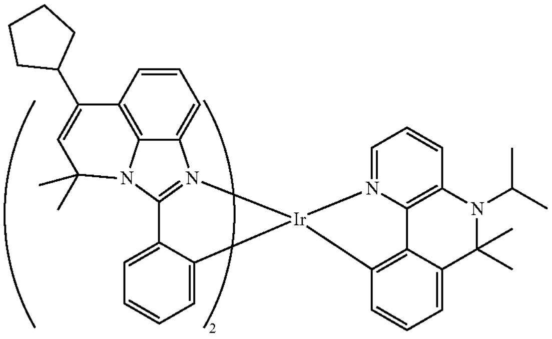
CPD 193
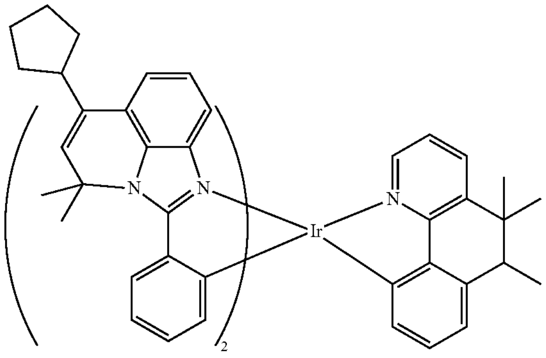
-continued
CPD 194
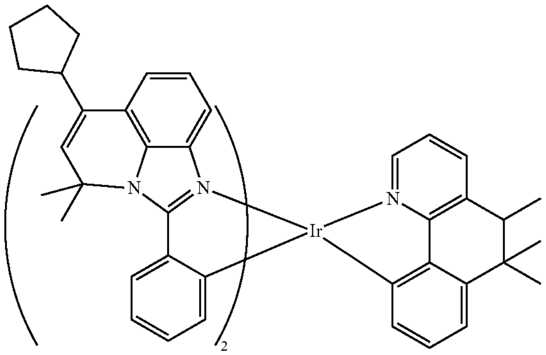
CPD 195
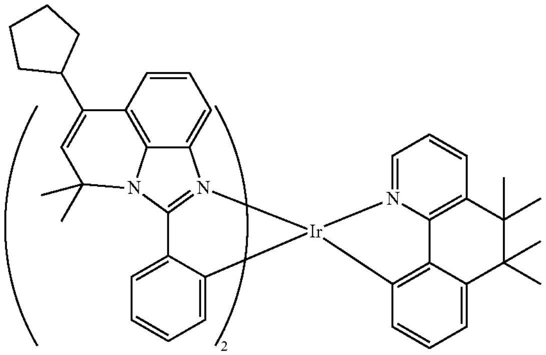
CPD 196
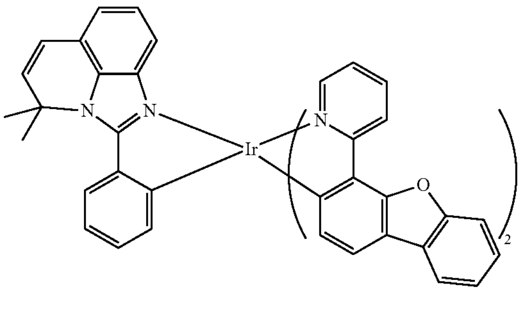
CPD 197
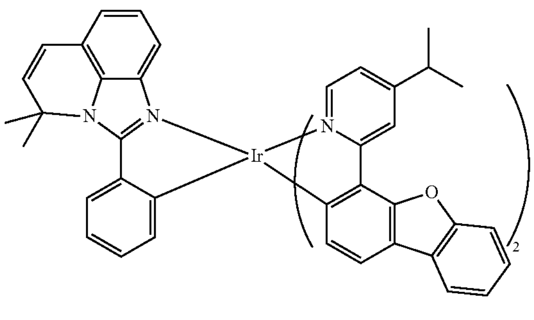

-continued
CPD 198
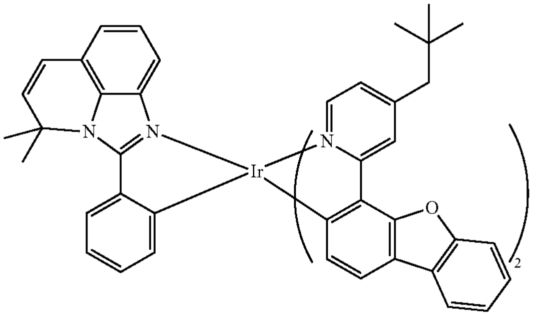
CPD 199
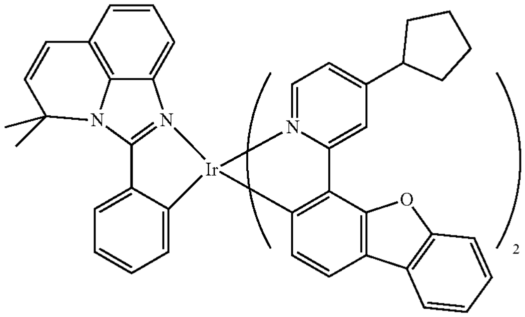
CPD 200
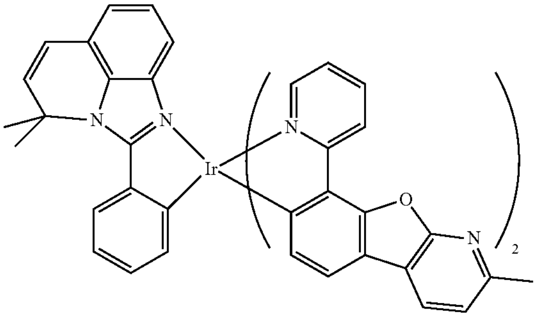
CPD 201
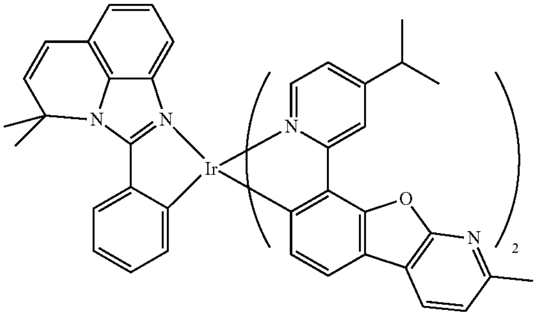
-continued
CPD 202
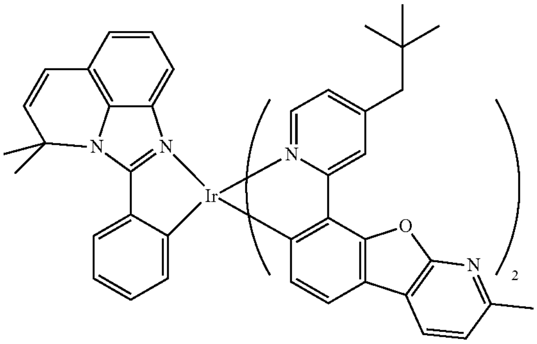
CPD 203
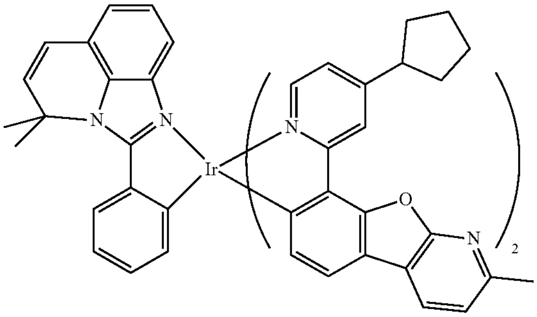
CPD 204
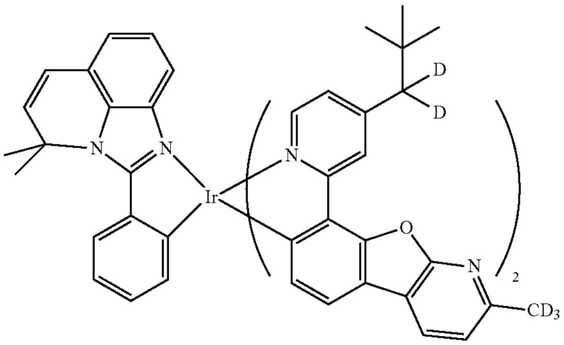
CPD 205
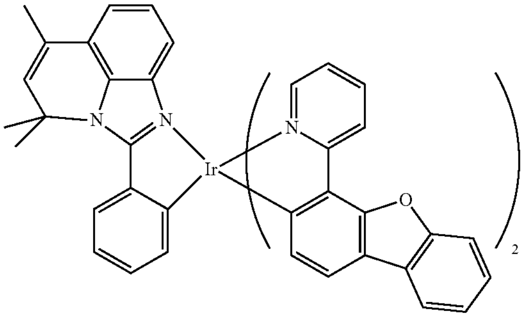

-continued
CPD 206
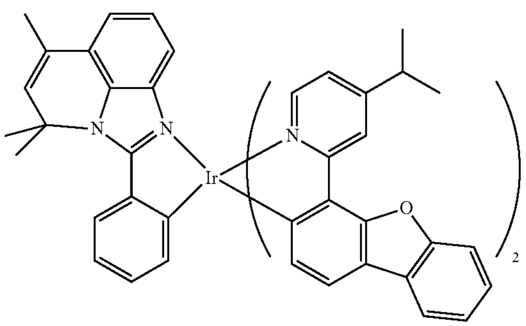
CPD 207
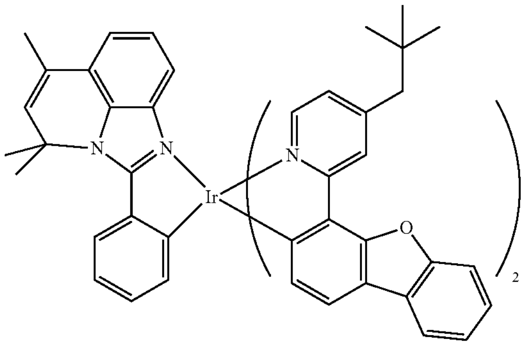
CPD 208
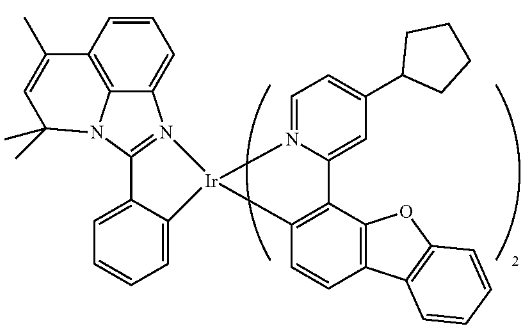
CPD 209
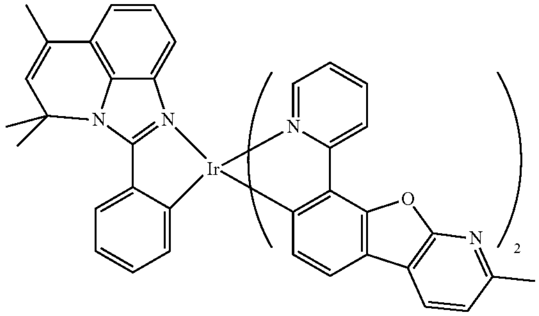
-continued
CPD 210
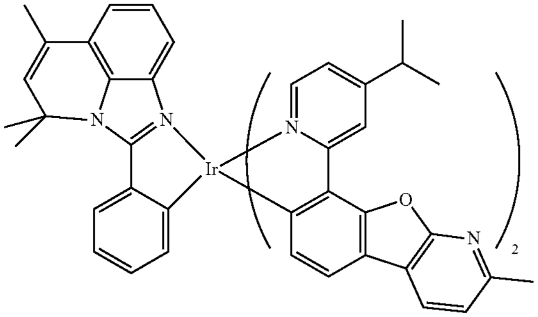
CPD 211
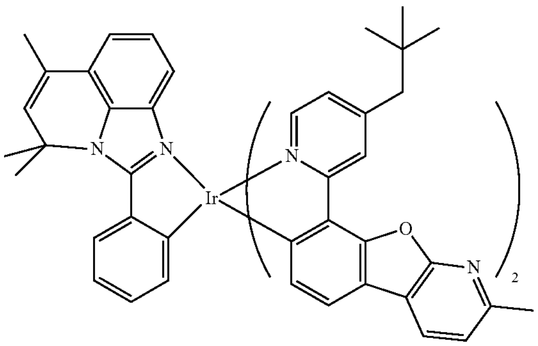
CPD 212
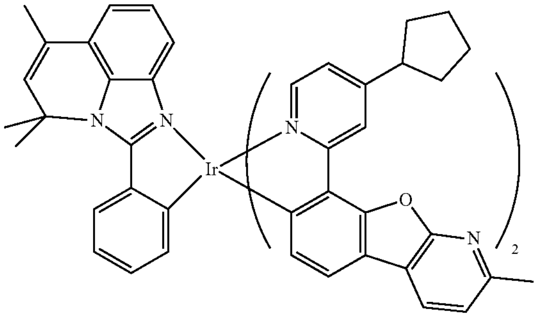
CPD 213
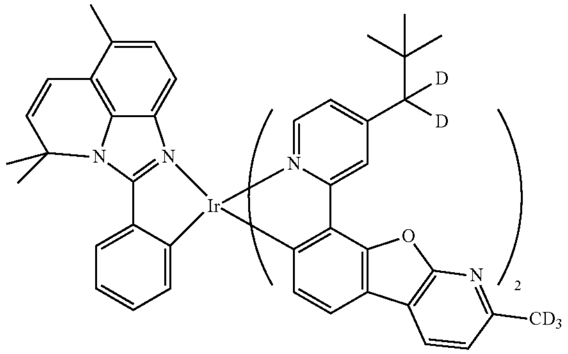

-continued
CPD 214
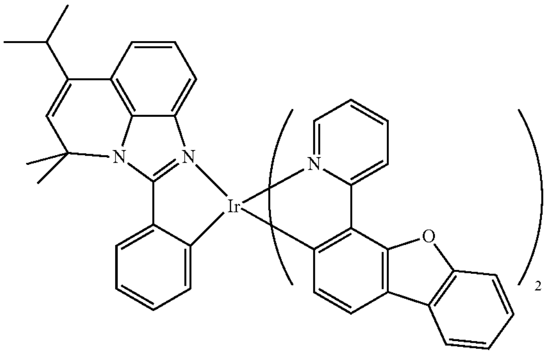
CPD 215
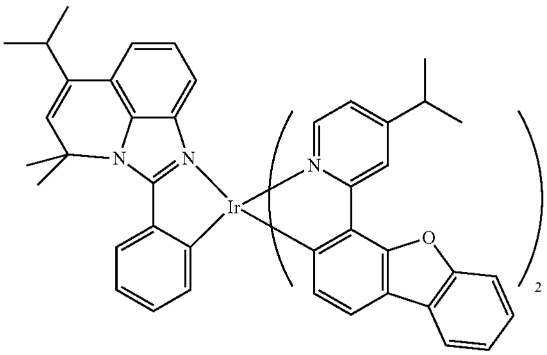
CPD 216
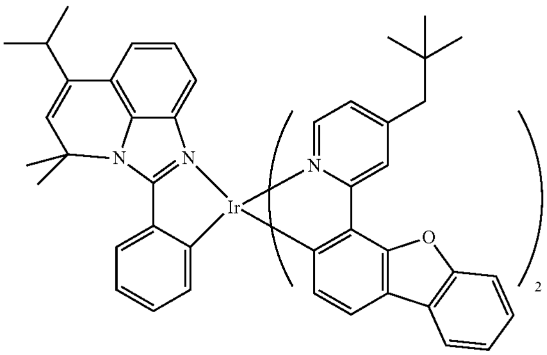
CPD 217
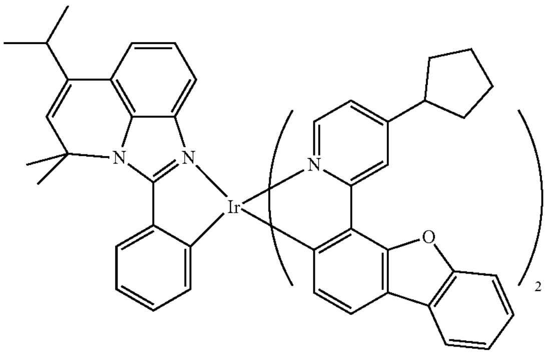
-continued
CPD 218
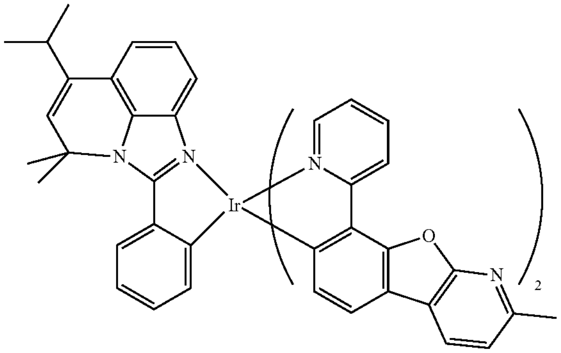
CPD 219
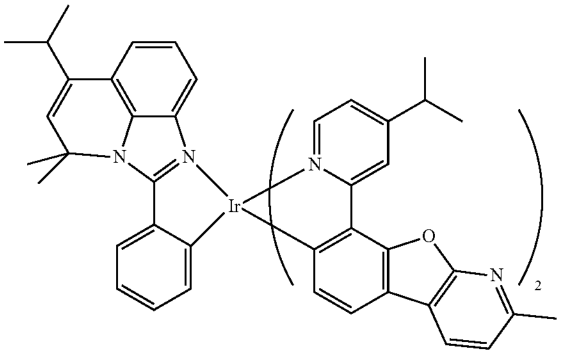
CPD 220
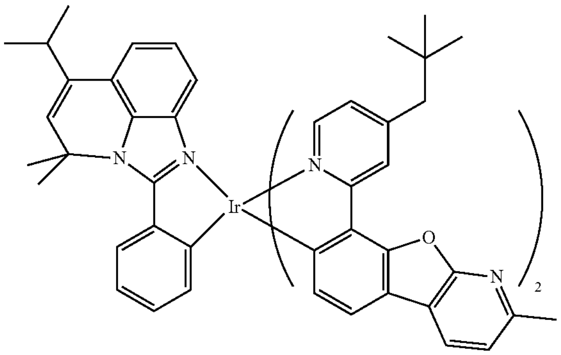
CPD 221
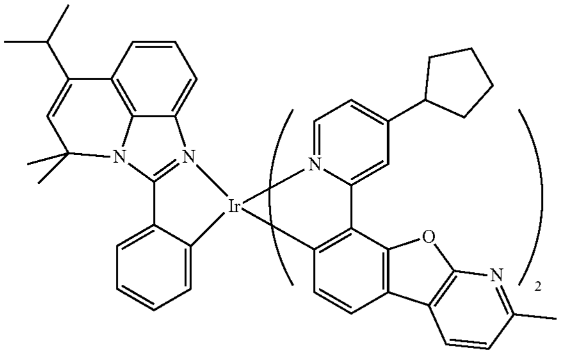

CPD 222
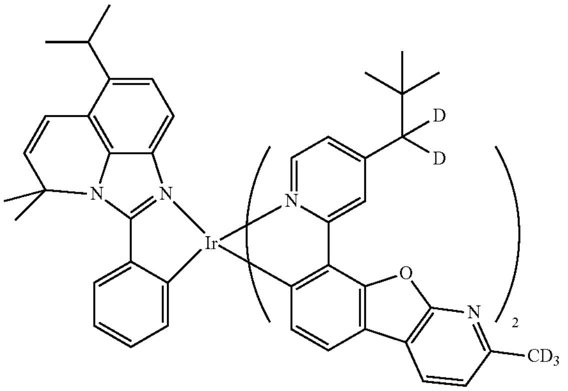
CPD 223
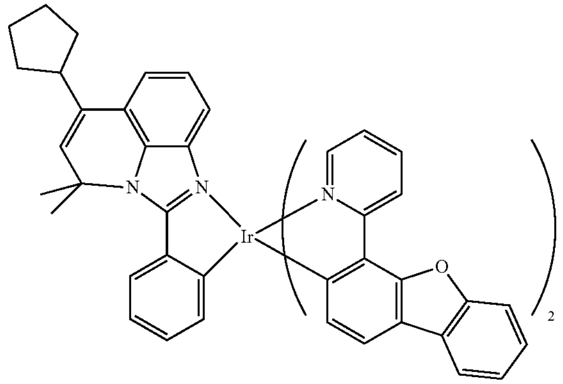
CPD 224
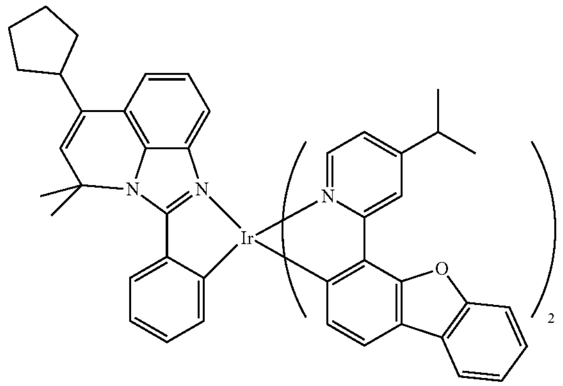
CPD 225
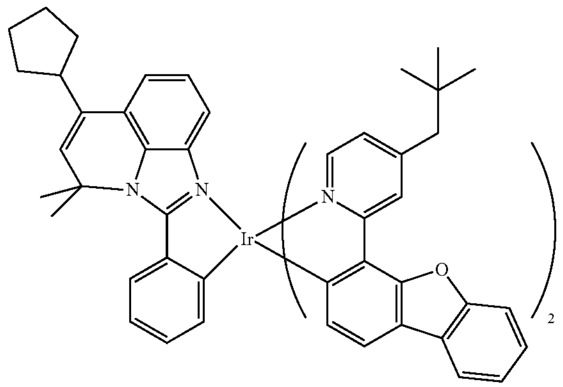
CPD 226
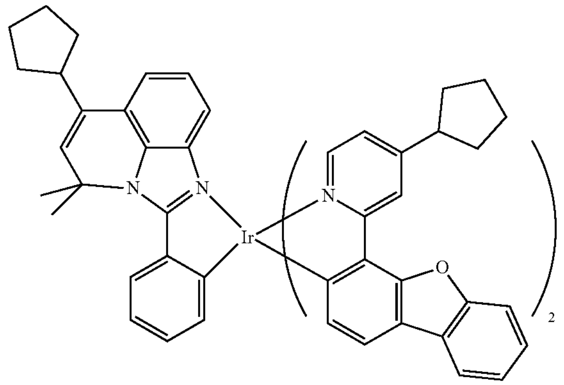
CPD 227
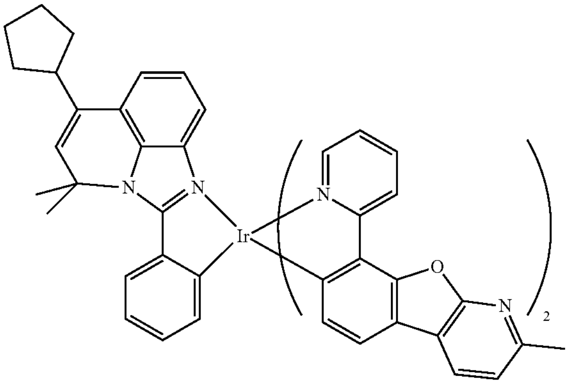
CPD 228
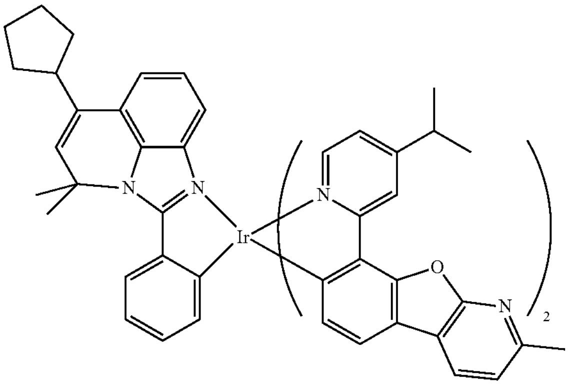
CPD 229
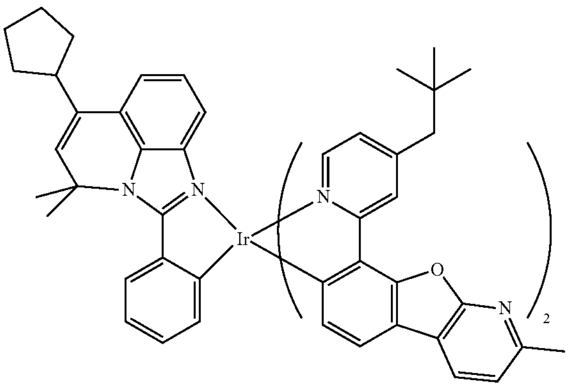

-continued
CPD 230
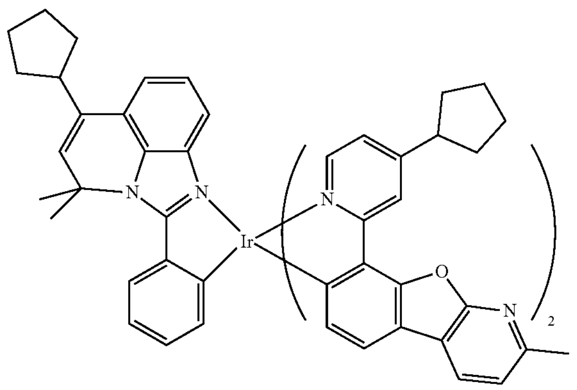
CPD 231
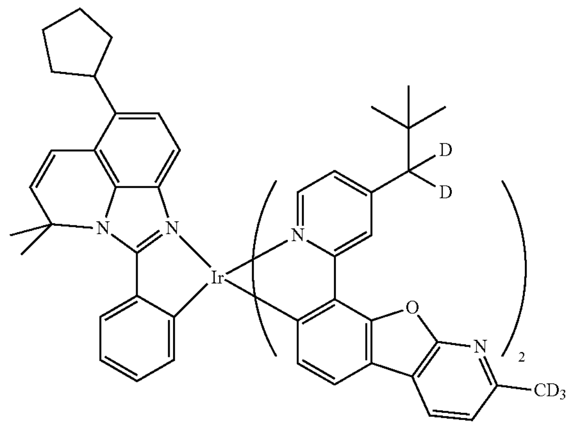
CPD 232
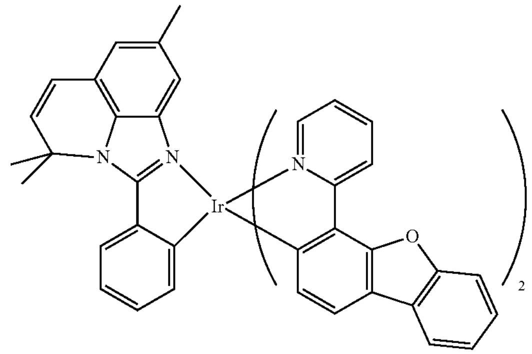
CPD 233
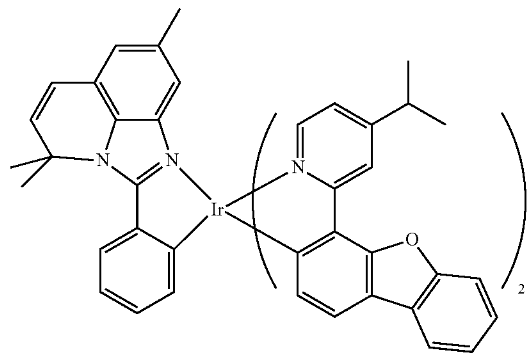
-continued
CPD 234
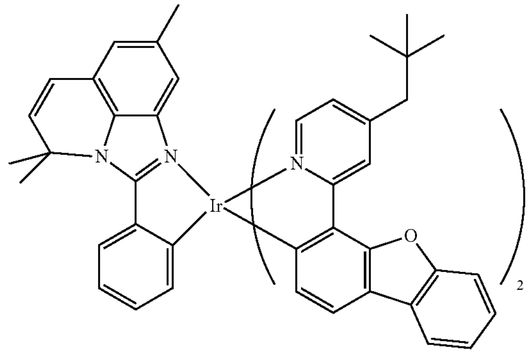
CPD 235
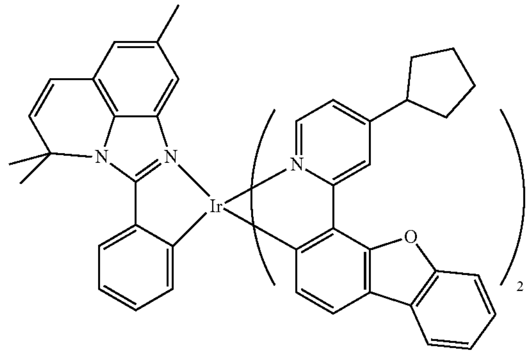
CPD 236
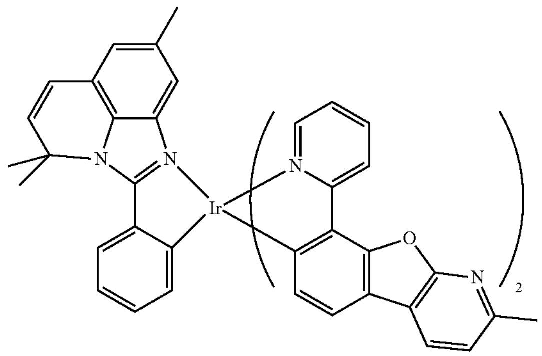
CPD 237
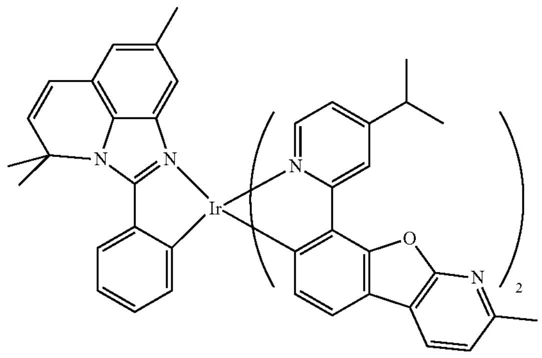

-continued
CPD 238
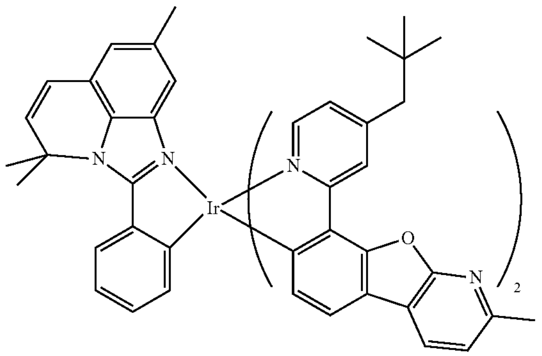
CPD 239
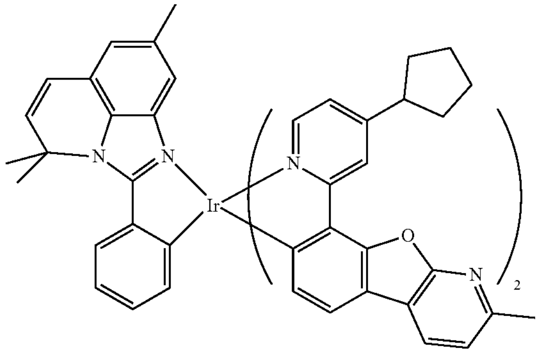
CPD 240
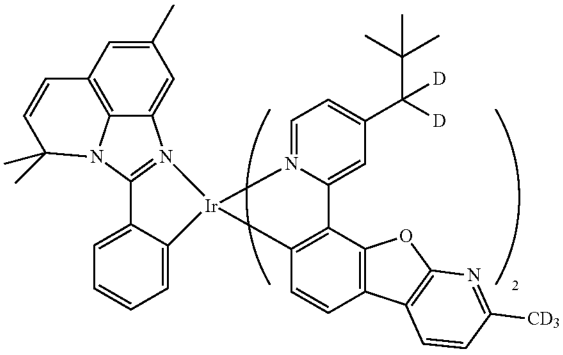
CPD 241
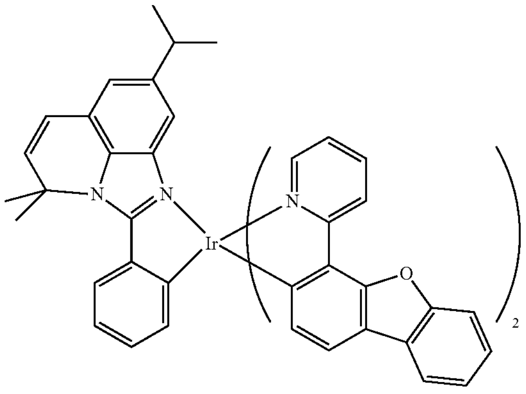
-continued
CPD 242
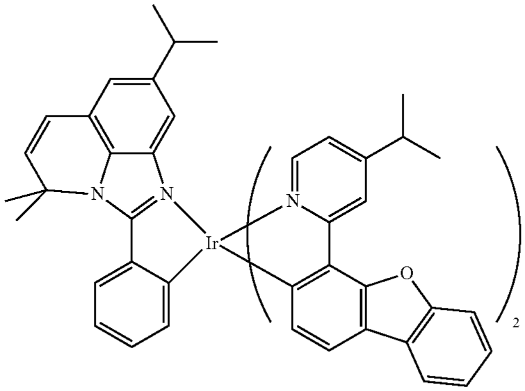
CPD 243
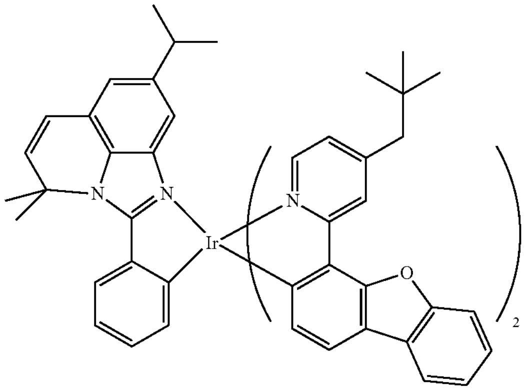
CPD 244
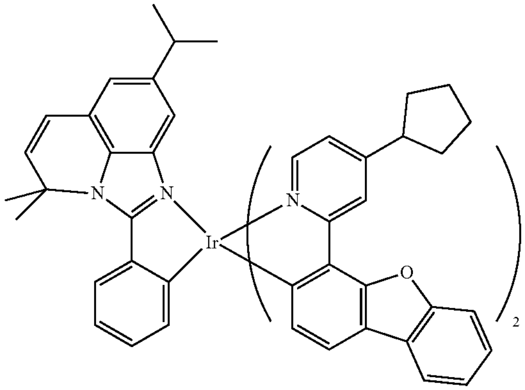
CPD 245
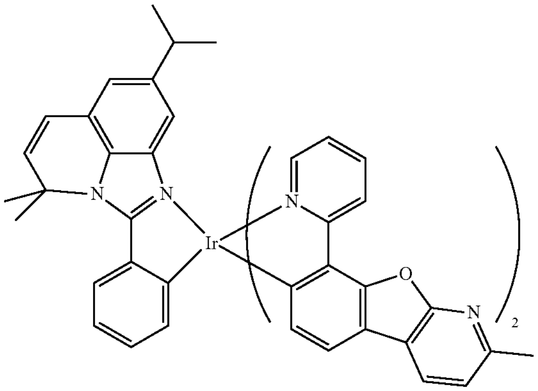

-continued
CPD 246
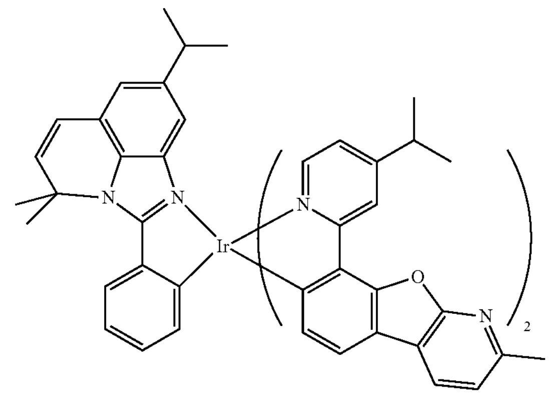
CPD 247
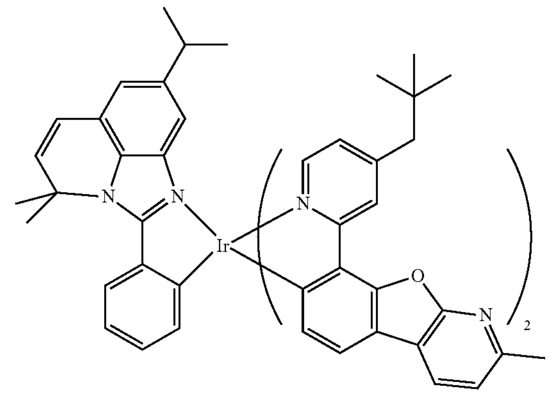
CPD 248
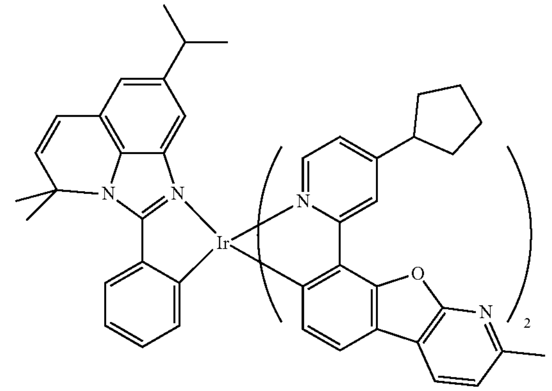
CPD 249
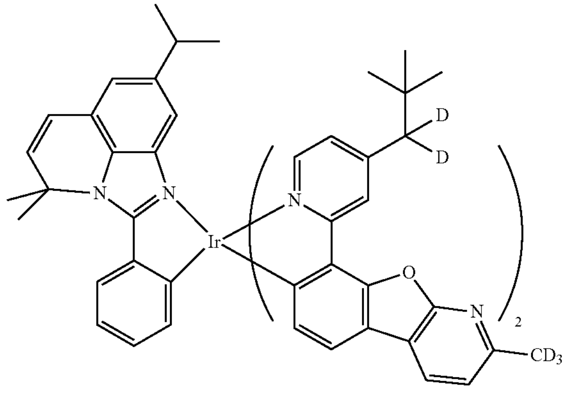
-continued
CPD 250
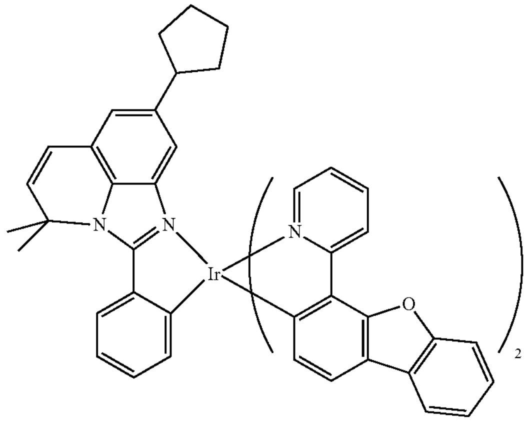
CPD 251
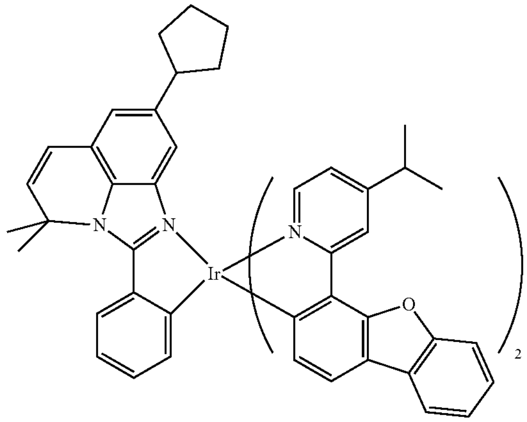
CPD 252
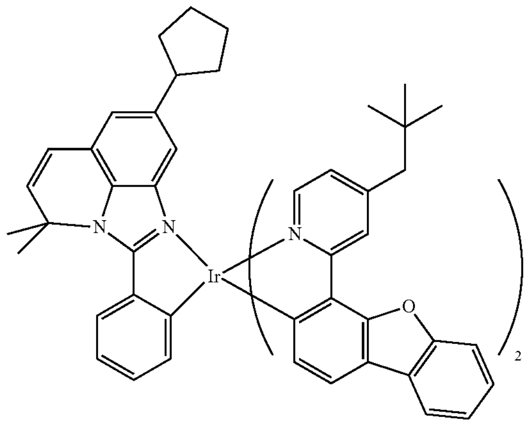

-continued
CPD 253
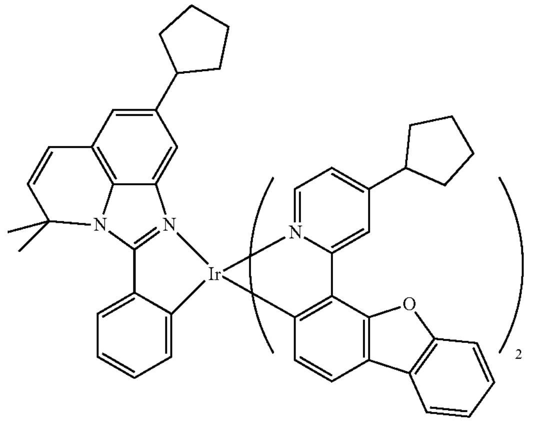
CPD 254
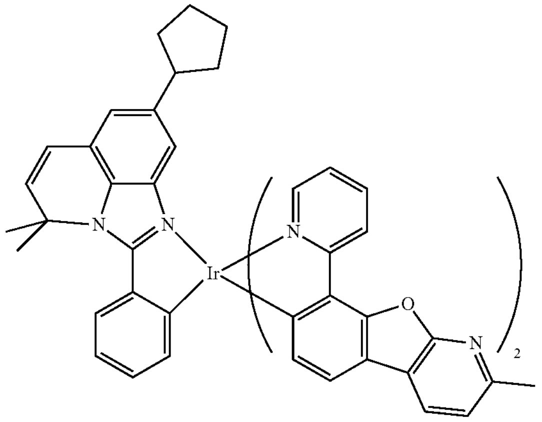
CPD 255
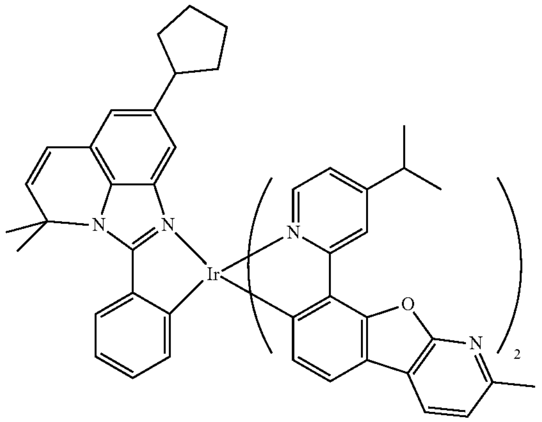
-continued
CPD 256
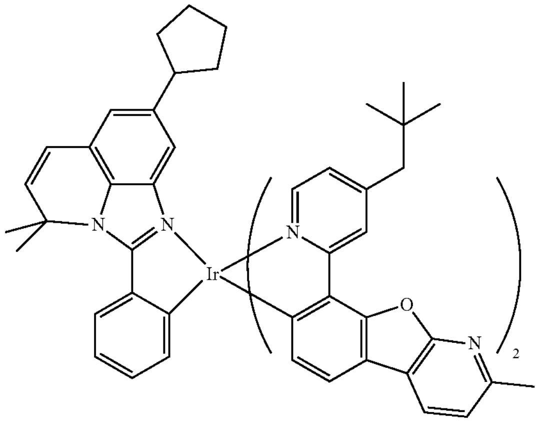
CPD 257
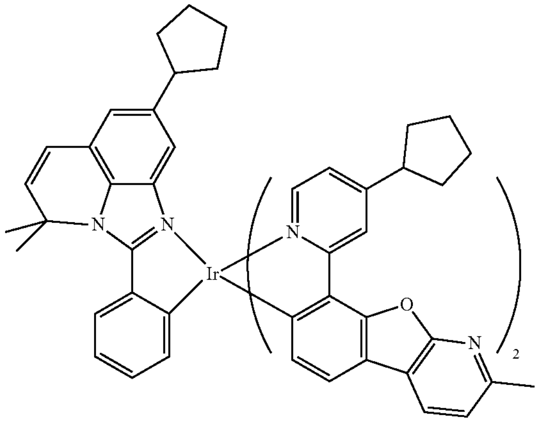
CPD 258
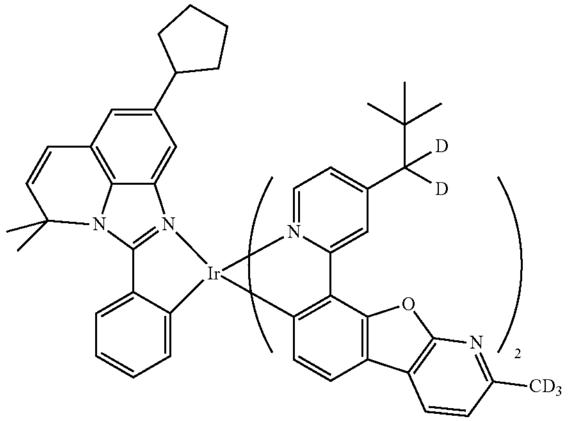

CPD 259
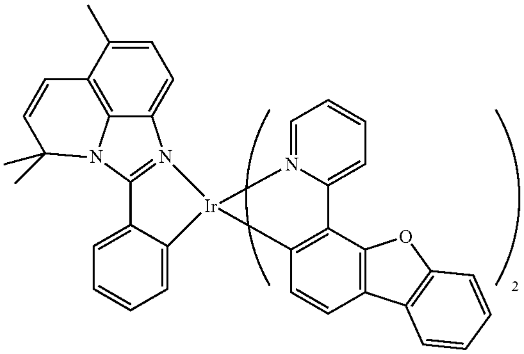
CPD 260
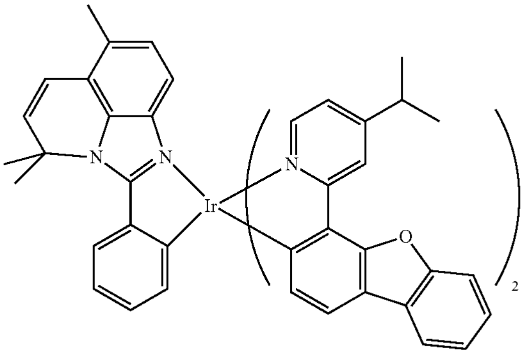
CPD 261
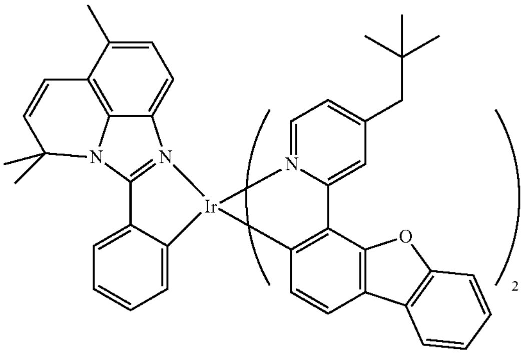
CPD 262
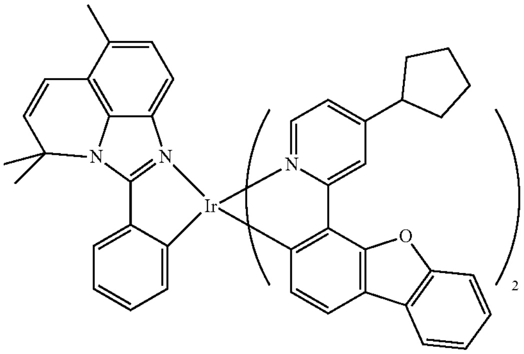
CPD 263
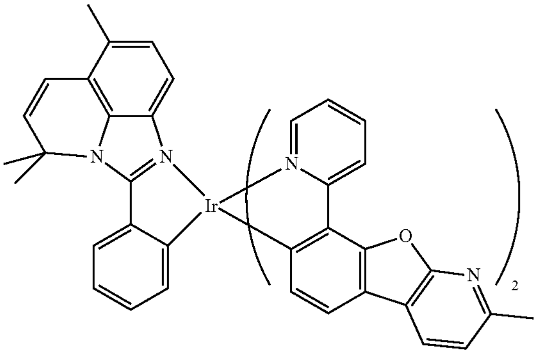
CPD 264
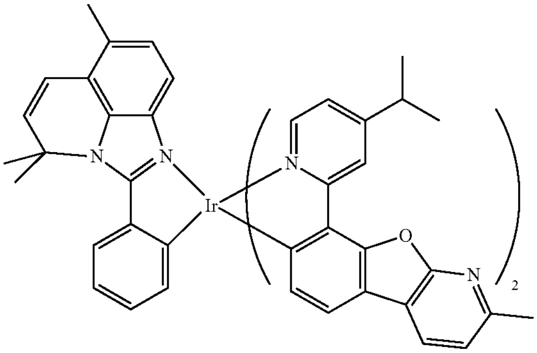
CPD 265
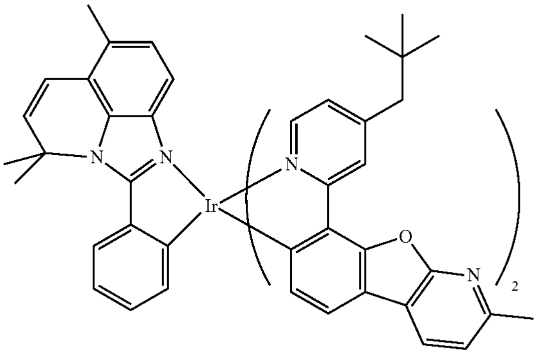
CPD 266
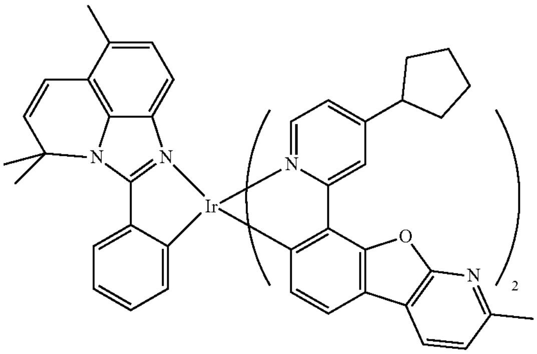

-continued
CPD 267
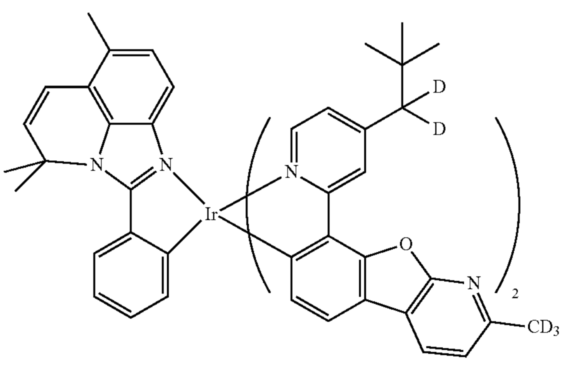
CPD 268
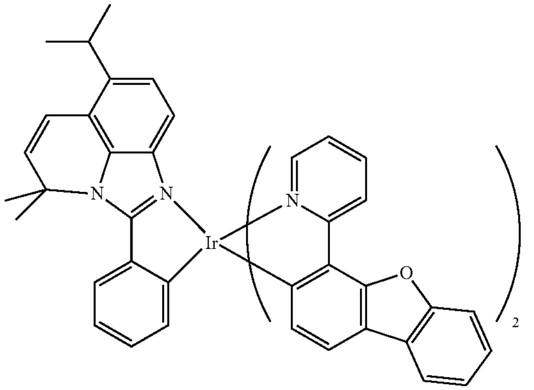
CPD 269
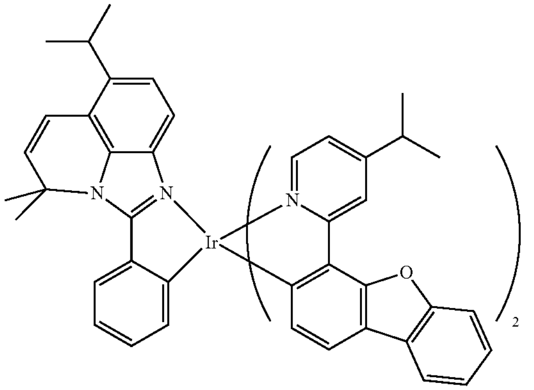
CPD 270
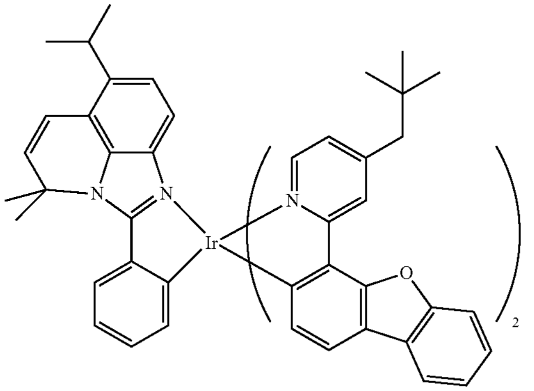
-continued
CPD 271
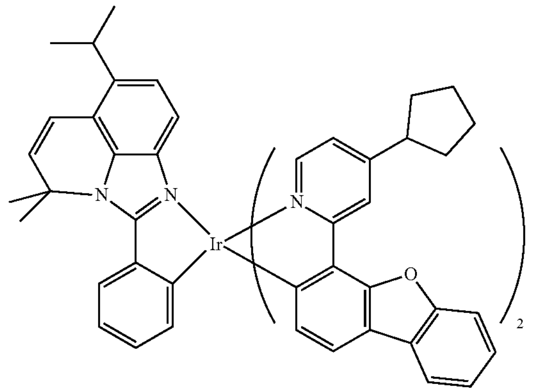
CPD 272
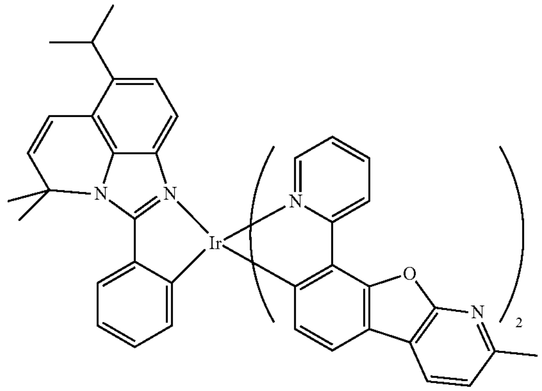
CPD 273
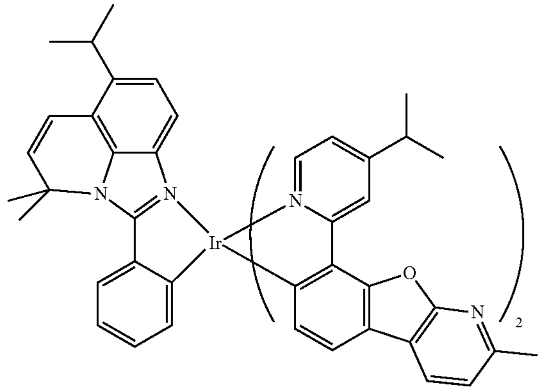
CPD 274
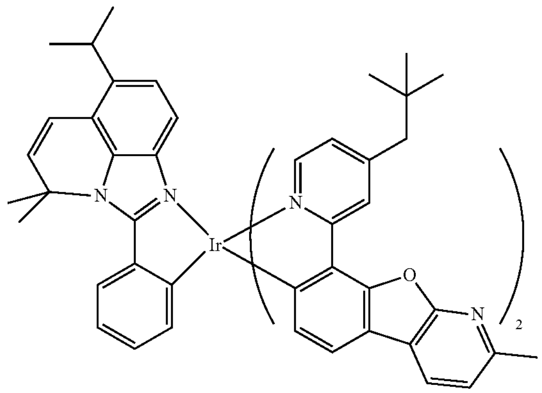

-continued
CPD 275
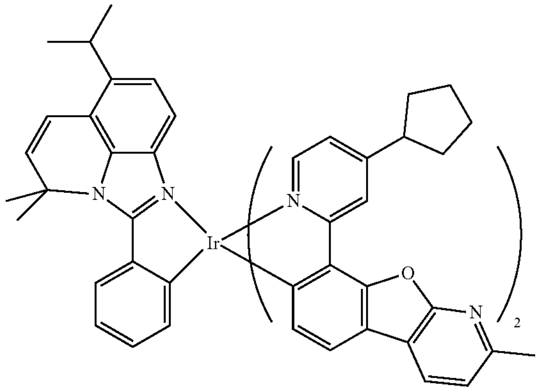
CPD 276
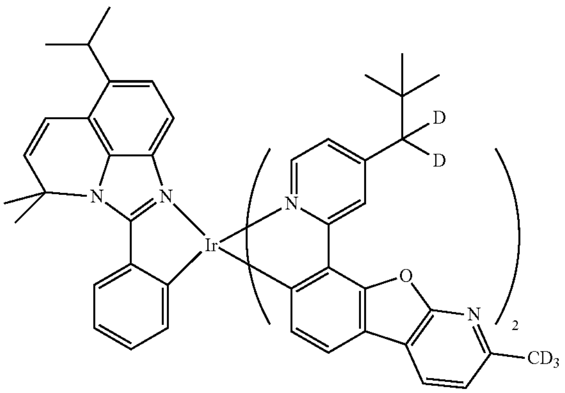
CPD 277
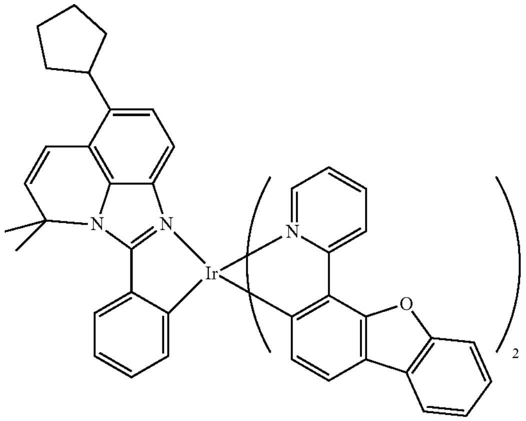
-continued
CPD 278
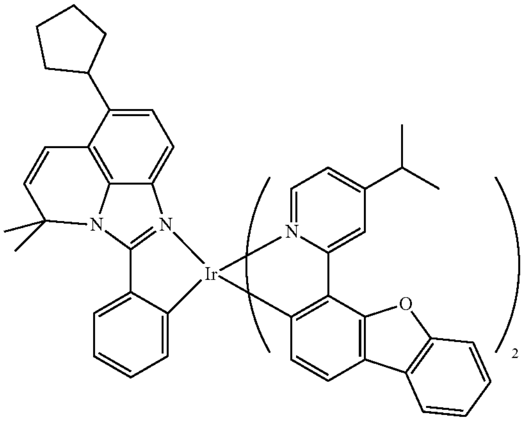
CPD 279
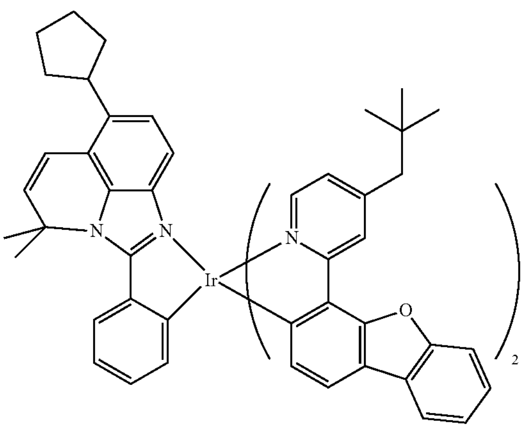
CPD 280
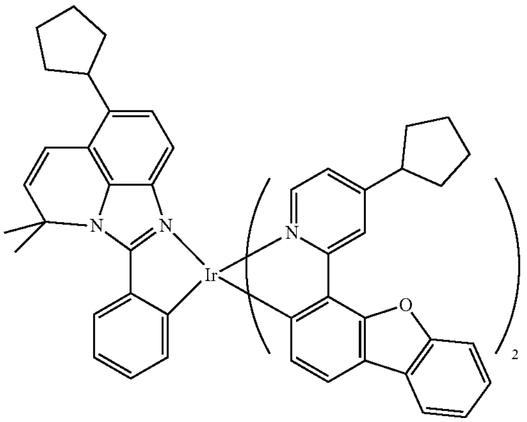

-continued
CPD 281
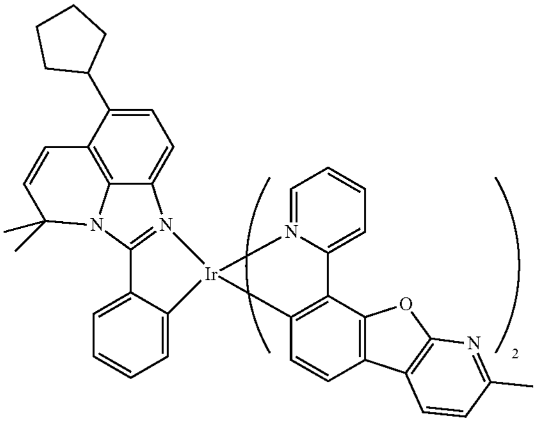
CPD 282
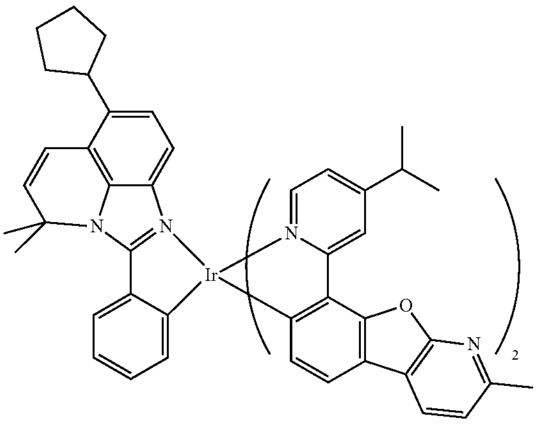
CPD 283
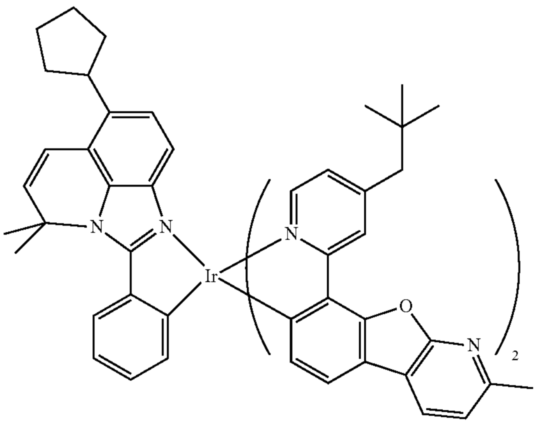
-continued
CPD 284
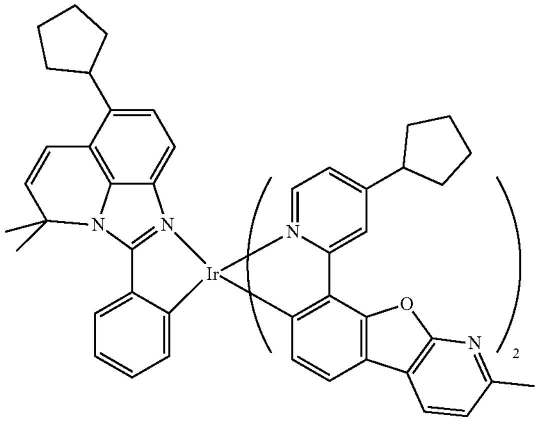
CPD 285
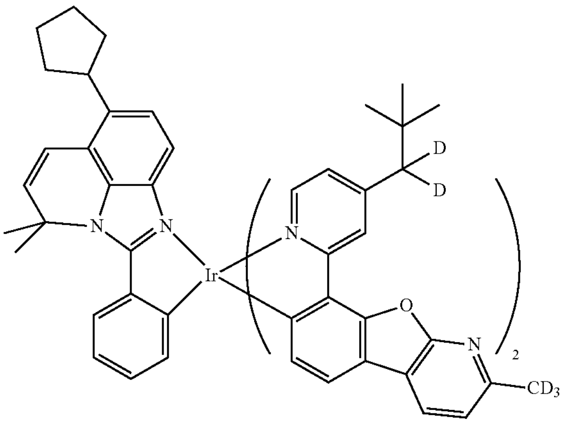
CPD 286
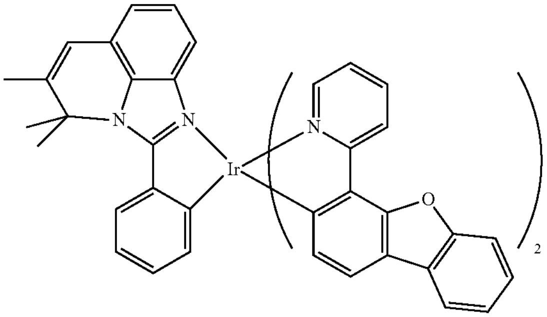
CPD 287
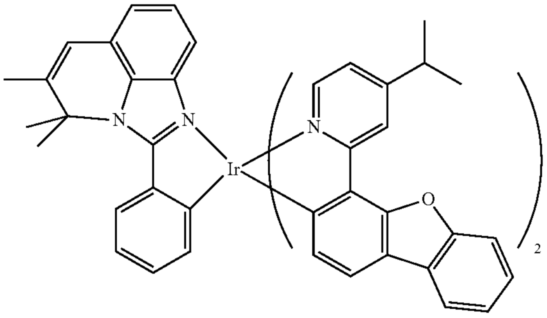

-continued
CPD 288
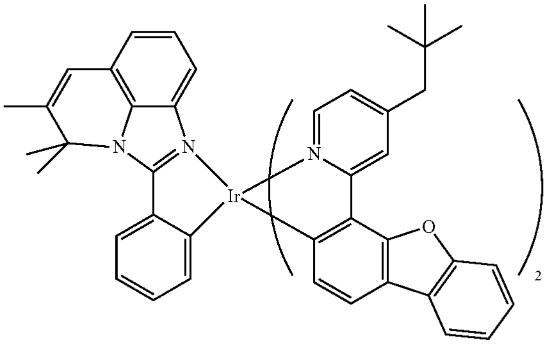
CPD 289
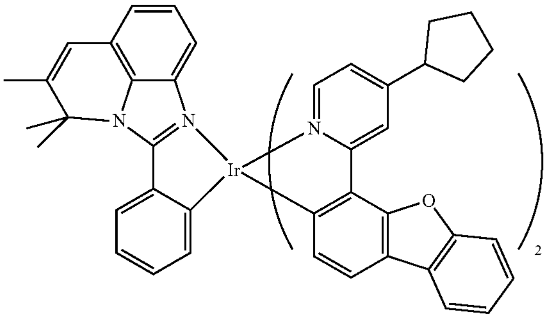
CPD 290
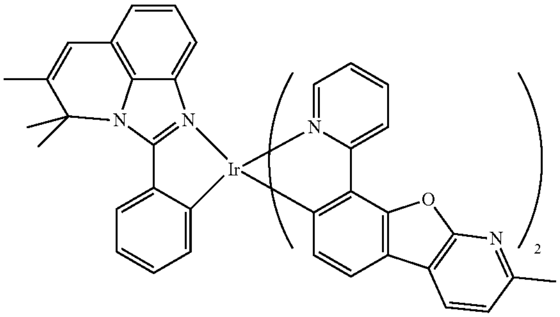
CPD 291
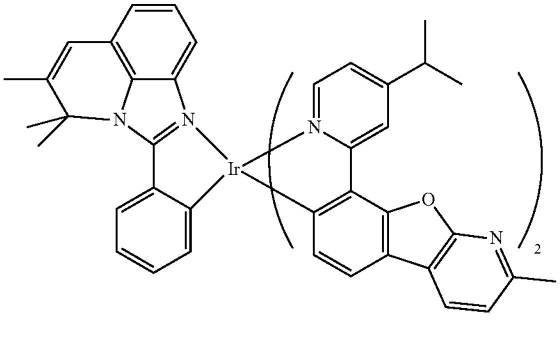
-continued
CPD 292
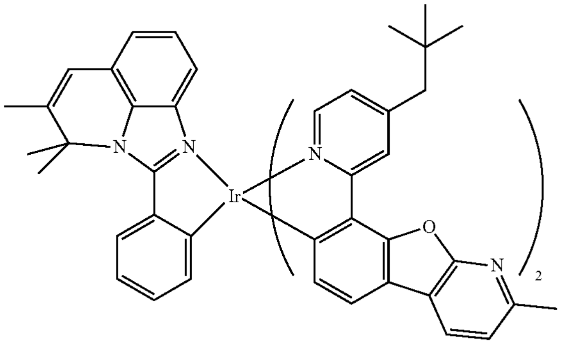
CPD 293
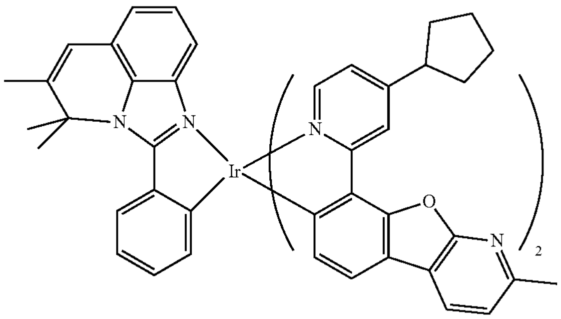
CPD 294
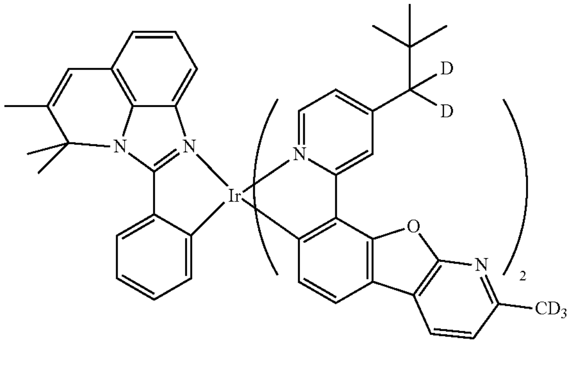
CPD 295
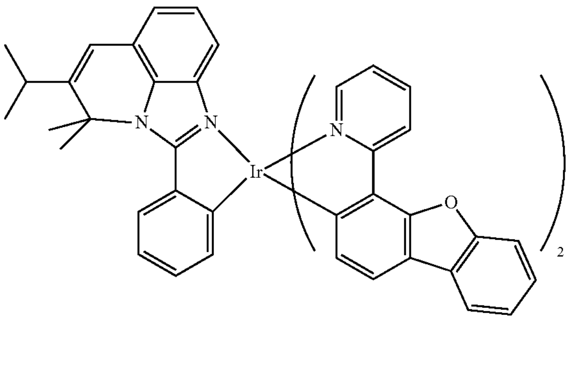

-continued
CPD 296
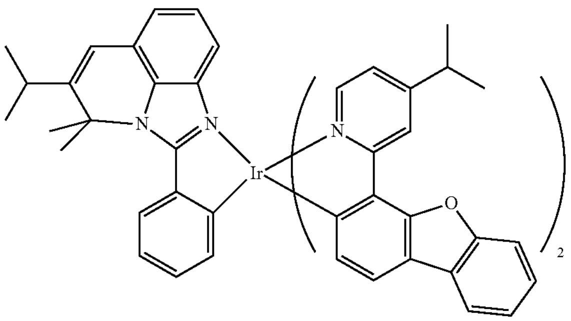
CPD 297
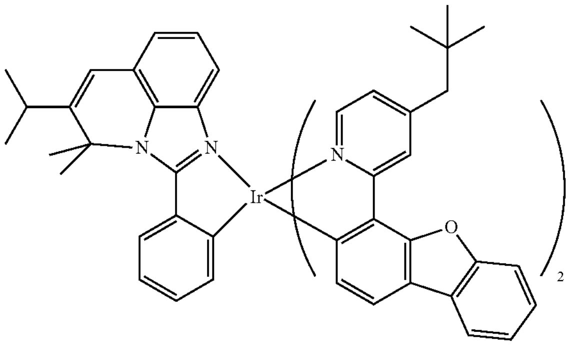
CPD 298
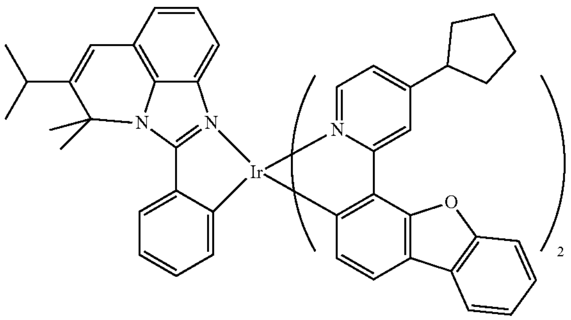
CPD 299
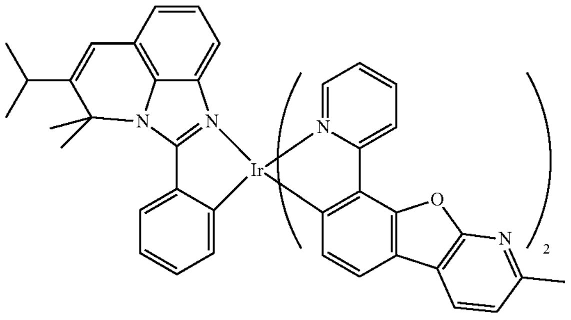
-continued
CPD 300
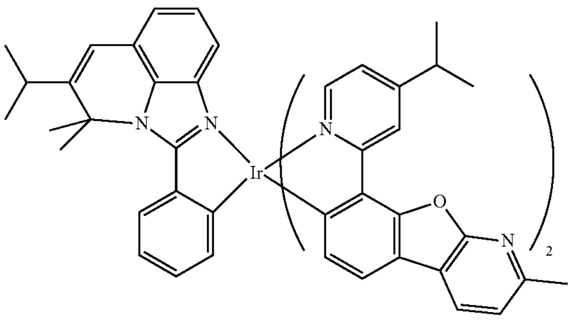
CPD 301
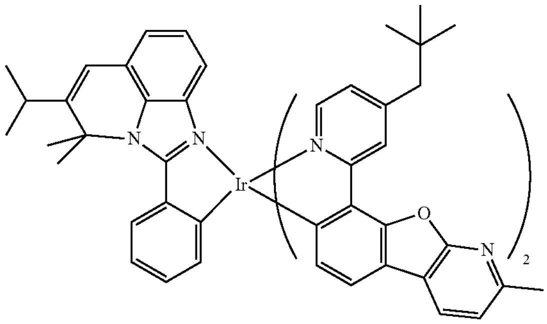
CPD 302
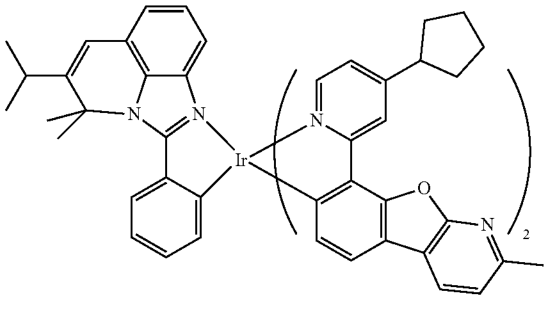
CPD 303
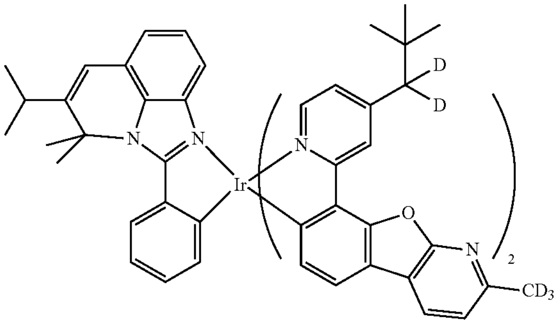

-continued
CPD 304
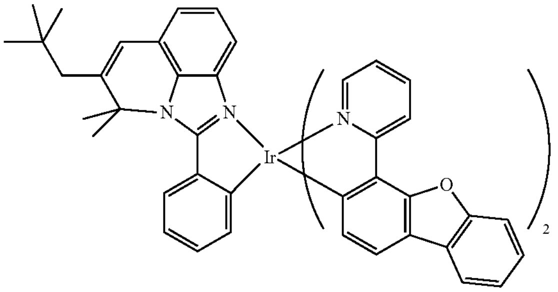
CPD 305
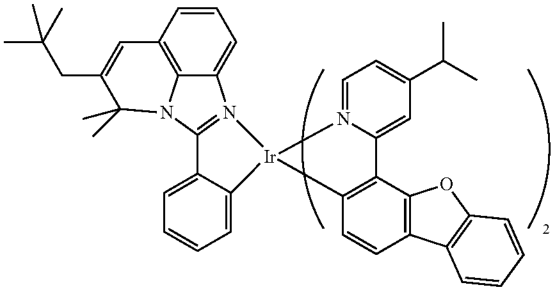
CPD 306
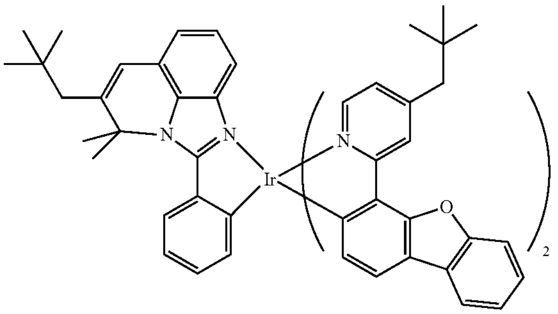
CPD 307
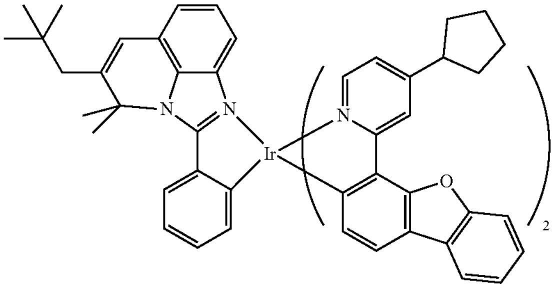
CPD 308
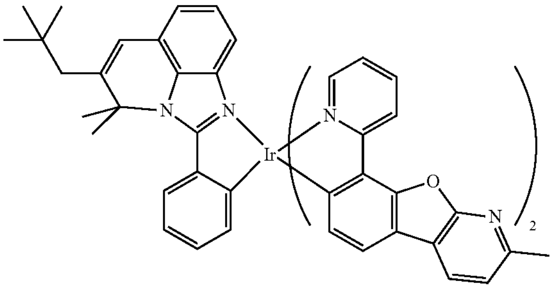
-continued
CPD 309
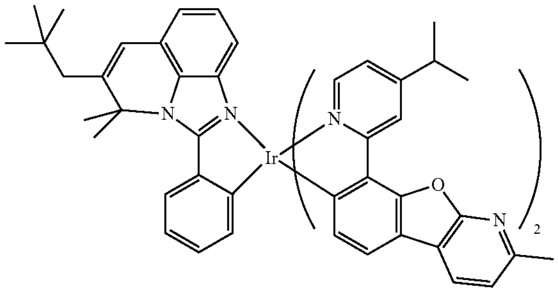
CPD 310
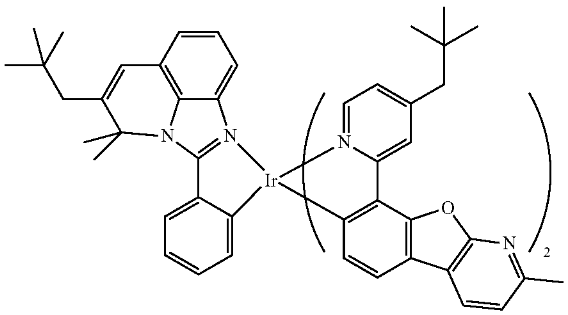
CPD 311
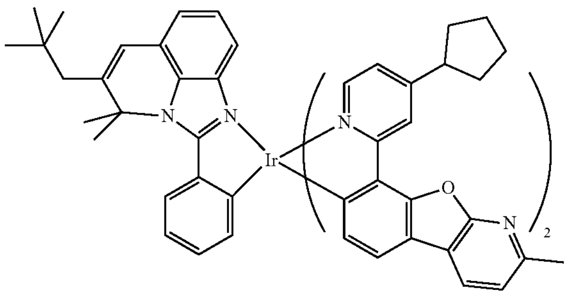
CPD 312
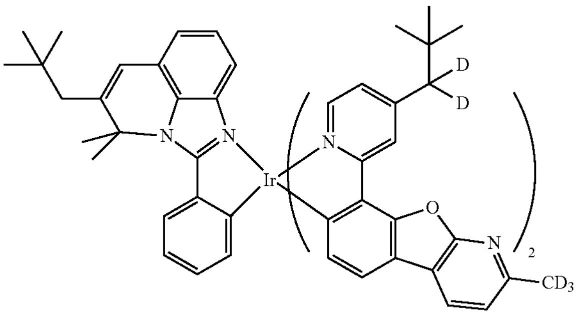
CPD 313
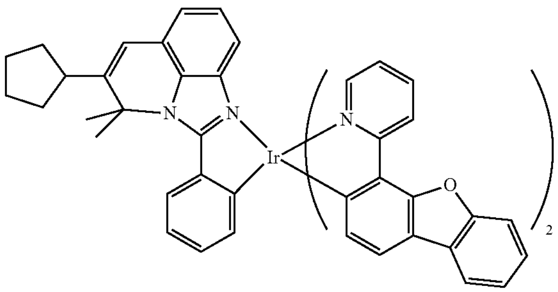

-continued
CPD 314
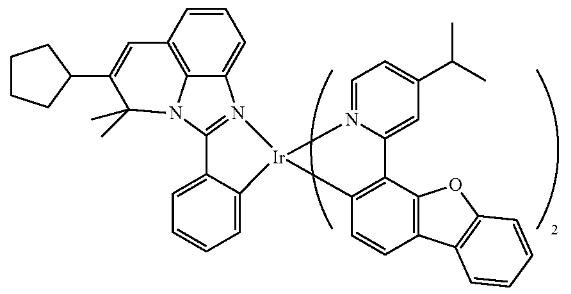
CPD 315
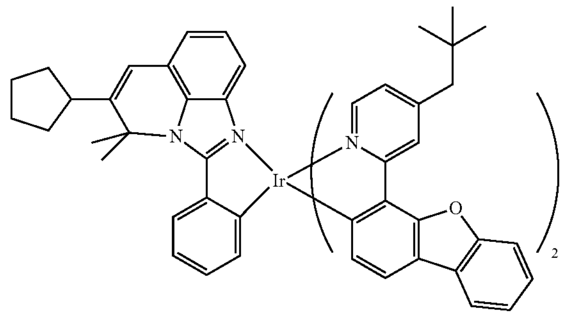
CPD 316
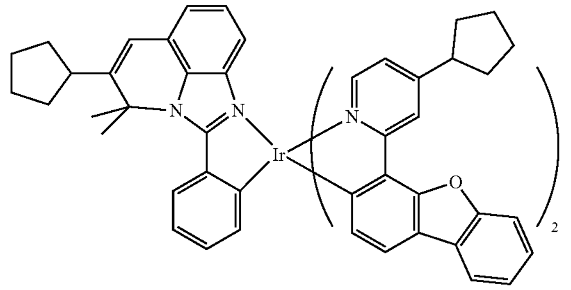
CPD 317
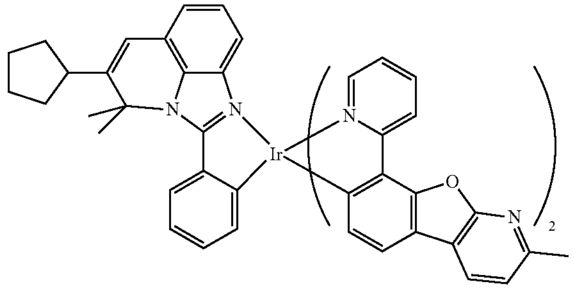
CPD 318
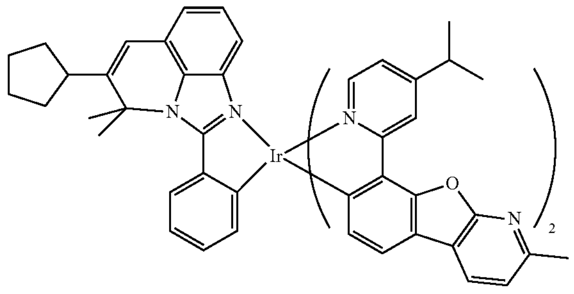
-continued
CPD 319
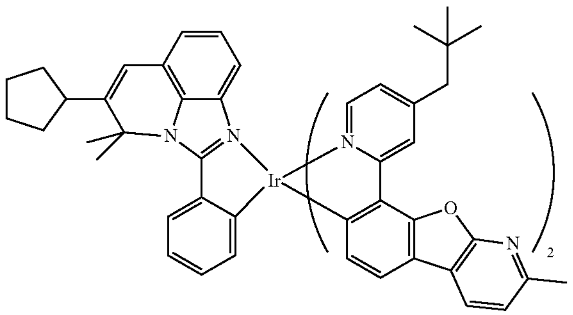
CPD 320
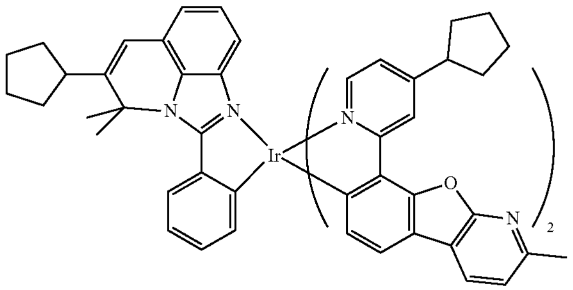
CPD 321
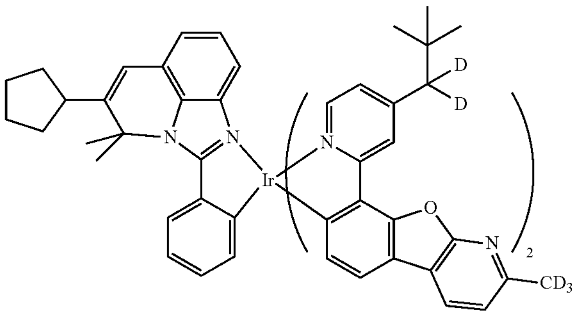
CPD 322
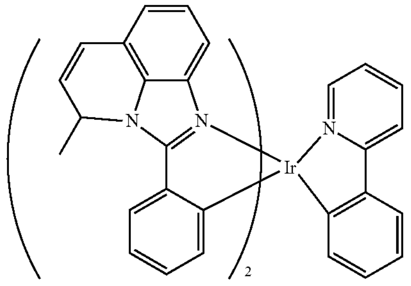
CPD 323
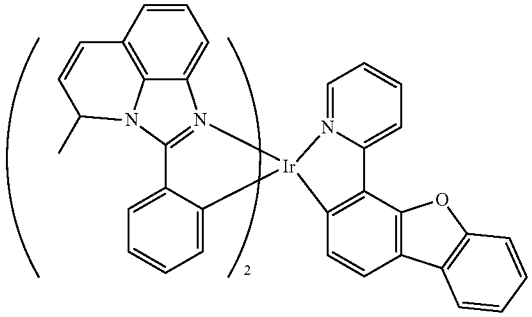

-continued
CPD 324
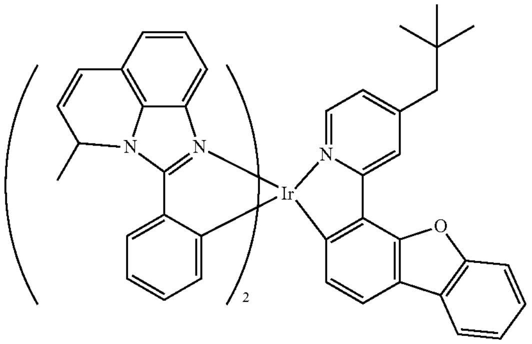
CPD 325
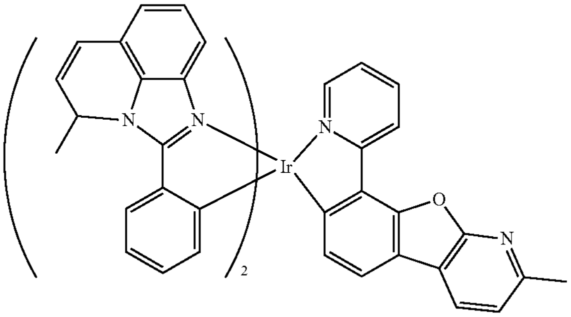
CPD 326
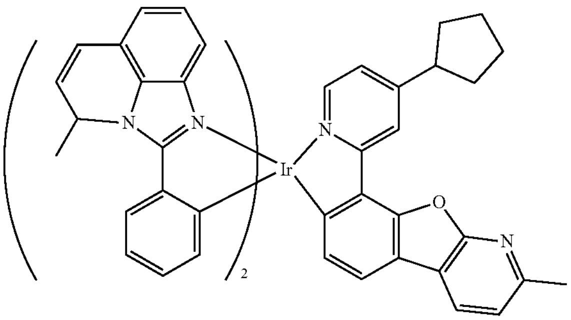
CPD 327
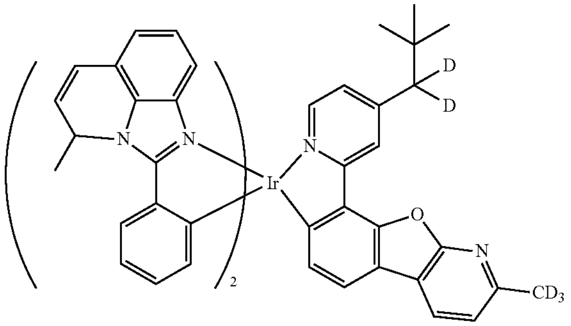
-continued
CPD 328
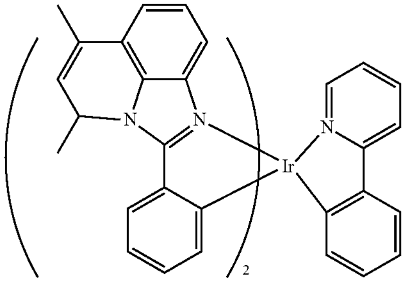
CPD 329
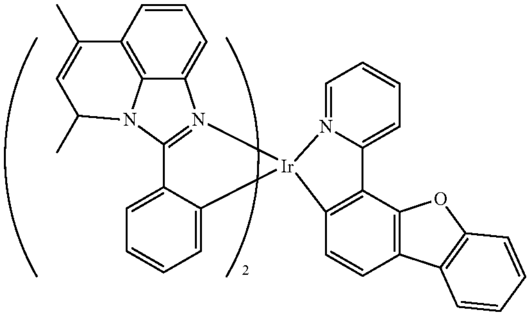
CPD 330
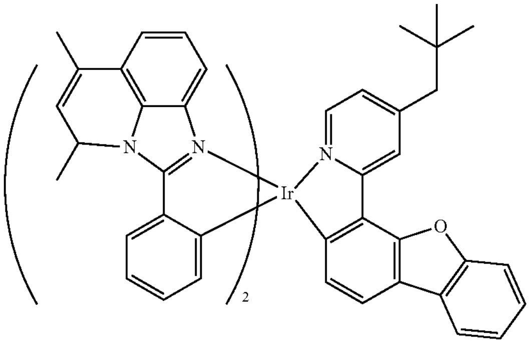
CPD 331
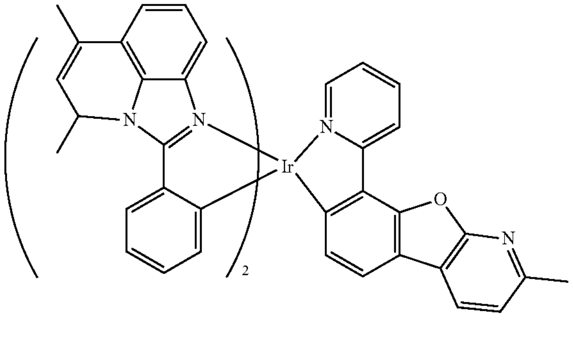

-continued
CPD 332
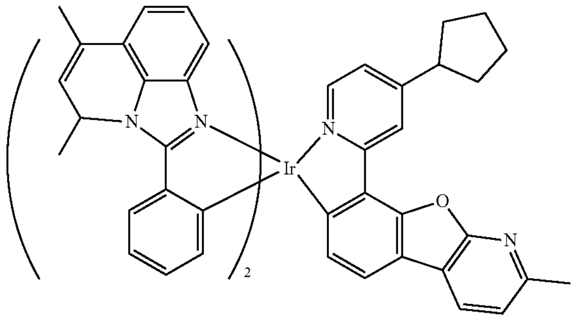
CPD 333
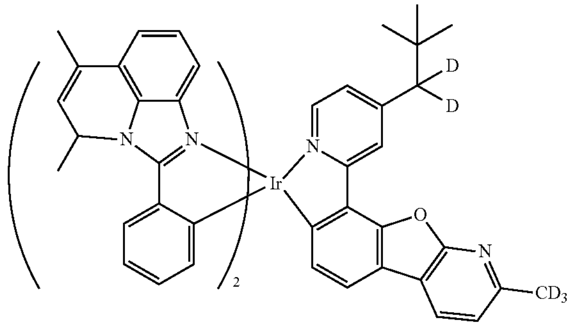
CPD 334
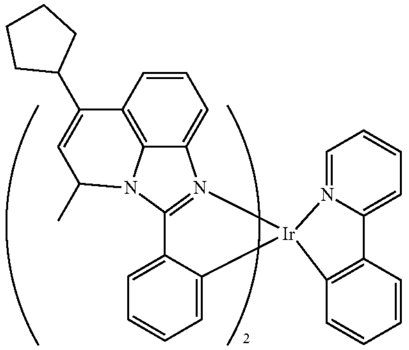
CPD 335
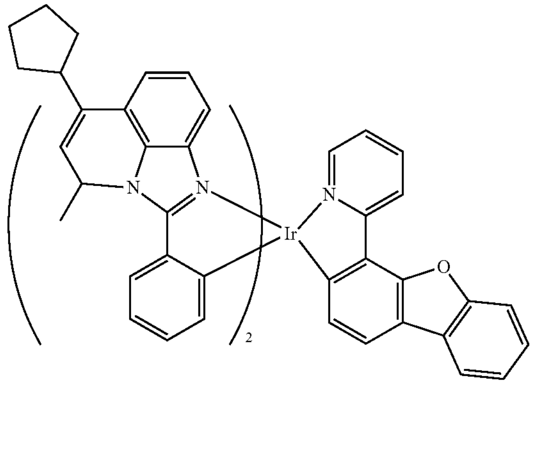
-continued
CPD 336
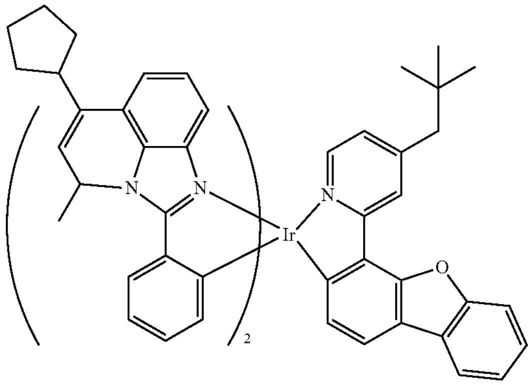
CPD 337
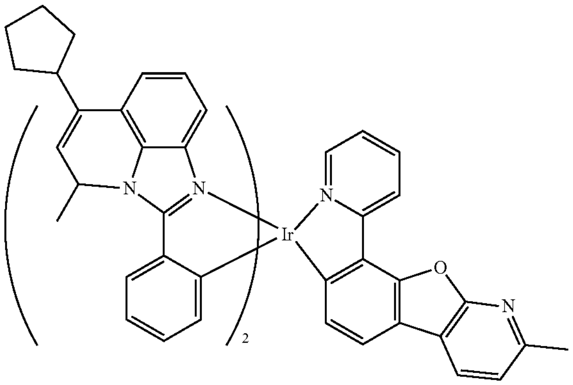
CPD 338
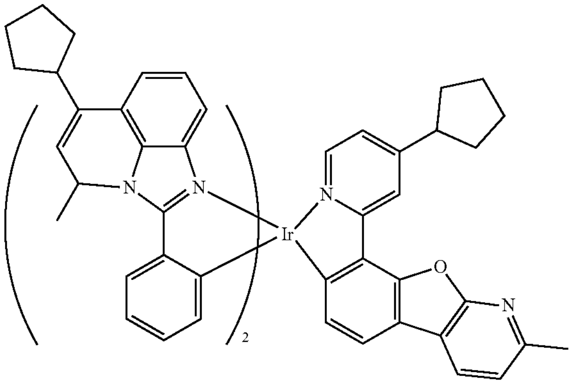
CPD 339
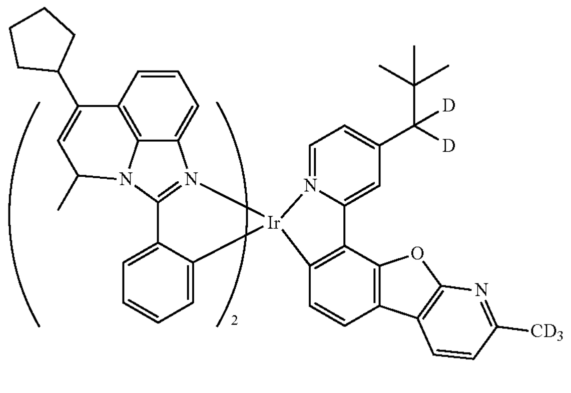

-continued
CPD 340
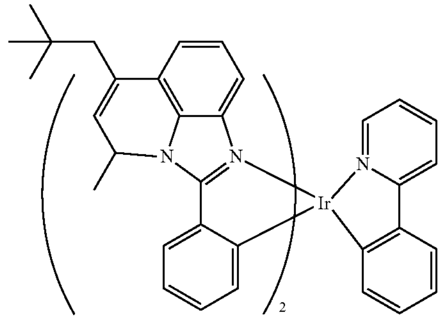
CPD 341
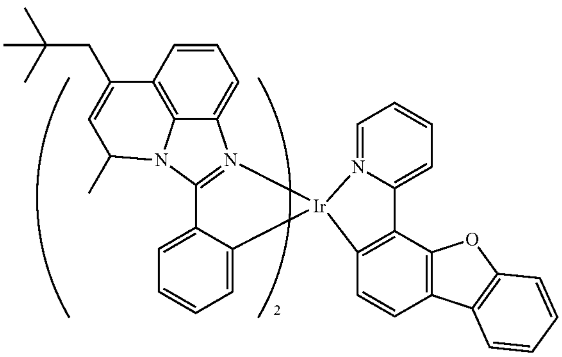
CPD 342
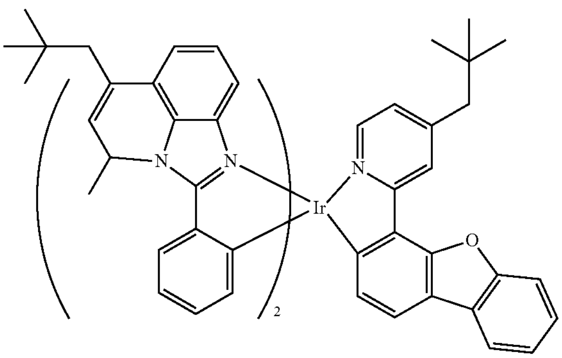
CPD 343
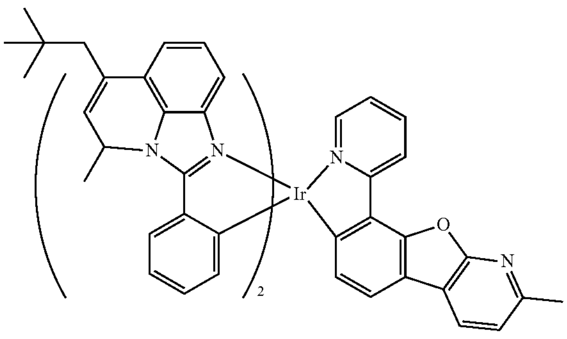
-continued
CPD 344
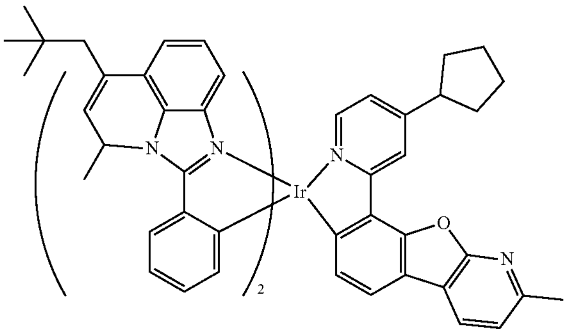
CPD 345
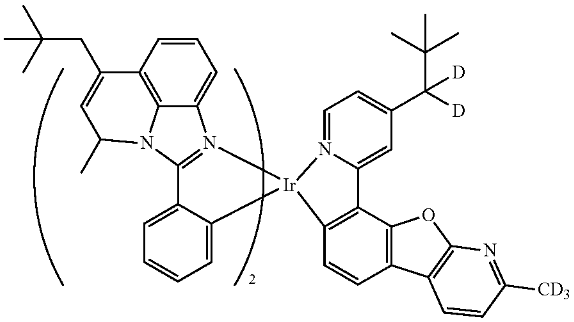
CPD 346
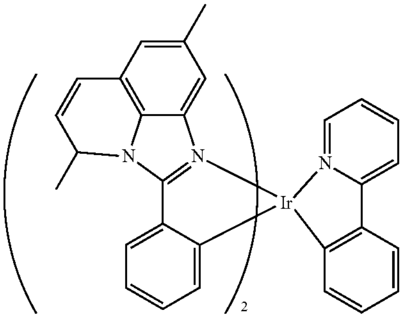
CPD 347
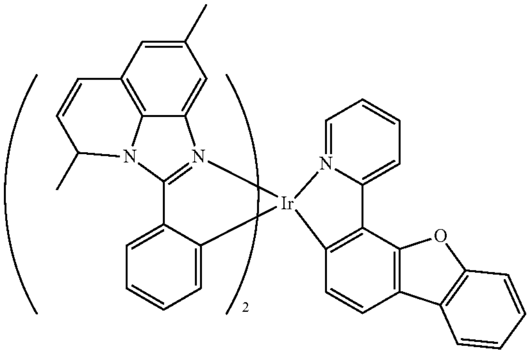

-continued
CPD 348
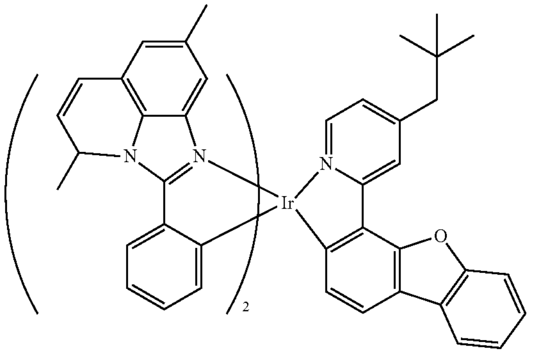
CPD 349
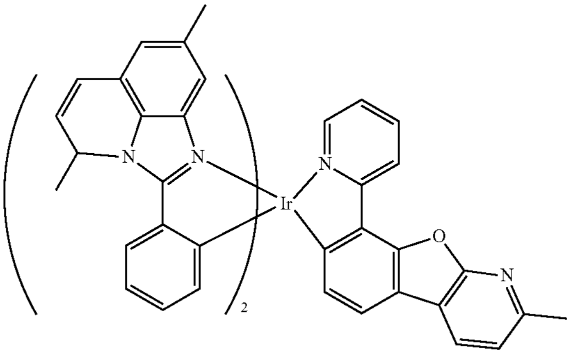
CPD 350
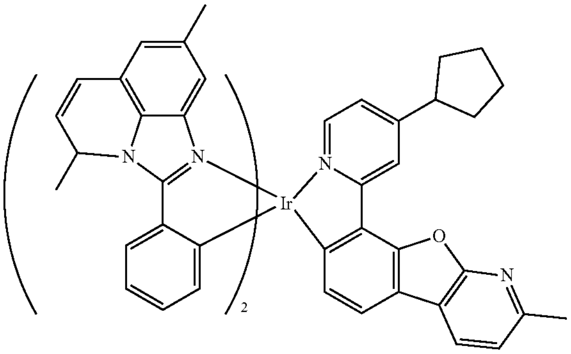
CPD 351
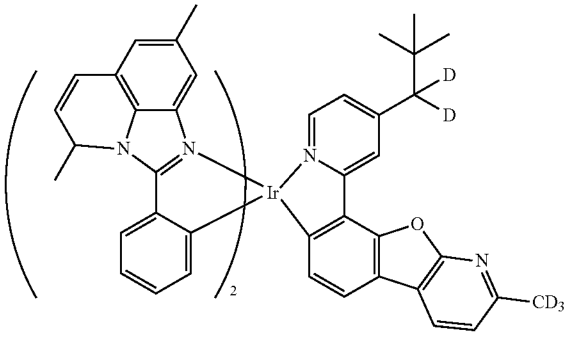
-continued
CPD 352
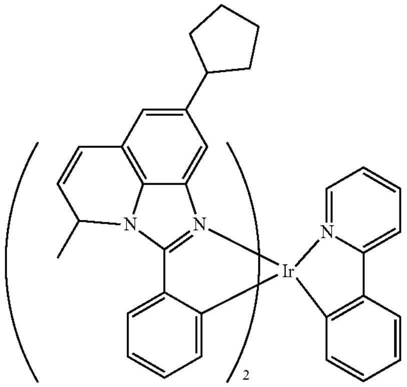
CPD 353
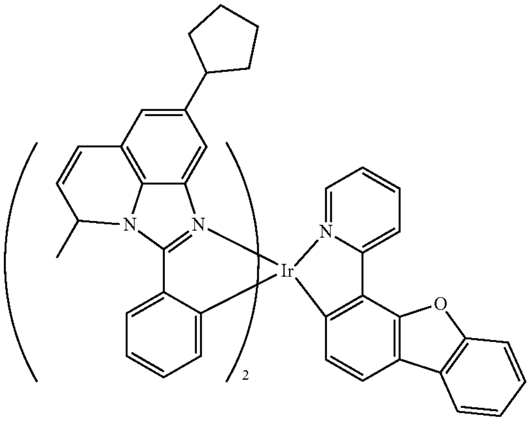
CPD 354
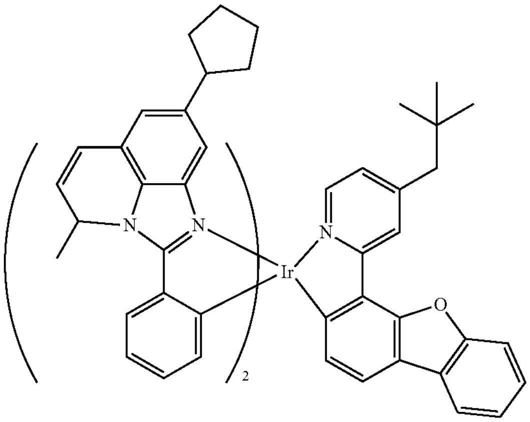

CPD 355
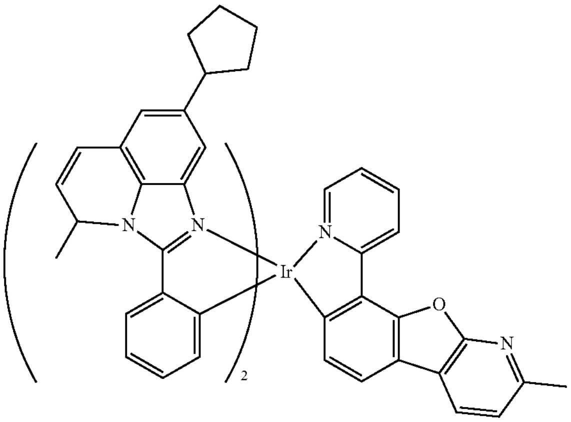
CPD 356
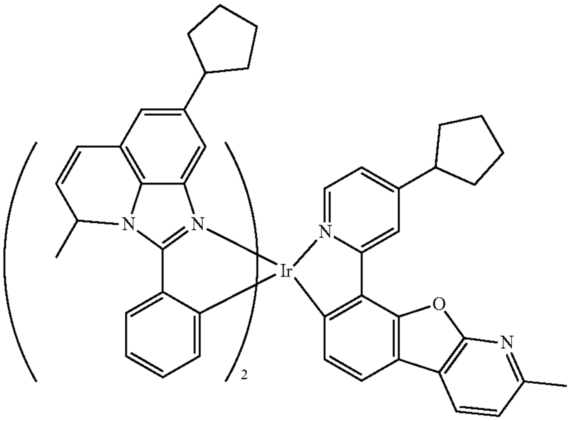
CPD 357
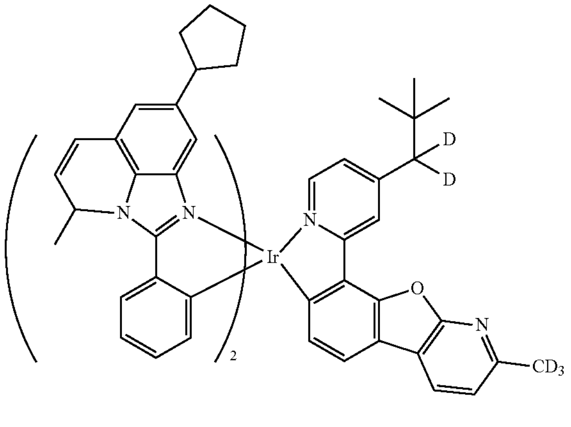
CPD 358
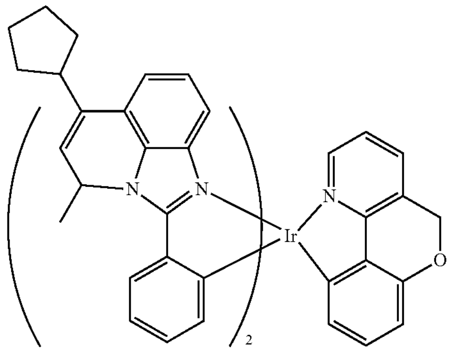
CPD 359
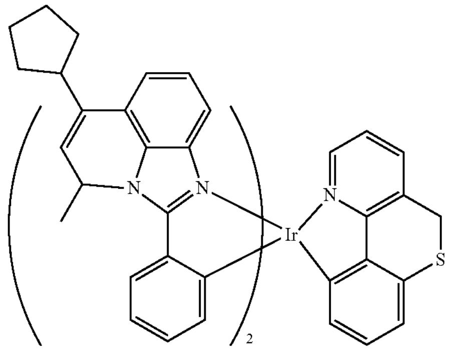
CPD 360
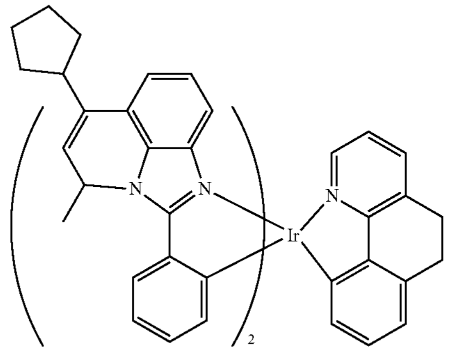
CPD 361
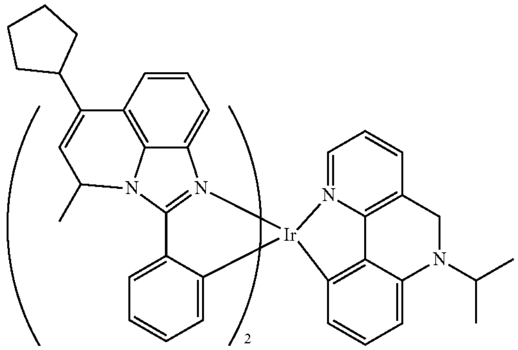

-continued
CPD 362
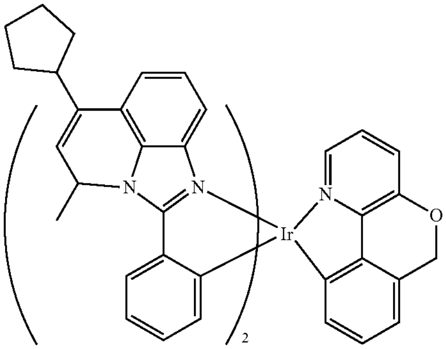
CPD 363
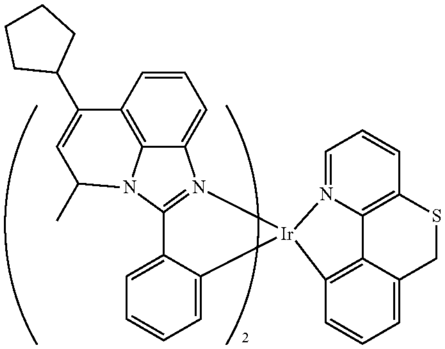
CPD 364
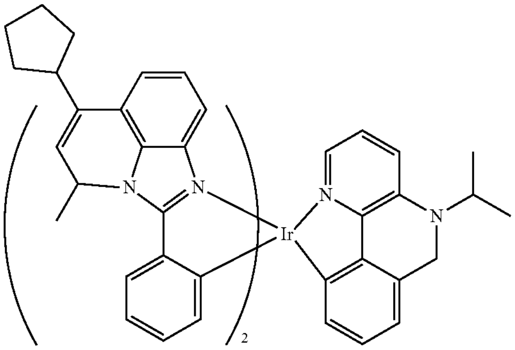
CPD 365
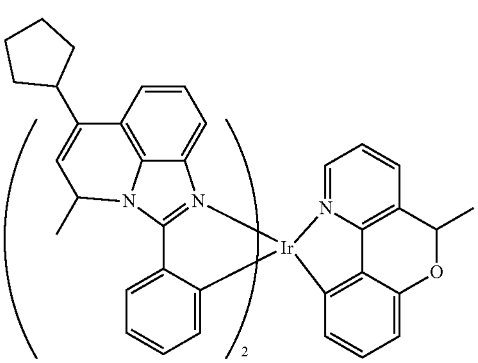
-continued
CPD 366
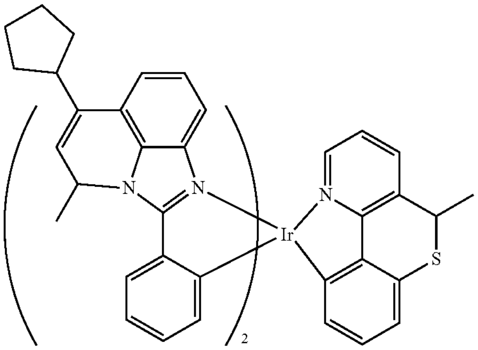
CPD 367
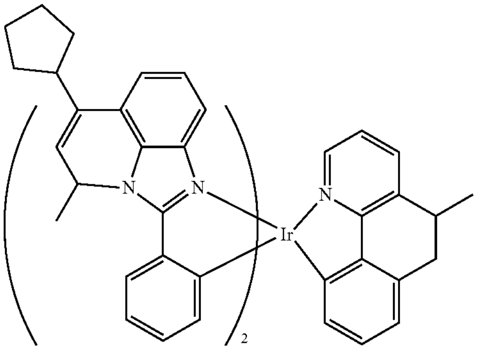
CPD 368
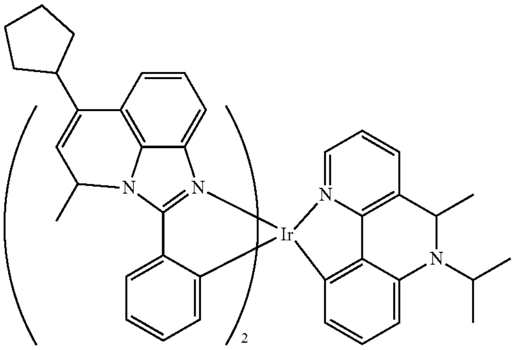
CPD 369
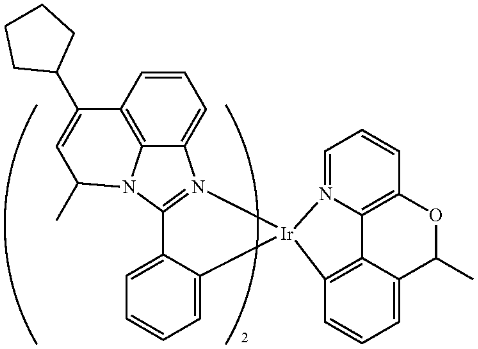

-continued
CPD 370
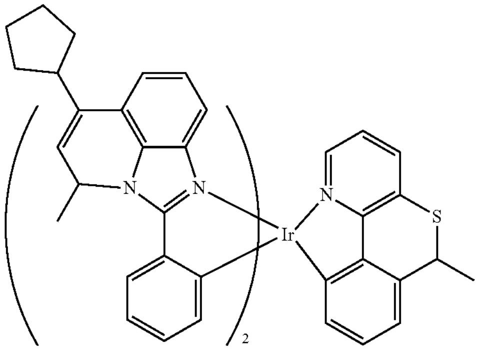
CPD 371
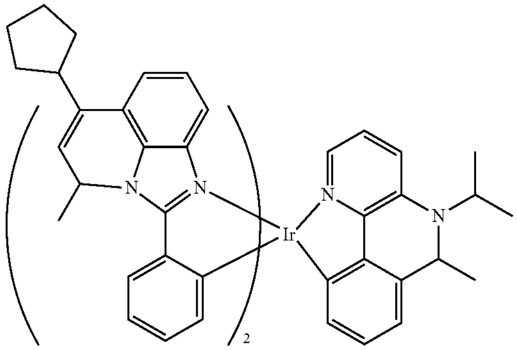
CPD 372
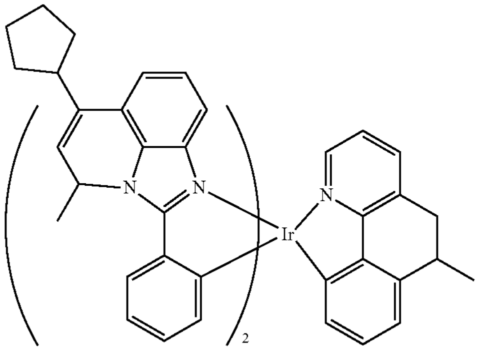
CPD 373
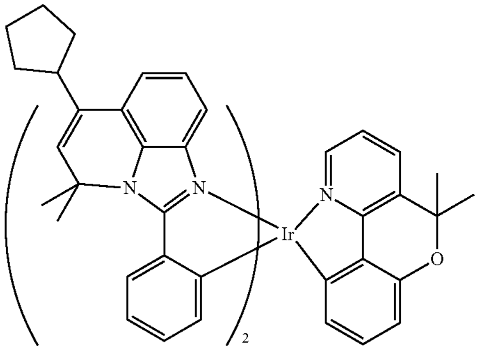
-continued
CPD 374
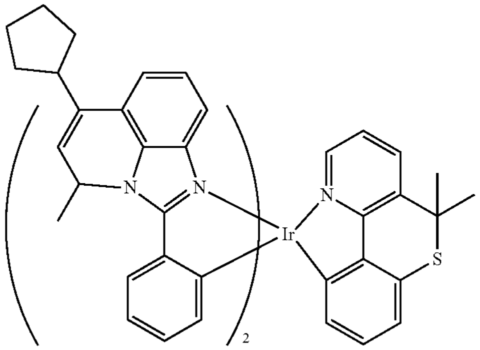
CPD 375
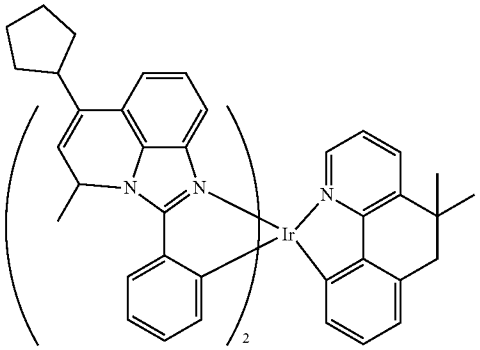
CPD 376
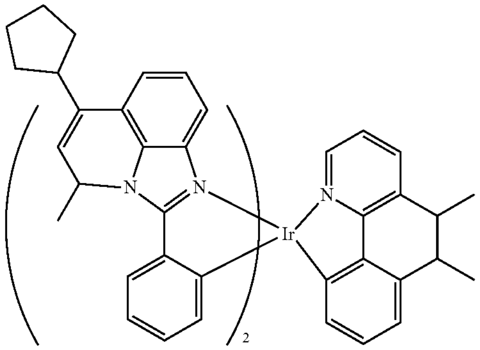
CPD 377
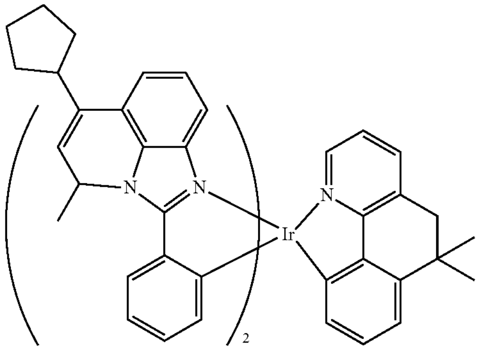

-continued

CPD 378

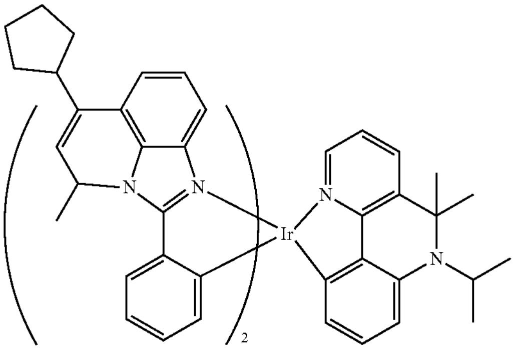

CPD 379

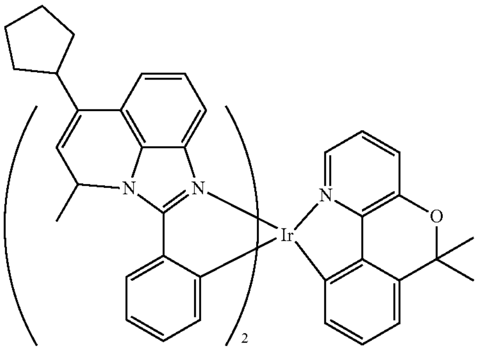

CPD 380

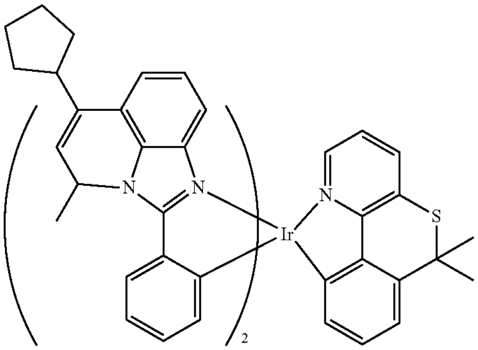

CPD 381

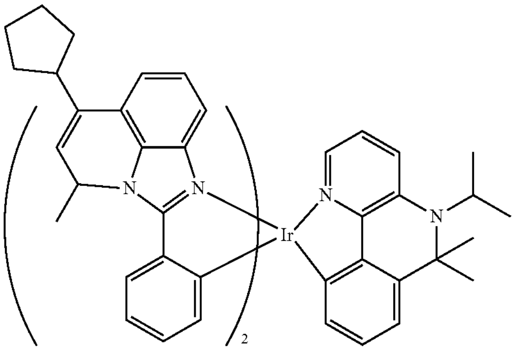

-continued

CPD 382

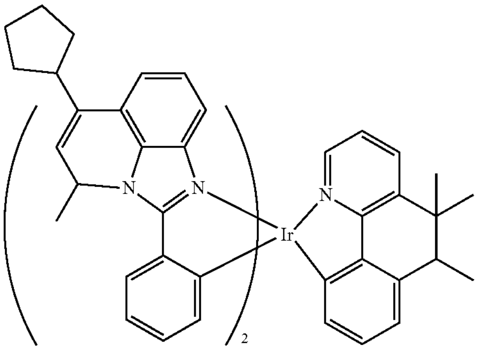

CPD 383

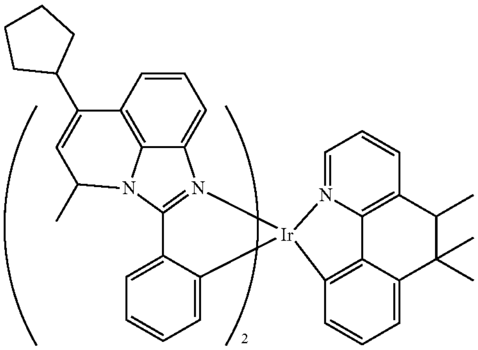

CPD 384

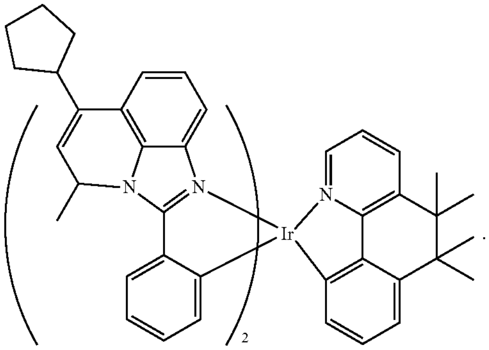

17. An organic electroluminescent device, comprising the organometallic iridium compound according to claim 1.

18. An organic electroluminescent device according to claim 17, comprising a light-emitting layer, wherein the organometallic iridium compound according to claim 1 is used as a green light-emitting doping material for a light-emitting layer.

19. The organometallic iridium compound according to claim 2, wherein at least one of the Rb and the Rc is not hydrogen.

20. An organic electroluminescent device, comprising the organometallic iridium compound according to claim 2.

* * * * *